(12) United States Patent
Lee et al.

(10) Patent No.: US 12,733,391 B2

(45) Date of Patent: Sep. 8, 2026

(54) ORGANOMETALLIC COMPOUND, LIGHT-EMITTING DEVICE INCLUDING THE SAME, AND ELECTRONIC APPARATUS INCLUDING THE LIGHT-EMITTING DEVICE

(71) Applicant: Samsung Display Co., Ltd., Yongin-si (KR)

(72) Inventors: Jaesung Lee, Yongin-si (KR); Iljoon Kang, Yongin-si (KR); Sungbum Kim, Yongin-si (KR); Sujin Shin, Yongin-si (KR); Eunyoung Lee, Yongin-si (KR); Mina Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 890 days.

(21) Appl. No.: 18/104,986

(22) Filed: Feb. 2, 2023

(65) Prior Publication Data

US 2023/0389411 A1 Nov. 30, 2023

(30) Foreign Application Priority Data

May 25, 2022 (KR) ........................ 10-2022-0064240

(51) Int. Cl.
*H10K 85/30* (2023.01)
*C07F 15/00* (2006.01)
(Continued)

(52) U.S. Cl.
CPC ....... *H10K 85/361* (2023.02); *C07F 15/0086* (2013.01); *C09K 11/06* (2013.01); (Continued)

(58) Field of Classification Search
CPC .......... C07F 15/0086; C09K 2211/185; H10K 85/361
See application file for complete search history.

(56) References Cited

U.S. PATENT DOCUMENTS 7,736,755 B2 6/2010 Igarashi et al.
9,735,378 B2 8/2017 Xia et al.
(Continued)

FOREIGN PATENT DOCUMENTS

JP 2001-172232 6/2001
JP 2005-170911 6/2005
(Continued)

*Primary Examiner* — Vu A Nguyen

(74) *Attorney, Agent, or Firm* — Womble Bond Dickinson (US) LLP

(57) ABSTRACT

Embodiments provide an organometallic compound, a light-emitting device including the organometallic compound, and an electronic apparatus including the light-emitting device. The organometallic compound is represented by Formula 1, which is explained in the specification.

[Formula 1]

(Continued)

-continued

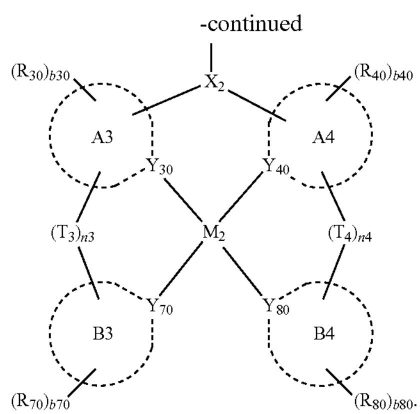

20 Claims, 8 Drawing Sheets

(51) Int. Cl.
*C09K 11/06* (2006.01)
*H10K 50/12* (2023.01)
*H10K 59/12* (2023.01)

(52) U.S. Cl.
CPC ................. *C09K 2211/1029* (2013.01); *C09K 2211/1044* (2013.01); *C09K 2211/185* (2013.01); *H10K 50/12* (2023.02); *H10K 59/12* (2023.02)

(56) References Cited

U.S. PATENT DOCUMENTS

| | | | |
|---|---|---|---|
| 9,923,155 B2 | 3/2018 | Li et al. | |
| 10,008,673 B2 | 6/2018 | Brocke et al. | |
| 10,374,166 B2 | 8/2019 | Hatakeyama et al. | |
| 2004/0131881 A1 | 7/2004 | Zheng et al. | |
| 2007/0106103 A1 | 5/2007 | Ikeda et al. | |
| 2014/0058099 A1 | 2/2014 | Wakamiya et al. | |
| 2021/0043855 A1* | 2/2021 | Lee ...................... | H10K 85/346 |
| 2022/0332741 A1 | 10/2022 | Lee et al. | |
| 2023/0389411 A1 | 11/2023 | Lee et al. | |

FOREIGN PATENT DOCUMENTS

| | | |
|---|---|---|
| JP | 2017-212093 | 11/2017 |
| KR | 10-2016-0012941 | 2/2016 |
| KR | 10-2021-0018574 | 2/2021 |
| KR | 10-2426597 | 7/2022 |
| KR | 10-2022-0132715 | 10/2022 |
| KR | 10-2023-0164802 A | 12/2023 |
| WO | 2004/061047 | 7/2004 |
| WO | 2011/107186 | 9/2011 |
| WO | 2012/118164 | 9/2012 |
| WO | 2015/102118 | 7/2015 |

* cited by examiner

ORGANOMETALLIC COMPOUND, LIGHT-EMITTING DEVICE INCLUDING THE SAME, AND ELECTRONIC APPARATUS INCLUDING THE LIGHT-EMITTING DEVICE

CROSS-REFERENCE TO RELATED APPLICATION(S)

This application claims priority to and benefits of Korean Patent Application No. 10-2022-0064240 under 35 U.S.C. § 119, filed on May 25, 2022, in the Korean Intellectual Property Office, the entire contents of which are incorporated herein by reference.

BACKGROUND

1. Technical Field

Embodiments relate to an organometallic compound, a light-emitting device including the organometallic compound, and an electronic apparatus including the light-emitting device.

2. Description of the Related Art

Among light-emitting devices, organic light-emitting devices are self-emissive devices that have wide viewing angles, high contrast ratios, short response times, and excellent characteristics in terms of luminance, driving voltage, and response speed, compared to devices in the related art.

Organic light-emitting devices may include a first electrode located on a substrate, and a hole transport region, an emission layer, an electron transport region, and a second electrode, sequentially stacked on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. The excitons may transition from an excited state to a ground state, thus generating light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include an organometallic compound having a low driving voltage, excellent luminance and luminescence efficiency, a light-emitting device using the same, and an electronic apparatus including the light-emitting device.

Additional aspects will be set forth in part in the description which follows and, in part, will be apparent from the description, or may be learned by practice of the embodiments of the disclosure.

According to embodiments, a light-emitting device may include a first electrode, a second electrode facing the first electrode, and an interlayer between the first electrode and the second electrode and including an emission layer, and an organometallic compound represented by Formula 1:

[Formula 1]

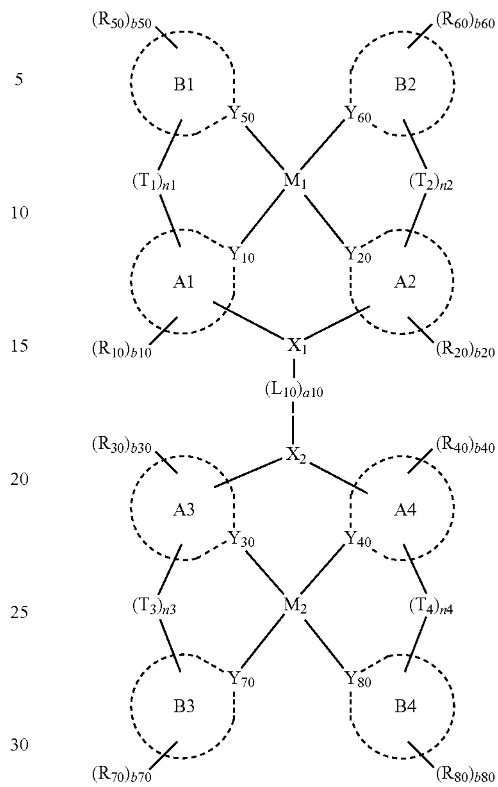

In Formula 1, $M_1$ and $M_2$ may each independently be platinum (Pt), palladium (Pd), gold (Au), nickel (Ni), silver (Ag), or copper (Cu), A1 to A4 and B1 to B4 may each independently be a $C_5$-$C_{60}$ carbocyclic group or a $C_1$-$C_{60}$ heterocyclic group, $Y_{10}$, $Y_{20}$, $Y_{30}$, $Y_{40}$, $Y_{50}$, $Y_{60}$, $Y_{70}$, and $Y_{80}$ may each independently be C or N, two bonds selected from a bond between $Y_{10}$ and $M_1$, a bond between $Y_{20}$ and Mt, a bond between $Y_{50}$ and $M_1$, and a bond between $Y_{60}$ and $M_1$ may each be a coordinate bond, and the remainder thereof may each be a covalent bond, two bonds selected from a bond between $Y_{30}$ and $M_2$, a bond between $Y_{40}$ and $M_2$, a bond between $Y_{70}$ and $M_2$, and a bond between $Y_{80}$ and $M_2$ may each be a coordinate bond, and the remainder thereof may each be a covalent bond, $T_1$ and $T_2$ may each independently be a single bond, *—O—*', *—S—*', *—C($R_1$)($R_2$)—*', *—C($R_1$)=*', *=C($R_1$)—*', *—C($R_1$)=C($R_2$)—*', *—C(=O)—*', *—C(=S)—*', *—C≡C—*', *—B($R_1$)—*', *—N($R_1$)—*', *—P($R_1$)—*', *—Si($R_1$)($R_2$)—*', *—P($R_1$)($R_2$)—*', or *—Ge($R_1$)($R_2$)—*', $T_3$ and $T_4$ may each independently be a single bond, *—O—*', *—S—*', *—C($R_3$)($R_4$)—*', *—C($R_3$)=*', *=C($R_3$)—*', *—C($R_3$)=C($R_4$)—*', *—C(=O)—*', *—C(=S)—*', *—C≡C—*', *—B($R_3$)—*', *—N($R_3$)—*', *—P($R_3$)—*', *—Si($R_3$)($R_4$)—*', *—P($R_3$)($R_4$)—*' or *—Ge($R_3$)($R_4$)—*', n1 to n4 may each independently be 1, 2, or 3, $X_1$ may be N, P, C($R_5$), or Si($R_5$), $X_2$ may be N, P, C($R_6$), or Si($R_6$), $L_{10}$ may be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a10 may be 1, 2, 3, 4, or 5,

* and *' each indicate a binding site to a neighboring atom, $R_1$ to $R_6$, $R_{10}$, $R_{20}$, $R_{30}$, $R_{40}$, $R_{50}$, $R_{60}$, $R_{70}$, and $R_{80}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b10, b20, b30, b40, b50, b60, b70, and b80 may each independently be an integer from 0 to 20, each of: $R_1$ and $R_2$; $R_3$ and $R_4$; two or more of $R_{10}$ in the number of b10; two or more of $R_{20}$ in the number of b20; two or more of $R_{30}$ in the number of b30; two or more of $R_{40}$ in the number of b40; two or more of $R_{50}$ in the number of b50; two or more of $R_{60}$ in the number of b60; two or more of $R_{70}$ in the number of b70; and two or more of $R_{80}$ in the number of b80 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_1$, $R_2$, $R_{10}$, $R_{20}$, $R_{50}$, and $R_{60}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_3$, $R_4$, $R_{30}$, $R_{40}$, $R_{70}$, and $R_{80}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be:

deuterium, —F, —Cl, —Br, a hydroxyl group, a cyano group, or a nitro group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the interlayer may further include a hole transport region between the first electrode and the emission layer and an electron transport region between the emission layer and the second electrode; the hole transport region may include a hole injection layer, a hole transport layer, an emission auxiliary layer, an electron-blocking layer, or any combination thereof; and the electron transport region may include a buffer layer, a hole-blocking layer, an electron control layer, an electron transport layer, an electron injection layer, or any combination thereof.

In an embodiment, the emission layer may include the organometallic compound.

In an embodiment, the emission layer may emit blue light having a maximum emission wavelength in a range of about 430 nm to about 470 nm.

In an embodiment, the emission layer may include a host and a dopant, and the dopant may include the organometallic compound.

In an embodiment, the electron transport region may include an electron transport layer and an electron injection layer; and at least one of the electron transport layer and the electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

According to embodiments, an electronic apparatus may include the light-emitting device.

In an embodiment, the electronic apparatus may further include: a thin-film transistor; and a color filter, a color conversion layer, a touch screen layer, a polarizing layer, or any combination thereof, wherein the thin-film transistor may include a source electrode and a drain electrode, and the first electrode of the light-emitting device may be electrically connected to the source electrode or the drain electrode.

According to embodiments, an electronic device may include the light-emitting device, wherein the electronic device may be a flat panel display, a curved display, a computer monitor, a medical monitor, a television, a billboard, an indoor light, an outdoor light, a signal light, a head-up display, a fully transparent display, a partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a micro display, a three-dimensional (3D) display, a virtual reality display, an augmented reality display, a vehicle, a video wall with multiple displays tiled together, a theater screen, a stadium screen, a phototherapy device, or a signboard.

According to embodiments, an organometallic compound may be represented by Formula 1.

In an embodiment, a bond between $Y_{50}$ and $M_1$ and a bond between $Y_{60}$ and $M_1$ may each be a coordinate bond, $Y_{50}$ and $Y_{60}$ may each independently be C or N, a bond between $Y_{10}$ and $M_1$ and a bond between $Y_{20}$ and $M_1$ may each be a covalent bond, and $Y_{10}$ and $Y_{20}$ may each independently be C or N; and/or a bond between $Y_{70}$ and $M_2$ and a bond between $Y_{80}$ and $M_2$ may each be a coordinate bond, $Y_{70}$ and $Y_{80}$ may each independently be C or N, a bond between $Y_{30}$ and $M_2$ and a bond between $Y_{40}$ and $M_2$ may each be a covalent bond, and $Y_{30}$ and $Y_{40}$ may each independently be C or N.

In an embodiment, $Y_{10}$, $Y_{20}$, $Y_{30}$, and $Y_{40}$ may each be C, and at least two of $Y_{50}$, $Y_{60}$, $Y_{70}$, and $Y_{80}$ may each be C.

In an embodiment, A1 to A4 and B1 to B4 may each independently be a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furoimidazole group, a thienoimidazole group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, the organometallic compound may satisfy at least one of Condition 1 and Condition 2, which are explained below.

In an embodiment, $T_1$ to $T_4$ may each be a single bond.

In an embodiment, $X_1$ and $X_2$ may each independently be N or P.

In an embodiment, $L_{10}$ may be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-a fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$; $L_{10}$ may not be bonded to each of A1 to A4, $R_{10}$, $R_{20}$, $R_{30}$, and $R_{40}$ in Formula 1, and $R_{10a}$ is the same as described in Formula 1.

In an embodiment, $L_{10}$ may be a group represented by one of Formulae 4-1 to 4-3, which are explained below.

In an embodiment, $R_{10}$, $R_{20}$, $R_{30}$, $R_{40}$, $R_{50}$, $R_{60}$, $R_{70}$, and $R_{80}$ may each independently be:

hydrogen, deuterium, —F, or a cyano group;

a $C_1$-$C_{20}$ alkyl group, a $C_1$-$C_{20}$ alkoxy group, or a $C_1$-$C_{20}$ alkylthio group, each unsubstituted or substituted with deuterium, —F, a cyano group, a phenyl group, a biphenyl group, or any combination thereof;

a cyclopentyl group, a pyrrolidinyl group, a cyclohexyl group, a phenyl group, a pyridinyl group, a pyrazinyl group, a pyrimidinyl group, a pyridazinyl group, a triazinyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, an indazolyl group, a purinyl group, a cinnolinyl group, a carbazolyl group, a benzofuranyl group, a dibenzofuranyl group, a benzothiophenyl group, a dibenzothiophenyl group, a benzocarbazolyl group, or a dibenzocarbazolyl group, each unsubstituted or substituted with deuterium, $—CD_3$, $—CD_2H$, $—CDH_2$, $—CF_3$, $—CF_2H$, $—CFH_2$, a cyano group, a $C_1$-$C_{20}$ alkyl group, $—Si(Q_{31})(Q_{32})(Q_{33})$, $—N(Q_{31})(Q_{32})$, $—B(Q_{31})(Q_{32})$, or any combination thereof; or $—Si(Q_1)(Q_2)(Q_3)$, $—N(Q_1)(Q_2)$, or $—B(Q_1)(Q_2)$, wherein $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$,

—$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In an embodiment, the organometallic compound may be a compound represented by Formula 1-1, which is explained below.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects and features of the disclosure will be more apparent by describing in detail embodiments thereof with reference to the accompanying drawings, in which.

DETAILED DESCRIPTION OF THE EMBODIMENTS

Figure 1:
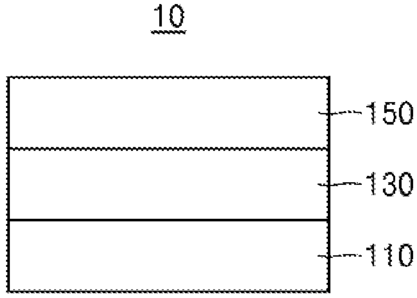
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group consisting of" for the purpose of its meaning and interpretation. For example, "at least one of A, B, and C" may be understood to mean A only, B only, C only, or any combination of two or more of A, B, and C, such as ABC, ACC, BC, or CC. When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An organometallic compound may be represented by Formula 1:

[Formula 1]

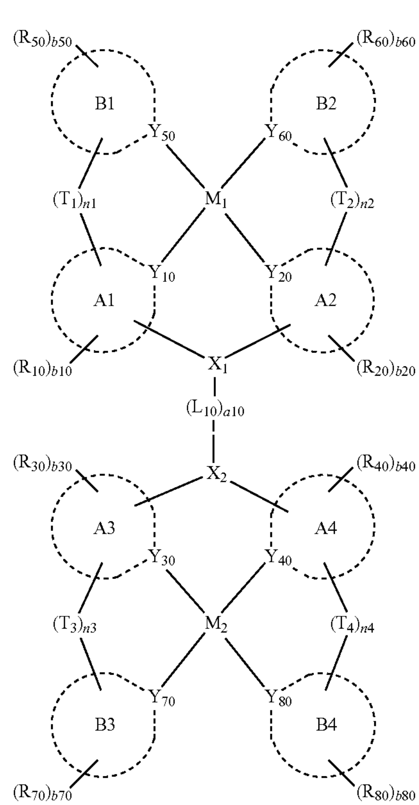

In Formula 1, $M_1$ and $M_2$ may each independently be platinum (Pt), palladium (Pd), gold (Au), nickel (Ni), silver (Ag), or copper (Cu).

In an embodiment, $M_1$ and $M_2$ may each independently be platinum (Pt) or palladium (Pd). In an embodiment, $M_1$ and $M_2$ may each be platinum (Pt).

In Formula 1, A1 to A4 and B1 to B4 may each independently be a $C_5$-$C_{60}$ carbocyclic group or a $C_1$-$C_{60}$ heterocyclic group.

In an embodiment, A1 to A4 and B1 to B4 may each independently be a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furoimidazole group, a thienoimidazole group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, A1 to A4 may each independently be a benzene group, a naphthalene group, a phenanthrene group, a 1,2,3,4-tetrahydronaphthalene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, an imidazole group, a benzimidazole group, a imidazopyridine group, a 2,3-dihydroimidazopyridine group, or an imidazopyrimidine group.

In an embodiment, B1 to B4 may each independently be a benzene group, a naphthalene group, a phenanthrene group, an indole group, a carbazole group, an indolopyridine group, an indolopyrimidine group, a pyridine group, a pyrimidine group, a pyrazine group, a pyridazine group, a triazine group, a quinoline group, an isoquinoline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a pyrazolopyridine group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzooxazole group, a benzothiazole group, a benzooxadiazole group, or a benzothiadiazole group.

In Formula 1, $Y_{10}$, $Y_{20}$, $Y_{30}$, $Y_{40}$, $Y_{50}$, $Y_{60}$, $Y_{70}$, and $Y_{80}$ may each independently be C or N.

In Formula 1, two bonds selected from a bond between $Y_{10}$ and $M_1$, a bond between $Y_{20}$ and $M_1$, a bond between $Y_{50}$ and $M_1$, and a bond between $Y_{60}$ and $M_1$ may each be a coordinate bond, and the remainder thereof may each be a covalent bond; and two bonds selected from a bond between $Y_{30}$ and $M_2$, a bond between $Y_{40}$ and $M_2$, a bond between $Y_{70}$ and $M_2$, and a bond between $Y_{80}$ and $M_2$ may be coordinate bonds, and the remainder thereof may each be a covalent bond.

In an embodiment, the organometallic compound may satisfy one of Condition A and Condition B; and may satisfy one of Condition C and Condition D:

[Condition A]

A bond between $Y_{50}$ and $M_1$ may be a coordinate bond; and one of a bond between $Y_{10}$ and $M_1$, a bond between $Y_{20}$ and $M_1$, and a bond between $Y_{60}$ and $M_1$ may be a coordinate bond, and the remainder thereof may each be a covalent bond.

[Condition B]

A bond between $Y_{10}$ and $M_1$ may be a coordinate bond; and one of a bond between $Y_{20}$ and $M_1$, a bond between $Y_{50}$ and $M_1$, and a bond between $Y_{60}$ and $M_1$ may be a coordinate bond, and the remainder thereof may each be a covalent bond.

[Condition C]

A bond between $Y_{70}$ and $M_2$ may be a coordinate bond; and one of a bond between $Y_{30}$ and $M_2$, a bond between $Y_{40}$ and $M_2$, and a bond between $Y_{80}$ and $M_2$ may be a coordinate bond, and the remainder thereof may each be a covalent bond.

[Condition D]

A bond between $Y_{30}$ and $M_2$ may be a coordinate bond; and one of a bond between $Y_{40}$ and $M_2$, a bond between $Y_{70}$ and $M_2$, and a bond between $Y_{80}$ and $M_2$ may be a coordinate bond, and the remainder thereof may each be a covalent bond.

In an embodiment, the organometallic compound may satisfy Condition A and Condition C.

In an embodiment, in Formula 1, a bond between $Y_{50}$ and $M_1$ and a bond between $Y_{60}$ and $M_1$ may each be a coordinate bond, $Y_{50}$ and $Y_{60}$ may each independently be C or N, a bond between $Y_{10}$ and $M_1$ and a bond between Yeo and $M_1$ may each be a covalent bond, and $Y_{10}$ and $Y_{20}$ may each independently be C or N; and/or a bond between $Y_{70}$ and $M_2$ and a bond between $Y_{80}$ and $M_2$ may each be a coordinate bond, $Y_{70}$ and $Y_{80}$ may each independently C or N, a bond between $Y_{30}$ and $M_2$ and a bond between $Y_{40}$ and $M_2$ may each be a covalent bond, and $Y_{30}$ and $Y_{40}$ may each independently be C or N.

In an embodiment, $Y_{10}$, $Y_{20}$, $Y_{30}$, and $Y_{40}$ may each be C, and at least two of $Y_{50}$, $Y_{60}$, $Y_{70}$, and $Y_{80}$ may each be C.

In an embodiment, $Y_{50}$, $Y_{60}$, $Y_{70}$, and $Y_{80}$ may each be C.

In an embodiment, $Y_{10}$, $Y_{20}$, $Y_{30}$, $Y_{40}$, $Y_{50}$, $Y_{60}$, $Y_{70}$, and $Y_{80}$ may each be C.

In Formula 1, $T_1$ and $T_2$ may each independently be a single bond, *—O—*', *—S—*', *—C($R_1$)($R_2$)—*' *—C($R_1$)=*', *=C($R_1$)—*', *—C($R_1$)=C($R_2$)—*', *—C(=O)—*', *—C(=S)—*', *—C≡C—*', *—B($R_1$)—*', *—N($R_1$)—*', *—P($R_1$)—*', *—Si($R_1$)($R_2$)—*', *—P($R_1$)($R_2$)—*' or *—Ge($R_1$)($R_2$)—*'; $T_3$ and $T_4$ may each independently be a single bond, *—O—*', *—C($R_3$)($R_4$)—*', *—C($R_3$)=*', *=C($R_3$)—*', *—C($R_3$)=C($R_4$)—*', *—C(=O)—*', *—C(=S)—*', *—C≡C—*', *—B($R_3$)—*', *—N($R_3$)—*', *—P($R_3$)—*', *—Si($R_3$)($R_4$)—*', *—P($R_3$)($R_4$)—*', or *—Ge($R_3$)($R_4$)—*'; and * and *' each indicate a binding site to an adjacent atom.

In an embodiment, $T_1$ and $T_2$ may each independently be a single bond, *—O—*', *—S—*', *—C($R_1$)($R_2$)—*', *—B($R_1$)—*', *—N($R_1$)—*', *—P($R_1$)—*', *—Si($R_1$)($R_2$)—*', or *—P($R_1$)($R_2$)—*'.

In an embodiment, $T_3$ and $T_4$ may each independently be a single bond, *—O—*', *—S—*', *—C($R_3$)($R_4$)—*', *—B($R_3$)—*', *—N($R_3$)—*', *—P($R_3$)—*', *—Si($R_3$)($R_4$)—*', or *—P($R_3$)($R_4$)—*'.

In an embodiment, $T_1$ to $T_4$ may each be a single bond.

In Formula 1, n1 to n4 may each independently be 1, 2, or 3.

For example, n1 to n4 may each be 1.

In Formula 1, $X_1$ may be N, P, C($R_5$), or Si($R_5$), and $X_2$ may be N, P, C($R_6$), or Si($R_6$).

In an embodiment, $X_1$ and $X_2$ may each independently be N or P.

For example, $X_1$ and $X_2$ may each be N.

For example, $X_1$ and $X_2$ may be identical to each other.

In Formula 1, $L_{10}$ may be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, $L_{10}$ may be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a oxazole group, an isoxazole group, a thiazole group, an isothiazole group, an oxadiazole group, a thiadiazole group, a benzopyrazole group, a benzoimidazole group, a benzoxazole group, a benzothiazole group, a benzooxadiazole group, a benzothiadiazole group, a 5,6,7,8-tetrahydroisoquinoline group, or a 5,6,7,8-tetrahydroquinoline group, each unsubstituted or substituted with at least one $R_{10a}$, wherein $L_{10}$ may not be bonded to each of A1 to A4, $R_{10}$, $R_{20}$, $R_{30}$, and $R_{40}$ in Formula 1, and $R_{10a}$ is the same as described herein.

In the embodiment described above, as $L_{10}$ may not be bonded to each of A1 to A4, $R_{10}$, $R_{20}$, $R_{30}$, and $R_{40}$ in Formula 1, this structure may be clearly distinguished from a structure in which $(L_{10})_{a10}$ in Formula 1 is bonded to, in addition to $X_1$ and $X_2$, at least one of ring A1 to ring A4, such as in Compound CE4 used in Comparative Example 4 of the specification. Thus, in Formula 1, $(L_{10})_{a10}$ may form a bond only with $X_1$ and $X_2$, so that the organometallic compound can exhibit excellent luminance.

In Formula 1, a10 may be 1, 2, 3, 4, or 5.

For example, a10 may be 1, 2, or 3.

$X_1$ and $X_2$ in Formula 1 may each be bonded to a cyclic group represented by $(L_{10})_{a10}$. This structure is clearly distinguished from a structure (for example, refer to Comparative Compound CE2 in the specification) in which two tetradentate ligands are linked via a linking group that does not include an intervening cyclic group (for example, a tetravalent carbon connection group, a tetravalent silicon connection group, etc.).

In an embodiment, a group represented by *-$(L_{10})_{a10}$-*' in Formula 1 may be:

a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzoimidazole group, a benzooxazole group, a benzothiazole group, a benzooxadiazole group, a benzothiadiazole group, a 5,6,7,8-tetrahydroisoquinoline group, or a 5,6,7,8-tetrahydroquinoline group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzooxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(═O)(Q_{31})$, $—S(═O)_2(Q_{31})$, $—P(═O)(Q_{31})(Q_{32})$, or any combination thereof, wherein * and *' each indicate a binding site to $X_1$ or $X_2$ in Formula 1.

In an embodiment, $L_{10}$ may be a group represented by one of Formulae 4-1 to 4-3:

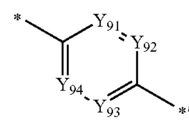

4-1

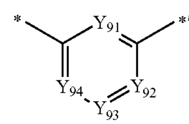

4-2

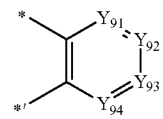

4-3

In Formulae 4-1 to 4-3, $Y_{91}$ may be $C(R_{91})$ or N, $Y_{92}$ may be $C(R_{92})$ or N, $Y_{93}$ may be $C(R_{93})$ or N, and $Y_{94}$ may be $C(R_{94})$ or N, $R_{91}$ to $R_{94}$ may each independently be hydrogen, or may each independently be the same as described in connection with $R_{10a}$ as defined herein, and

* and *' each indicate a binding site to a neighboring atom.

For example, in Formulae 4-1 to 4-3, $R_{91}$ to $R_{94}$ may each independently be:

hydrogen, deuterium, —F, or a cyano group;

a $C_1$-$C_{10}$ alkyl group, a $C_1$-$C_{10}$ alkoxy group, or a $C_1$-$C_{10}$ alkylthio group, unsubstituted or substituted with deuterium, —F, a cyano group, a phenyl group, a biphenyl group, or any combination thereof;

a cyclopentyl group, a pyrrolidinyl group, a cyclohexyl group, a phenyl group, a pyridinyl group, a pyrazinyl group, a pyrimidinyl group, a pyridazinyl group, a triazinyl group, a biphenyl group, a terphenyl group, a $C_1$-$C_{20}$ alkylphenyl group, or a naphthyl group, each unsubstituted or substituted with deuterium, $—CD_3$, $—CD_2H$, $—CDH_2$, $—CF_3$, $—CF_2H$, $—CFH_2$, a cyano group, a $C_1$-$C_{10}$ alkyl group, —$N(Q_{31})(Q_{32})$, or any combination thereof; or —$N(Q_1)(Q_2)$, and $Q_1$ and $Q_2$ and $Q_{31}$ and $Q_{32}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

For example, in Formulae 4-1 to 4-3, $Y_{91}$ to $Y_{94}$ may each be N.

In an embodiment, in Formulae 4-1 to 4-3, one of $Y_{91}$ to $Y_{94}$ may be N, or two of $Y_{91}$ to $Y_{94}$ may each be N, or three of $Y_{91}$ to $Y_{94}$ may each be N.

In Formula 1, $R_1$ to $R_6$, $R_{10}$, $R_{20}$, $R_{30}$, $R_{40}$, $R_{50}$, $R_{60}$, $R_{70}$, and $R_{80}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$.

In Formula 1, b10, b20, b30, b40, b50, b60, b70, and b80 may each independently be an integer from 0 to 20.

In an embodiment, b10, b20, b30, b40, b50, b60, b70, and b80 may each independently be an integer from 0 to 10.

In Formula 1, each of: $R_1$ and $R_2$; $R_3$ and $R_4$; two or more of $R_{10}$ in the number of b10; two or more of $R_{20}$ in the number of b20; two or more of $R_{30}$ in the number of b30; two or more of $R_{40}$ in the number of b40; two or more of $R_{50}$ in the number of b50; two or more of $R_{60}$ in the number of b60; two or more of $R_{70}$ in the number of b70; and two or more of $R_{80}$ in the number of b80 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

For example, $R_1$ and $R_2$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_3$ and $R_4$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_{10}$(s) in the number of b10 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_{20}$ (s) in the number of b20 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_{30}$ (s) in the number of b30 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_{40}$(s) in the number of b40 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_{50}$ (s) in the number of b50 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_{60}$ (s) in the number of b60 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_{70}$(s) in the number of b70 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and two or more of $R_{80}$(s) in the number of b80 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In Formula 1, two or more of $R_1$, $R_2$, $R_{10}$, $R_{20}$, $R_{50}$, and Rho may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In Formula 1, two or more of $R_3$, $R_4$, $R_{30}$, $R_{40}$, $R_{70}$, and $R_{80}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, the organometallic compound may be a compound represented by Formula 1-1:

[Formula 1-1]

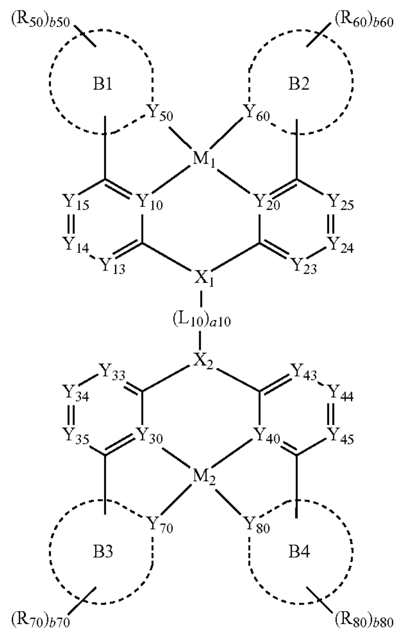

In Formula 1-1, $M_1$, $M_2$, B1 to B4, $Y_{10}$, $Y_{20}$, $Y_{30}$, $Y_{40}$, $Y_{50}$, $Y_{60}$, $Y_{70}$, $Y_{80}$, $X_1$, $X_2$, $L_{10}$, a10, $R_{50}$, $R_{60}$, $R_{70}$, $R_{80}$, b50, b60, b70, and b80 are each the same as described above, $Y_{13}$ may be $C(R_{13})$ or N, $Y_{14}$ may be $C(R_{14})$ or N, and $Y_{15}$ may be $C(R_{15})$ or N, $Y_{23}$ may be $C(R_{23})$ or N, $Y_{24}$ may be $C(R_{24})$ or N, and $Y_{25}$ may be $C(R_{25})$ or N, $Y_{33}$ may be $C(R_{33})$ or N, $Y_{34}$ may be $C(R_{34})$ or N, and $Y_{35}$ may be $C(R_{35})$ or N, $Y_{43}$ may be $C(R_{43})$ or N, $Y_{44}$ may be $C(R_{44})$ or N, and $Y_{45}$ may be $C(R_{45})$ or N, $R_{13}$ to $R_{15}$ may each independently be the same as described in connection with $R_{10}$ in the specification, and two or more of $R_{13}$ to $R_{15}$ may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{23}$ to $R_{25}$ may each independently be the same as described in connection with $R_{20}$ in the specification, and two or more of $R_{23}$ to $R_{25}$ may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{33}$ to $R_{35}$ may each independently be the same as described in connection with $R_{30}$ in the specification, and two or more of $R_{33}$ to $R_{35}$ may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{43}$ to $R_{45}$ may each independently be the same as described in connection with $R_{40}$ in the specification, and two or more of $R_{43}$ to $R_{45}$ may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

For example, $Y_{13}$ may be $C(R_{13})$, $Y_{14}$ may be $C(R_{14})$, and $R_{13}$ and Ru may optionally be bonded to each other to form a $C_3$-$C_{60}$ carbocyclic group unsubstituted or substituted with at least one $R_{10a}$ (for example, a benzene group or the like) or a $C_1$-$C_{60}$ heterocyclic group unsubstituted or substituted with at least one $R_{10a}$; or $Y_{14}$ may be $C(R_{14})$, $Y_{15}$ may be $C(R_{15})$, and $R_{14}$ and $R_{15}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. However, embodiments are not limited thereto.

For example, $Y_{43}$ may be $C(R_{43})$ $Y_{44}$ may be $C(R_{44})$, and $R_{43}$ and $R_{44}$ may optionally be bonded to each other to form a $C_3$-$C_{60}$ carbocyclic group unsubstituted or substituted with at least one $R_{10a}$ (for example, a benzene group or the like) or a $C_1$-$C_{60}$ heterocyclic group unsubstituted or substituted with at least one $R_{10a}$; or $Y_{44}$ may be $C(R_{44})$, $Y_{45}$ may be $C(R_{45})$, and $R_{44}$ and $R_{45}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. However, embodiments are not limited thereto.

In an embodiment, the organometallic compound may satisfy at least one of Condition 1 and Condition 2:

[Condition 1]

A1 to A4 in Formula 1 may each independently be a moiety represented by one of Formula 2-1 to 2-23:

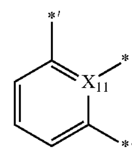

2-1

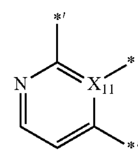

2-2

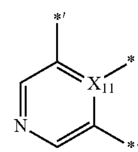

2-3

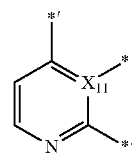

2-4

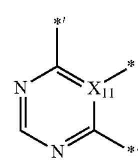

2-5

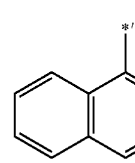

2-6

-continued
2-7
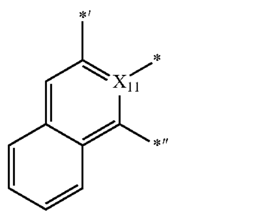
2-8
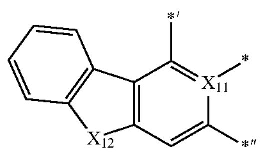
2-9
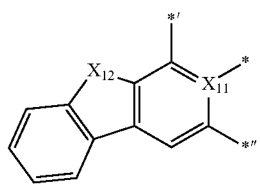
2-10
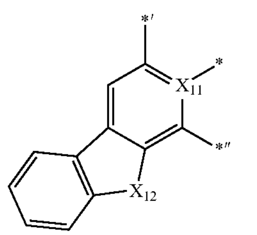
2-11
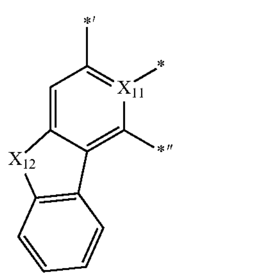
2-12
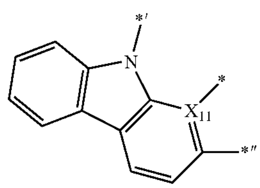
2-13
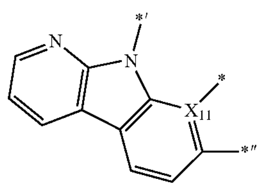
2-14
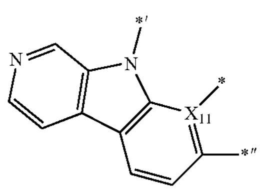
-continued
2-15
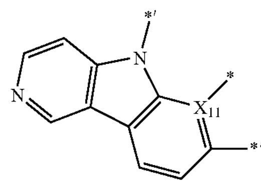
2-16
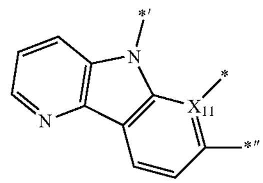
2-17
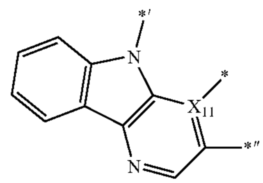
2-18
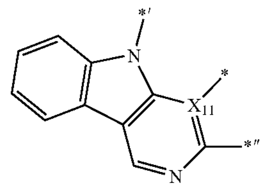
2-19
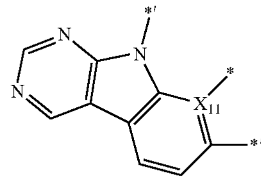
2-20
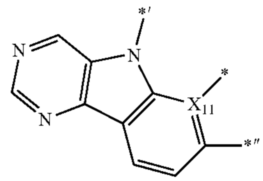
2-21
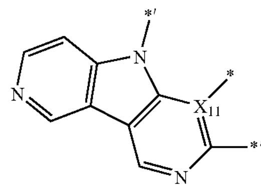
2-22
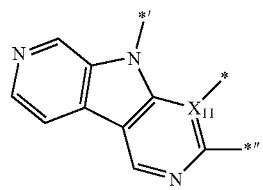

-continued 2-23

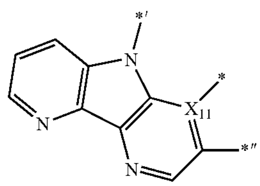

wherein in Formulae 2-1 to 2-23, $X_{11}$ may be C or N, $X_{12}$ may be O, S, $N(Z_{12})$, $C(Z_{12})(Z_{13})$, or $Si(Z_{12})(Z_{13})$, $Z_{12}$ and $Z_{13}$ are each independently the same as described in connection with $R_{10}$ in Formula 1,

* indicates a binding site to $M_1$ or $M_2$ in Formula 1,

*' indicates a binding site to $(T_1)_{n1}$, $(T_2)_{n2}$, $(T_3)_{n3}$, or $(T_4)_{n4}$ in Formula 1, and

*" indicates a binding site to $X_1$ or $X_2$ in Formula 1.

[Condition 2]

B1 to B4 in Formula 1 may each independently be a moiety represented by one of Formulae 3-1 to 3-35:

3-1

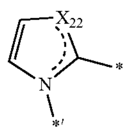

3-2

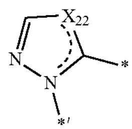

3-3

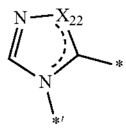

3-4

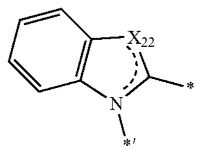

3-5

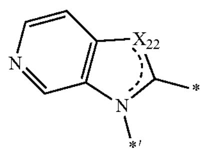

3-6

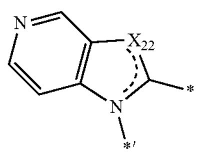

3-7

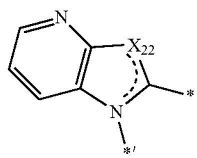

-continued 3-8

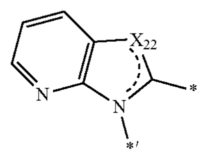

3-9

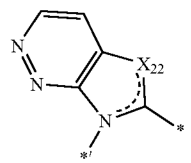

3-10

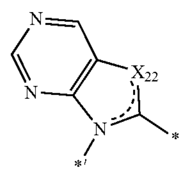

3-11

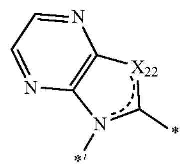

3-12

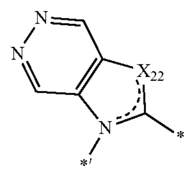

3-13

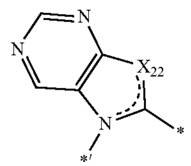

3-14

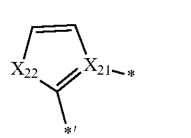

3-15

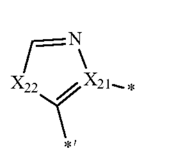

3-16

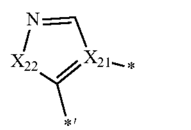

3-17

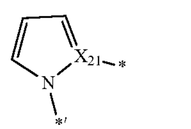

-continued
3-18
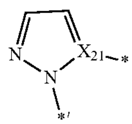
3-19
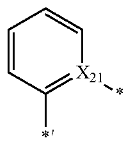
3-20
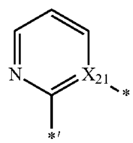
3-21
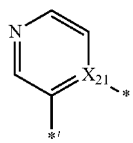
3-22
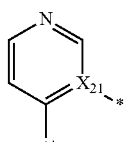
3-23
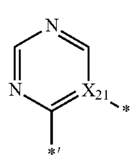
3-24
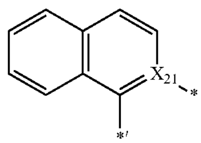
3-25
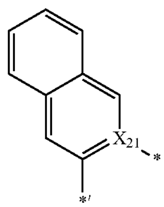
3-26
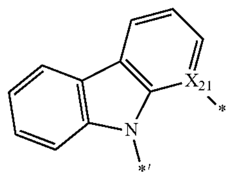
3-27
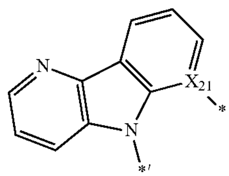
-continued
3-28
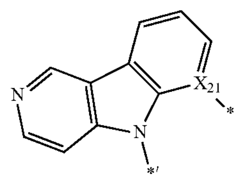
3-29
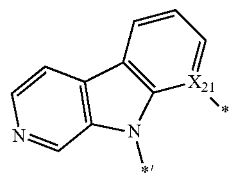
3-30
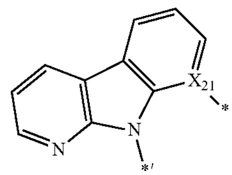
3-31
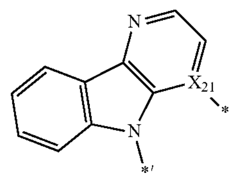
3-32
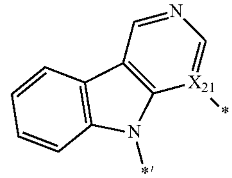
3-33
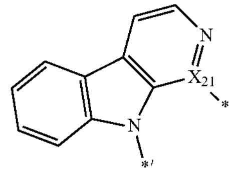
3-34
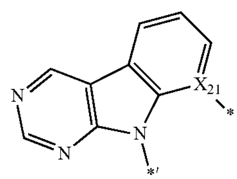
3-35
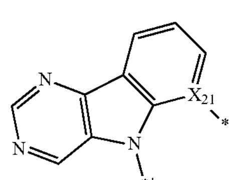
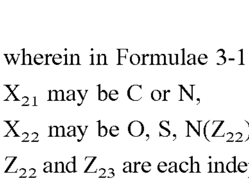
wherein in Formulae 3-1 to 3-35,
$X_{21}$ may be C or N,
$X_{22}$ may be O, S, $N(Z_{22})$, $C(Z_{22})(Z_{23})$, or $Si(Z_{22})(Z_{23})$,
$Z_{22}$ and $Z_{23}$ are each independently the same as described in connection with $R_{50}$ in Formula 1,

* indicates a binding site to $M_1$ or $M_2$ in Formula 1, and

*' indicates a binding site to $(T_1)_{n1}$, $(T_2)_{n2}$, $(T_3)_{n3}$, or $(T_4)_{n4}$ in Formula 1.

In an embodiment, $X_{11}$ in Formulae 2-1 to 2-23 may correspond to $Y_{10}$, $Y_{20}$, $Y_{30}$, or $Y_{40}$ in Formula 1. For example, a case where A2 is a moiety represented by Formula 2-1 may satisfy such conditions that * indicates a binding site to $M_1$ in Formula 1, *' indicates a binding site to $(T_2)_{n2}$ in Formula 1, *'' indicates a binding site to $X_1$ in Formula 1, and $Y_{20}$ in Formula 1 is C or N, but embodiments are not limited thereto.

In an embodiment, $X_{21}$ in Formulae 3-14 to 3-35 may correspond to $Y_{50}$, $Y_{60}$, $Y_{70}$, or $Y_{80}$ in Formula 1. For example, a case where B2 is a moiety represented by Formula 3-19 may satisfy such conditions that * indicates a binding site to $M_1$ in Formula 1, *' indicates a binding site to $(T_2)_{n2}$ in Formula 1, and $Y_{60}$ in Formula 1 is C or N, but embodiments are not limited thereto.

In an embodiment, in Formulae 2-1 to 2-23, $X_{11}$ may be C.

For example, A1 to A4 may each independently be a moiety represented by one of Formulae 2-1 to 2-7, but embodiments are not limited thereto.

For example, in Formulae 3-1 to 3-16, $X_{22}$ may be $N(Z_{22})$.

For example, in Formulae 3-14 to 3-18, $X_{21}$ may be N.

For example, B1 to B4 in Formulae 1 and 1-1 may each independently be a moiety represented by one of Formulae 3-1 to 3-8 and 3-19 to 3-25, but embodiments are not limited thereto.

In an embodiment, in Formulae 1 and 1-1, a moiety represented by

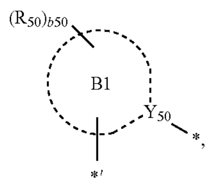

a moiety represented by

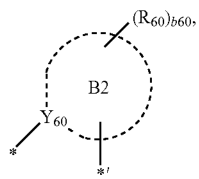

a moiety represented by

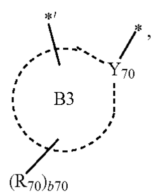

and a moiety represented by

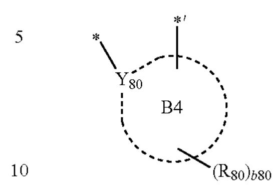

may each independently be a moiety represented by one of Formulae 3(1) to 3(9):

3(1)

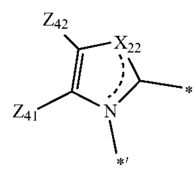

3(2)

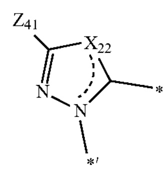

3(3)

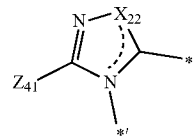

3(4)

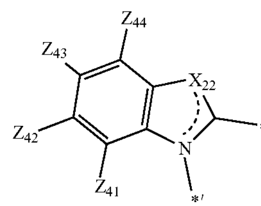

3(5)

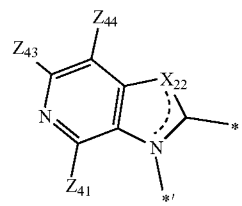

3(6)

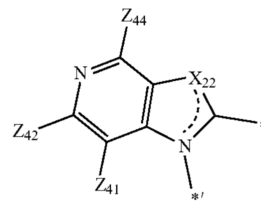

-continued

3(7)

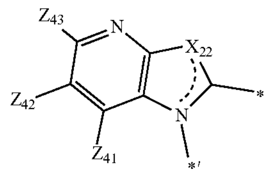

3(8)

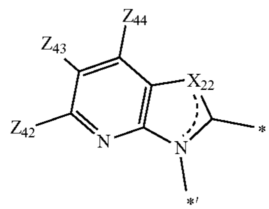

3(9)

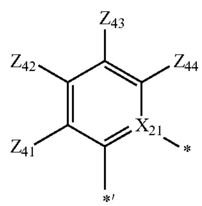

wherein in Formulae 3(1) to 3(9), $X_{21}$ may be C or N, $X_{22}$ may be $N(Z_{22})$, $Z_{22}$ and $Z_{41}$ to $Z_{44}$ are each independently the same as described in connection with $R_{50}$ in Formula 1,

* indicates a binding site to $M_1$ or $M_2$ in Formula 1, and

*' indicates a binding site to $(T_1)_{n1}$, $(T_2)_{n2}$, $(T_3)_{n3}$, or $(T_4)_{n4}$ in Formula 1.

In an embodiment, $Z_{12}$, $Z_{13}$, $Z_{22}$, $Z_{23}$, and $Z_{41}$ to $Z_{44}$ in Formulae 2-1 to 2-23, Formulae 3-1 to 3-35, and Formulae 3(1) to 3(9) may each independently be:

hydrogen, deuterium, —F, or a cyano group;

a $C_1$-$C_{20}$ alkyl group which is unsubstituted or substituted with deuterium, —F, a cyano group, a phenyl group, a biphenyl group, or any combination thereof; or a phenyl group, a pyridinyl group, a pyrimidinyl group, a triazinyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, or a chrysenyl group, each unsubstituted or substituted with deuterium, $—CD_3$, $—CD_2H$, $—CDH_2$, $—CF_3$, $—CF_2H$, $—CFH_2$, a cyano group, a $C_1$-$C_{20}$ alkyl group, or any combination thereof.

In an embodiment, $R_1$ to $R_6$, $R_{10}$, $R_{20}$, $R_{30}$, $R_{40}$, $R_{50}$, $R_{60}$, $R_{70}$, and $R_{80}$ may each independently be:

hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof;

a cyclopentyl group, a pyrrolidinyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzooxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a $C_1$-$C_{20}$ alkylthio group, a cyclopentyl group, a pyrrolidinyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzooxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), —P(=O)($Q_{31}$)($Q_{32}$), or any combination thereof; or —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($C_{21}$)($Q_2$), and $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In an embodiment, $R_{10}$, $R_{20}$, $R_{30}$, $R_{40}$, $R_{50}$, $R_{60}$, $R_{70}$, and $R_{80}$ may each independently be:

hydrogen, deuterium, —F, or a cyano group;

a $C_1$-$C_{20}$ alkyl group, a $C_1$-$C_{20}$ alkoxy group, or a $C_1$-$C_{20}$ alkylthio group, each unsubstituted or substituted with deuterium, —F, a cyano group, a phenyl group, a biphenyl group, or any combination thereof;

a cyclopentyl group, a pyrrolidinyl group, a cyclohexyl group, a phenyl group, a pyridinyl group, a pyrazinyl group, a pyrimidinyl group, a pyridazinyl group, a triazinyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, an indazolyl group, a purinyl group, a cinnolinyl group, a carbazolyl group, a benzofuranyl group, a dibenzofuranyl group, a benzothiophenyl group, a dibenzothiophenyl group, a benzocarbazolyl group, or a dibenzocarbazolyl group, each unsubstituted or substituted with deuterium, —$CD_3$, —$CD_2H$, —$CDH_2$, —$CF_3$, —$CF_2H$, —$CFH_2$, a cyano group, a $C_1$-$C_{20}$ alkyl group, —Si($Q_{31}$)($Q_{32}$)($Q_{33}$), —N($Q_{31}$)($Q_{32}$), —B($Q_{31}$)($Q_{32}$), or any combination thereof; or —Si($Q_1$)($Q_2$)($Q_3$), —N($Q_1$)($Q_2$), or —B($Q_1$)($Q_2$), wherein $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In the specification, the group "$R_{10a}$" may be:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the organometallic compound may be one of compounds BD1 to BD52, but embodiments are not limited thereto:
BD1
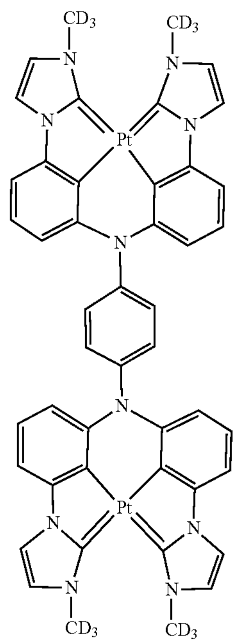
BD2
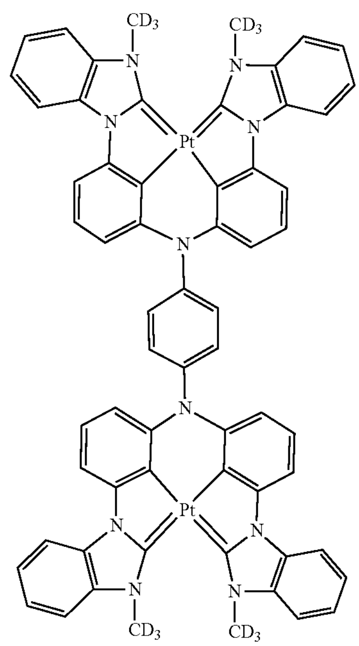
-continued
BD3
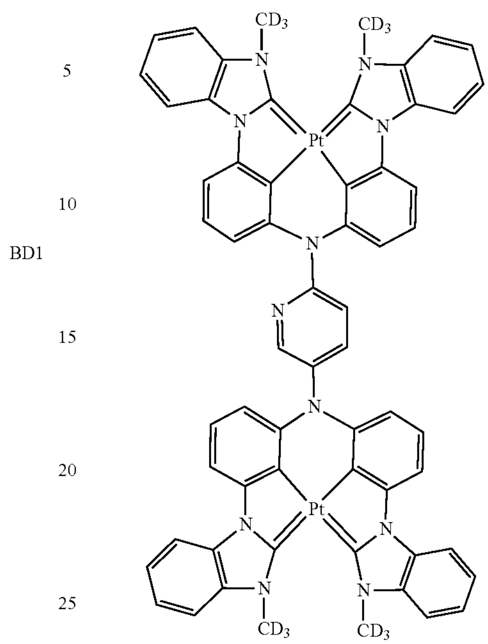
BD4
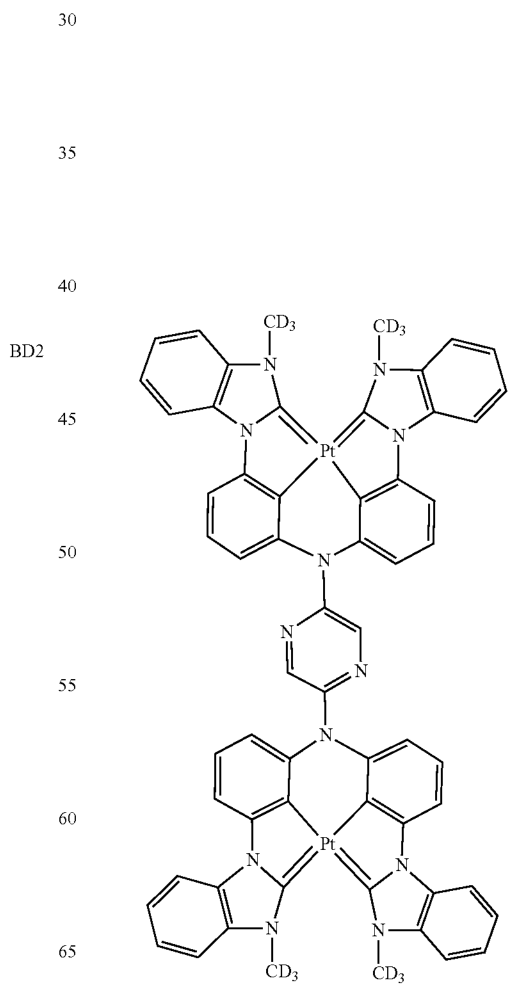

-continued
BD5
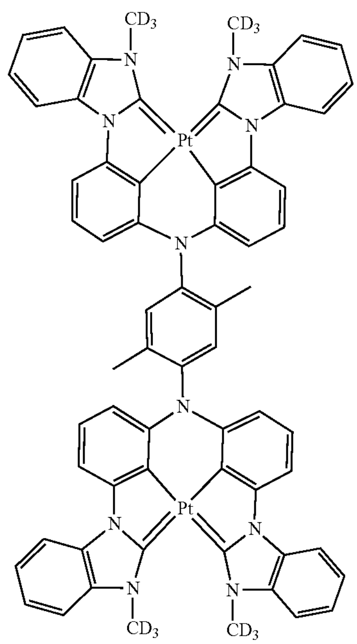
BD6
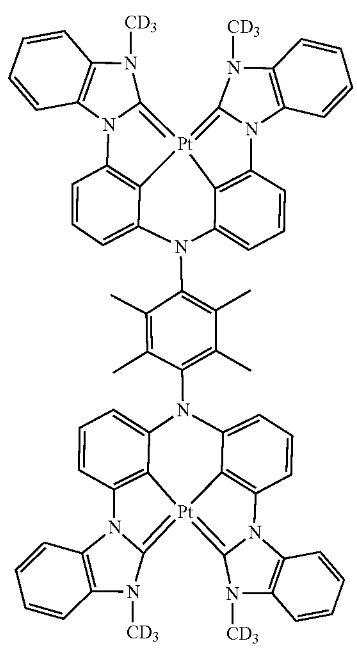
-continued
BD7
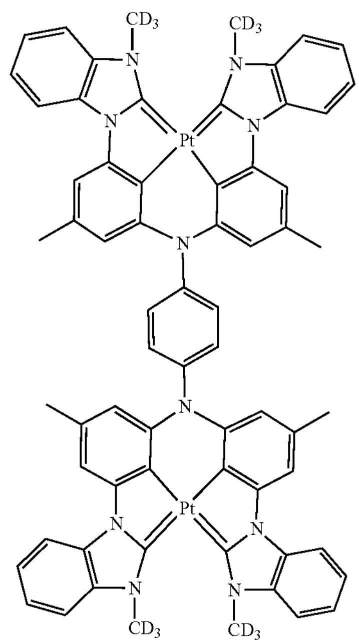
BD8
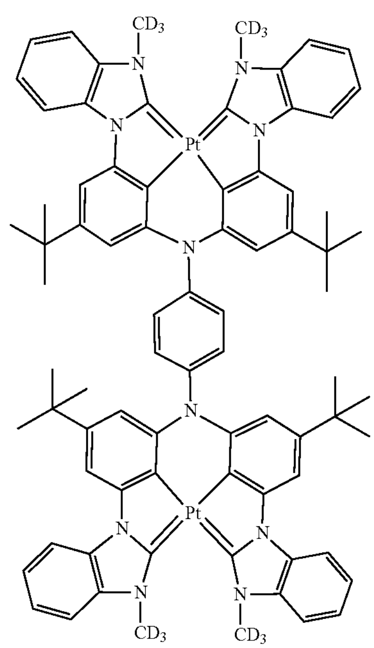

-continued
BD9
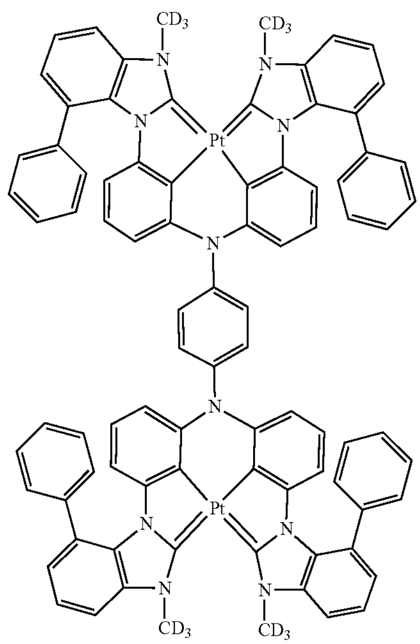
-continued
BD11
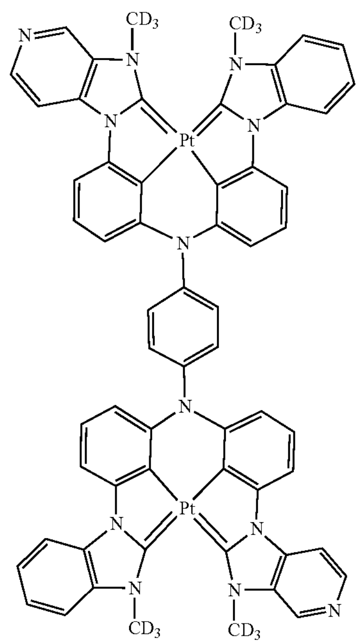
BD10
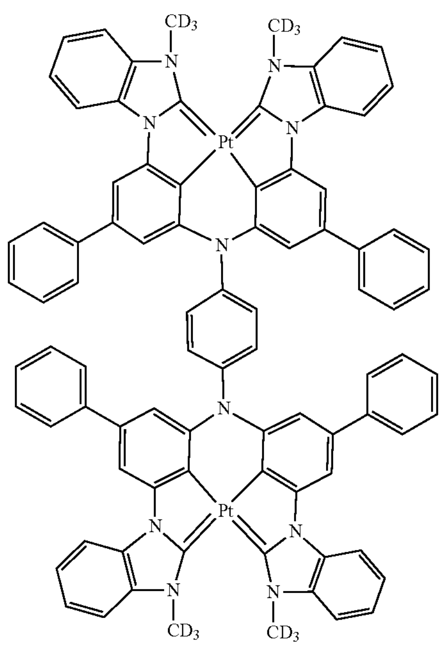
BD12
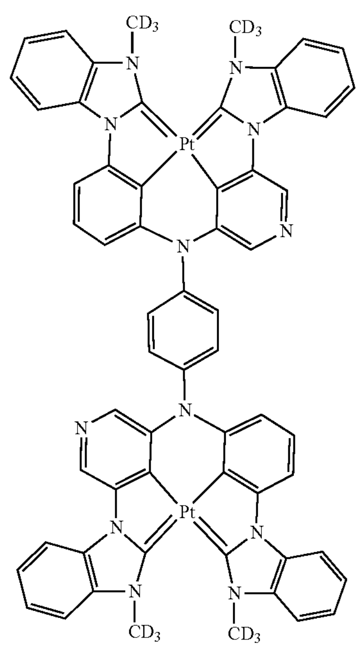

-continued
BD13
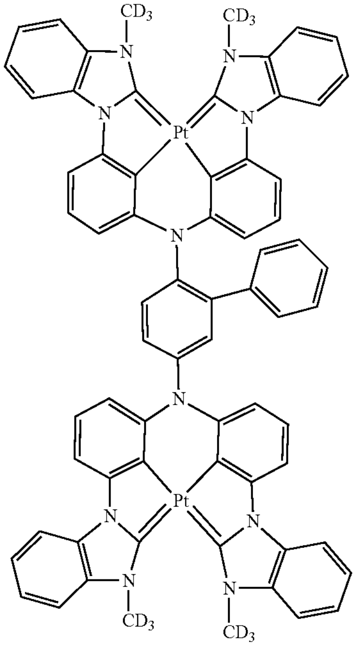
BD14
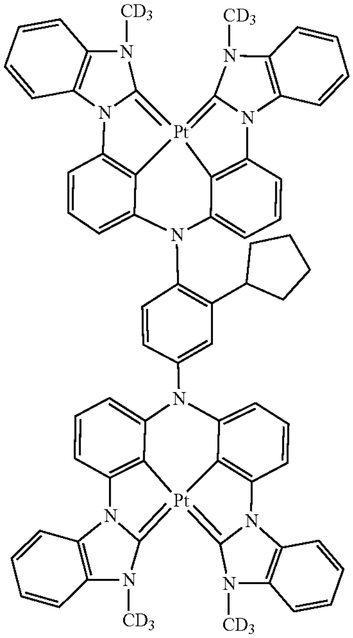
-continued
BD15
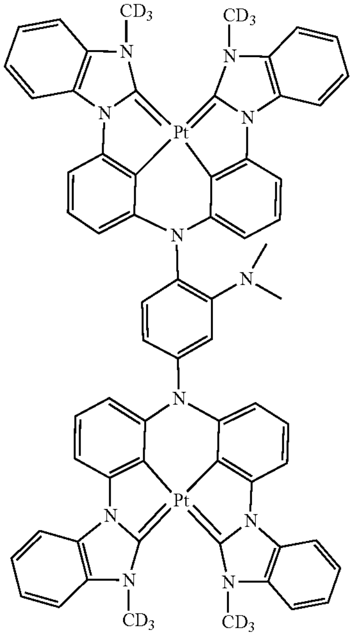
BD16
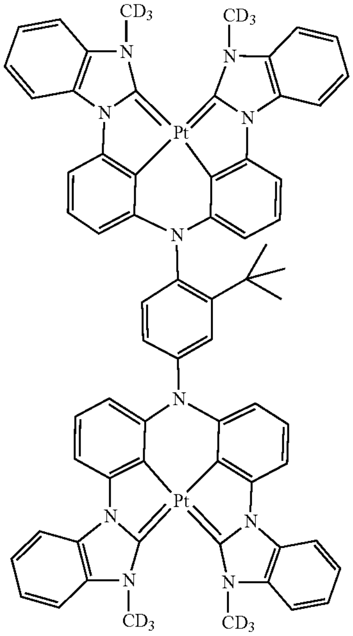

-continued
BD17
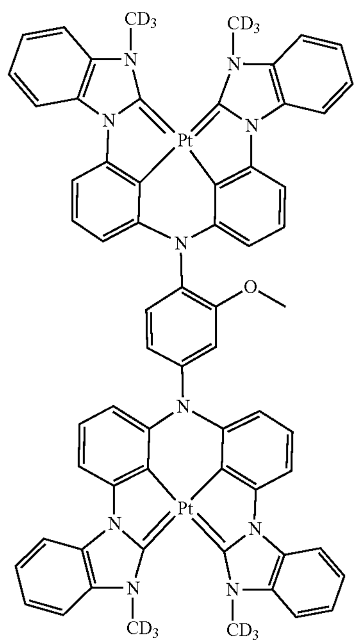
BD18
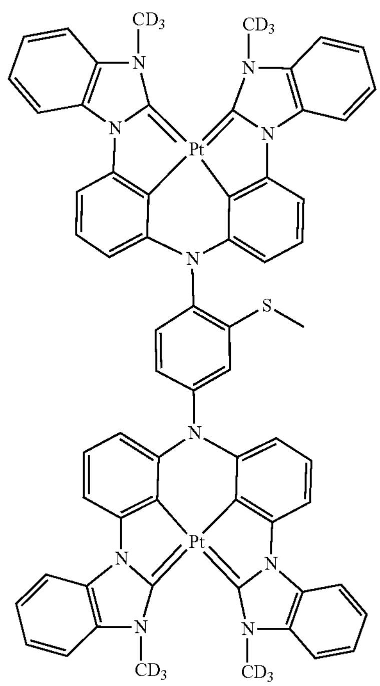
-continued
BD19
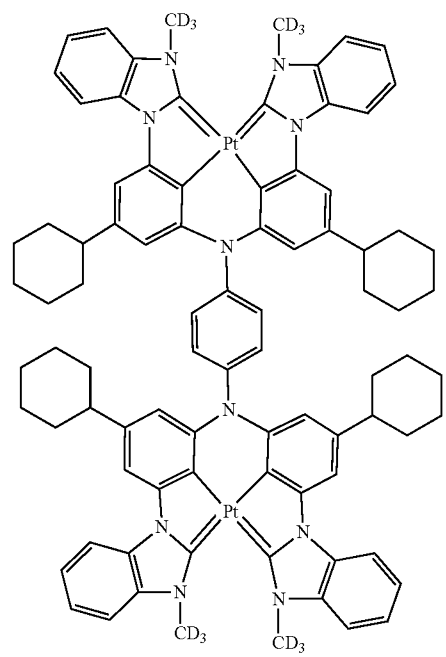
BD20
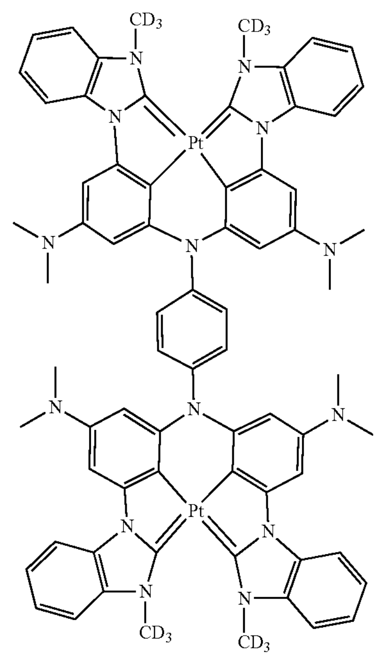

-continued
BD21
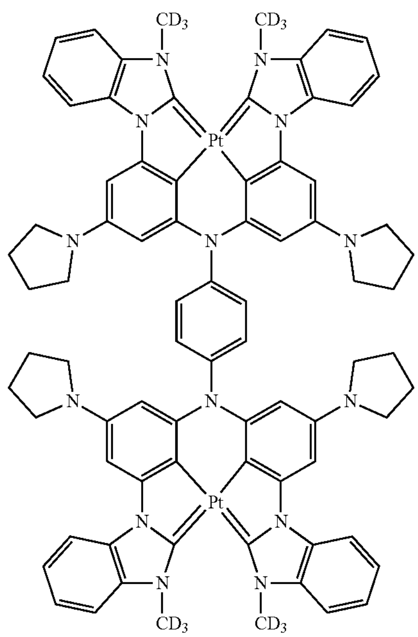
BD23
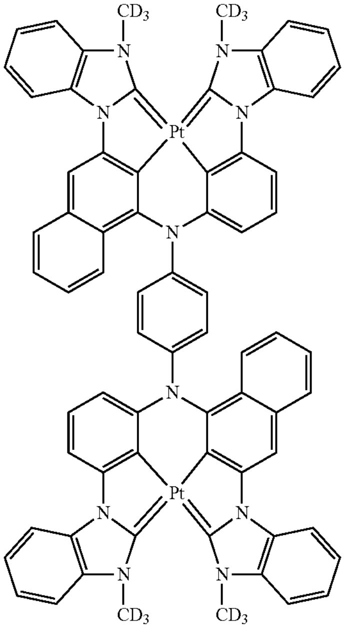
BD22
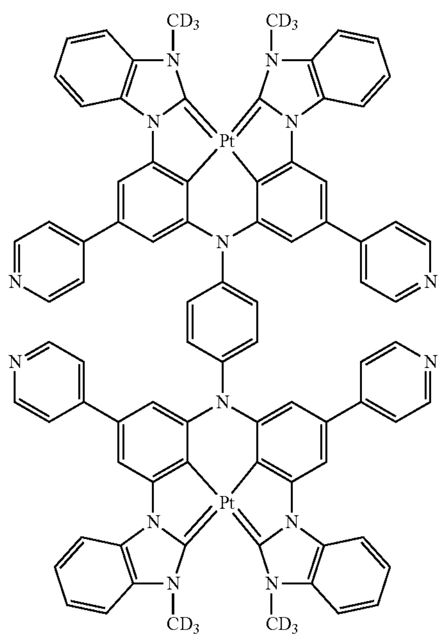
BD24
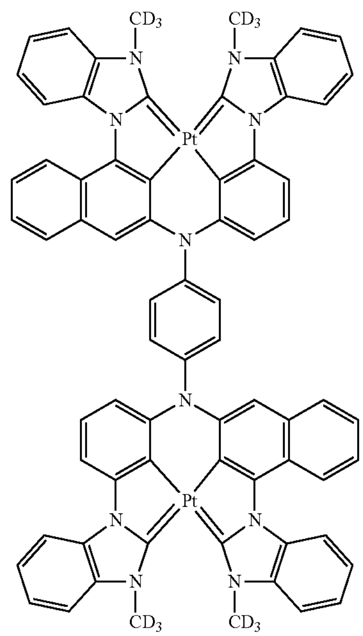

-continued
BD25
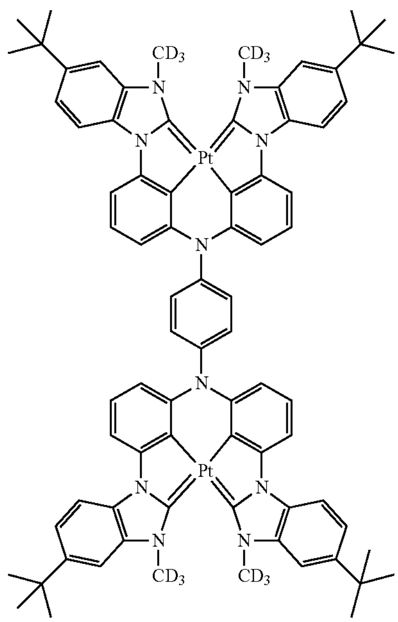
BD26
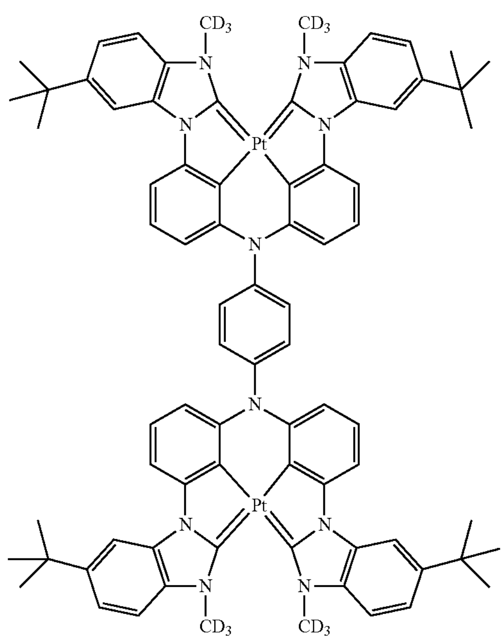
-continued
BD27
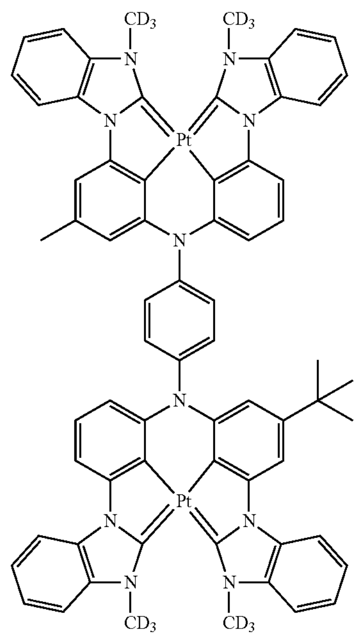
BD28
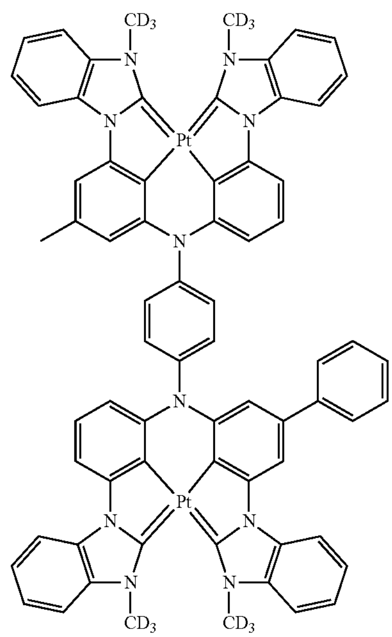

-continued
BD29
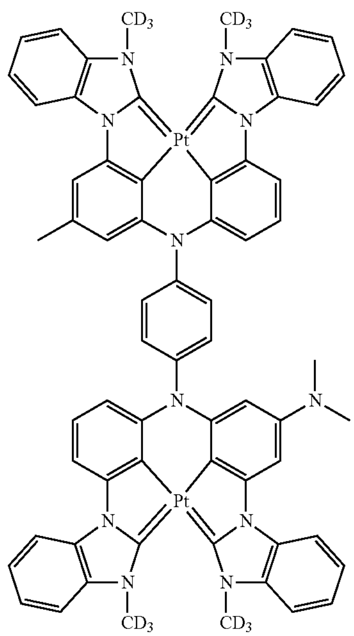
BD30
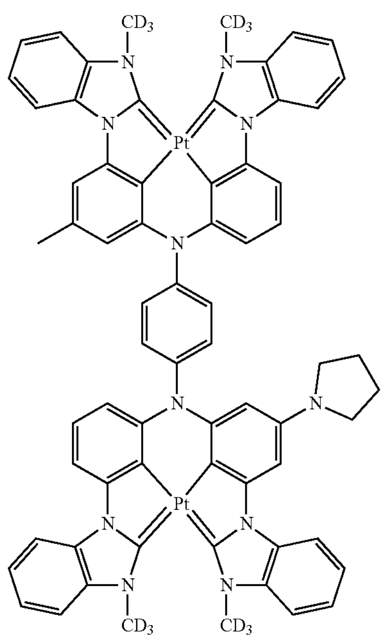
-continued
BD31
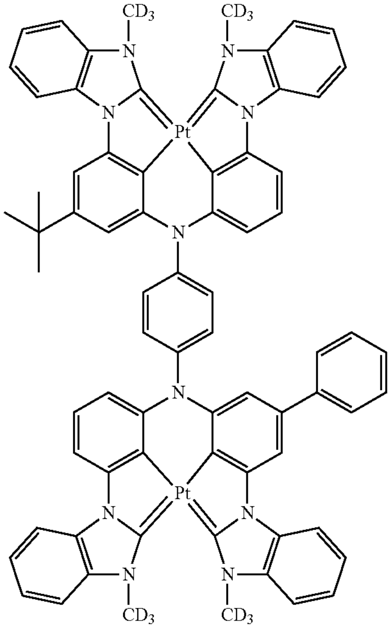
BD32
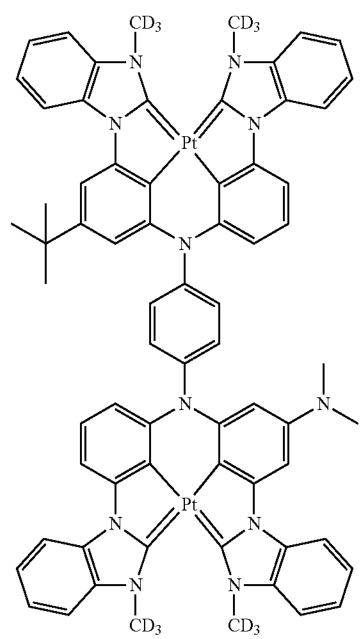

-continued
BD33
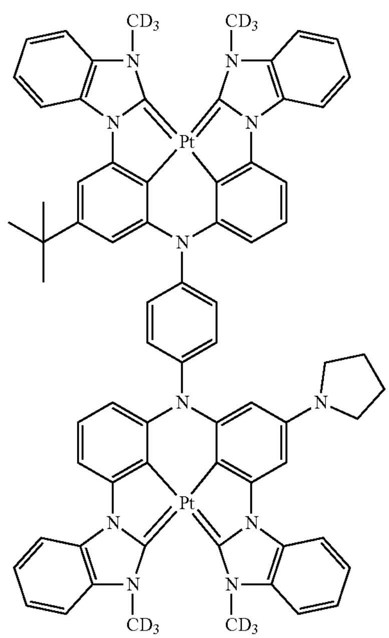
BD34
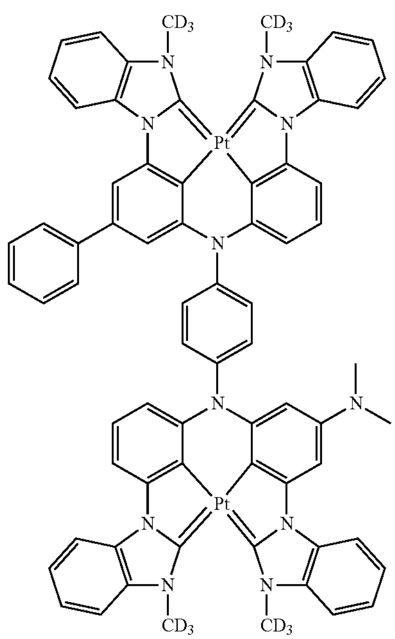
-continued
BD35
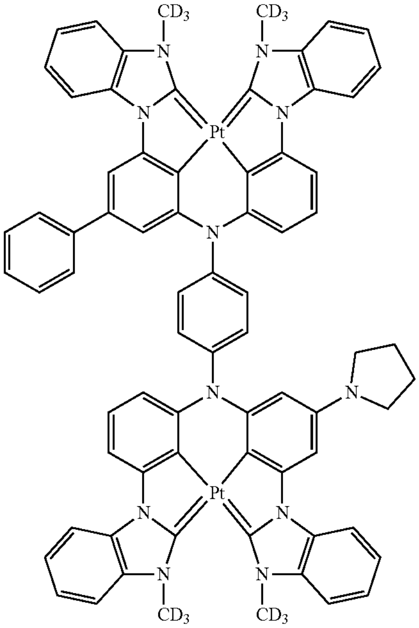
BD36
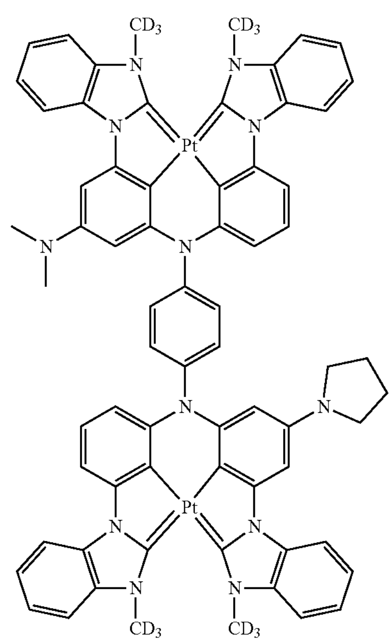

-continued
BD37
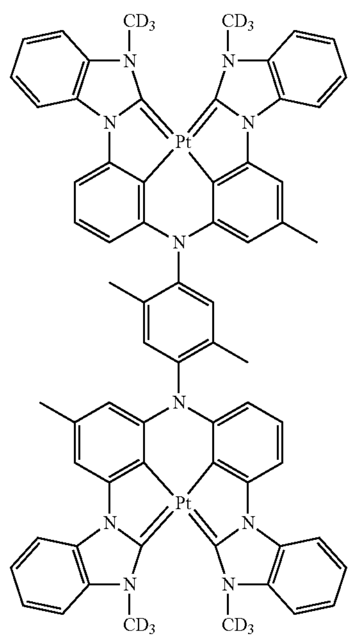
BD38
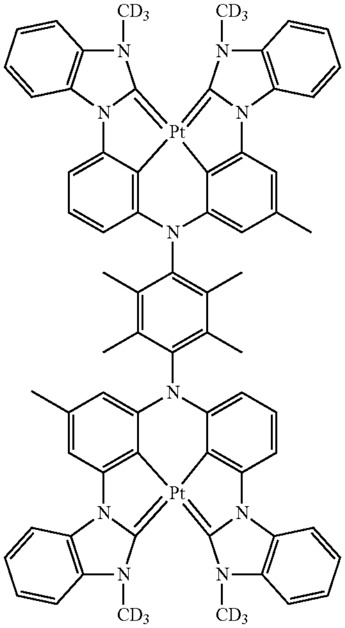
-continued
BD39
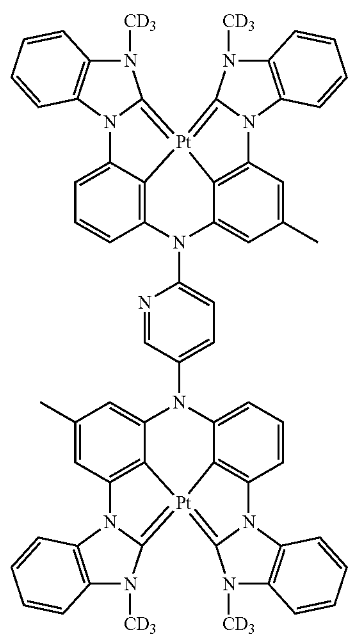
BD40
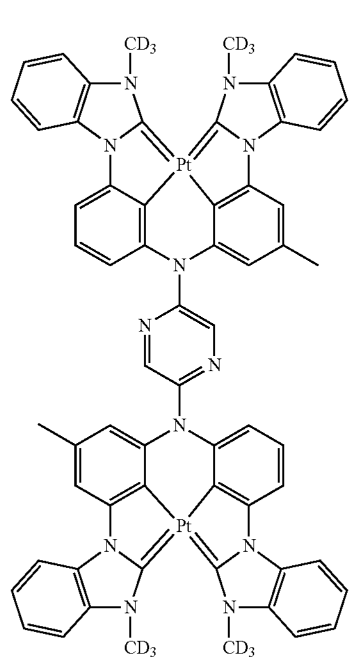

BD41
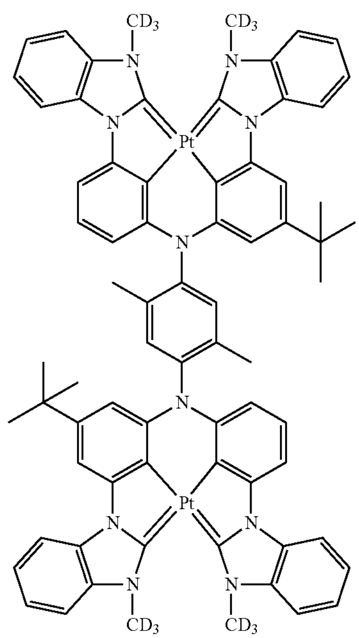
BD42
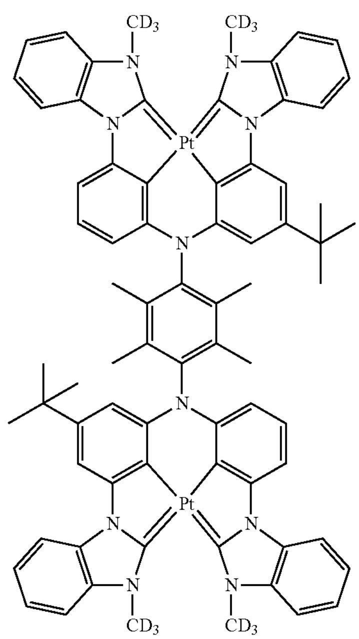
BD43
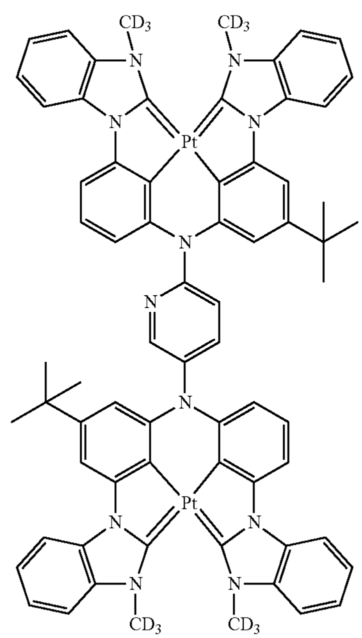
BD44
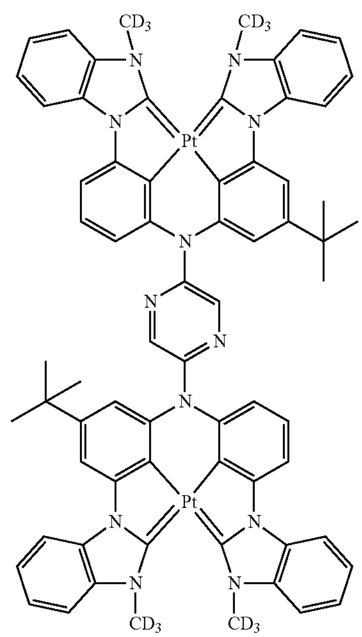

-continued
BD45
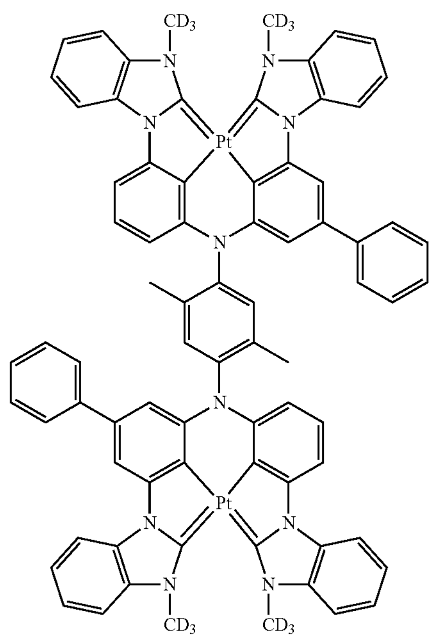
BD47
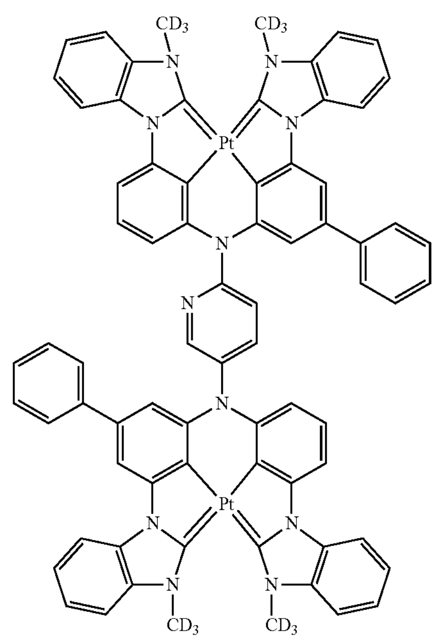
BD46
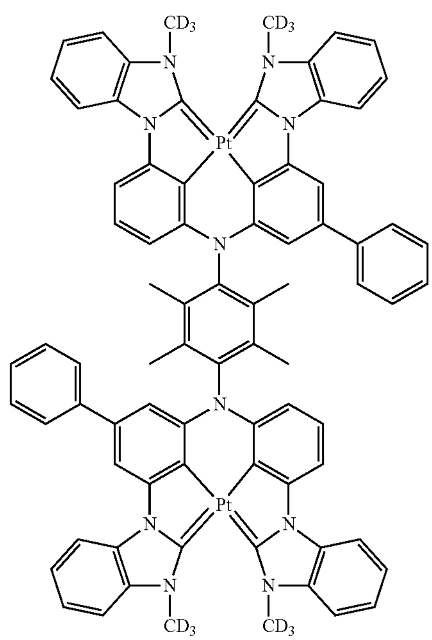
BD48
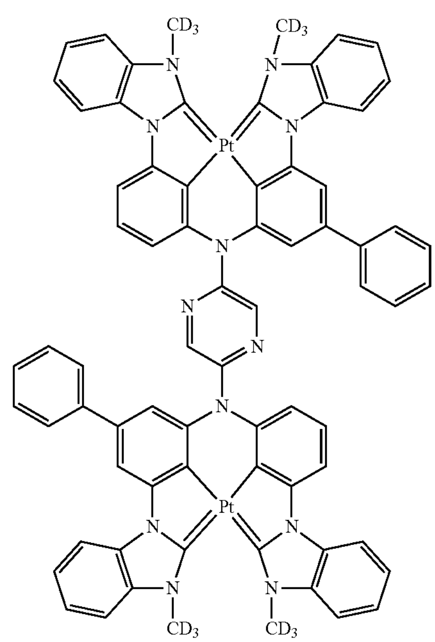

-continued

BD49

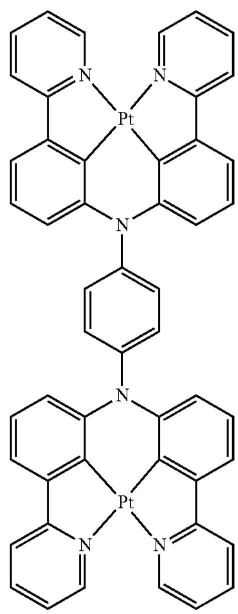

BD50

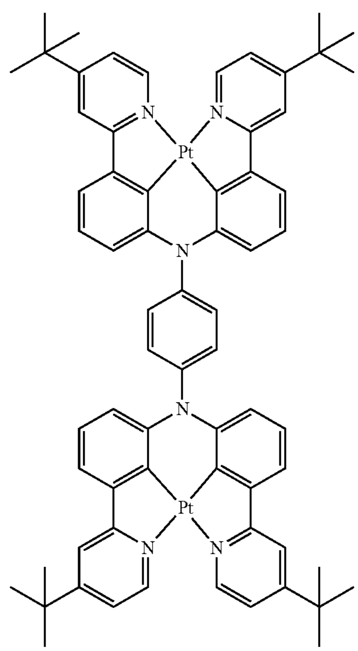

-continued

BD51

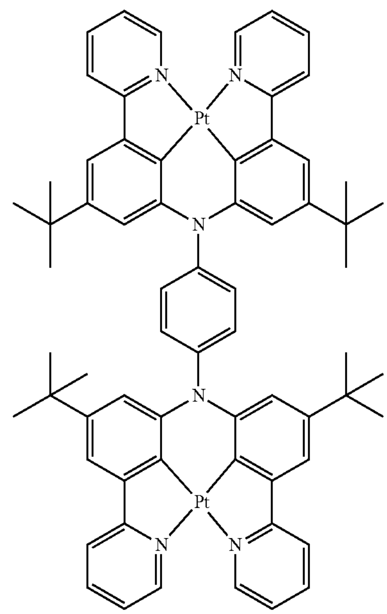

BD52

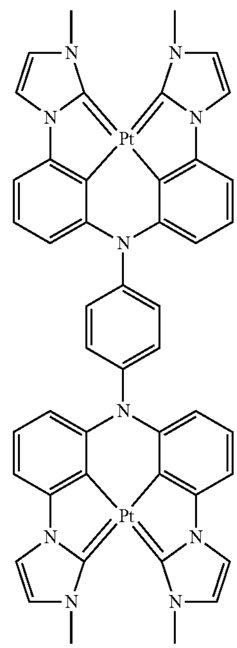

The organometallic compound represented by Formula 1 has a bimetallic complex structure which includes two metal atoms and ligands that are coordinated to these metal atoms and connected to each other, and thus luminescence efficiency thereof is high.

The organometallic compound represented by Formula 1 may have a multiple connection group (wherein $X_1$, at least one $L_{10}$, and $X_2$ are connected to each other) in which ring A1 and ring A2 are connected to each other via $X_1$, ring A3 and ring A4 are connected to each other via $X_2$, and at least one cyclic group (see $(L_{10})_{a10}$ in Formula 1) exists between $X_1$ and $X_2$. Since the bimetallic complex has such a structure that connections are made via a multiple linking group including a cyclic group and not a single bond, a carbon tetravalent linking group, or a silicon tetravalent linking group, etc., the organometallic compound may have a low driving voltage, the structure of the compound is more rigid and thus the stability thereof can be increased, and the angle of ligands with respect to the central transition metal is further tilted to inhibit formation of an excimer.

Therefore, a light-emitting device (for example, an organic light-emitting device) including the organometallic compound may have a low driving voltage and may be excellent in high luminance, luminescence efficiency, and lifespan characteristics.

The organometallic compound may emit blue light. In an embodiment, the organometallic compound may emit blue light (bottom emission $CIE_{x,y}$ color coordinates of 0.05 to 0.06) having a maximum emission wavelength in a range of about 430 nm to about 475 nm, but embodiments are not limited thereto. For example, in an embodiment, the organometallic compound may emit blue light having a maximum emission wavelength in a range of about 430 nm to about 470 nm. Accordingly, the organometallic compound represented by Formula 1 may be useful for the manufacture of a light-emitting device that emits blue light.

Synthesis methods of the organometallic compound represented by Formula 1 may be recognizable by one of ordinary skill in the art by referring to the Synthesis Examples and/or the Examples provided below.

At least one organometallic compound represented by Formula 1 may be used in a light-emitting device (for example, an organic light-emitting device).

In an embodiment, a light-emitting device may include a first electrode, a second electrode facing the first electrode, an interlayer between the first electrode and the second electrode and including an emission layer, and an organometallic compound represented by Formula 1.

In embodiments, the interlayer may further include a hole transport region between the first electrode and the emission layer and an electron transport region between the emission layer and the second electrode, the hole transport region may include a hole injection layer, a hole transport layer, an emission auxiliary layer, an electron-blocking layer, or any combination thereof, and the electron transport region may include a buffer layer, a hole-blocking layer, an electron control layer, an electron transport layer, an electron injection layer, or any combination thereof.

In an embodiment, the first electrode of the light-emitting device may be an anode, and the second electrode of the light-emitting device may be a cathode.

In an embodiment, the electron transport region may include an electron transport layer and an electron injection layer, and at least one of the electron transport layer and the electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

In embodiments, the organometallic compound may be included between the first electrode and the second electrode of the light-emitting device. In an embodiment, the interlayer of the light-emitting device may include the organometallic compound.

In an embodiment, the emission layer may include the organometallic compound.

In an embodiment, the emission layer in the interlayer of the light-emitting device may include a dopant and a host, and the dopant may include the organometallic compound. For example, the organometallic compound may serve as a dopant. The emission layer may emit red light, green light, blue light, and/or white light. For example, the emission layer may emit blue light. In embodiments, the emission layer may emit blue light having a maximum emission wavelength in a range of about 430 nm to about 490 nm. For example, the emission layer may emit blue light having a maximum emission wavelength in a range of about 430 nm to about 480 nm. For example, the emission layer may emit blue light having a maximum emission wavelength in a range of about 430 nm to about 475 nm. For example, the emission layer may emit blue light having a maximum emission wavelength in a range of about 430 nm to about 470 nm.

In an embodiment, the light-emitting device may include a capping layer outside the first electrode or a capping layer outside the second electrode.

In an embodiment, the light-emitting device may further include at least one of a first capping layer outside the first electrode and a second capping layer outside the second electrode, and at least one of the first capping layer and the second capping layer may include the organometallic compound represented by Formula 1. The first capping layer and/or second capping layer may be the same as described in the specification.

In an embodiment, the light-emitting device may further include:

a first capping layer outside the first electrode and including the organometallic compound represented by Formula 1;

a second capping layer outside the second electrode and including the organometallic compound represented by Formula 1; or the first capping layer and the second capping layer.

In the specification, the term "(interlayer and/or capping layer) includes an organometallic compound" as used herein may be understood as "(interlayer and/or capping layer) may include one kind of organometallic compound represented by Formula 1 or two or more different kinds of organometallic compounds, each independently represented by Formula 1."

For example, the interlayer and/or the capping layer may include Compound BD01 as the organometallic compound. In this regard, Compound BD1 may exist in the emission layer of the light-emitting device. In an embodiment, the interlayer may include, as the organometallic compound, Compound BD1 and Compound BD2. In this regard, Compound BD1 and Compound BD2 may exist in a same layer (for example, both Compound BD1 and Compound BD2 may exist in an emission layer), or may exist in different layers (for example, Compound BD1 may exist in an emission layer and Compound BD2 may exist in an electron transport region).

The term "interlayer" as used herein may refer to a single layer and/or multiple layers between the first electrode and the second electrode of a light-emitting device.

In another embodiment, an electronic apparatus may include the light-emitting device. In an embodiment, the electronic apparatus may further include a thin-film transistor. In an embodiment, the electronic apparatus may further include a thin-film transistor, wherein the thin-film transistor may include a source electrode and a drain electrode, and the first electrode of the light-emitting device may be electrically connected to the source electrode or the drain electrode. In an embodiment, the electronic apparatus may further include a color filter, a color conversion layer, a touch screen layer, a polarizing layer, or any combination thereof. Further details on the electronic apparatus may be the same as related descriptions that are provided herein.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described with reference to FIG. 1.

[First Electrode 110]

In FIG. 1, a substrate may be further included under the first electrode 110 or on the second electrode 150. In an embodiment, the substrate may be a glass substrate or a plastic substrate. In an embodiment, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on a substrate. When the first electrode 110 is an anode, a material for forming the first electrode 110 may be a high-work function material that facilitates the injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In an embodiment, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a structure including multiple layers. For example, the first electrode 110 may have a three-layered structure of ITO/Ag/ITO.

[Interlayer 130]

The interlayer 130 may be located on the first electrode 110. The interlayer 130 may include an emission layer.

The interlayer 130 may further include a hole transport region between the first electrode 110 and the emission layer, and an electron transport region between the emission layer and the second electrode 150.

The interlayer 130 may further include, in addition to various organic materials, a metal-containing compound such as an organometallic compound, an inorganic material such as quantum dots, or the like.

In an embodiment, the interlayer 130 may include two or more emitting units stacked between the first electrode 110 and the second electrode 150, and at least one charge generation layer located between the two or more emitting units. When the interlayer 130 includes the two or more emitting units and the at least one charge generation layer as described above, the light-emitting device 10 may be a tandem light-emitting device.

[Hole Transport Region in Interlayer 130]

The hole transport region may have a structure consisting of a layer consisting of a single material, a structure consisting of a layer including different materials, or a structure including multiple layers including different materials.

The hole transport region may include a hole injection layer, a hole transport layer, an emission auxiliary layer, an electron-blocking layer, or any combination thereof.

In embodiments, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, wherein the layers of each structure may be stacked from the first electrode 110 in its respective stated order, but the structure of the hole transport region is not limited thereto.

The hole transport region may include a compound represented by Formula 201, a compound represented by Formula 202, or any combination thereof:

[Formula 201]

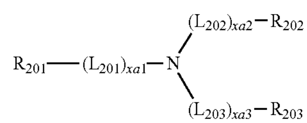

[Formula 202]

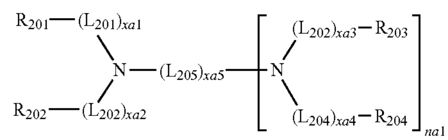

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In embodiments, the compound represented by Formula 201 and the compound represented by Formula 202 may each independently include at least one of groups represented by Formulae CY201 to CY217:

CY201

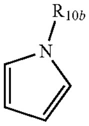

CY202

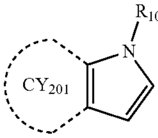

CY203

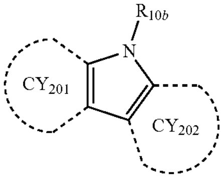

CY204

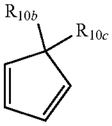

CY205

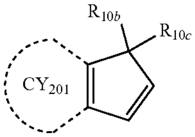

CY206

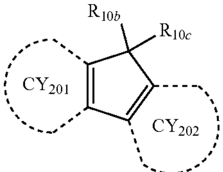

CY207

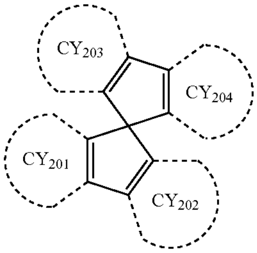

CY208

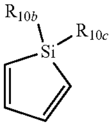

CY209

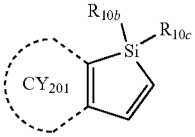

-continued

CY210

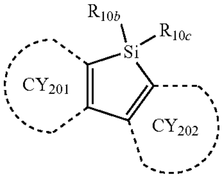

CY211

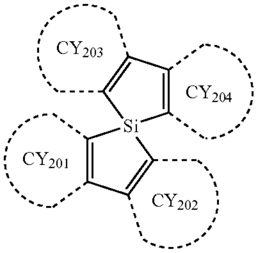

CY212

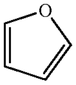

CY213

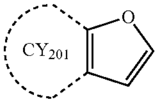

CY214

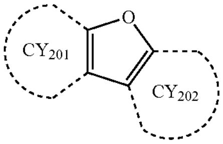

CY215

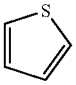

CY216

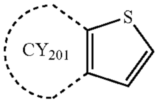

CY217

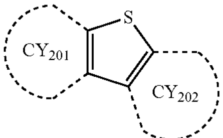

In Formulae CY201 to CY217, $R_{10b}$ and $R_{10c}$ may each independently be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, in Formulae CY201 to CY217, ring $CY_{201}$ to ring $CY_{204}$ may each independently be a benzene group, a naphthalene group, a phenanthrene group, or an anthracene group.

In an embodiment, the compound represented by Formula 201 and the compound represented by Formula 202 may each independently include at least one of groups represented by Formulae CY201 to CY203.

In an embodiment, the compound represented by Formula 201 may include at least one of groups represented by Formulae CY201 to CY203 and at least one of groups represented by Formulae CY204 to CY217.

In an embodiment, in Formula 201, xa1 may be 1, $R_{201}$ may be a group represented by one of Formulae CY201 to CY203, xa2 may be 0, and $R_{202}$ may be a group represented by one of Formulae CY204 to CY207.

In an embodiment, the compound represented by Formula 201 and the compound represented by Formula 202 may each not include a group represented by one of Formulae CY201 to CY203.

In an embodiment, the compound represented by Formula 201 and the compound represented by Formula 202 may each not include a group represented by one of Formulae CY201 to CY203, and may each independently include at least one of groups represented by Formulae CY204 to CY217.

In an embodiment, the compound represented by Formula 201 and the compound represented by Formula 202 may each not include a group represented by one of Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

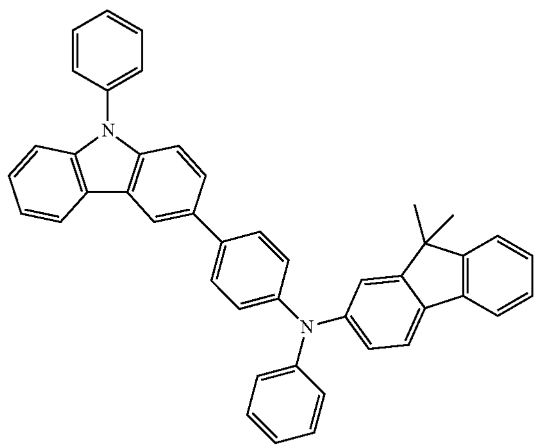

HT2

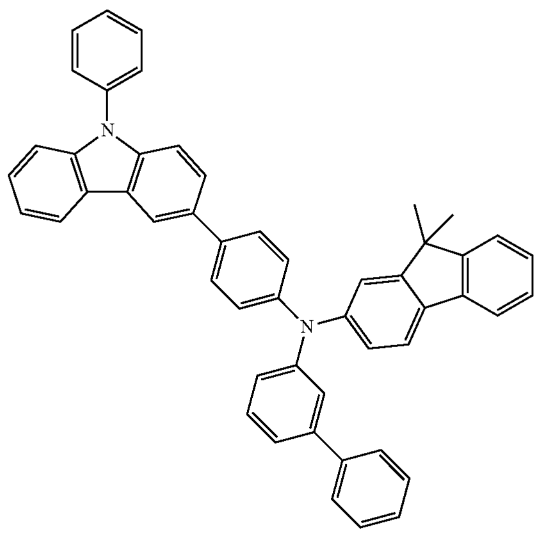

HT3

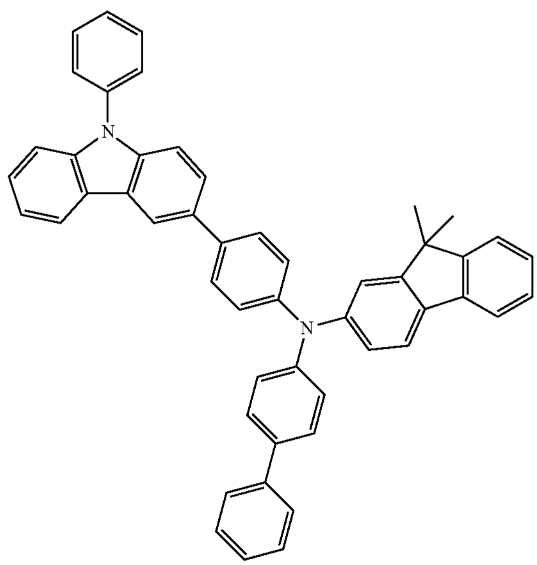

HT4

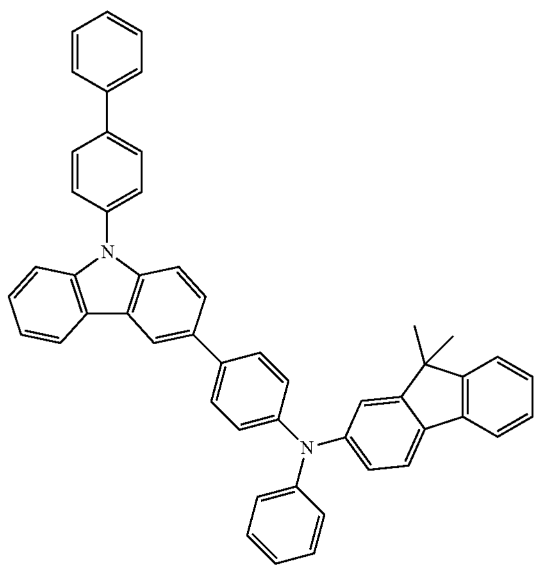

-continued
HT5
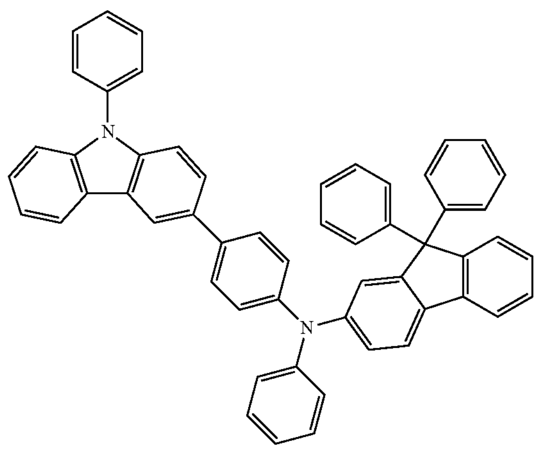
HT6
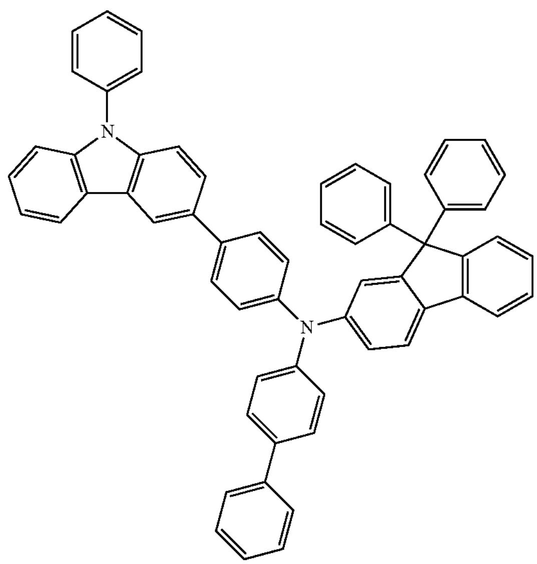
HT7
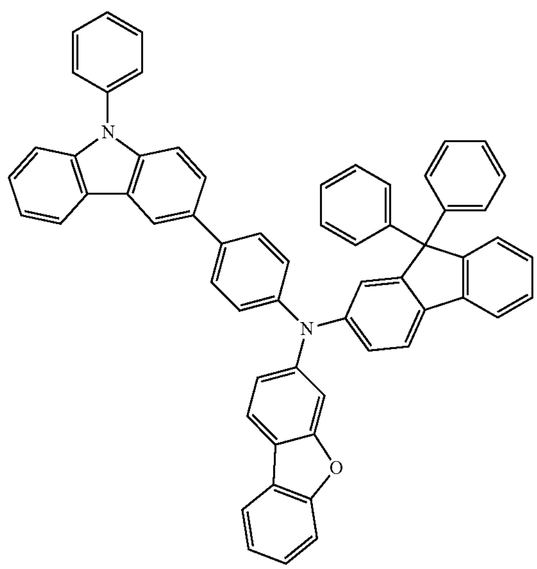
HT8
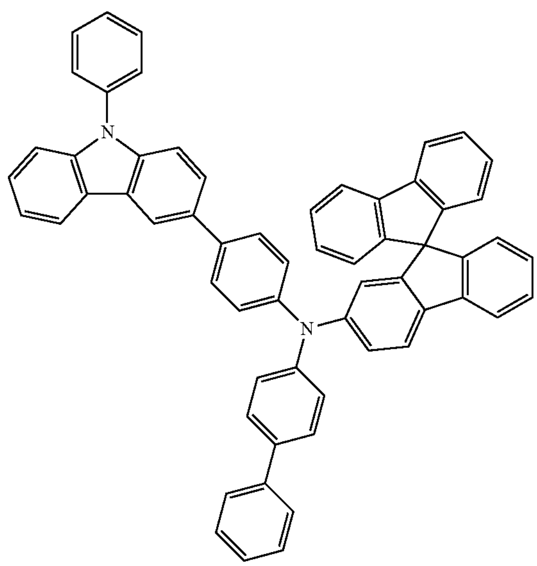

-continued
HT9
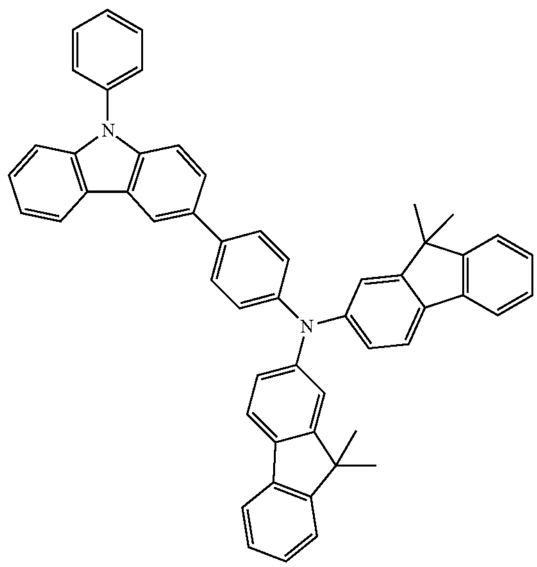
HT10
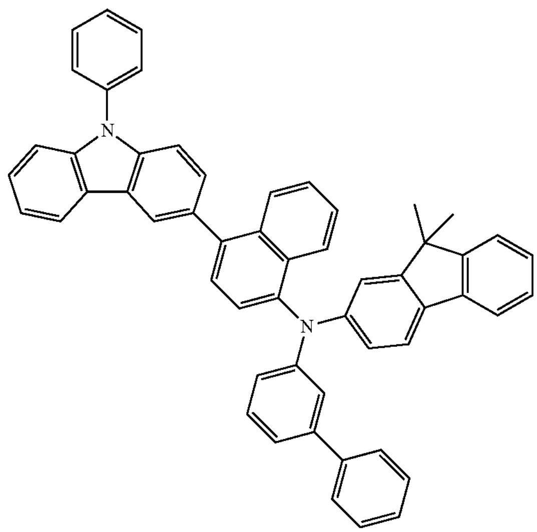
HT11
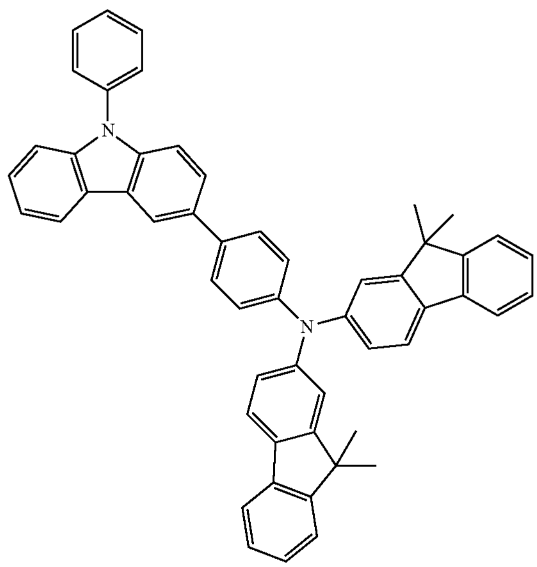
HT12
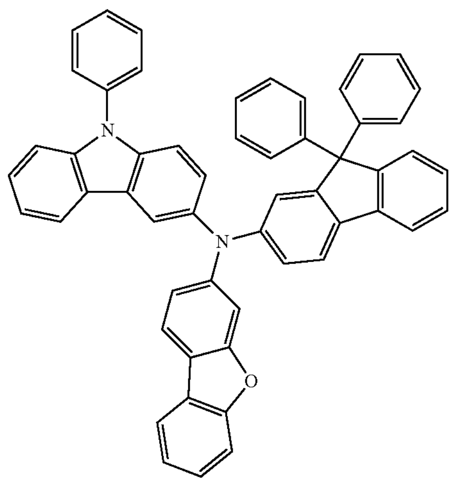

-continued
HT13
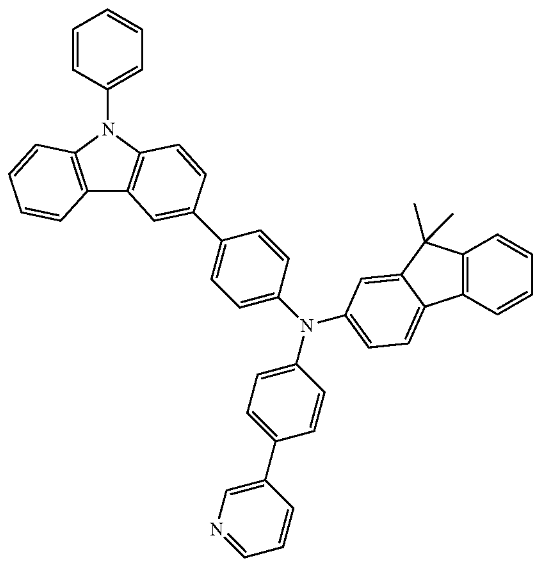
HT14
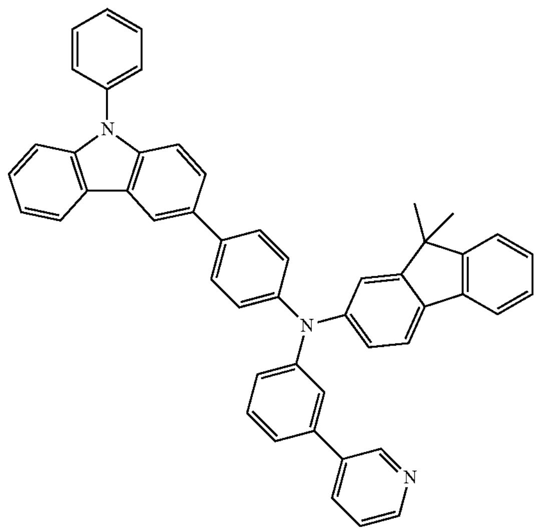
HT15
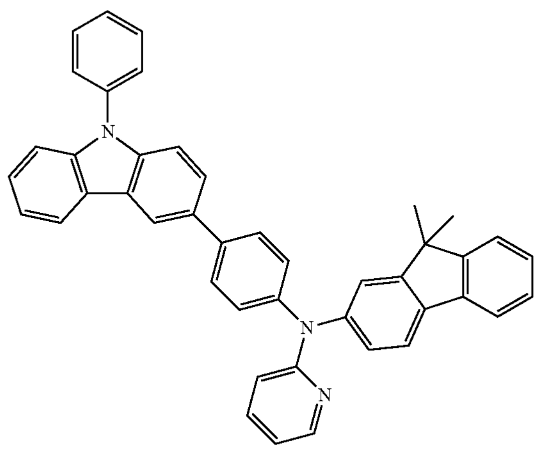
HT16
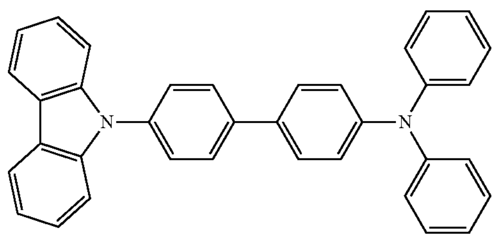
HT17
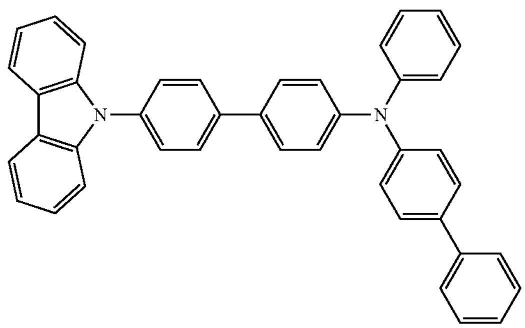
HT18
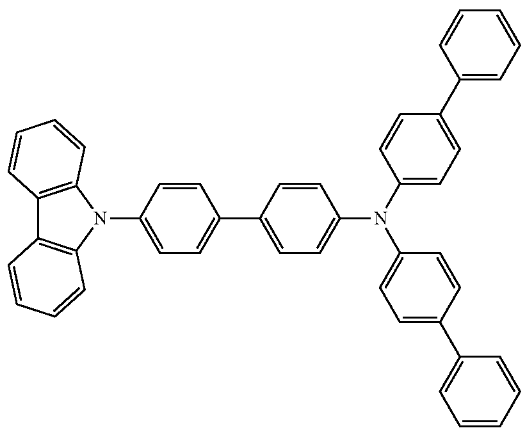

-continued
HT19
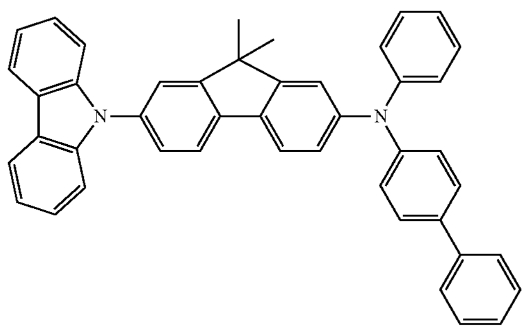
HT20
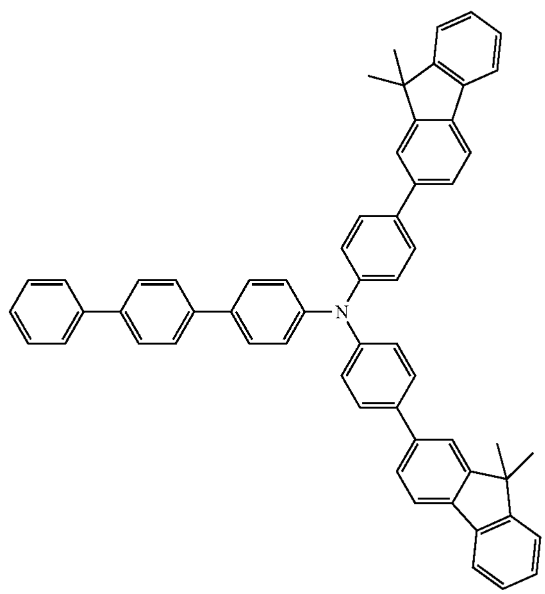
HT21
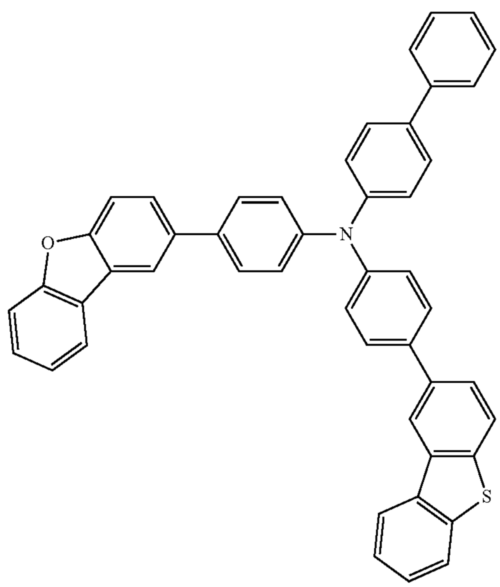
HT22
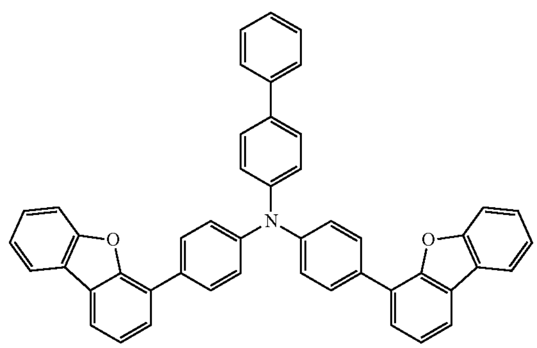

-continued
HT23
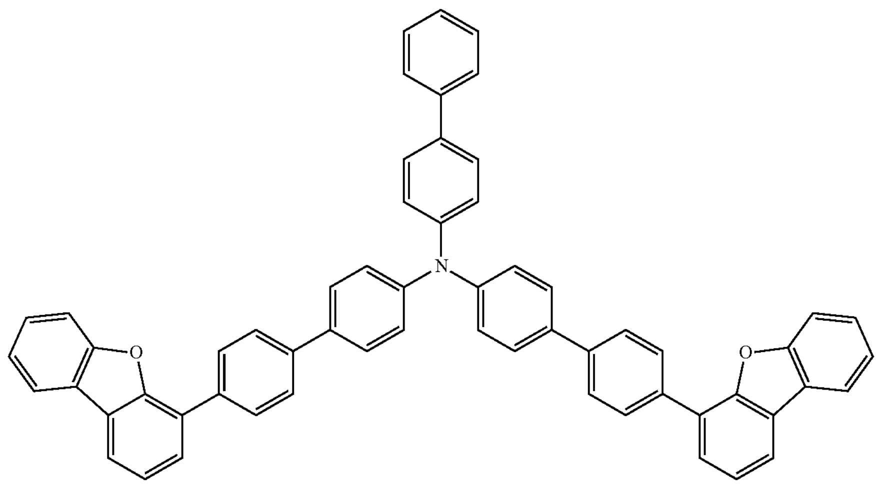
HT24
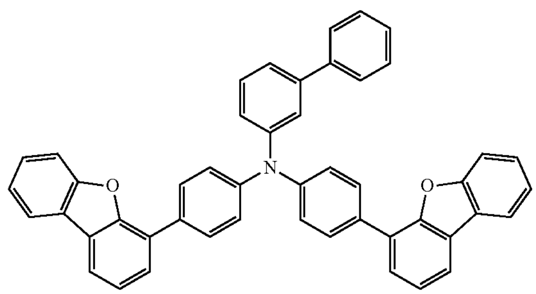
HT25
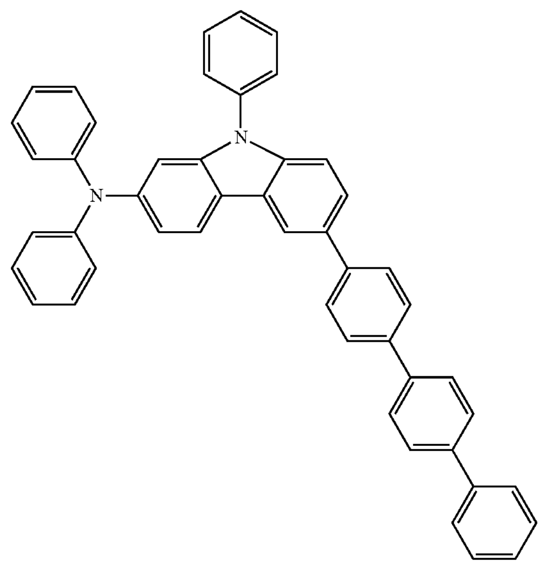
HT26
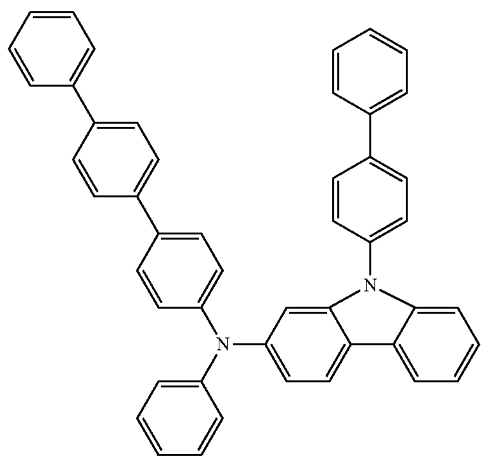
HT27
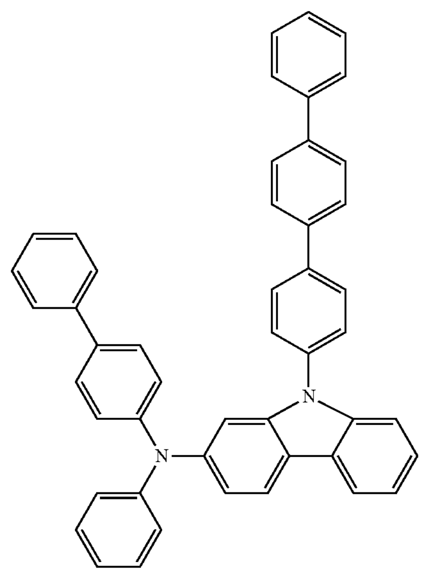

-continued
HT28
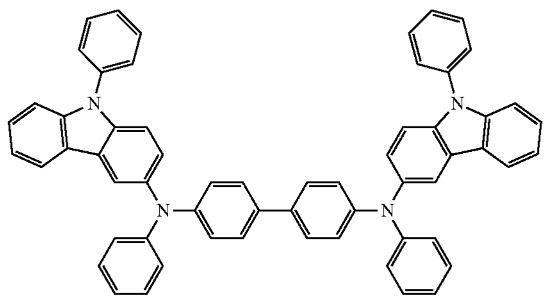
HT29
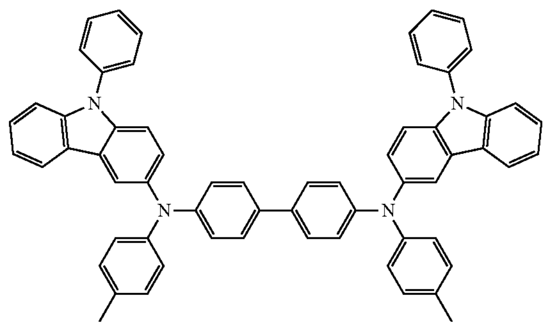
HT30
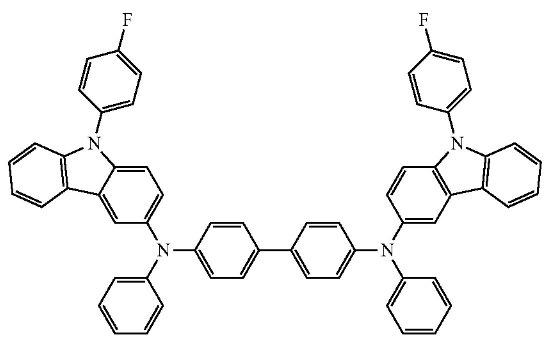
HT31
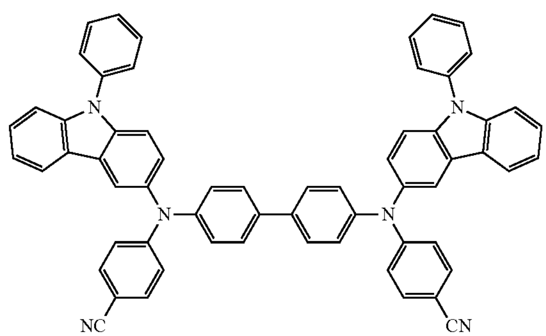
HT32
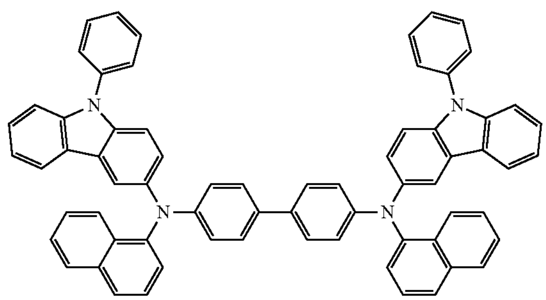
HT33
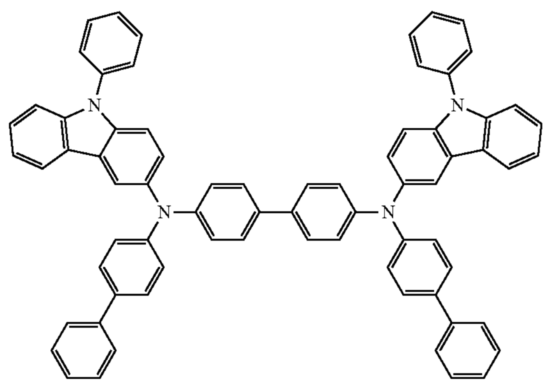
HT34
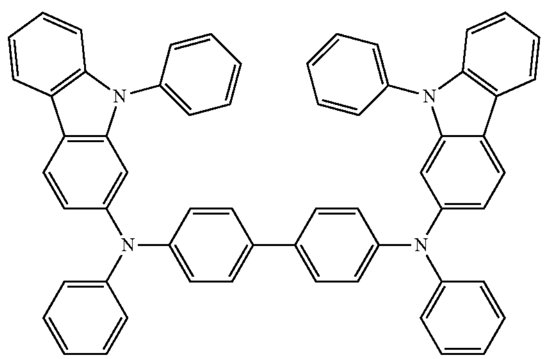
HT35
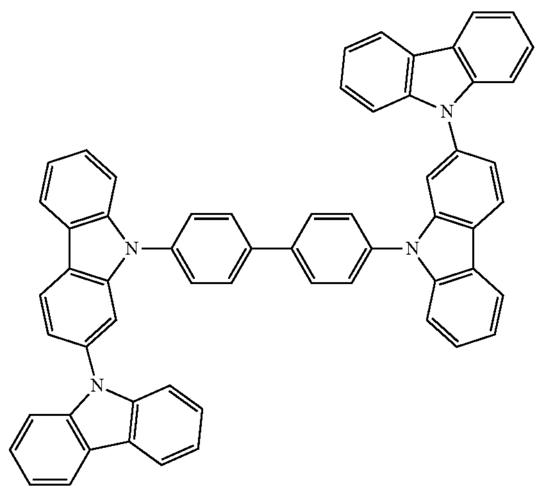

-continued
HT36
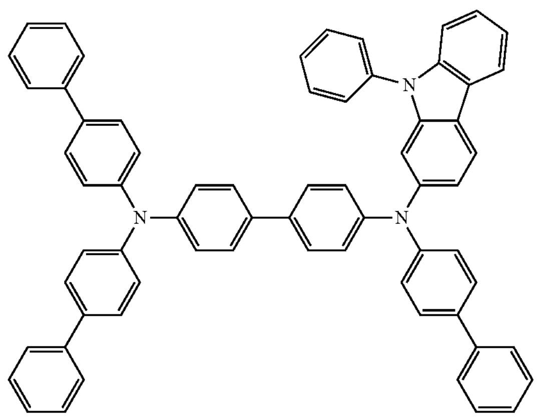
HT37
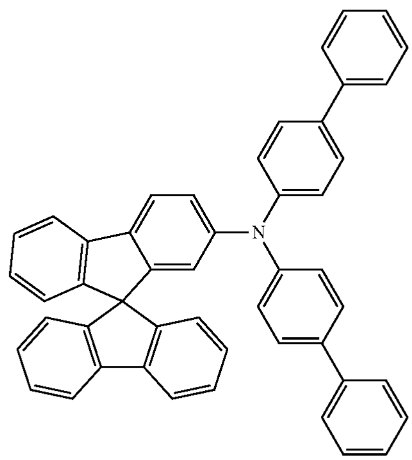
HT38
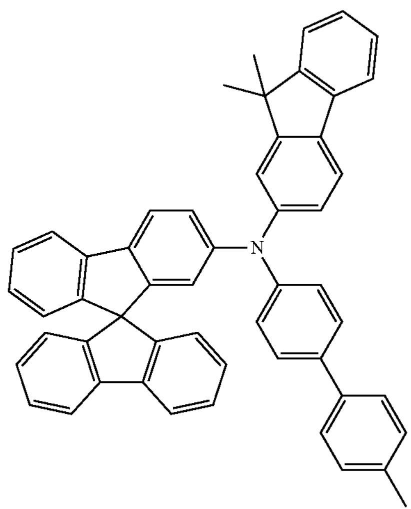
HT39
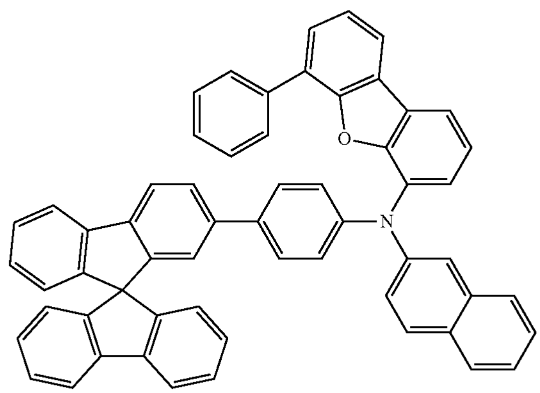
HT40
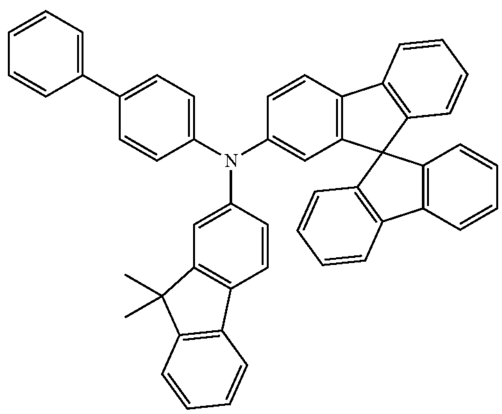
HT41
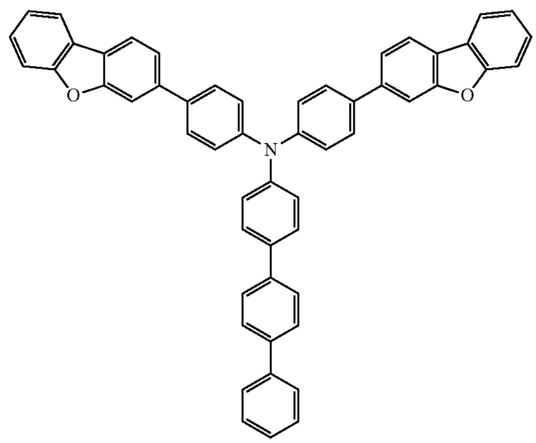

-continued
HT42
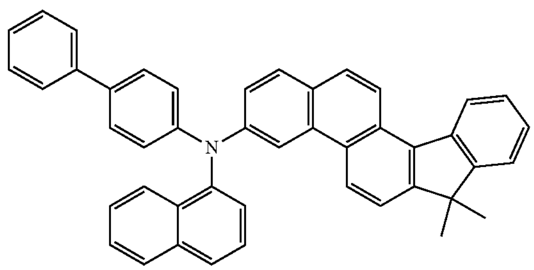
HT43
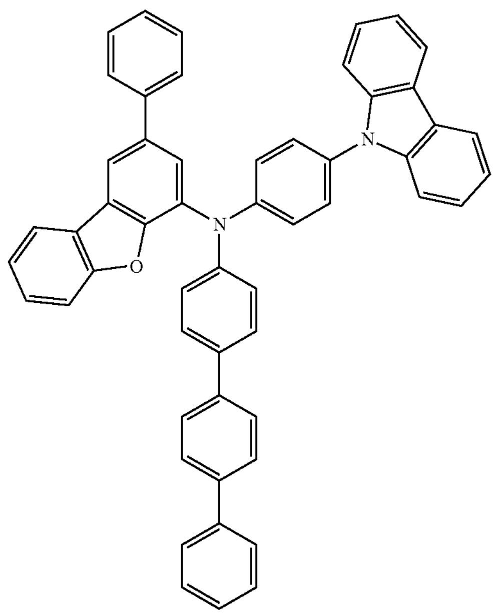
HT44
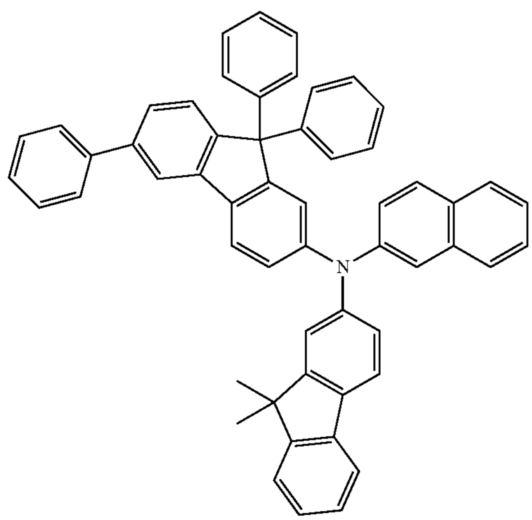
HT45
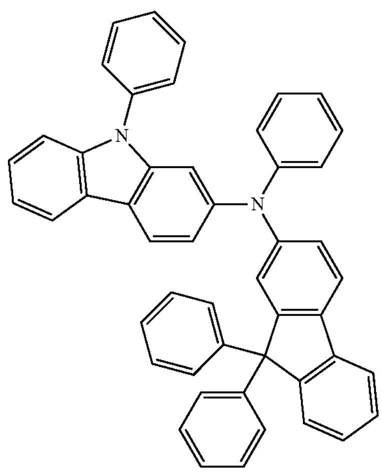
HT46
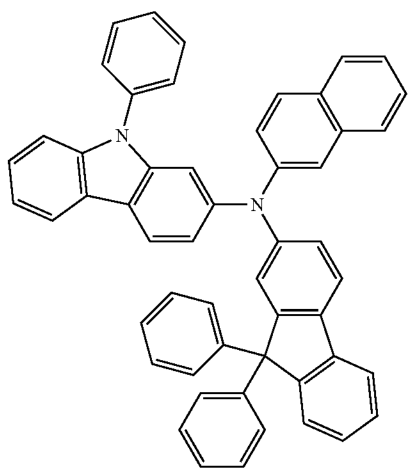

-continued
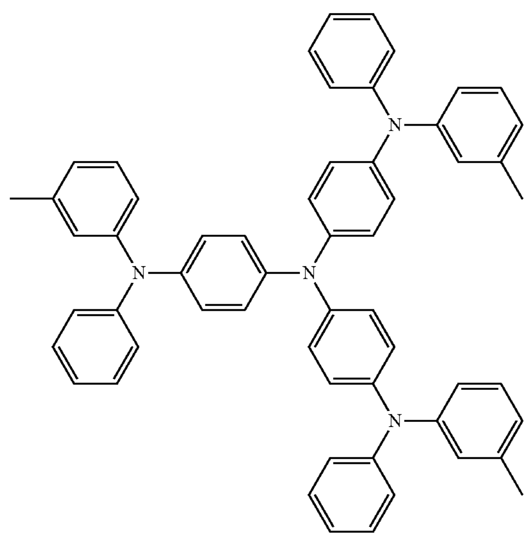
m-MTDATA
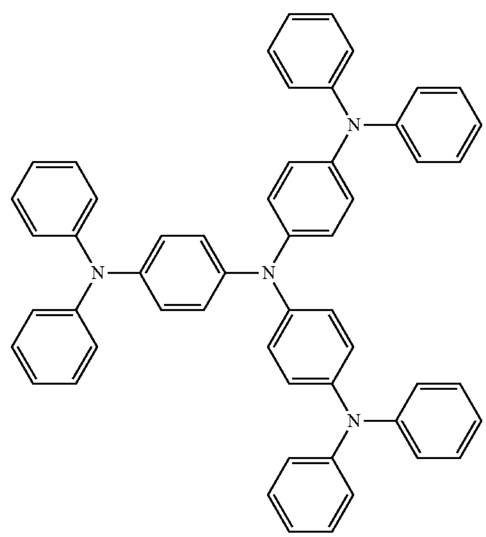
TDATA
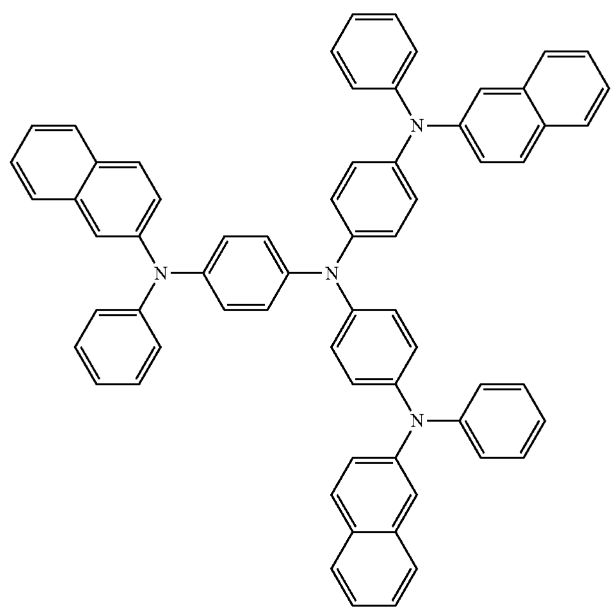
2-TNATA
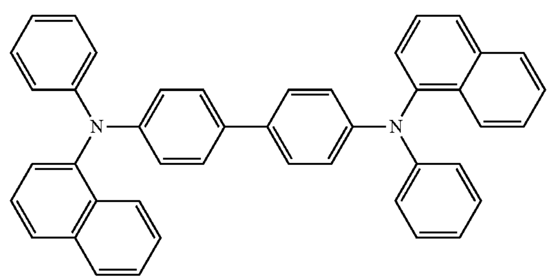
NPB -continued
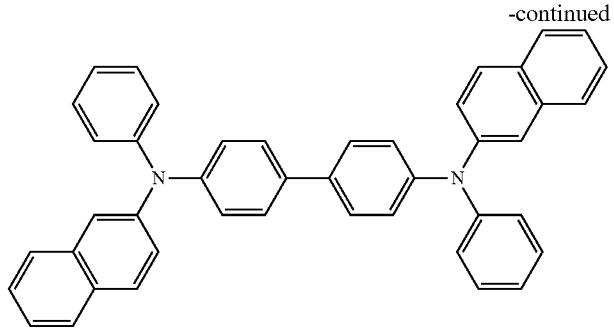
β-NPB
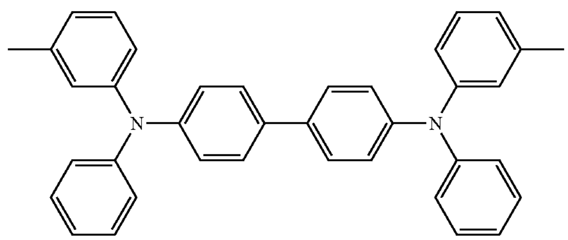
TPD
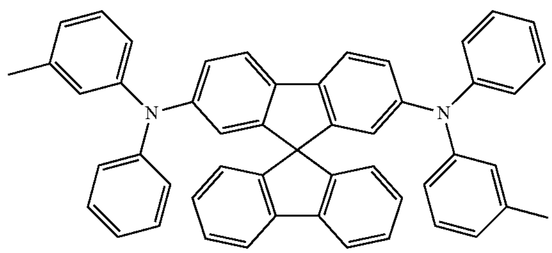
Spiro-TPD
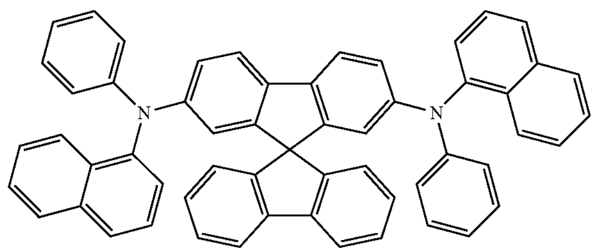
Spiro-NPB
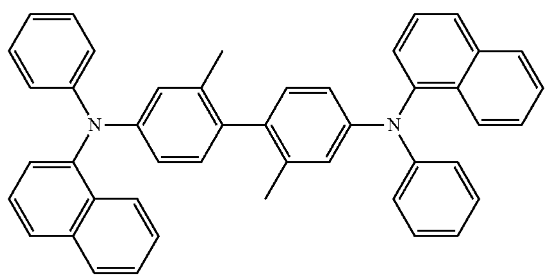
methylated-NPB -continued

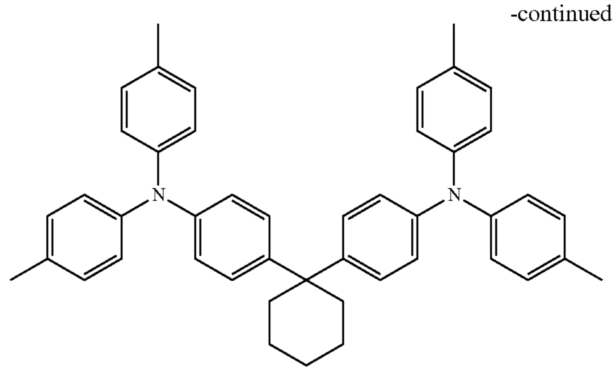

TAPC

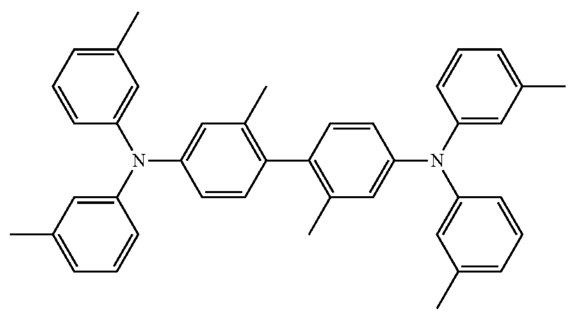

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted by an emission layer, and the electron-blocking layer may block the leakage of electrons from an emission layer to a hole transport region. Materials that may be included in the hole transport region may be included in the emission auxiliary layer and the electron-blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, a lowest unoccupied molecular orbital (LUMO) energy level of the p-dopant may be equal to or less than about −3.5 eV.

In an embodiment, the p-dopant may include a quinone derivative, a cyano group-containing compound, a compound including element EL1 and element EL2, or any combination thereof.

Examples of the quinone derivative may include TCNQ, F4-TCNQ, etc.

Examples of the cyano group-containing compound may include HAT-CN, and a compound represented by Formula 221:

[Formula 221]

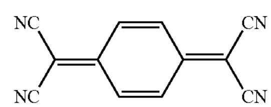

TCNQ

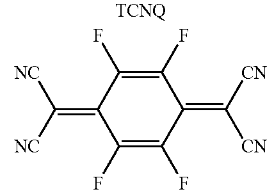

F4-TCNQ

-continued

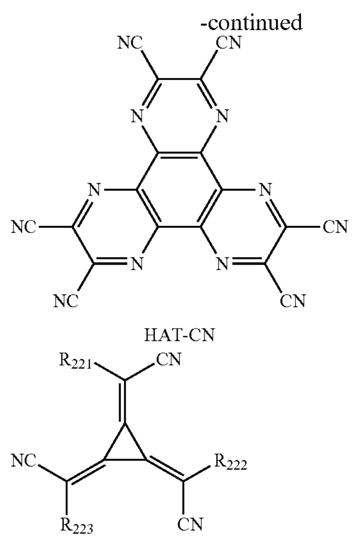

HAT-CN

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

Examples of the compound including element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WC_{13}$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, Ruiz etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, $SmI_3$, and the like.

Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

When the light-emitting device 10 is a full-color light-emitting device, the emission layer may be patterned into a red emission layer, a green emission layer, and/or a blue emission layer, according to a subpixel. In an embodiment, the emission layer may have a stacked structure of two or more layers of a red emission layer, a green emission layer, and a blue emission layer, in which the two or more layers may contact each other or may be separated from each other to emit white light. In an embodiment, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be in a range of about 0.01 parts by weight to about 15 parts by weight, based on 100 parts by weight of the host.

In an embodiment, the emission layer may include a quantum dot.

In embodiments, the emission layer may include a delayed fluorescence material. The delayed fluorescence material may serve as a host or as a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within these ranges, excellent light-emission characteristics may be obtained without a substantial increase in driving voltage.

[Host]

In an embodiment, the host may include a compound represented by Formula 301:

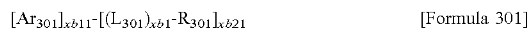

[Formula 301]

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as described herein with respect to $Q_1$.

In an embodiment, in Formula 301, when xb11 is 2 or more, two or more of $Ar_{301}$(s) may be linked to each other via a single bond.

In an embodiment, the host may include a compound represented by Formula 301-1, a compound represented by Formula 301-2, or any combination thereof:

[Formula 301-1]

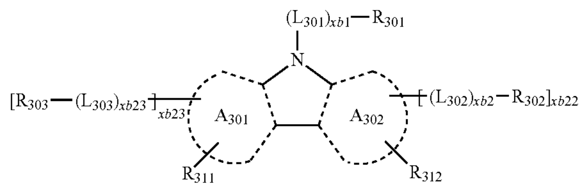

[Formula 301-2]

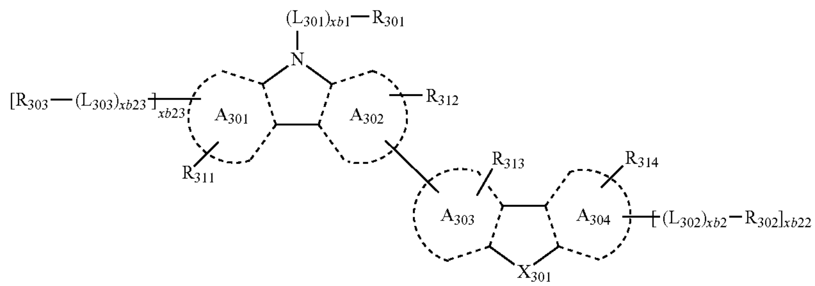

In Formulae 301-1 and 301-2, ring A301 to ring A304 may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{30}$ 4)$_{xb4}$-$R_{304}$], C($R_{304}$)($R_{305}$), or Si($R_{304}$)($R_{305}$), xb22 and xb23 may each independently be 0, 1, or 2, $L_{301}$, xb17 and $R_{301}$ may each be the same as described herein, $L_{302}$ to $L_{304}$ may each independently be the same as described herein with respect to with $L_{301}$, xb2 to xb4 may each independently be the same as described herein with respect to xb1, and $R_{302}$ to $R_{305}$ and $R_{311}$ to $R_{314}$ may each independently be the same as described herein with respect to $R_{301}$.

In an embodiment, the host may include an alkali earth metal complex, a post-transition metal complex, or any combination thereof. For example, the host may include a Be complex (for example, Compound H55), an Mg complex, a Zn complex, or any combination thereof.

In an embodiment, the host may include one of Compounds H1 to H128, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-Abenzene (TCP), or any combination thereof:
H1
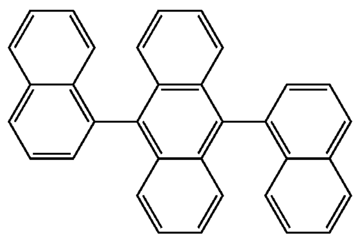
H2
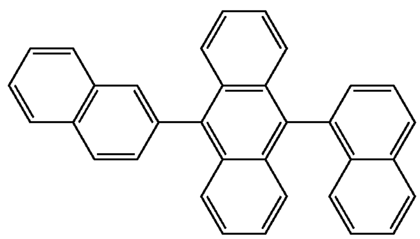
H3
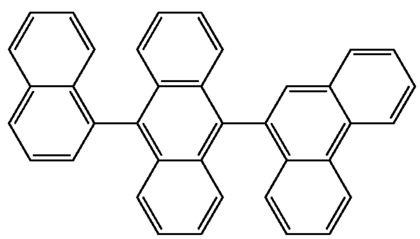
H4
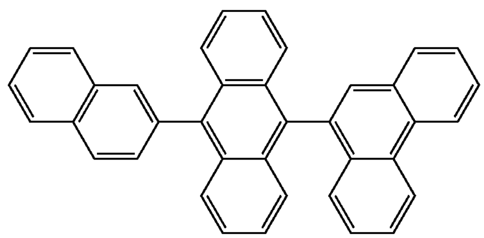
H5
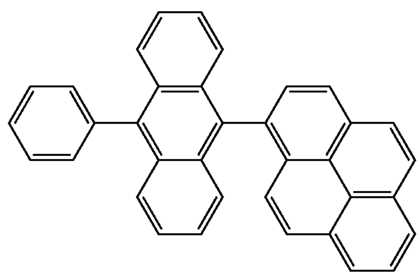
-continued
H6
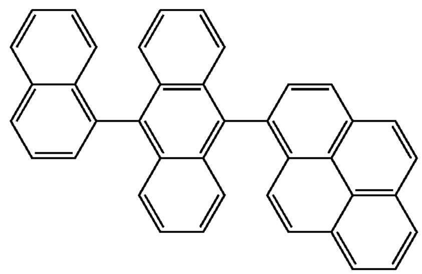
H7
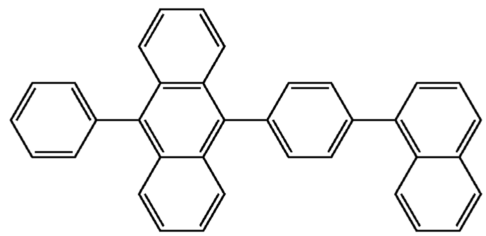
H8
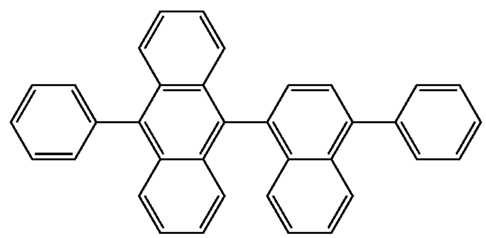
H9
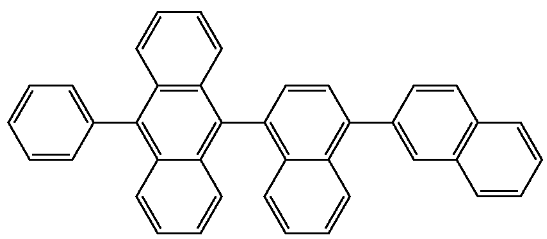
H10
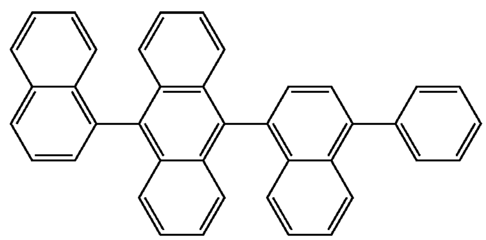
H11
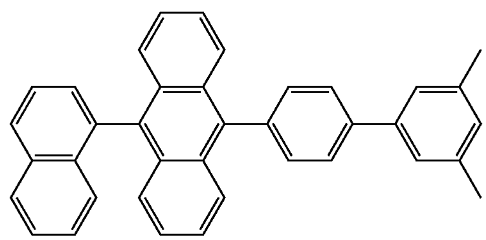

-continued
H12
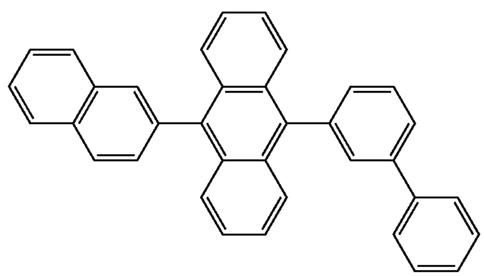
H13
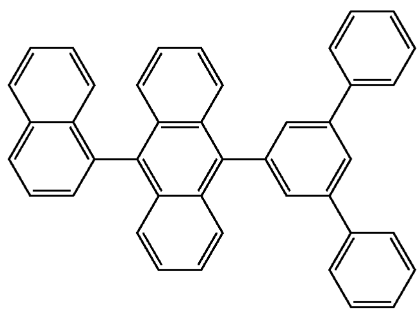
H14
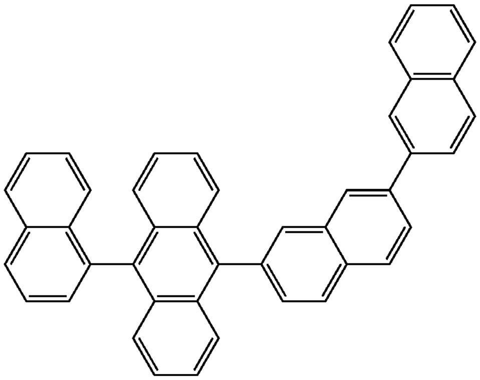
H15
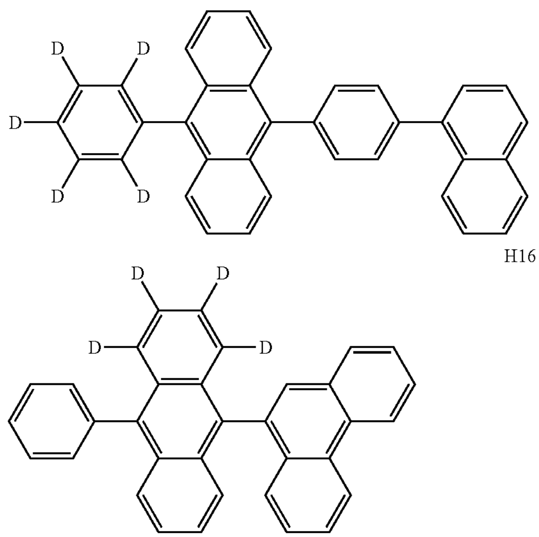
H16
-continued
H17
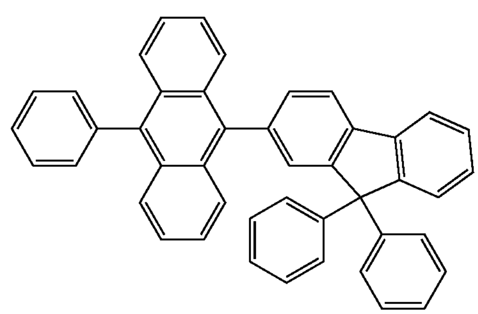
H18
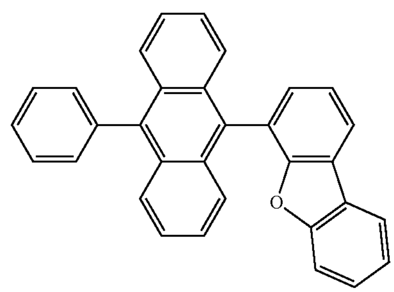
H19
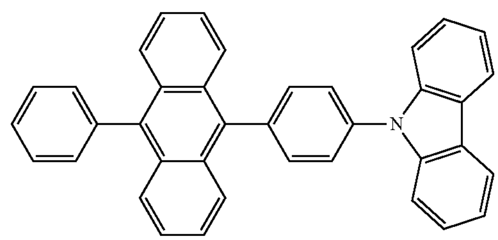
H20
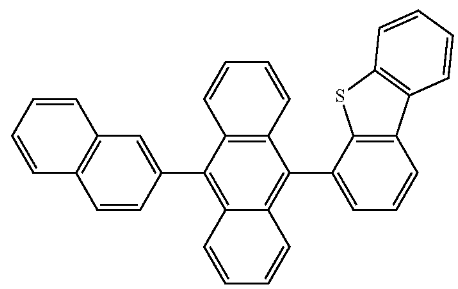
H21
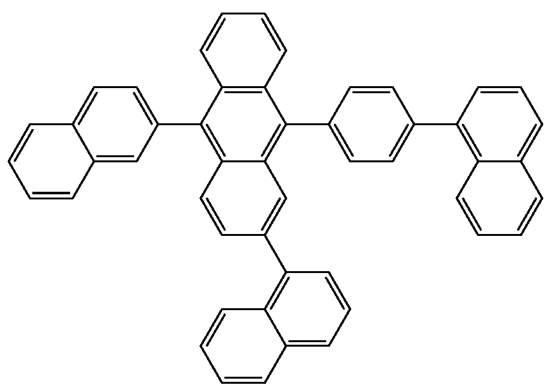

-continued
H22
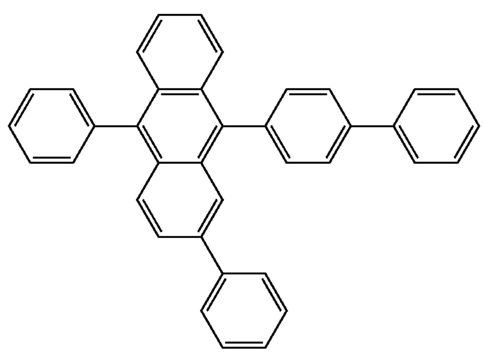
H23
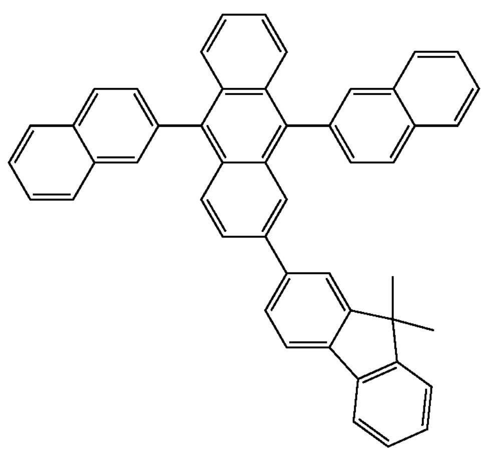
H24
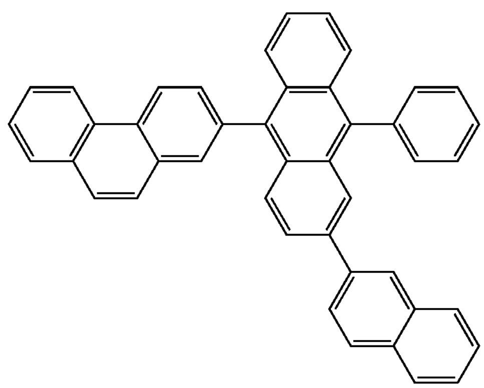
-continued
H25
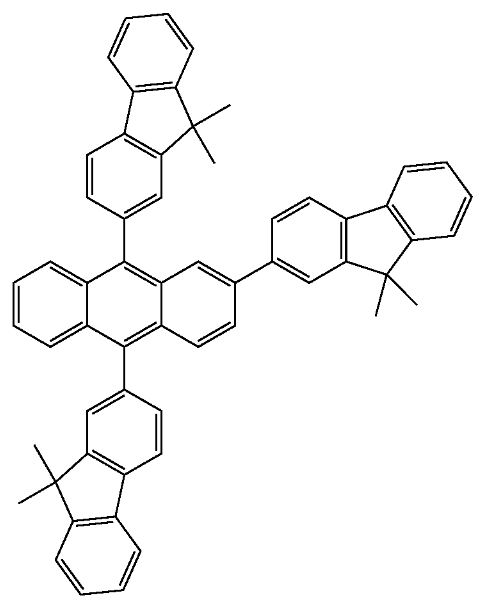
H26
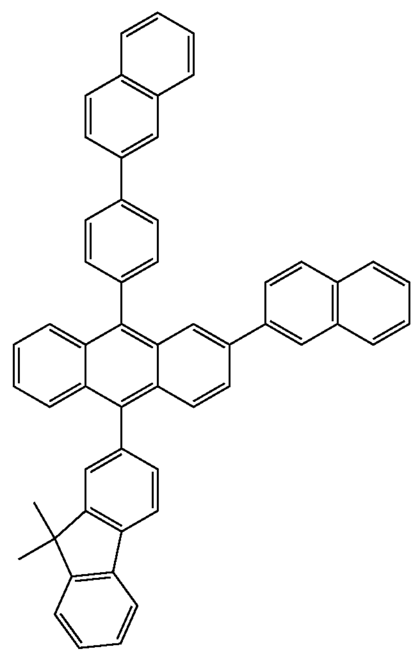

-continued
H27
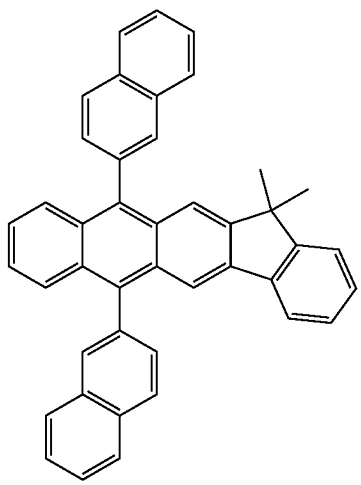
H28
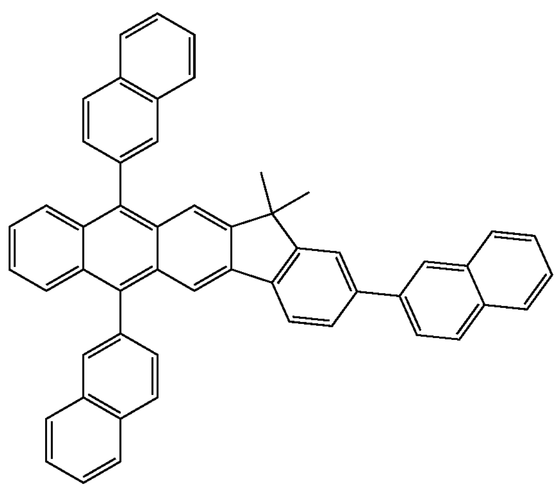
H29
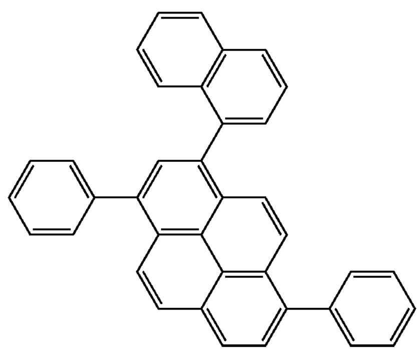
-continued
H30
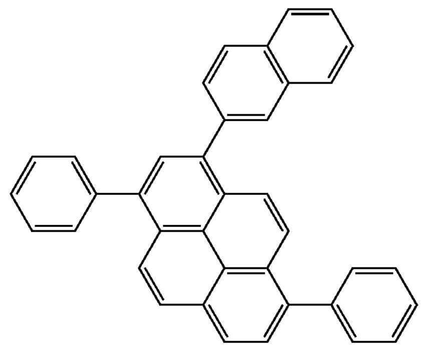
H31
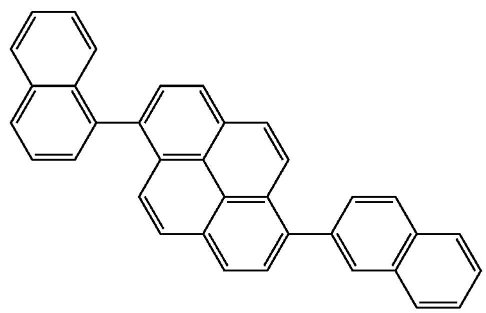
H32
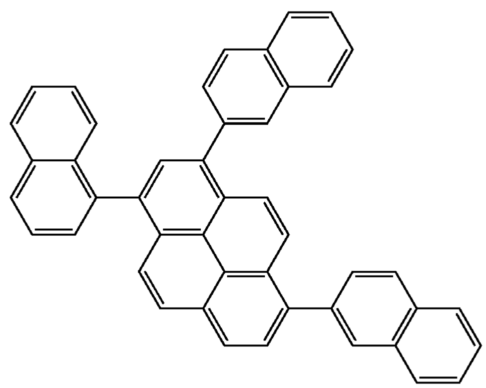
H33
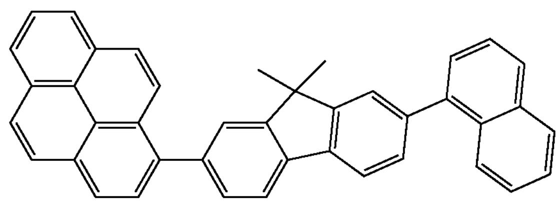
H34
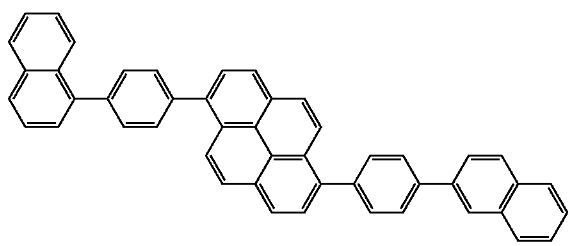

-continued
H35
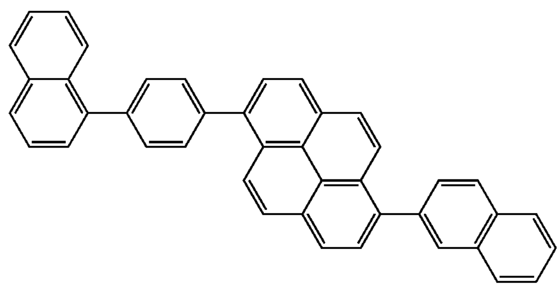
H36
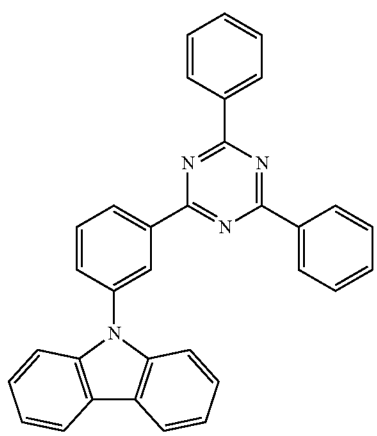
H37
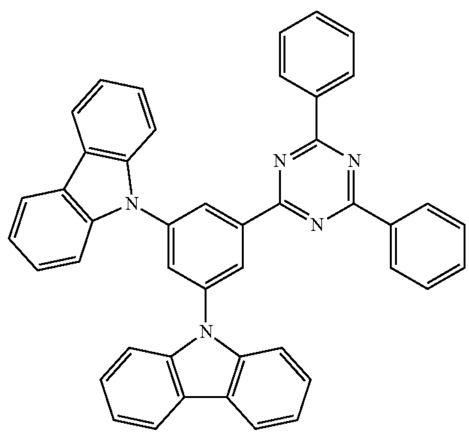
H38
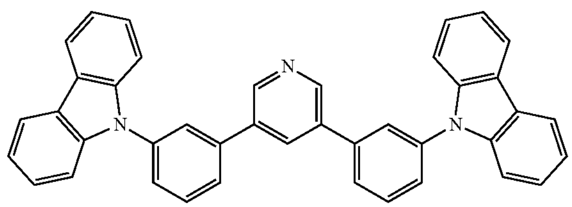
-continued
H39
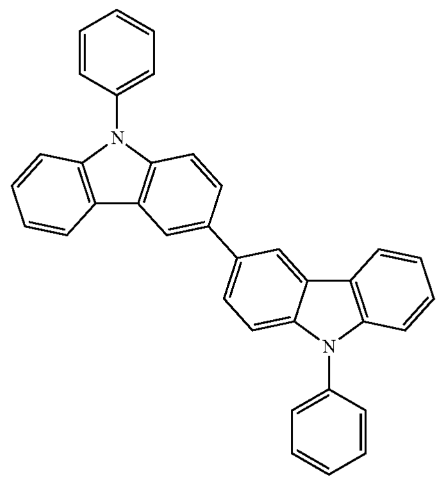
H40
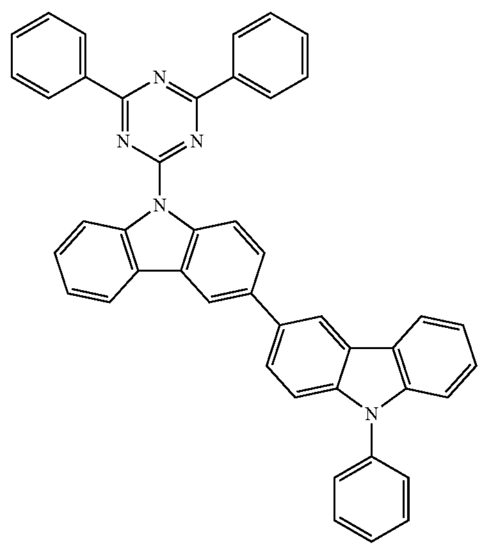
H41
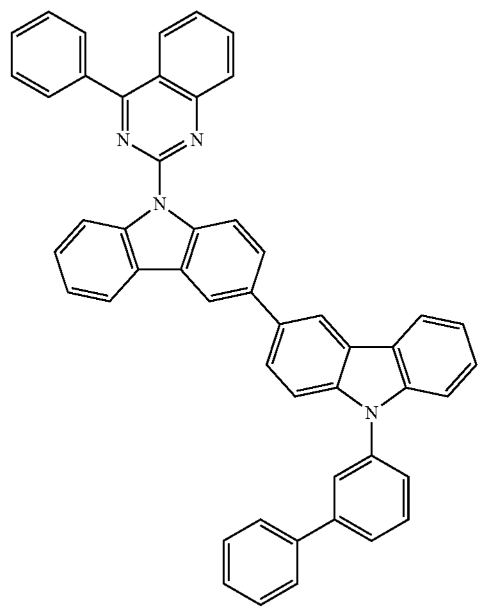

-continued
H42
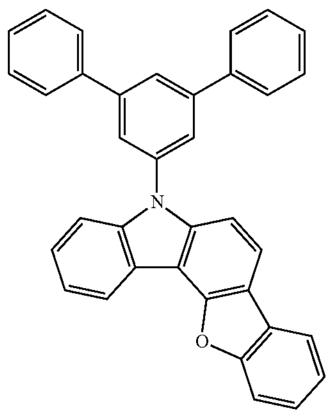
H43
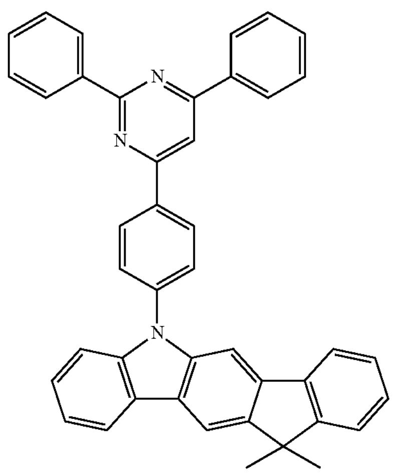
H44
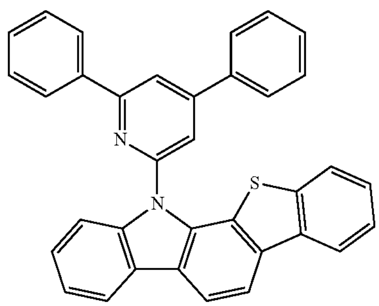
H45
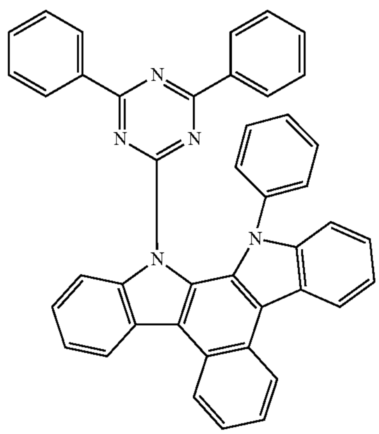
-continued
H46
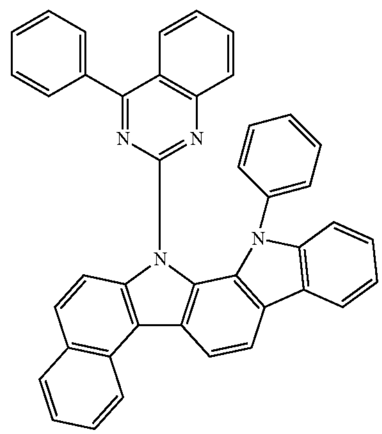
H47
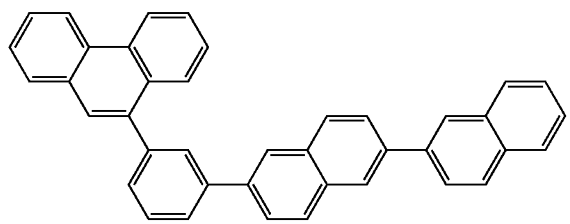
H48
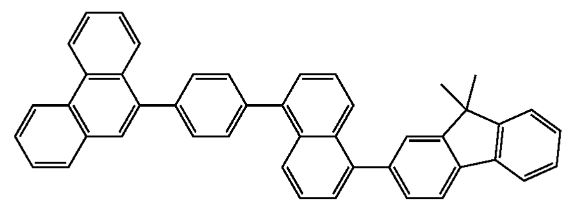
H49
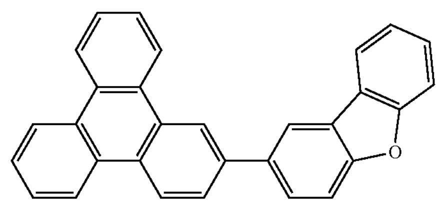
H50
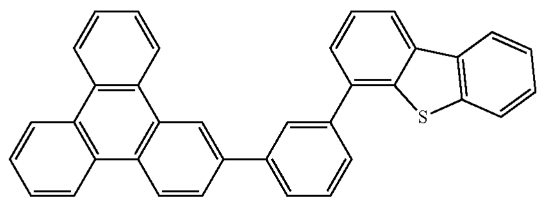
H51
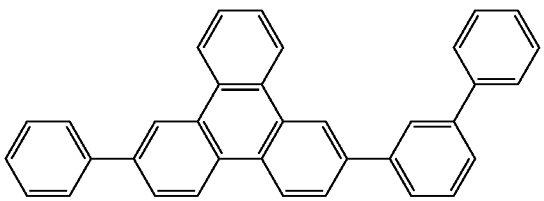

-continued
H52
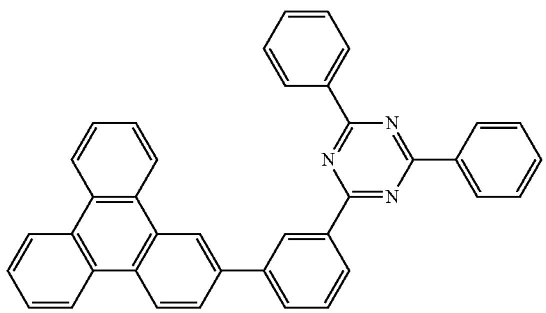
H53
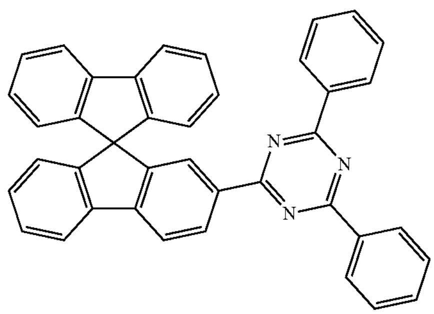
H54
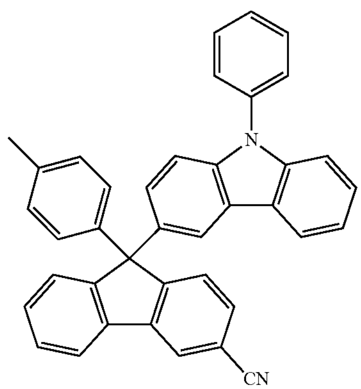
H55
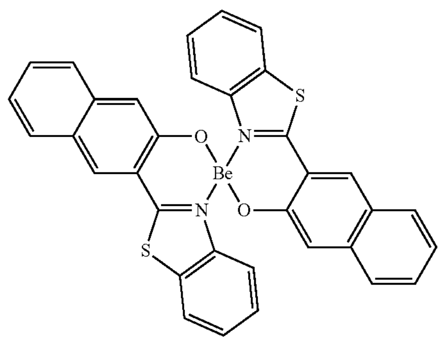
-continued
H56
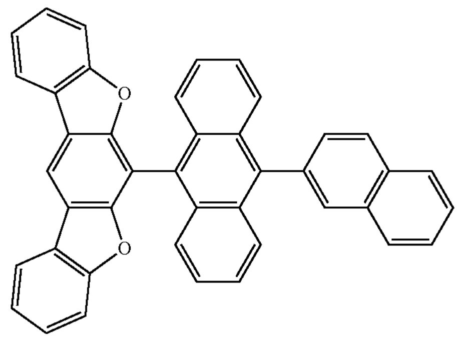
H57
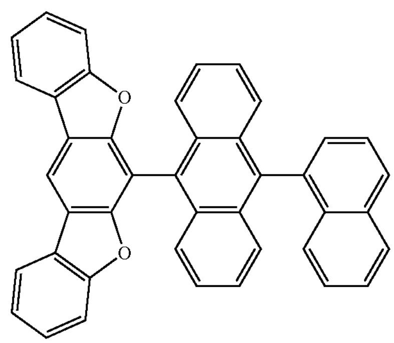
H58
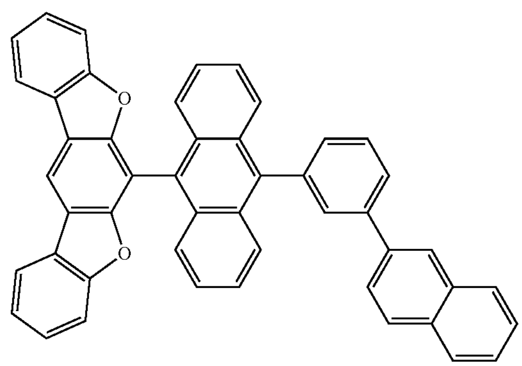
H59
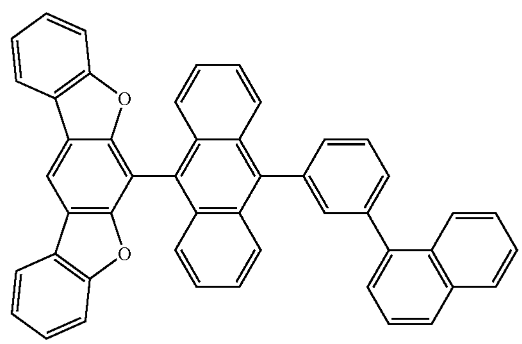

-continued
H60
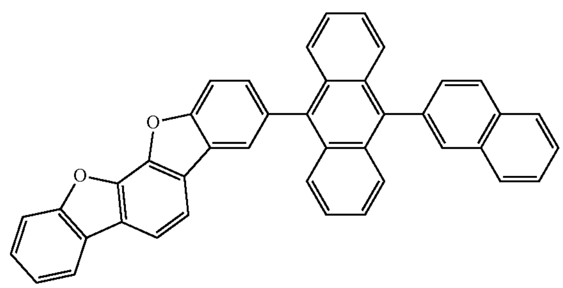
H61
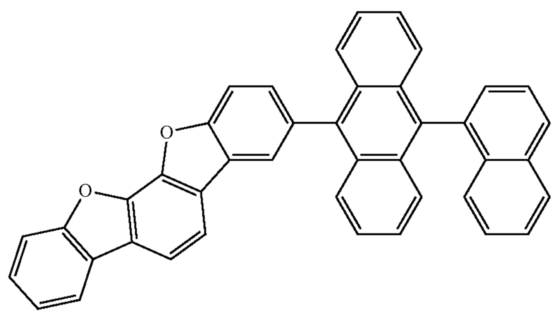
H62
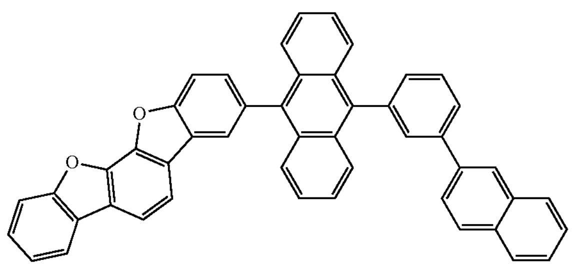
H63
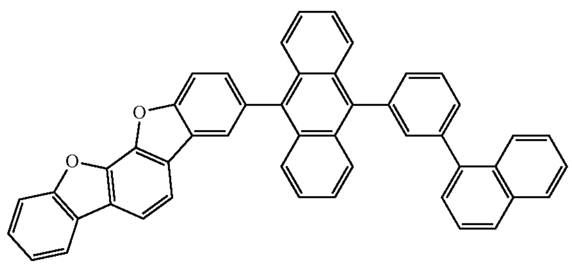
H64
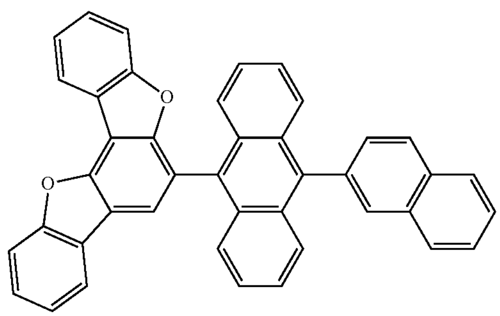
-continued
H65
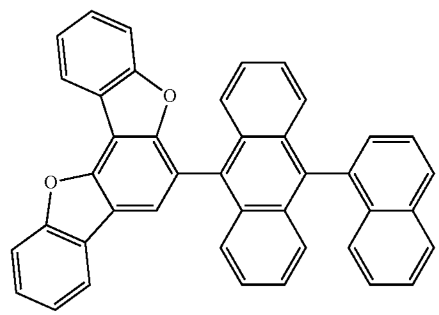
H66
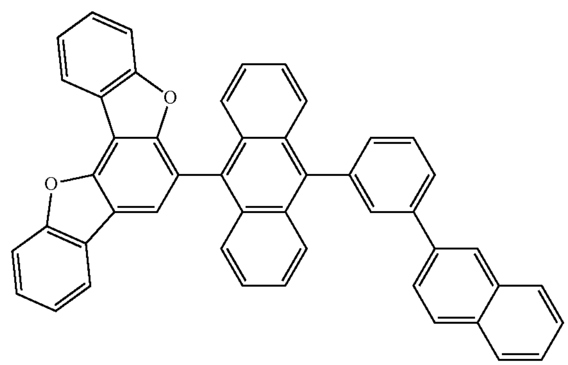
H67
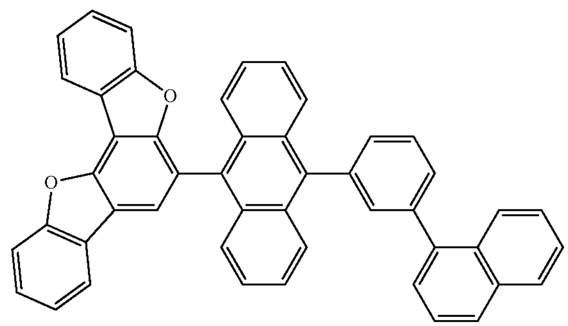
H68
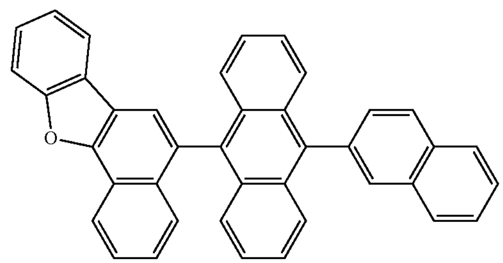
H69
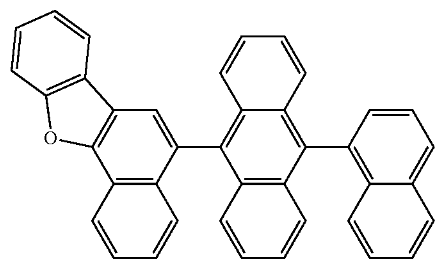

-continued
H70
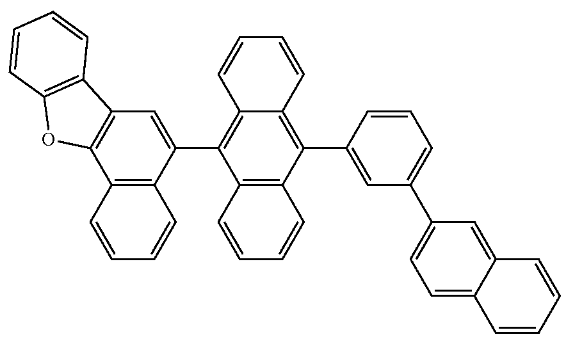
H71
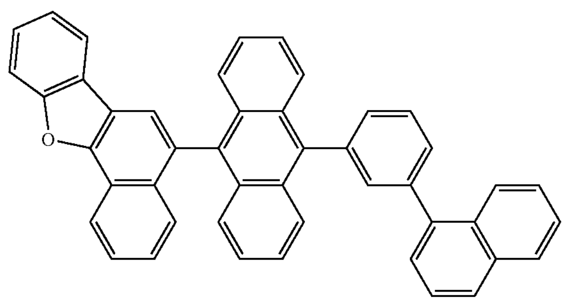
H72
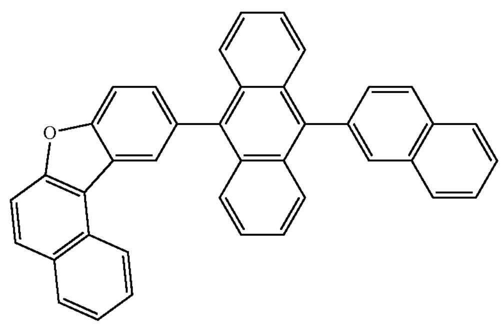
H73
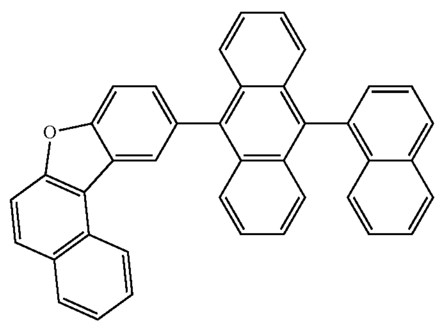
-continued
H74
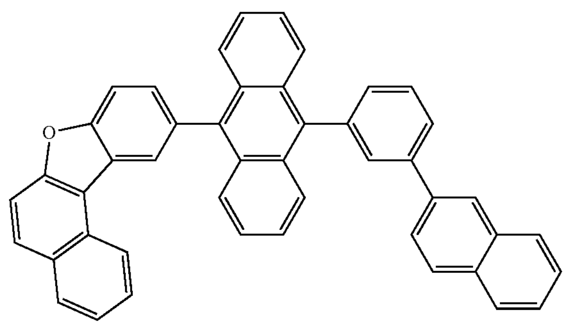
H75
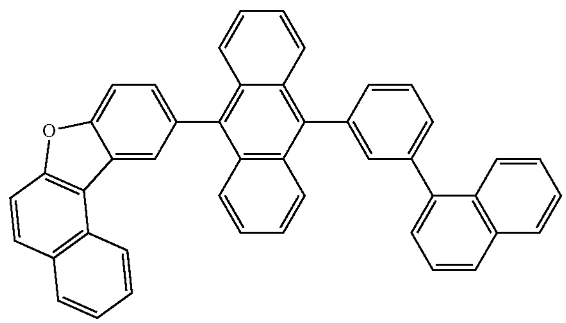
H76
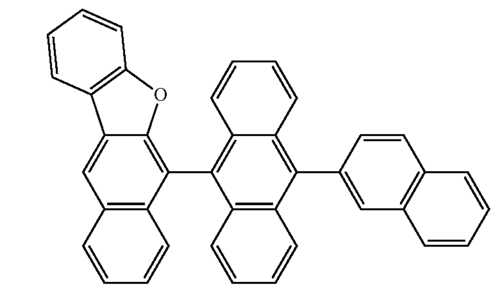
H77
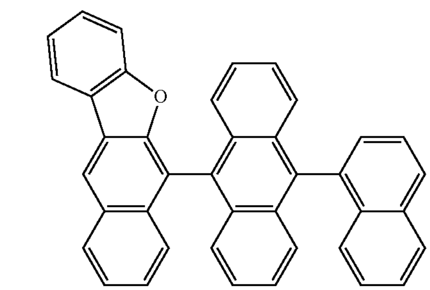
H78
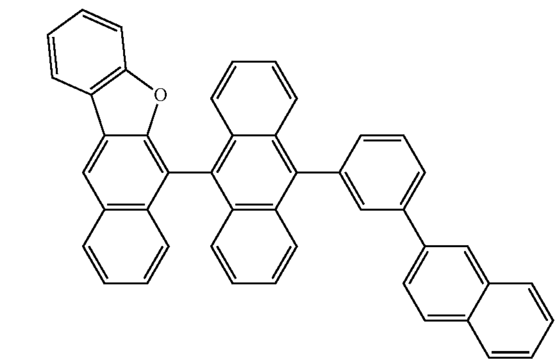

-continued
H79
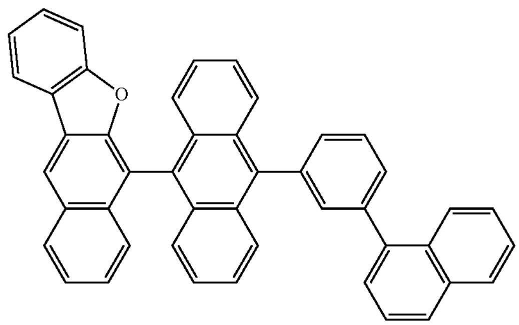
H80
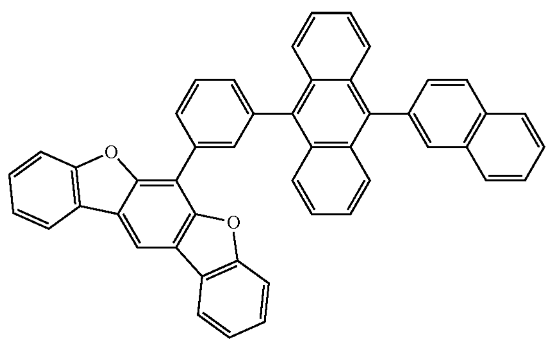
H81
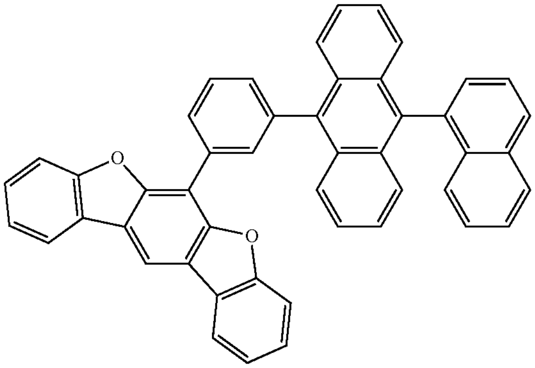
H82
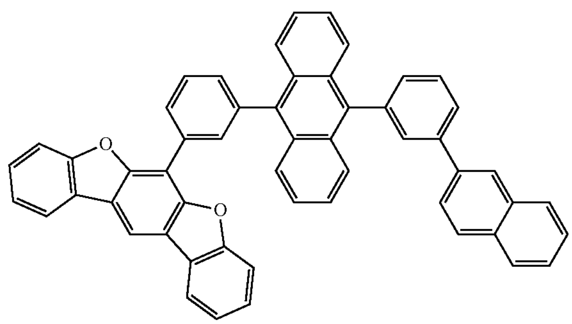
-continued
H83
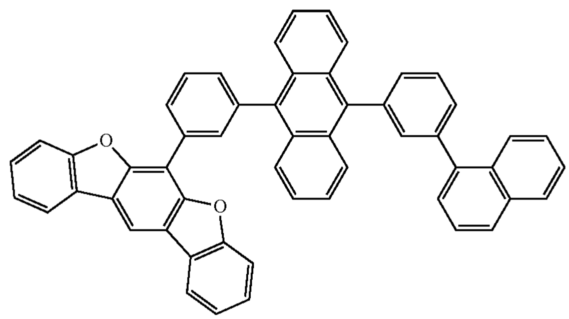
H84
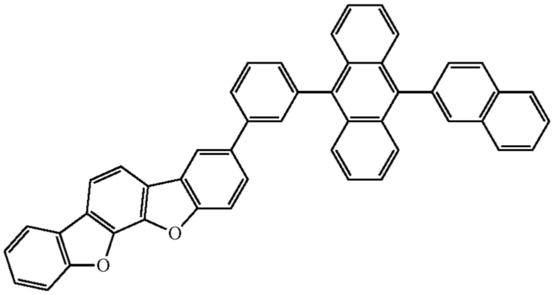
H85
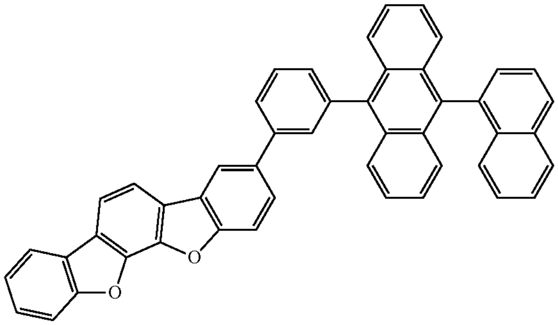
H86
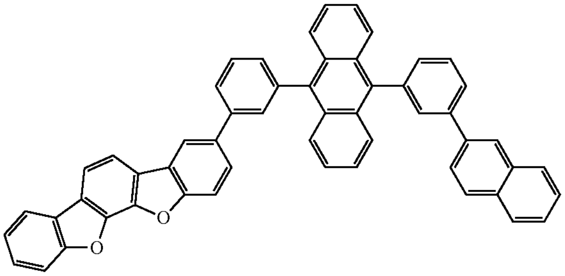
H87
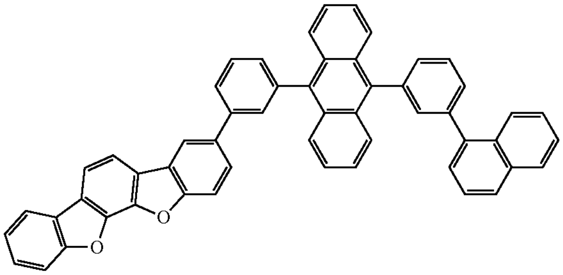

-continued
H88
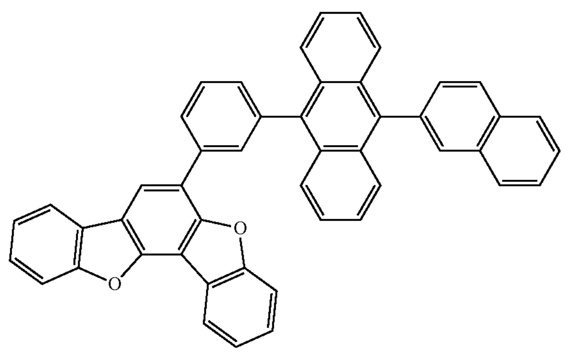
H89
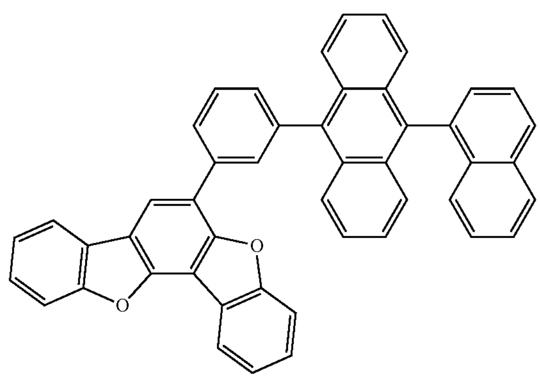
H90
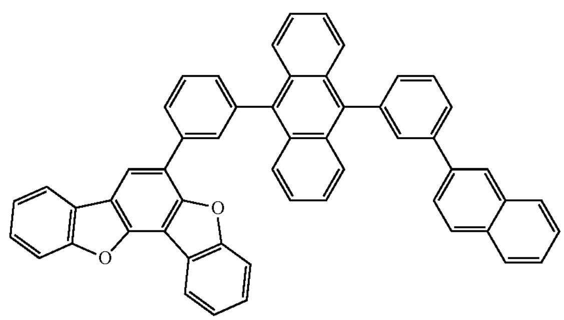
H91
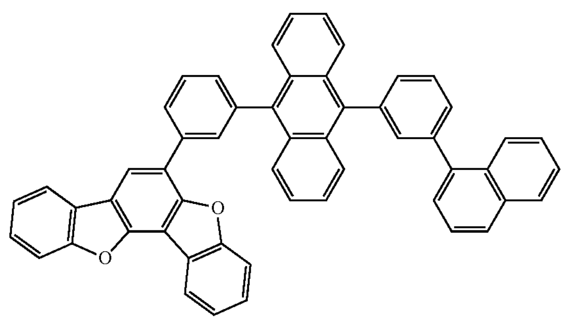
-continued
H92
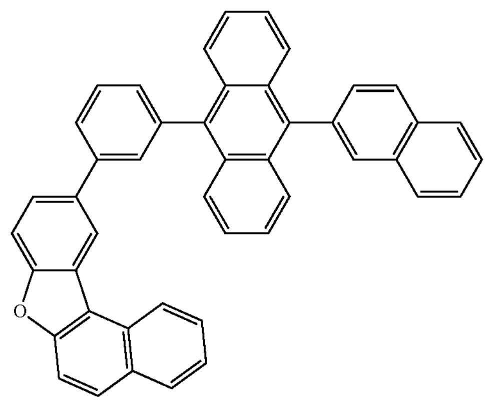
H93
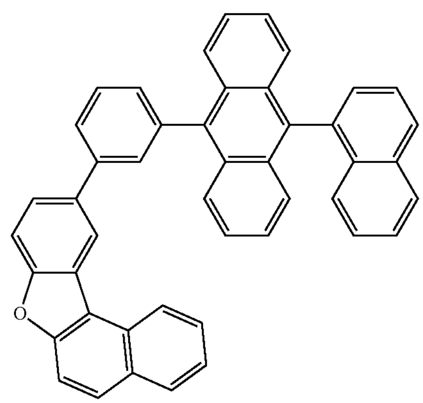
H94
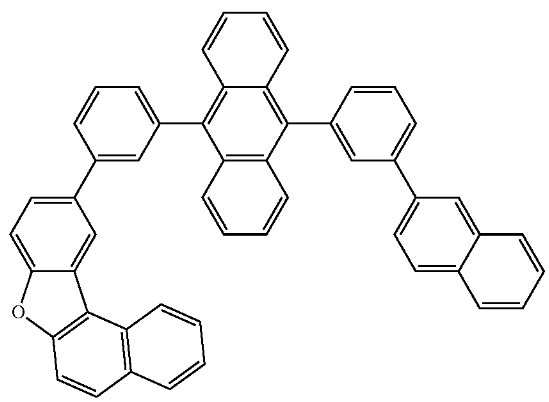
H95
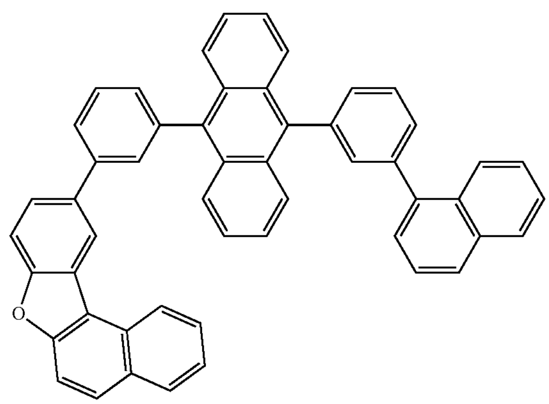

-continued
H96
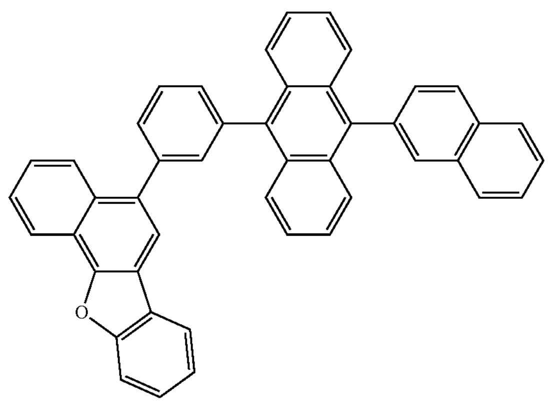
H97
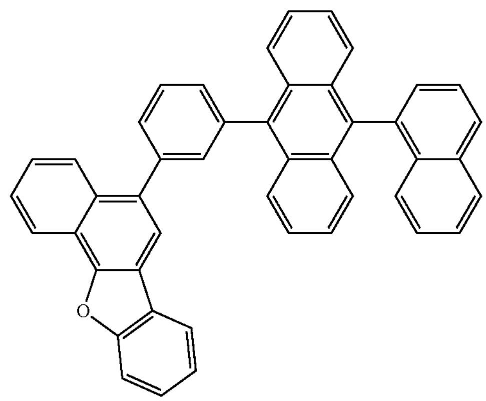
H98
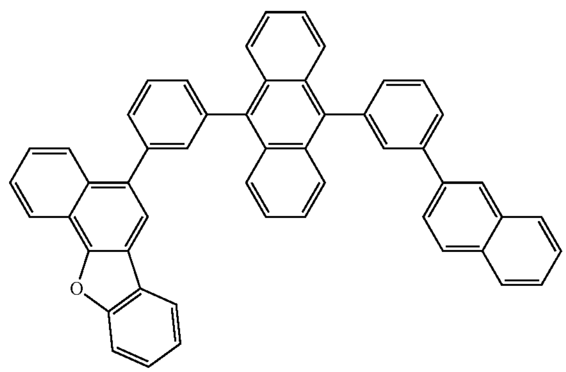
H99
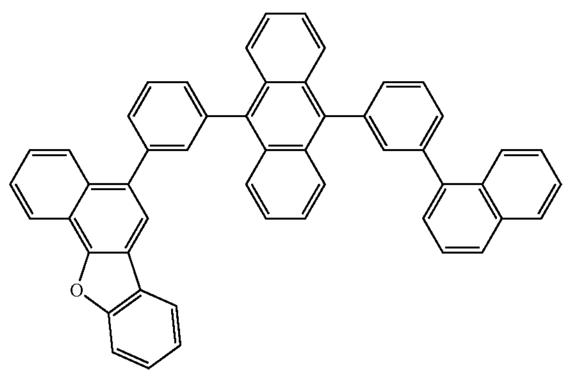
-continued
H100
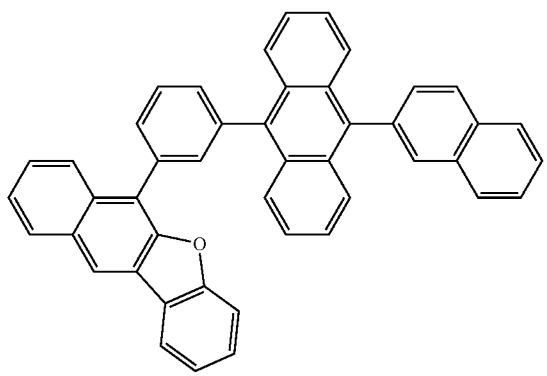
H101
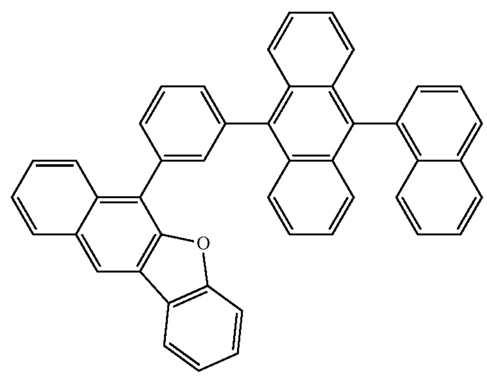
H102
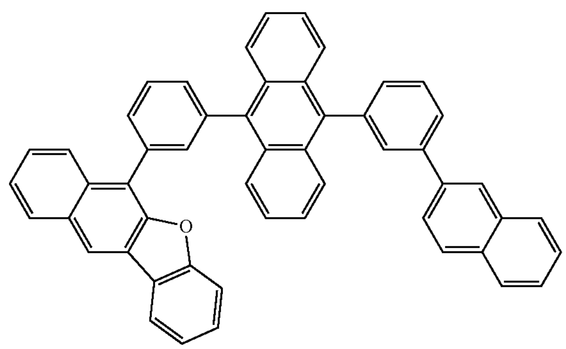
H103
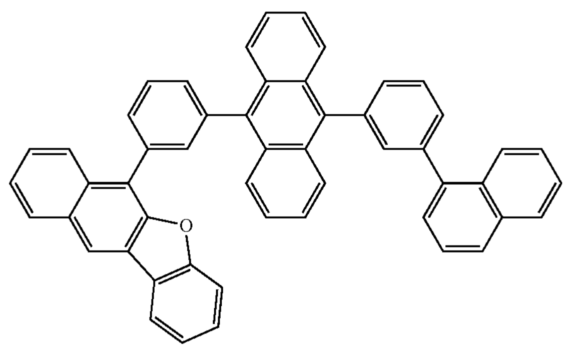

H104
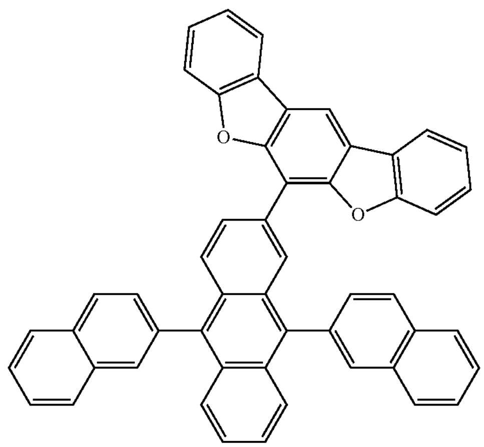
H105
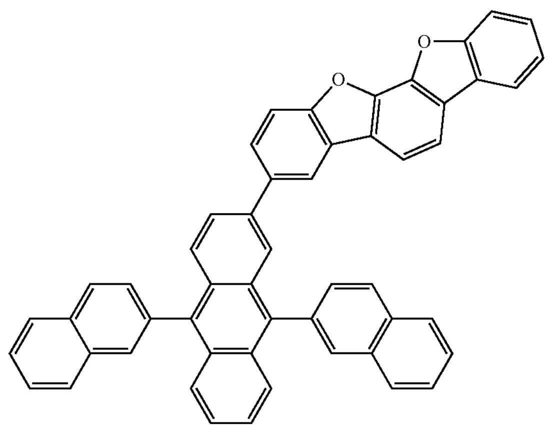
H106
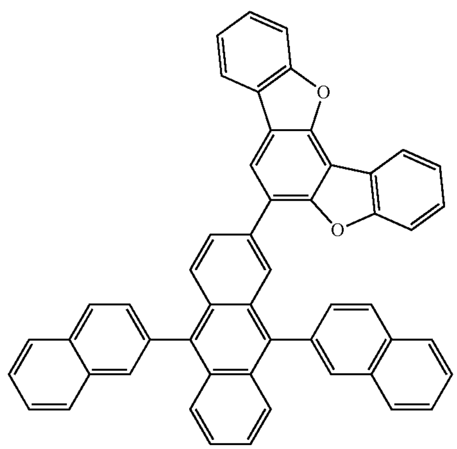
H107
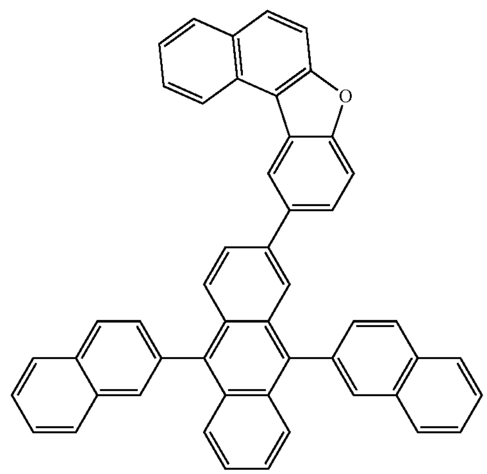
H108
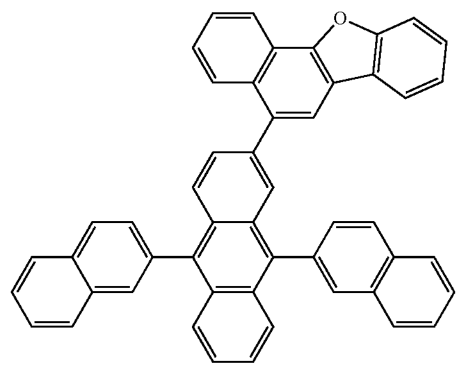
H109
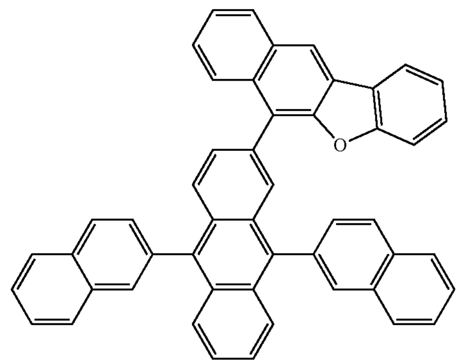
H110
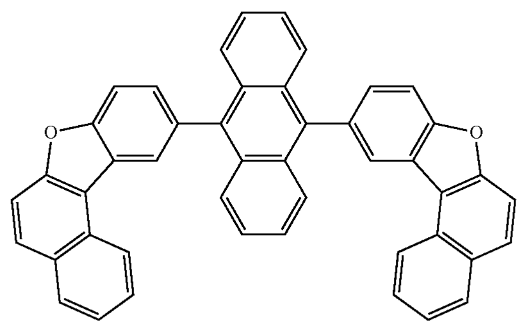

-continued
H111
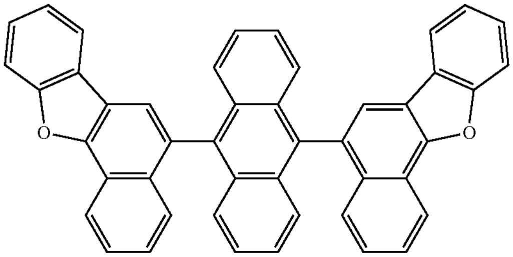
H112
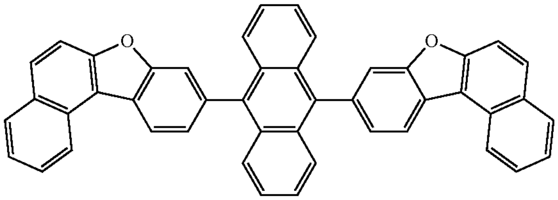
H113
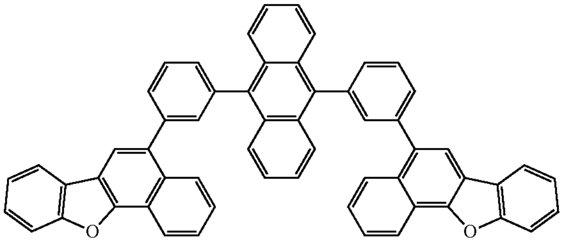
H114
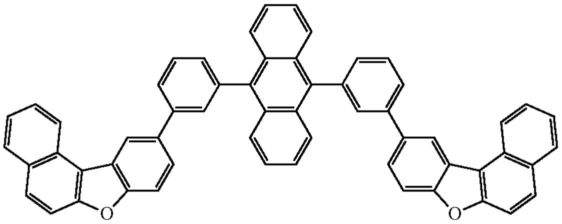
H115
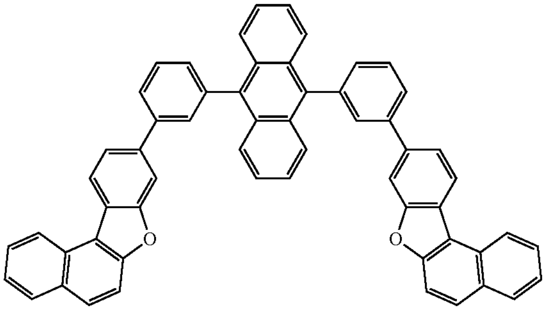
-continued
H116
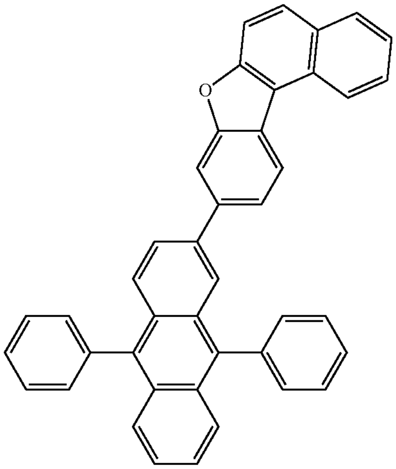
H117
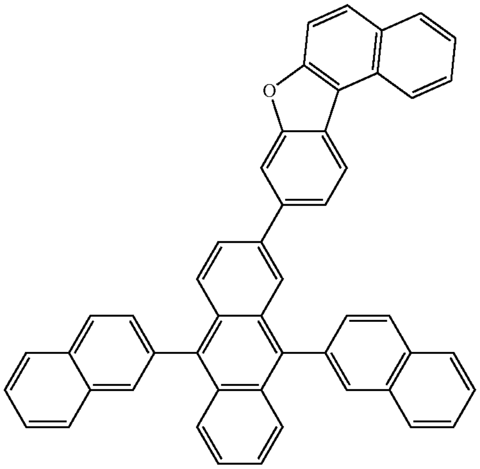
H118
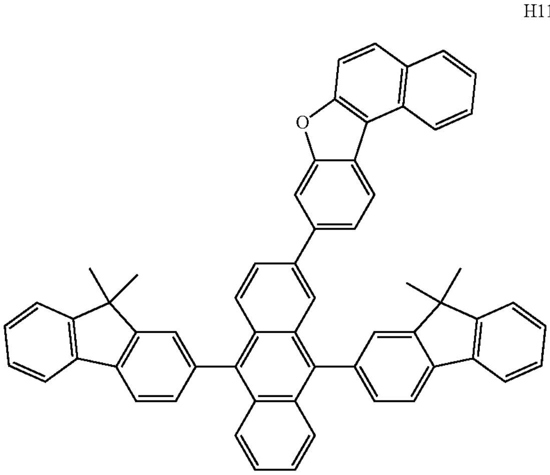

-continued
H119
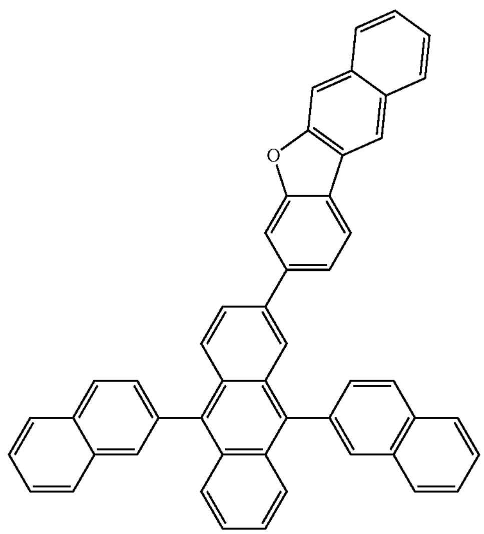
H120
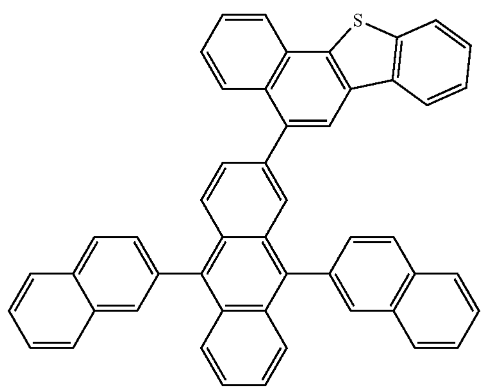
H121
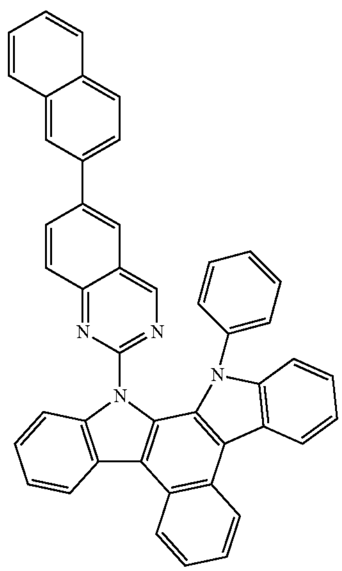
-continued
H122
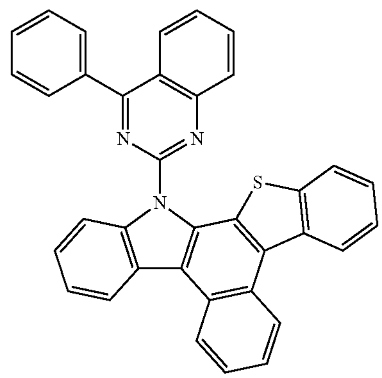
H123
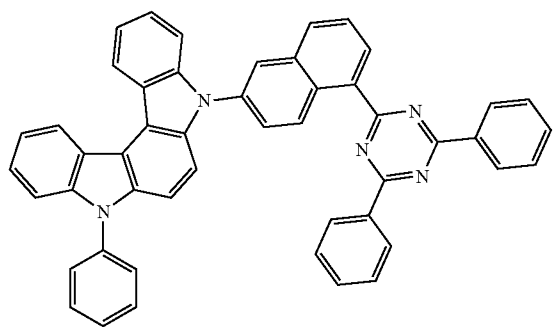
H124
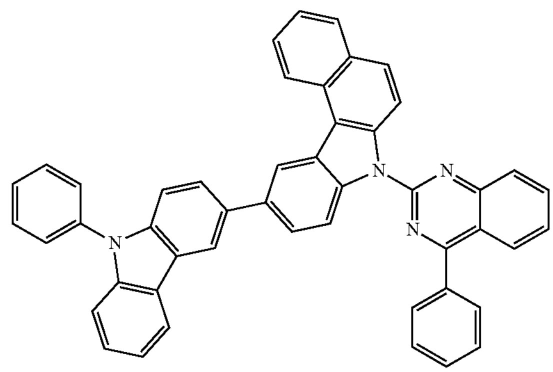
H125
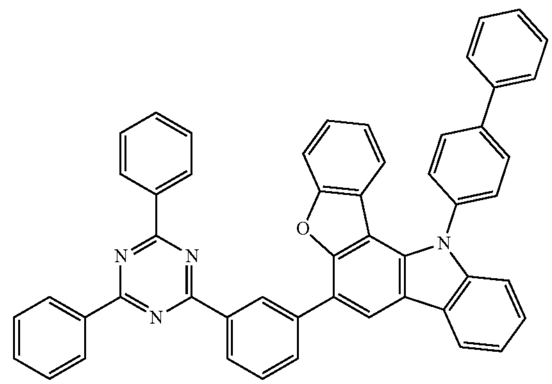

-continued

H126

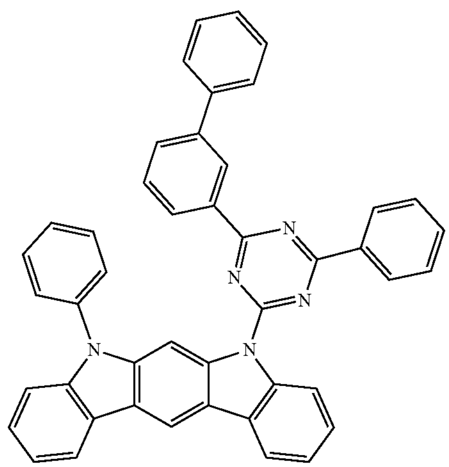

H127

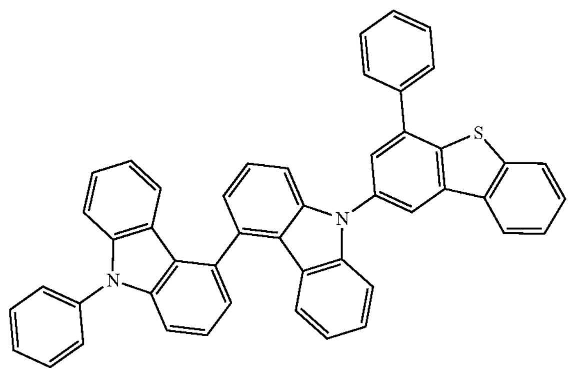

H128

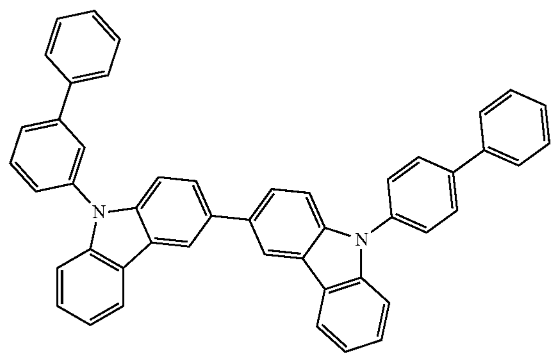

[Phosphorescent Dopant]

The phosphorescent dopant may be the organometallic compound represented by Formula 1.

In an embodiment, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In embodiments, the phosphorescent dopant may include an organometallic compound represented by Formula 401:

[Formula 401]

$M(L_{401})_{xc1}(L_{402})_{xc2}$

[Formula 402]

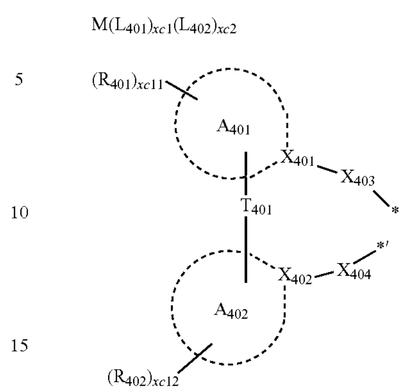

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$ (s) may be identical to or different from each other, $L_{402}$ may be an organic ligand, and xc2 may be 0, 1, 2, 3, or 4, wherein when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described herein with respect to $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described herein with respect to $Q_1$, xc11 and xc12 may each independently be an integer from 0 to 10, and

* and *' in Formula 402 each indicate a binding site to M in Formula 401.

In an embodiment, in Formula 402, $X_{401}$ may be nitrogen and $X_{402}$ may be carbon, or $X_{401}$ and $X_{402}$ may each be nitrogen.

In an embodiment, in Formula 401, when xc1 is 2 or more, two ring $A_{401}$(s) among two or more of $L_{401}$ may optionally be bonded to each other via $T_{402}$, which is a linking group, and two ring $A_{402}$(s) among two or more of $L_{401}$ may optionally be bonded to each other via $T_{403}$, which is a linking group (see Compounds PD1 to PD4 and PD7). $T_{402}$ and $T_{403}$ may each independently be the same as described herein with respect to $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(═O), an isonitrile group, —CN group, a phosphorus group (for example, a phosphine group, a phosphite group, etc.), or any combination thereof.

The phosphorescent dopant may include, for example, one of Compounds PD1 to PD39, or any combination thereof:

PD1

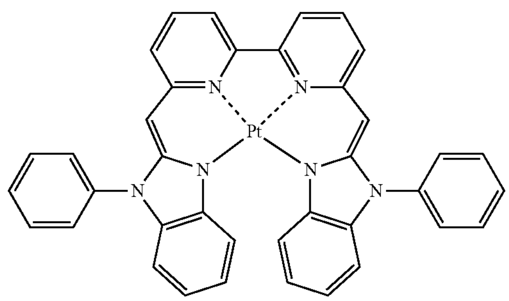

PD2

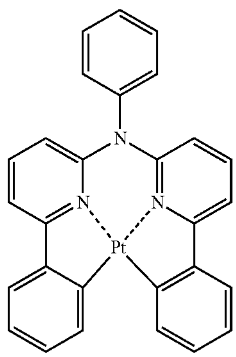

PD3

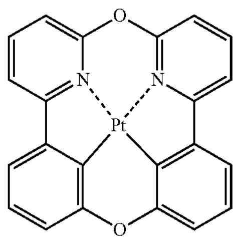

PD4

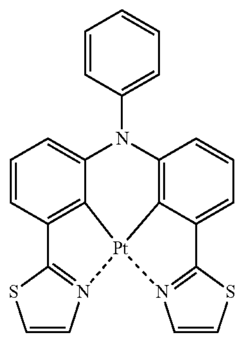

-continued

PD5

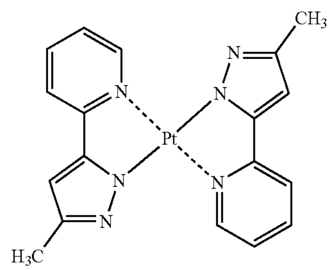

PD6

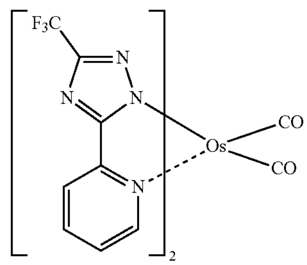

PD7

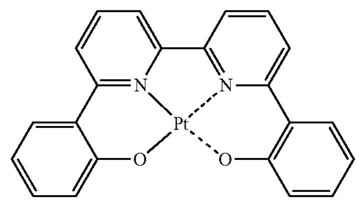

PD8

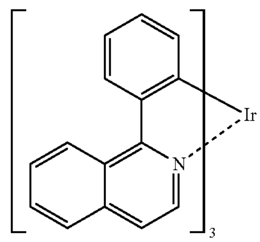

PD9

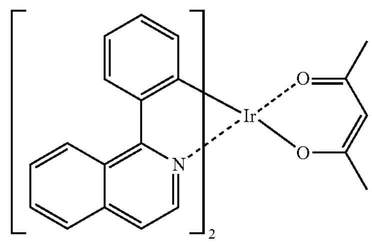

PD10

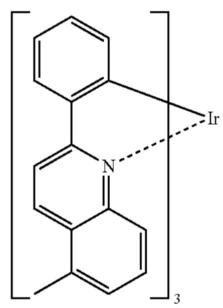

-continued
PD11
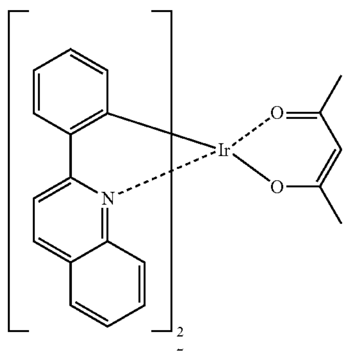
PD12
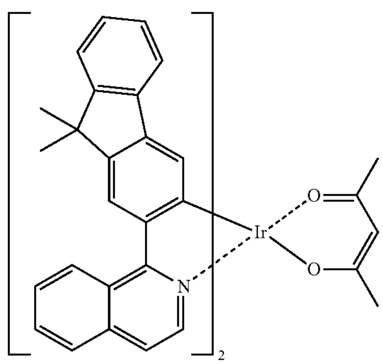
PD13
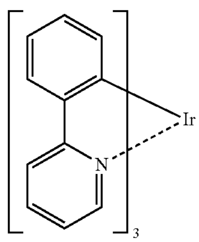
PD14
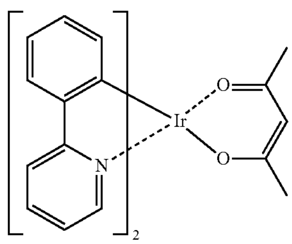
PD15
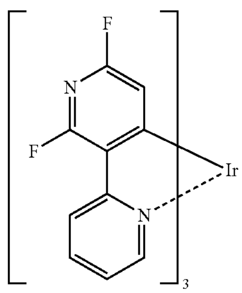
-continued
PD16
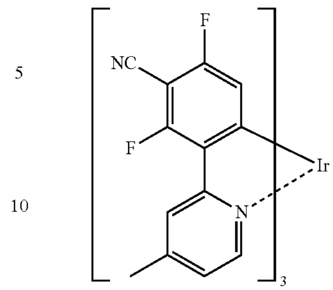
PD17
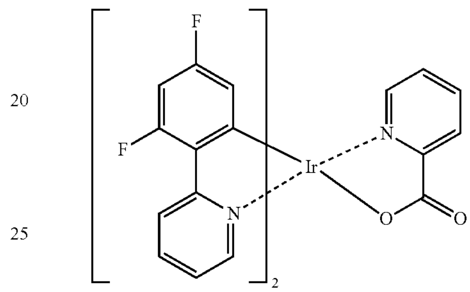
PD18
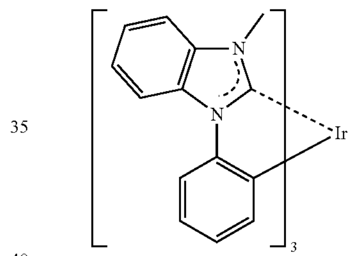
PD19
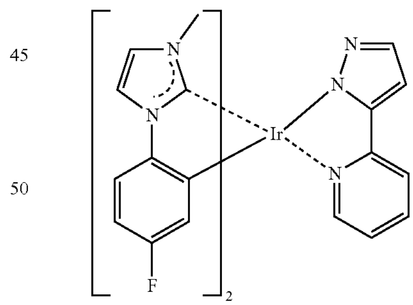
PD20
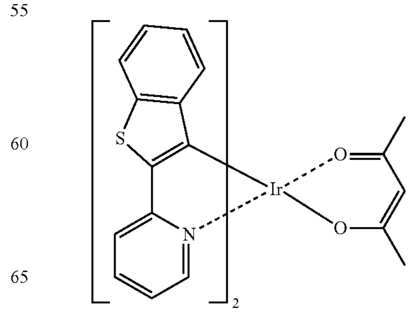

-continued
PD21
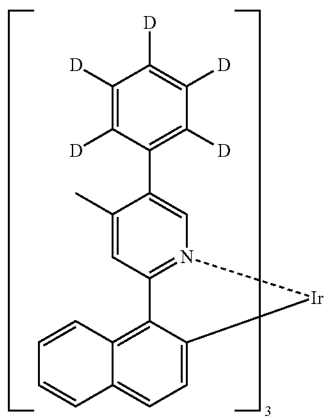
PD22
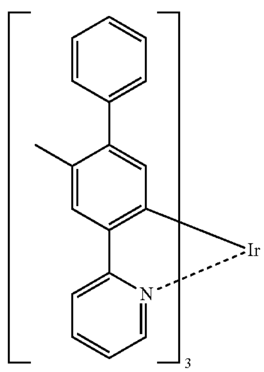
PD23
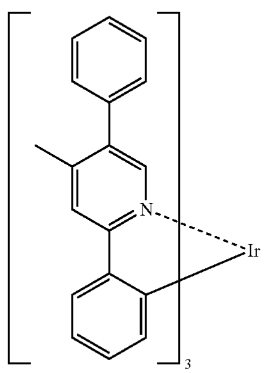
PD24
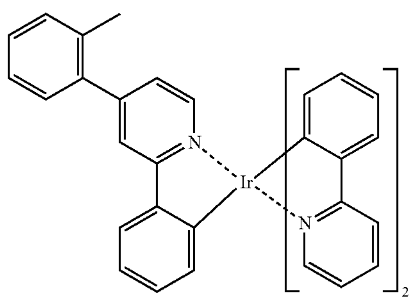
-continued
PD25
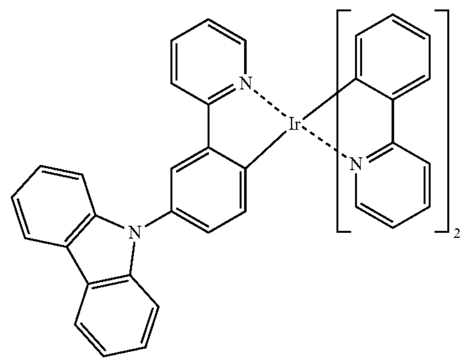
PD26
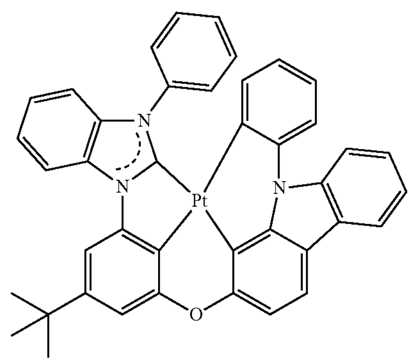
PD27
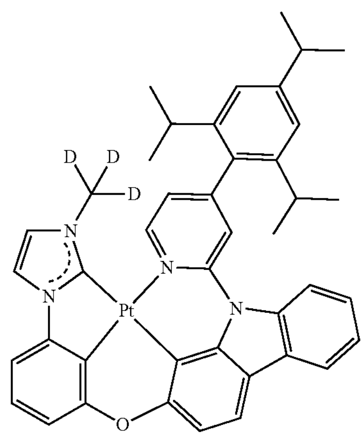
PD28
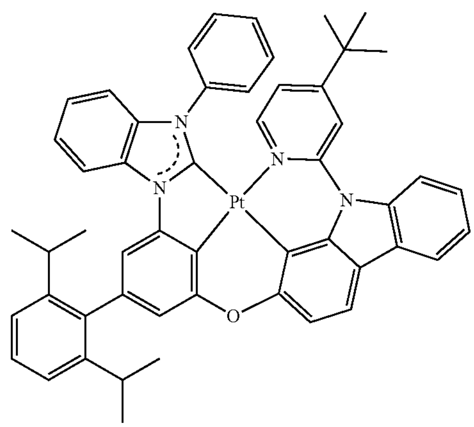

-continued
PD29
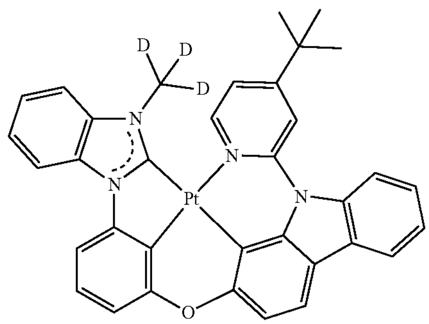
PD30
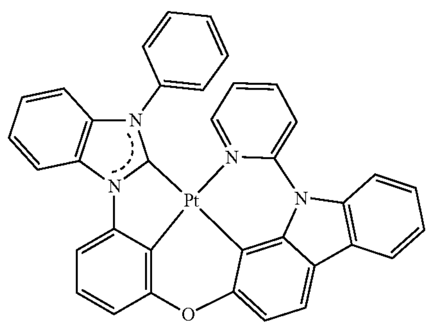
PD31
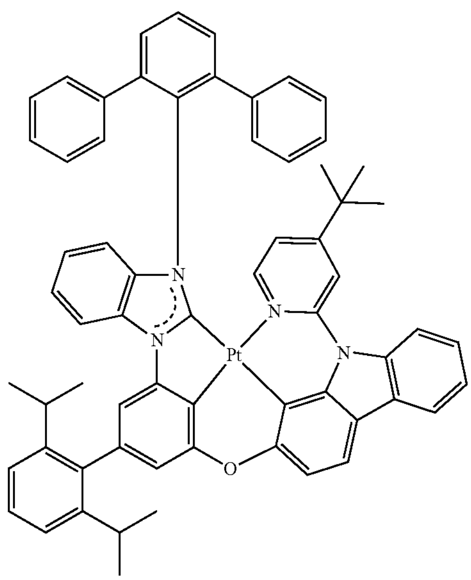
-continued
PD32
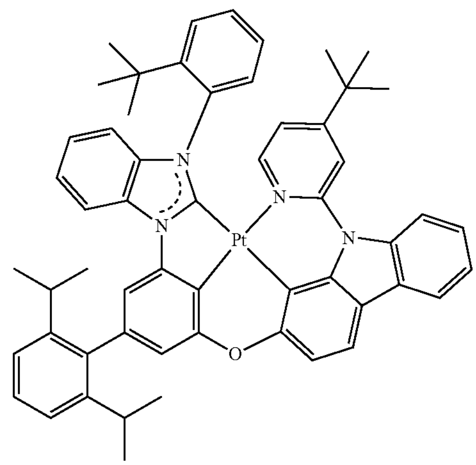
PD33
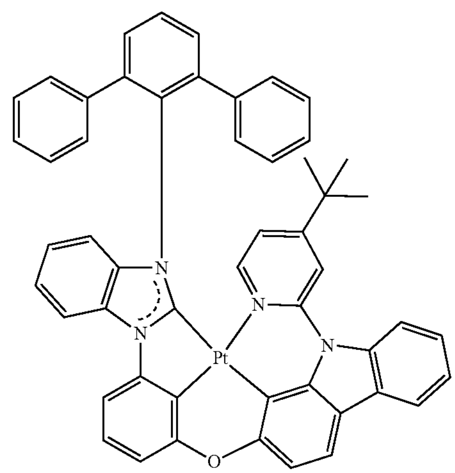
PD34
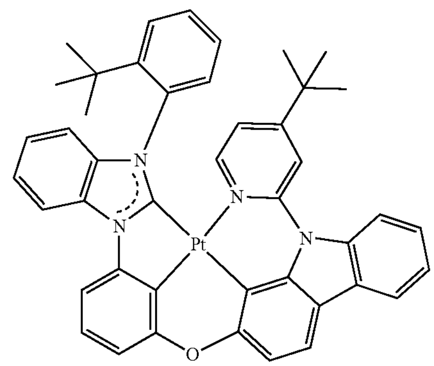

-continued

PD35

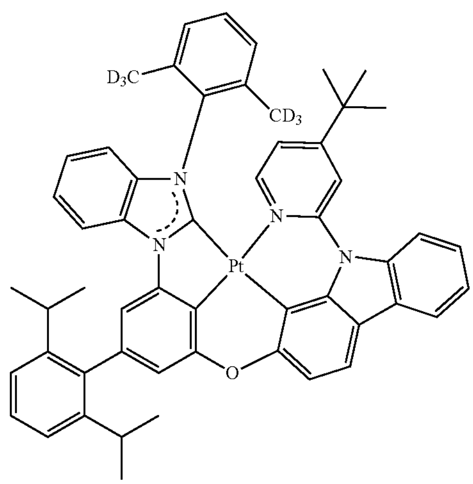

PD36

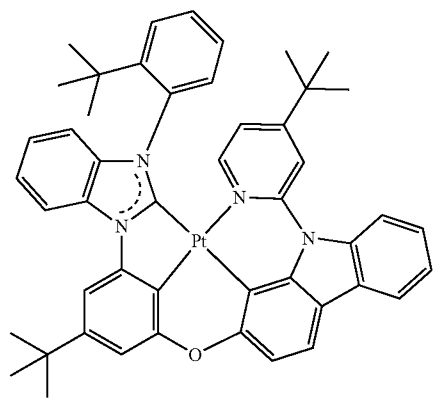

PD37

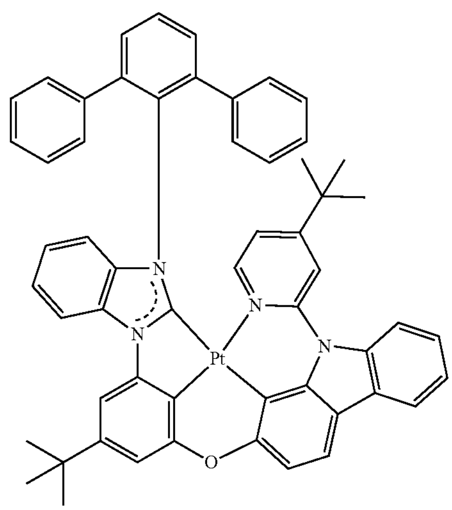

-continued

PD38

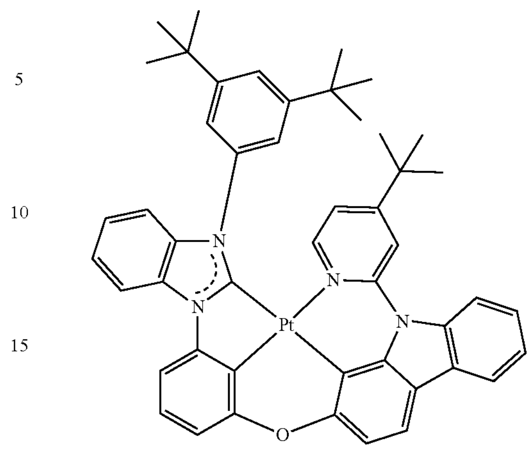

PD39

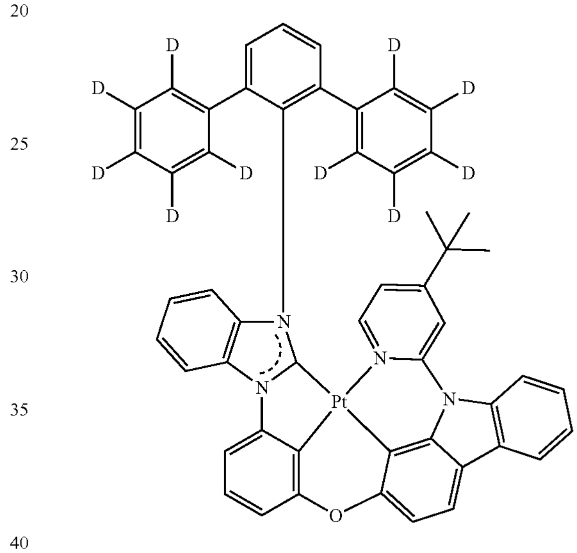

.

[Fluorescent Dopant]

The fluorescent dopant may include an amine group-containing compound, a styryl group-containing compound, or any combination thereof.

In an embodiment, the fluorescent dopant may include a compound represented by Formula 501:

[Formula 501]

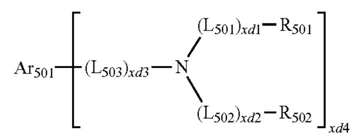

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, in Formula 501, $Ar_{501}$ may be a condensed cyclic group (for example, an anthracene group, a chrysene group, or a pyrene group) in which three or more monocyclic groups are condensed together.
In an embodiment, in Formula 501, xd4 may be 2.
In an embodiment, the fluorescent dopant may include one of Compounds FD1 to FD37, DPVBi, DPAVBi, or any combination thereof:
FD1
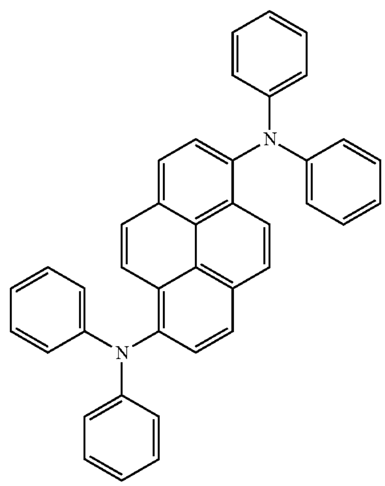
FD2
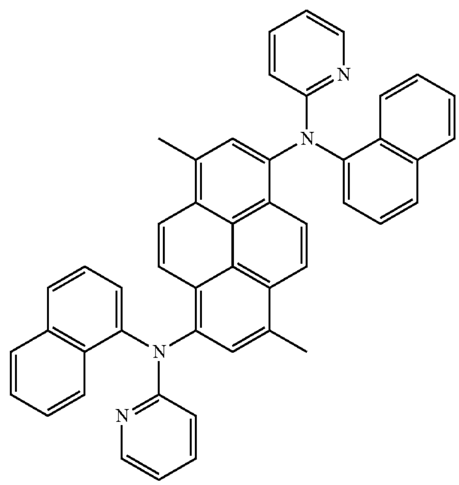
FD3
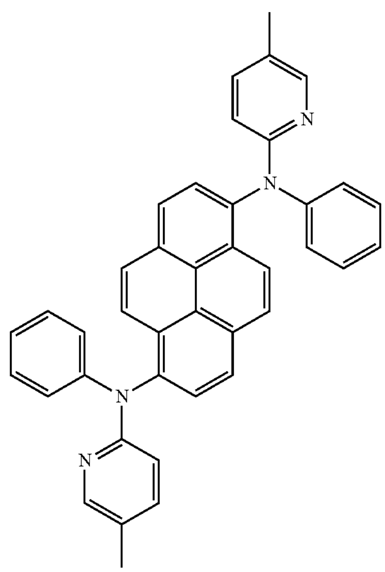
-continued
FD4
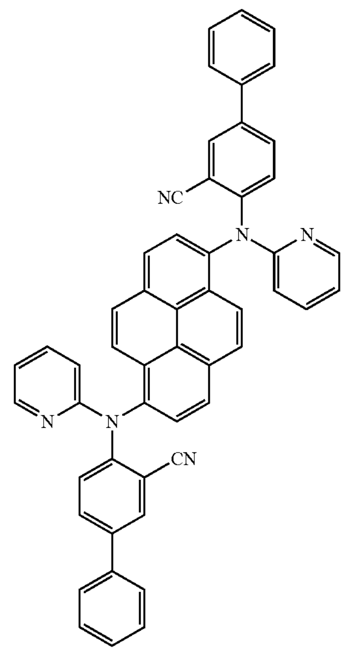
FD5
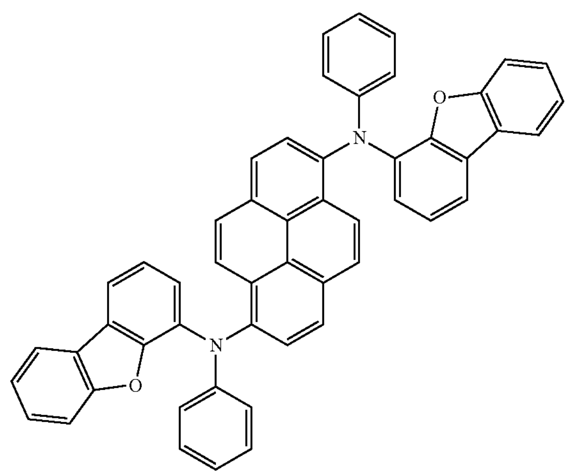
FD6
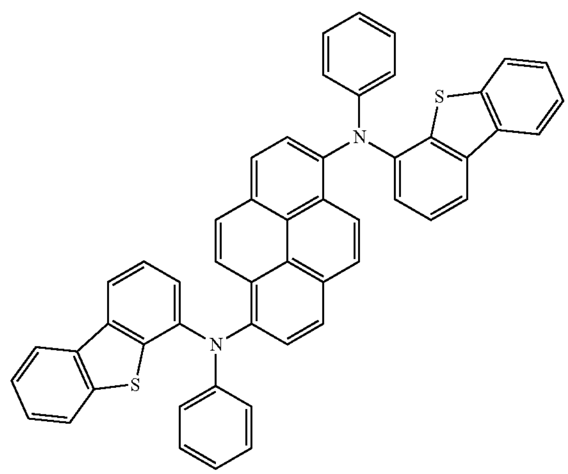

-continued
FD7
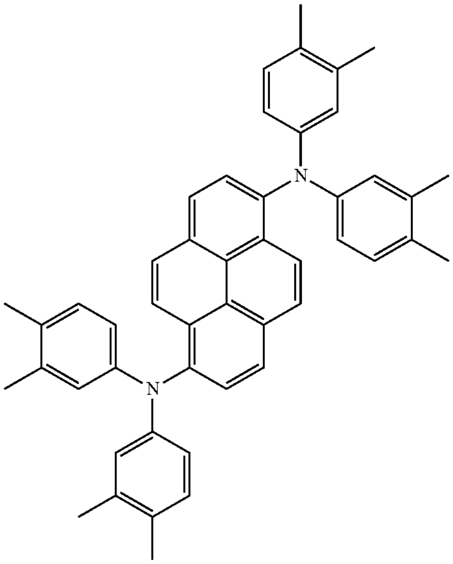
FD8
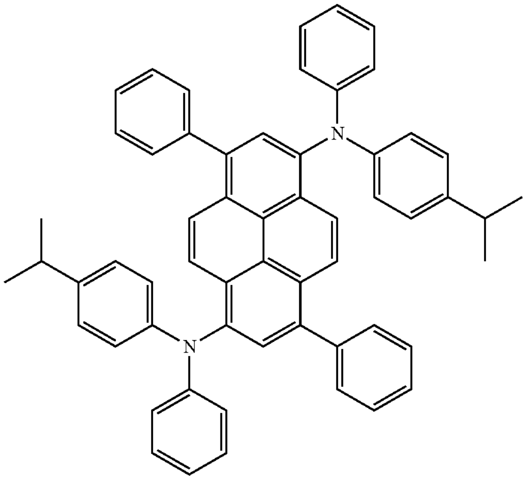
FD9
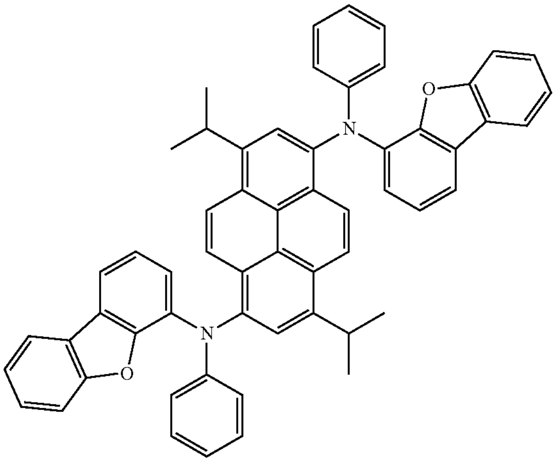
-continued
FD10
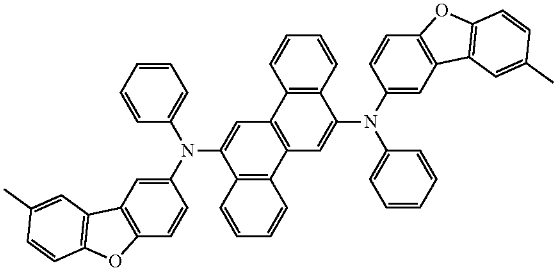
FD11
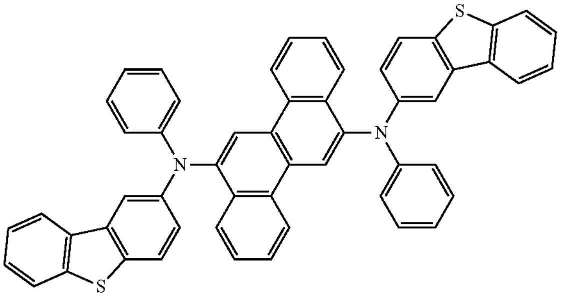
FD12
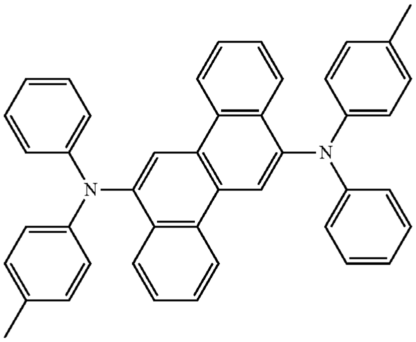
FD13
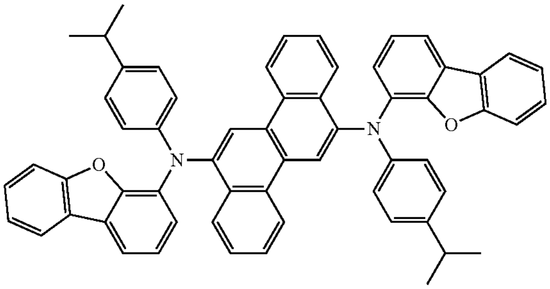
FD14
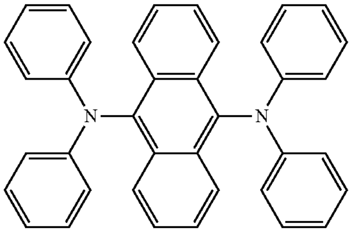

-continued
FD15
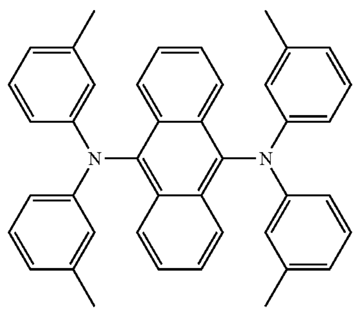
FD16
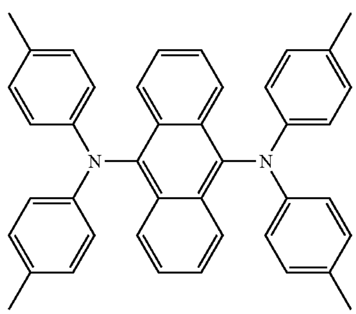
FD17
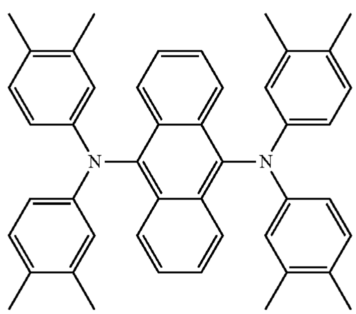
FD18
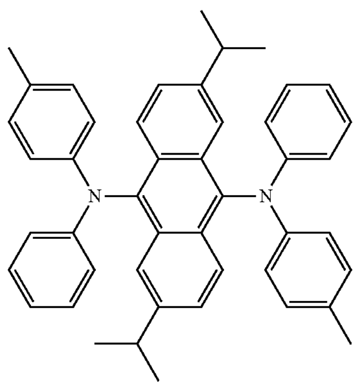
-continued
FD19
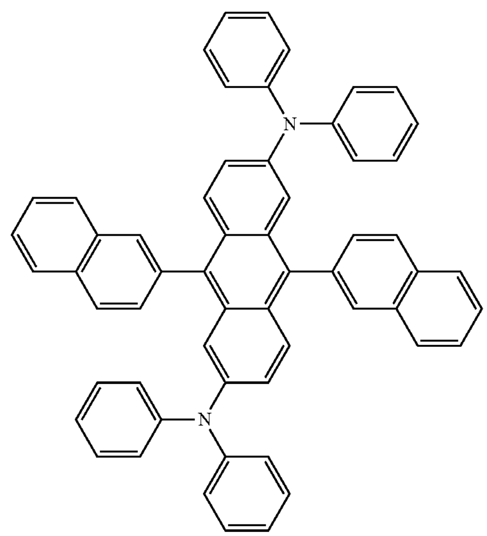
FD20
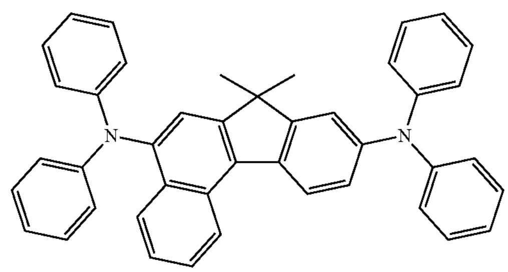
FD21
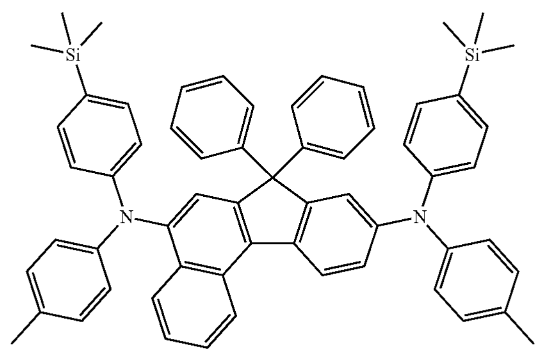
FD22
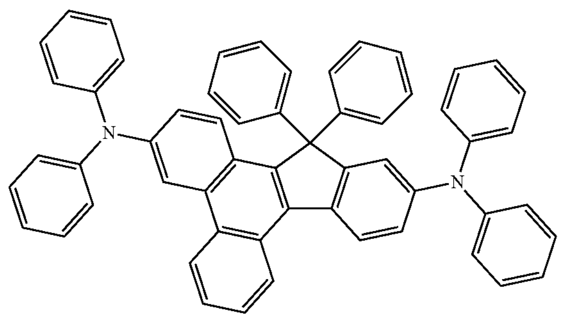

-continued
FD23
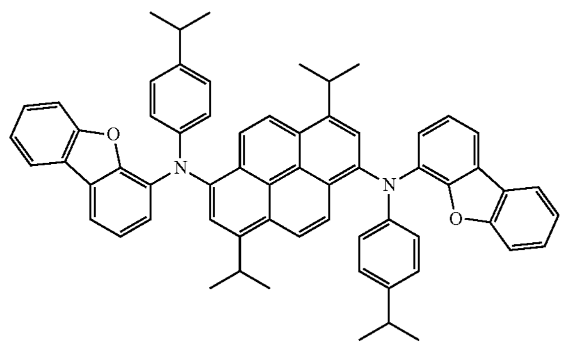
FD24
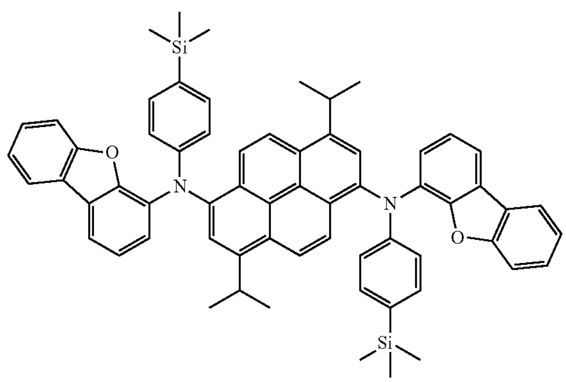
FD25
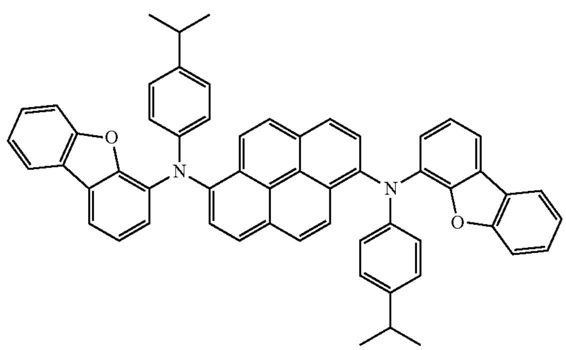
FD26
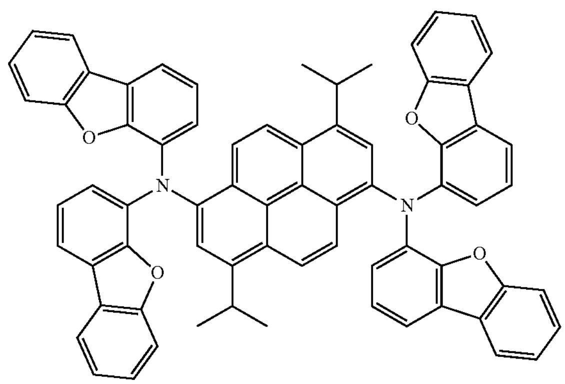
-continued
FD27
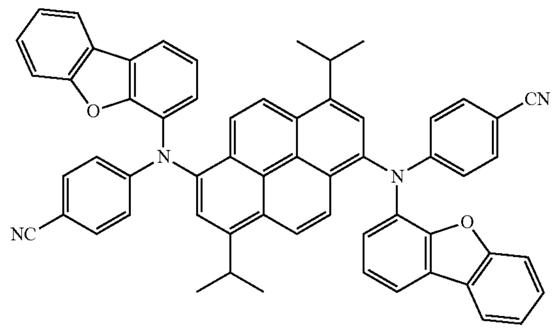
FD28
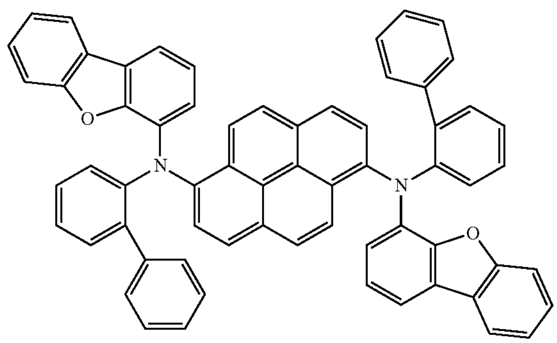
FD29
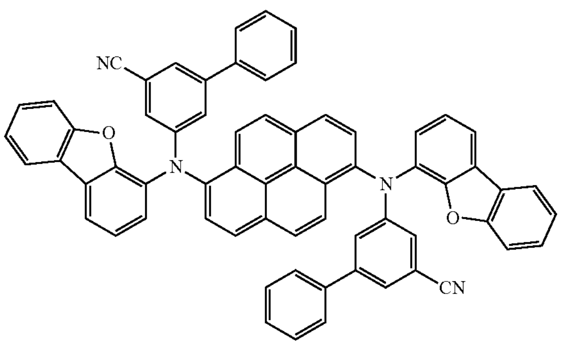
FD30
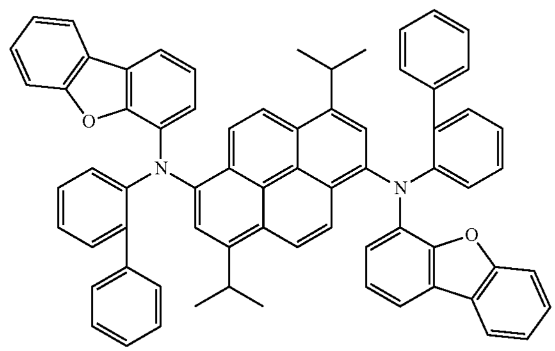

-continued
FD31
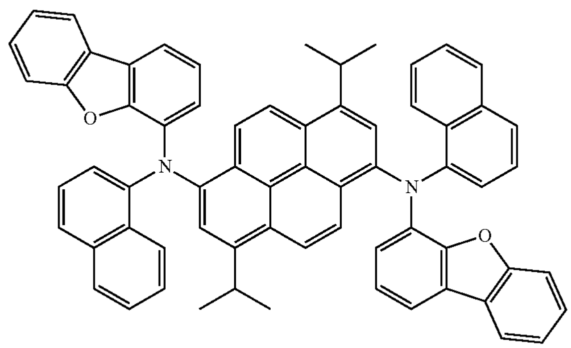
FD32
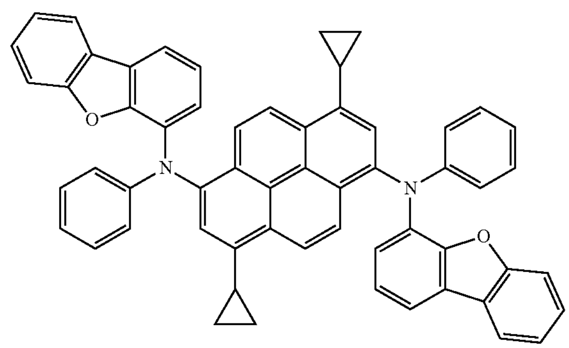
FD33
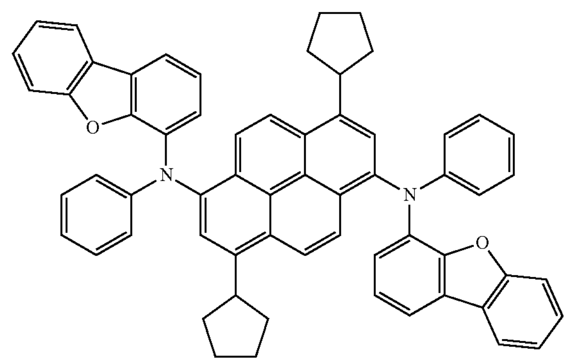
FD34
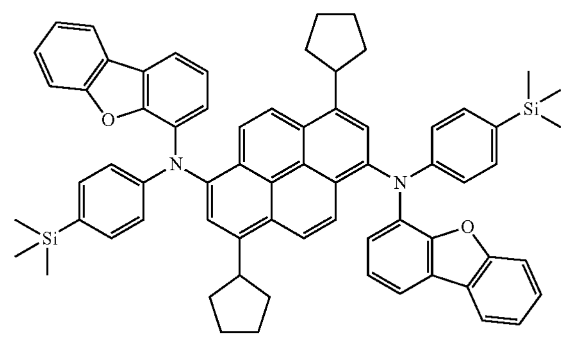
-continued
FD35
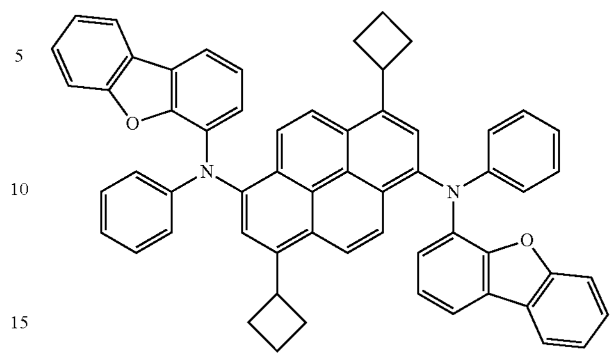
FD36
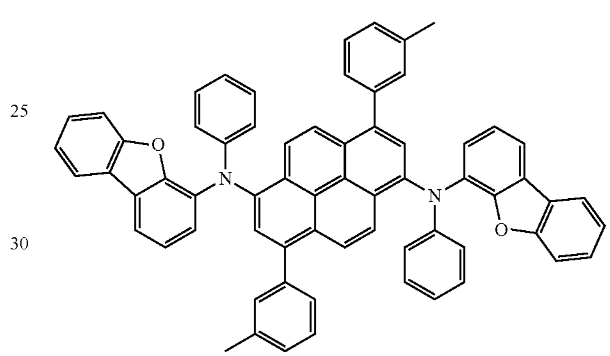
FD37
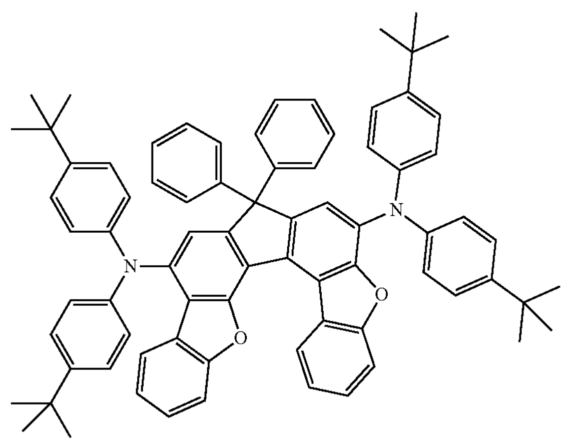
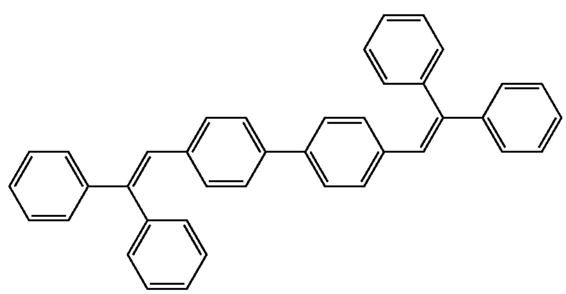
DPVBi -continued

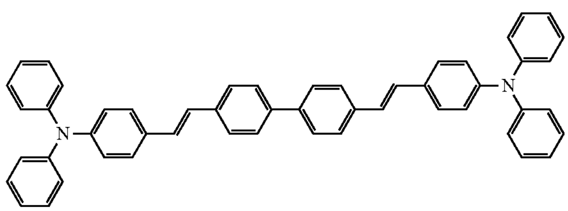

DPAVBi

[Delayed Fluorescence Material]

The emission layer may include a delayed fluorescence material.

In the specification, the delayed fluorescence material may be selected from compounds capable of emitting delayed fluorescent light based on a delayed fluorescence emission mechanism.

The delayed fluorescence material included in the emission layer may serve as a host or as a dopant, depending on the types of other materials included in the emission layer.

In an embodiment, a difference between a triplet energy level (eV) of the delayed fluorescence material and a singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In embodiments, the delayed fluorescence material may include: a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group); or a material including a $C_8$-$C_{60}$ polycyclic group in which two or more cyclic groups are condensed while sharing boron (B).

Examples of the delayed fluorescence material may include at least one of Compounds DF1 to DF14:

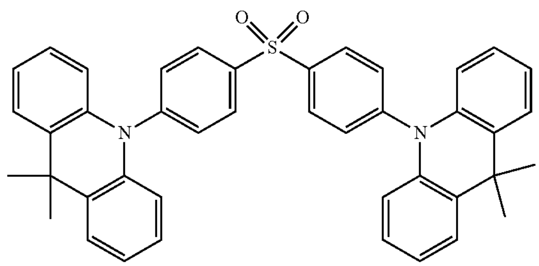

DF1(DMAC-DPS)

-continued

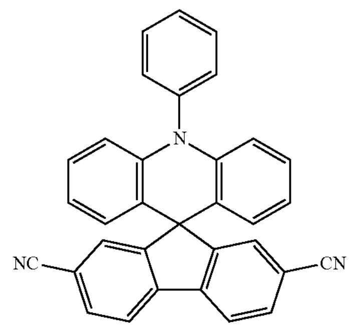

DF2(ACRFLCN)

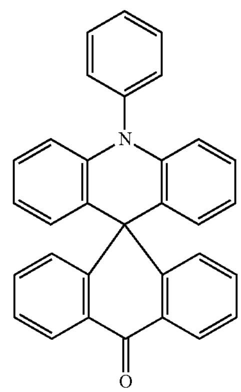

DF3(ACRSA)

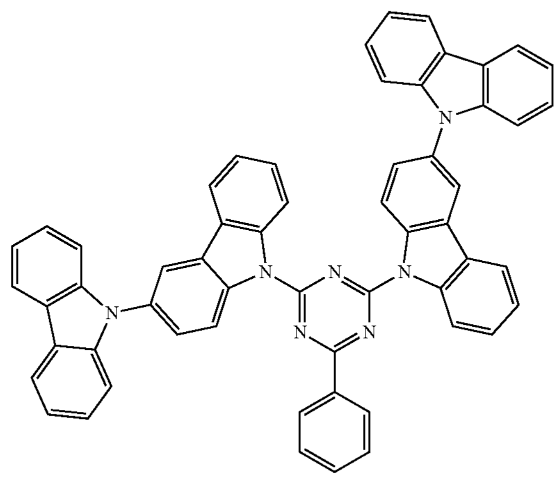

DF4(CC2TA)

-continued
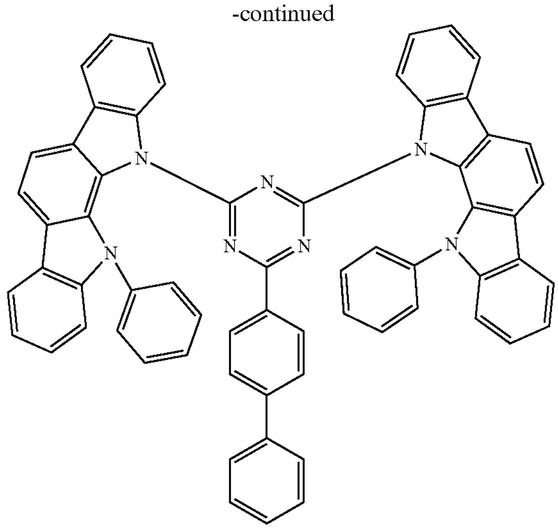
DF5(PIC-TRZ)
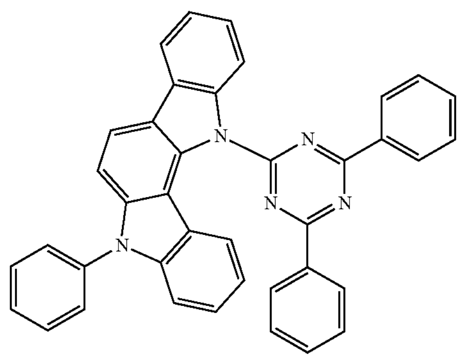
DF5(PIC-TRZ2)
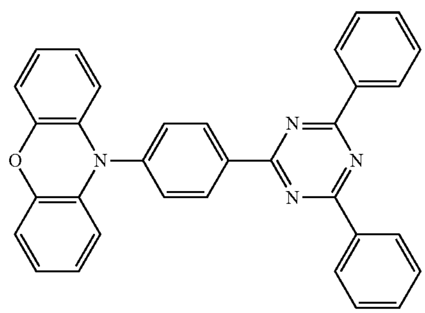
DF7(PXZ-TRZ)
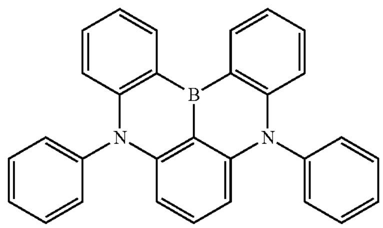
DF8(DABNA-1)
-continued
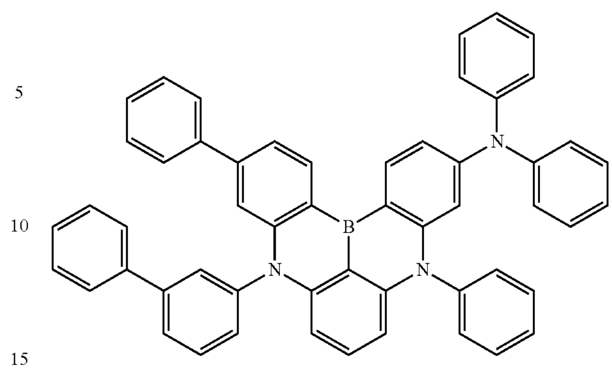
DF9(DABNA-2)
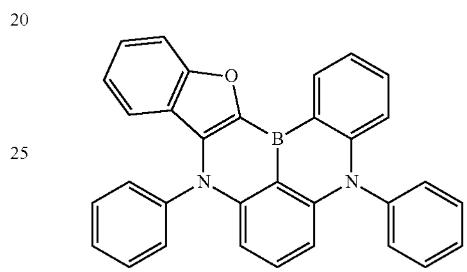
DF10
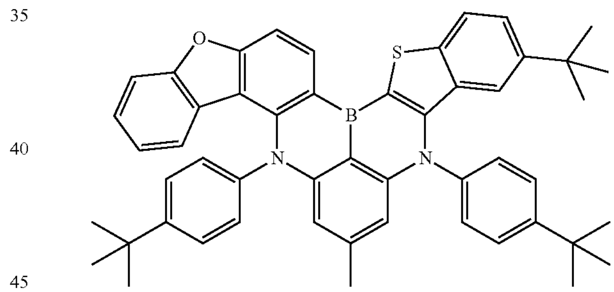
DF11
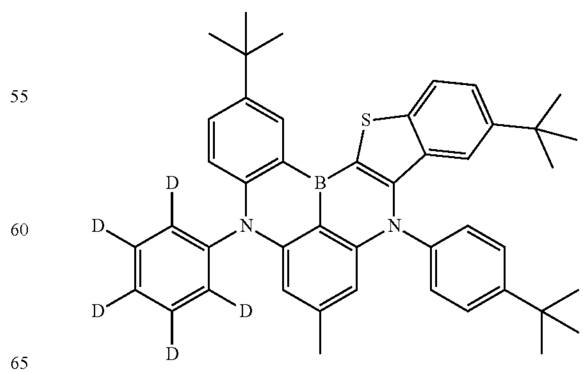
DF12

-continued

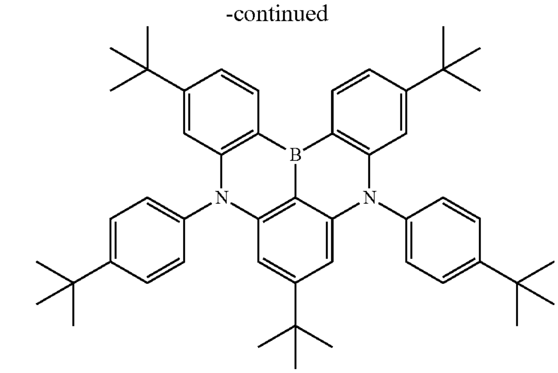

DF13

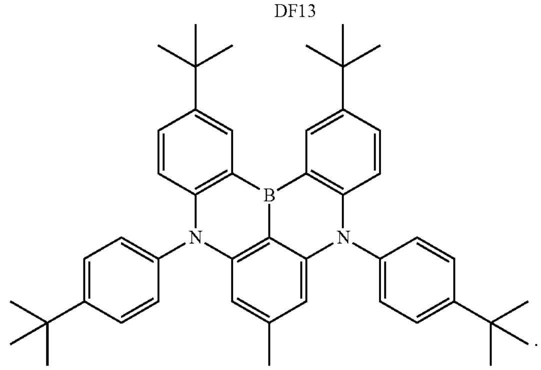

DF14

[Quantum Dot]

The emission layer may include a quantum dot.

In the specification, a quantum dot may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method that may include mixing a precursor material with an organic solvent and growing a quantum dot particle crystal. When the crystal grows, the organic solvent naturally acts as a dispersant coordinated on the surface of the quantum dot crystal and controls the growth of the crystal so that the growth of quantum dot particles can be controlled through a process which costs less, and may be more readily performed than vapor deposition methods, such as metal organic chemical vapor deposition (MOCVD) or molecular beam epitaxy (MBE), The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In an embodiment, the Group III-V semiconductor compound may further include a Group II element. Examples of the Group III-V semiconductor compound further including a Group II element may include InZnP, InGaZnP, InAlZnP, etc.

Examples of the Group III-VI semiconductor compound may include: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and any combination thereof.

Examples of the Group I-III-VI semiconductor compound may include: a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

Examples of the Group IV element or compound may include: a single element material, such as Si or Ge; a binary compound, such as SiC or SiGe; or any combination thereof.

Each element included in a multi-element compound such as a binary compound, a ternary compound, or a quaternary compound may be present in a particle at a uniform concentration or at a non-uniform concentration.

In embodiments, the quantum dot may have a single structure in which the concentration of each element in the quantum dot is uniform, or the quantum dot may have a core-shell structure. In an embodiment, in case that the quantum dot has a core-shell structure, a material included in the core and a material included in the shell may be different from each other.

The shell of the quantum dot may serve as a protective layer that prevents chemical degeneration of the core to maintain semiconductor characteristics, and/or may serve as a charging layer that imparts electrophoretic characteristics to the quantum dot. The shell may be a single layer or a multi-layer. An interface between the core and the shell may have a concentration gradient in which the concentration of a material that is present in the shell decreases toward the core.

Examples of the shell of the quantum dot may include a metal oxide, a metalloid oxide, a non-metal oxide, a semiconductor compound, or any combination thereof. Examples of the metal oxide, the metalloid oxide, or the non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof.

Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. Within these ranges, color purity or color reproducibility may be increased. Light emitted through the quantum dot may be emitted in all directions, so that a wide viewing angle may be improved.

In embodiments, the quantum dot may be in the form of a spherical particle, a pyramidal particle, a multi-arm particle, a cubic nanoparticle, a nanotube particle, a nanowire particle, a nanofiber particle, or a nanoplate particle.

Since the energy band gap may be adjusted by controlling the size of the quantum dot, light having various wavelength bands may be obtained from a quantum dot emission layer. Accordingly, by using quantum dots of different sizes, a light-emitting device that emits light of various wavelengths may be implemented. In an embodiment, the size of the quantum dot may be selected to emit red, green, and/or blue light. In an embodiment, the size of the quantum dot may be configured to emit white light by combination of light of various colors.

[Electron Transport Region in Interlayer 130]

The electron transport region may have a structure consisting of a layer consisting of a single material, a structure consisting of a layer including different materials, or a structure including multiple layers including different materials.

The electron transport region may include a buffer layer, a hole-blocking layer, an electron control layer, an electron transport layer, an electron injection layer, or any combination thereof.

In embodiments, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, wherein the layers of each structure may be stacked from an emission layer in its respective stated order, but the structure of the electron transport region is not limited thereto.

In an embodiment, the electron transport region (for example, a buffer layer, a hole-blocking layer, an electron control layer, or an electron transport layer in the electron transport region) may include a metal-free compound including at least one π electron-deficient nitrogen-containing $C_1$-$C_{60}$ cyclic group.

In embodiments, the electron transport region may include a compound represented by Formula 601:

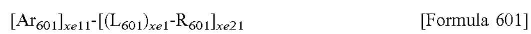

$[Ar_{601}]_{xe11}$-$[(L_{601})_{xe1}$-$R_{601}]_{xe21}$ [Formula 601]

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(═O)($Q_{601}$), —S(═O)$_2$($Q_{601}$), or —P(═O)($Q_{601}$)($Q_{602}$), $Q_{601}$ to $Q_{603}$ may each independently be the same as described herein with respect to $Q_1$, xe21 may be 1, 2, 3, 4, or 5, at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, in Formula 601, when xe11 is 2 or more, two or more of $Ar_{601}$(s) may be linked to each other via a single bond.

In embodiments, in Formula 601, $Ar_{601}$ may be an anthracene group unsubstituted or substituted with at least one $R_{10a}$.

In embodiments, the electron transport region may include a compound represented by Formula 601-1:

[Formula 601-1]

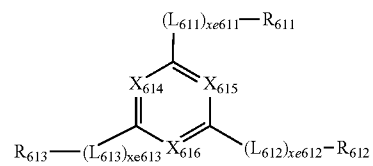

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may each be N, $L_{611}$ to $L_{613}$ may each independently be the same as described herein with respect to $L_{601}$, xe611 to xe613 may each independently be the same as described herein with respect to xe1, $R_{611}$ to $R_{613}$ may each independently be the same as described herein with respect to $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In embodiments, in Formulae 601 and 601-1, xe1 and xe611 to xe613 may each independently be 0, 1, or 2.

In an embodiment, the electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, TSPO1, or any combination thereof:

-continued
ET1
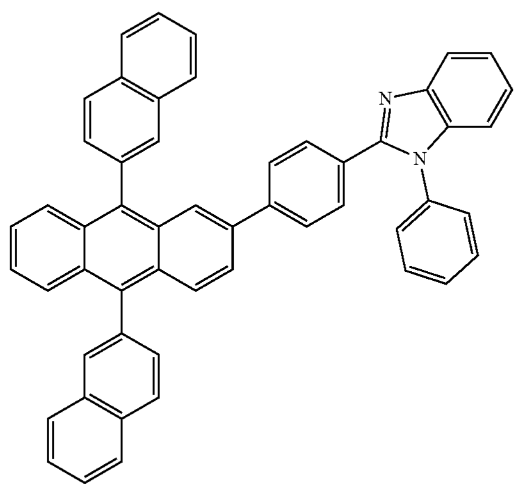
ET4
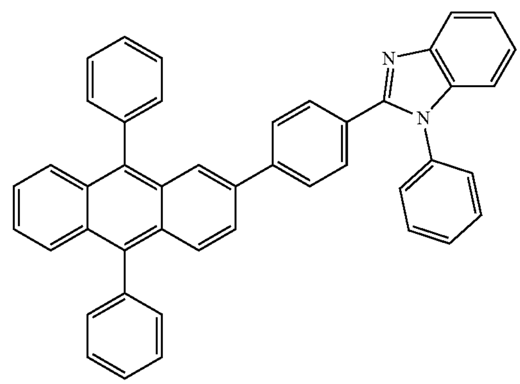
ET2
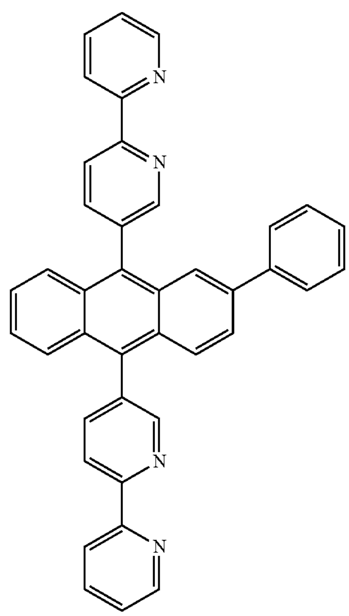
ET5
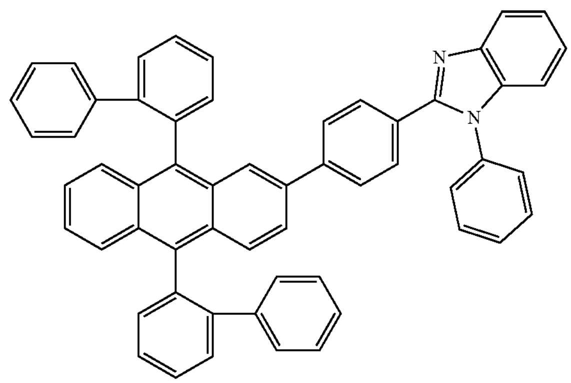
ET3
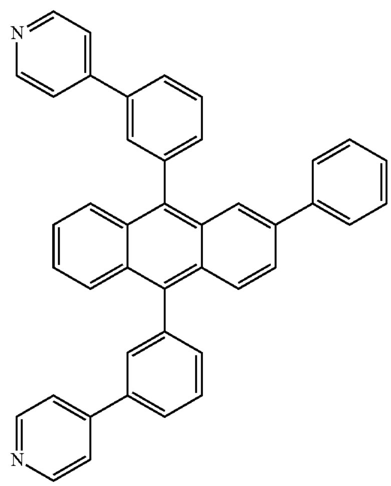
ET6
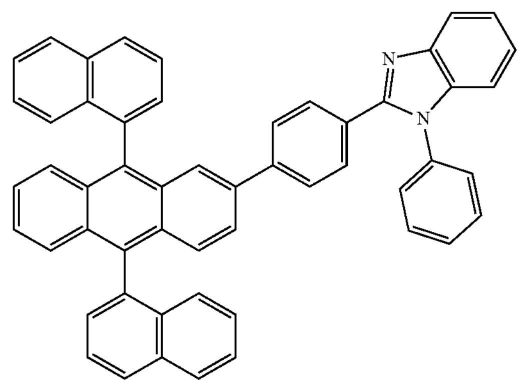

-continued
ET7
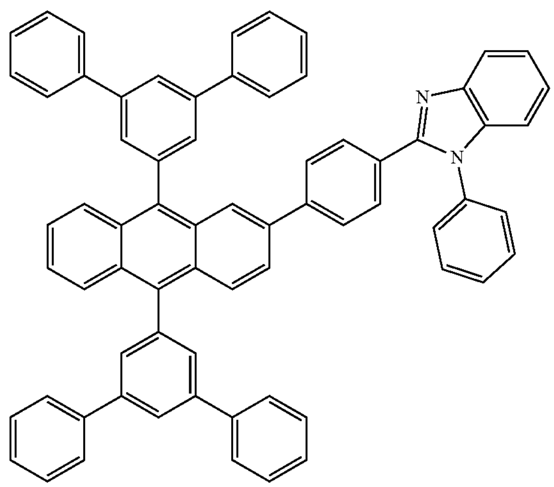
ET8
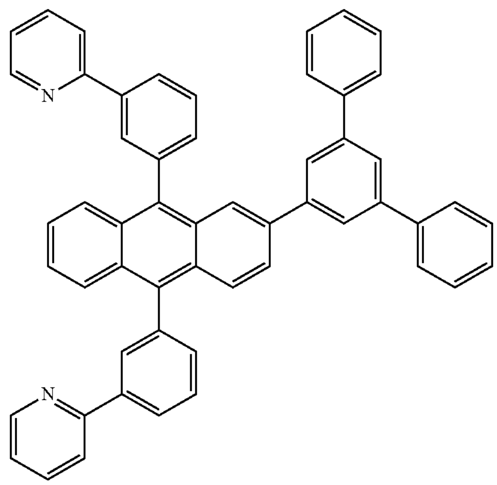
ET9
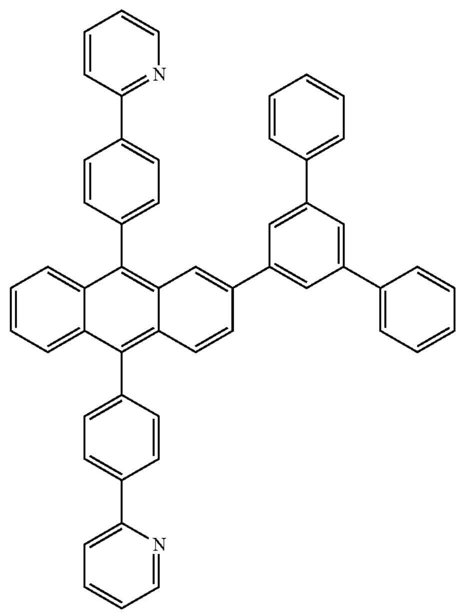
-continued
ET10
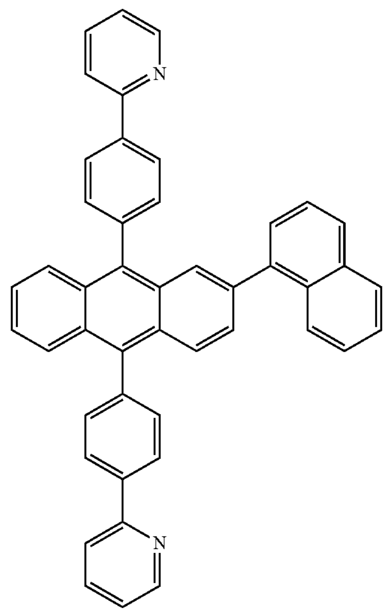
ET11
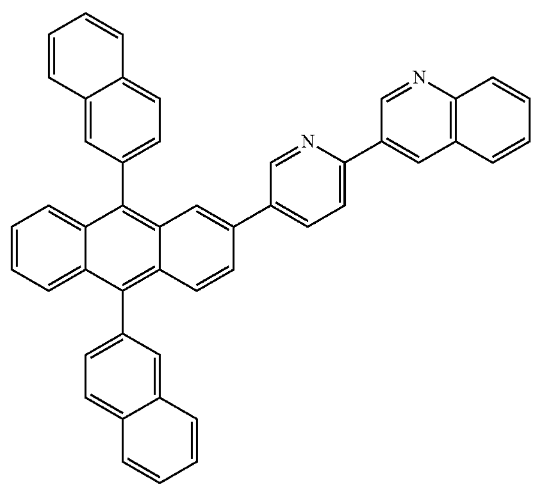
ET12
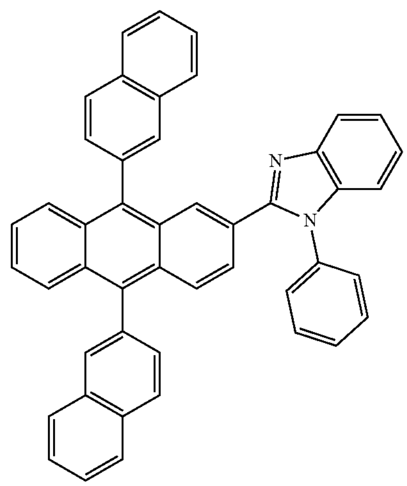

-continued
ET13
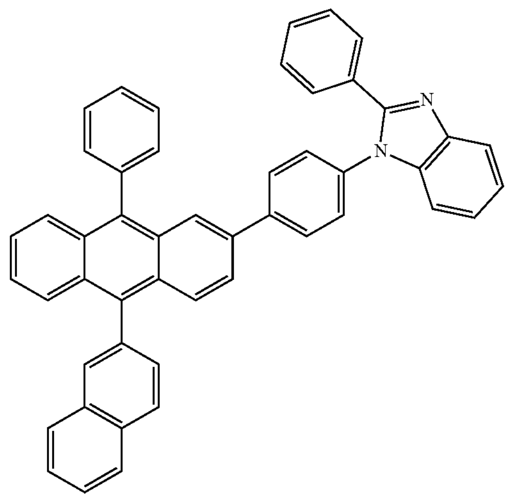
ET14
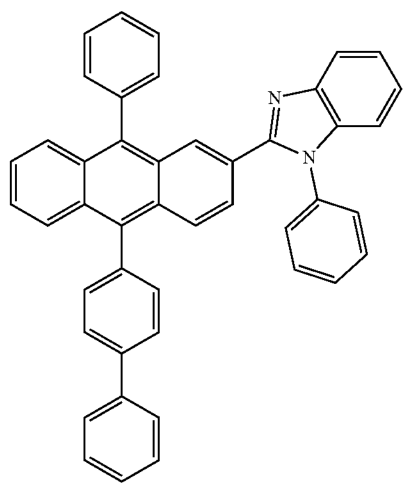
ET15
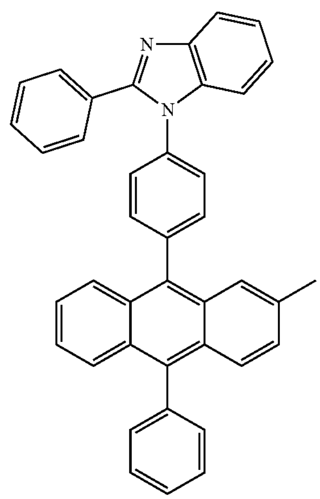
-continued
ET16
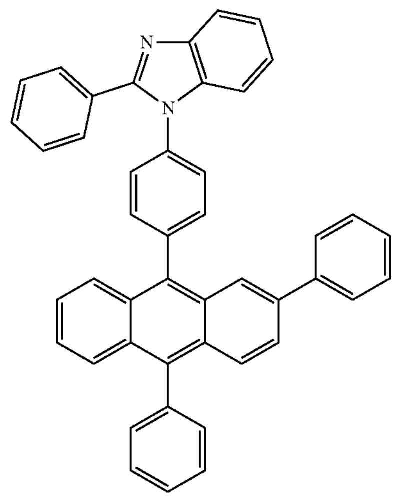
ET17
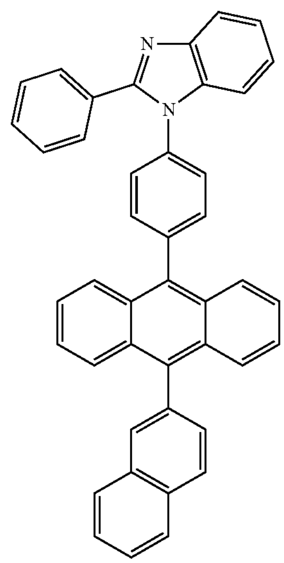
ET18
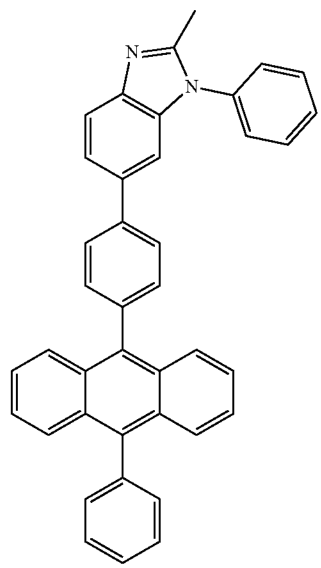

-continued
ET19
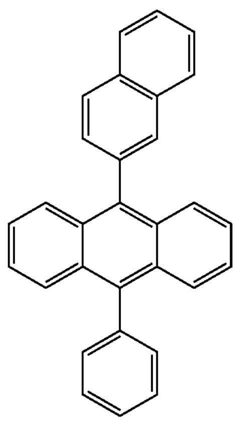
ET20
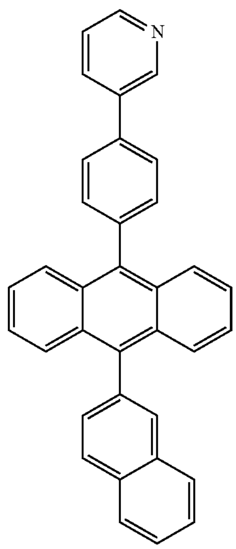
ET21
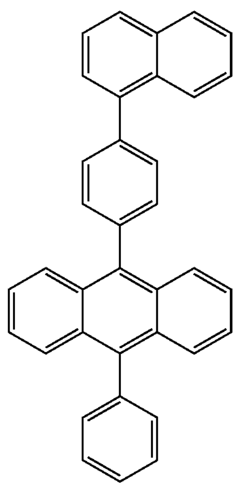
-continued
ET22
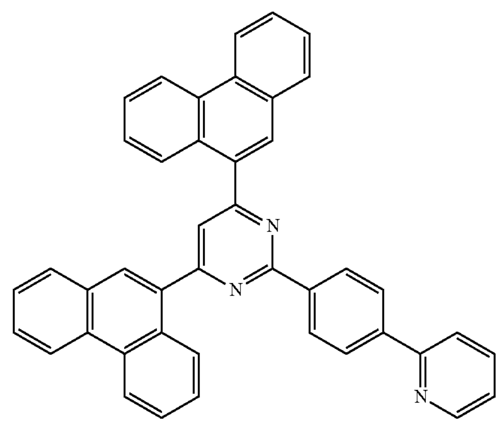
ET23
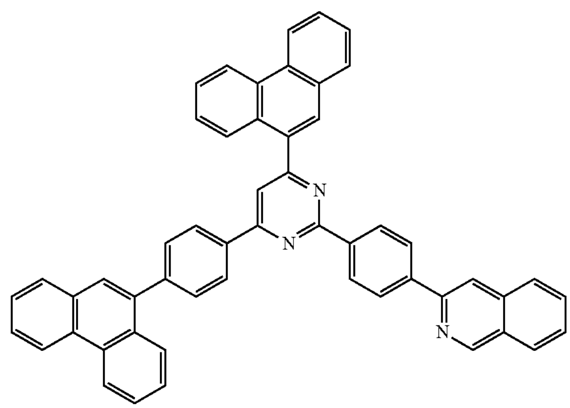
ET24
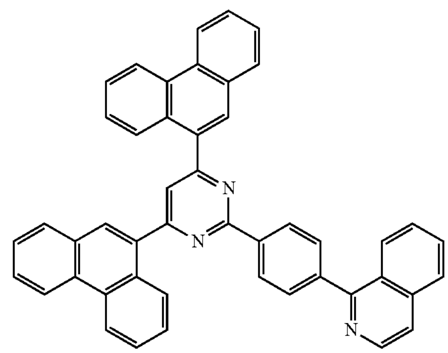
ET25
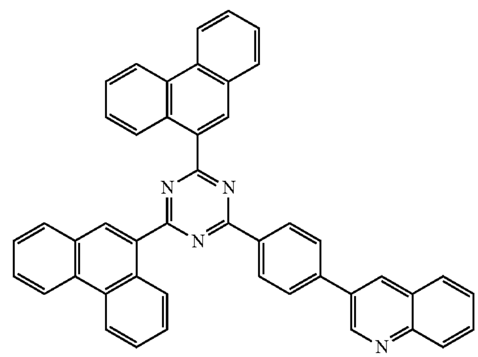

-continued
ET26
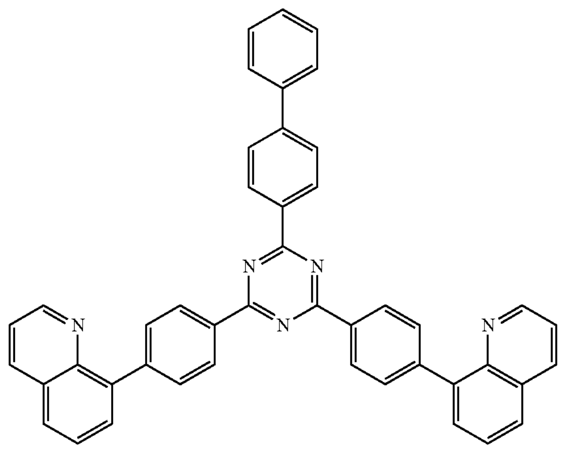
ET27
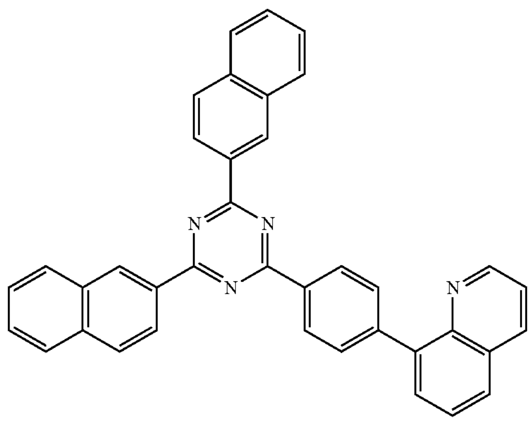
ET28
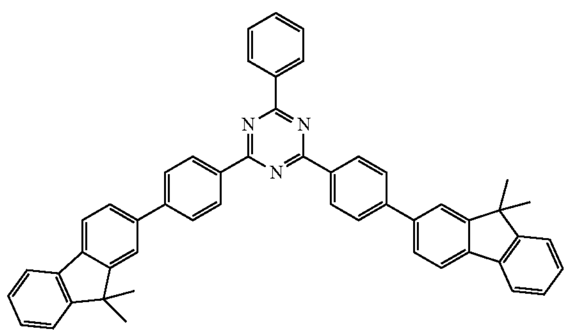
-continued
ET29
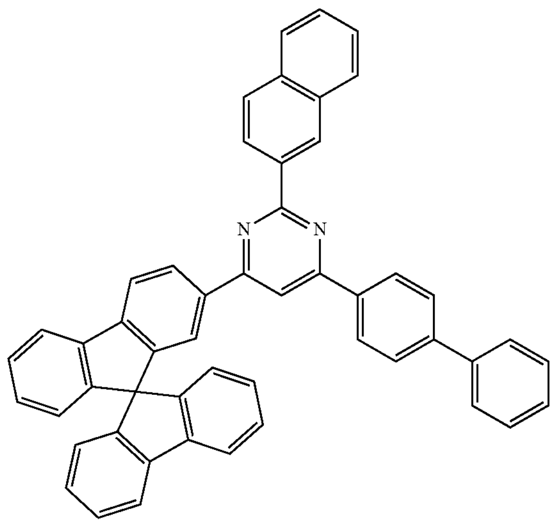
ET30
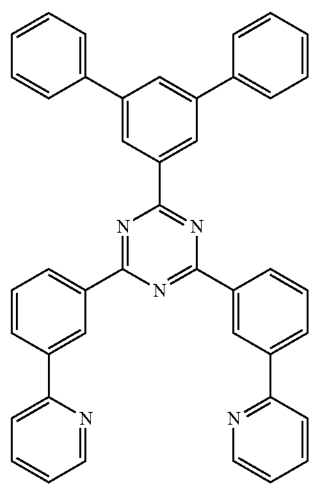
ET31
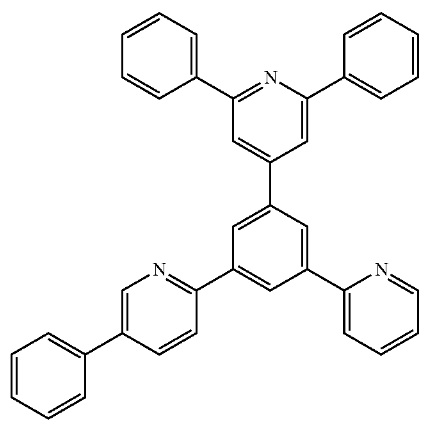

-continued
ET32
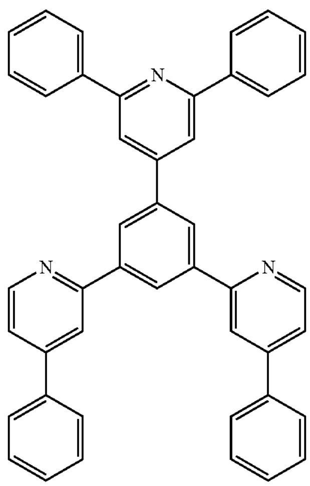
ET33
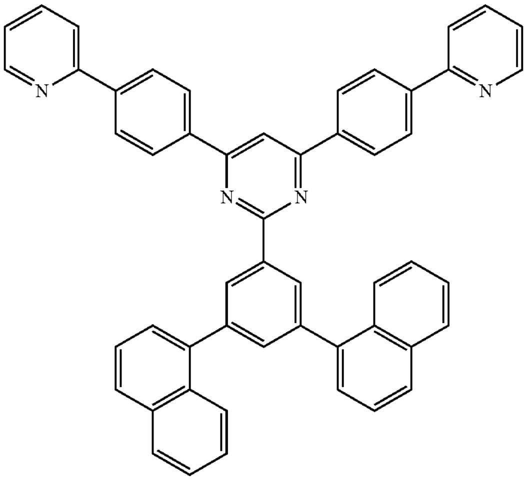
ET34
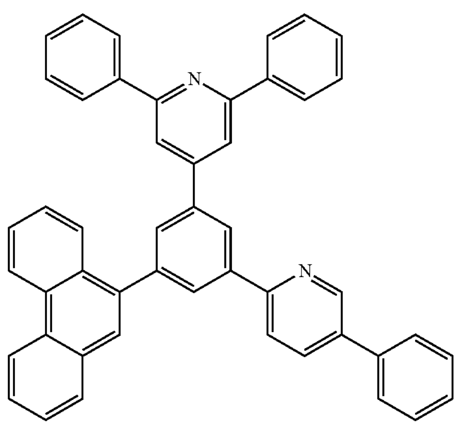
-continued
ET35
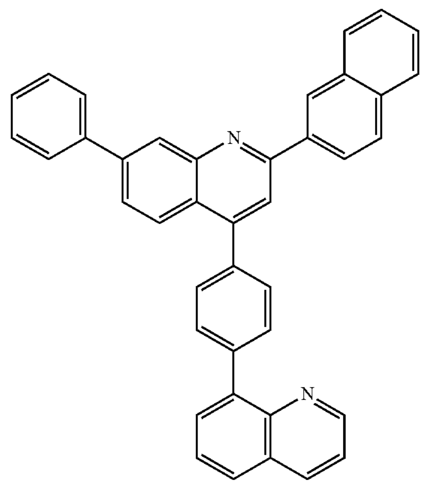
ET36
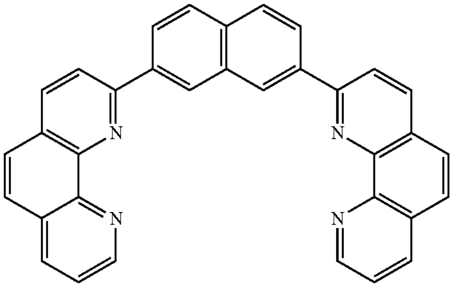
ET37
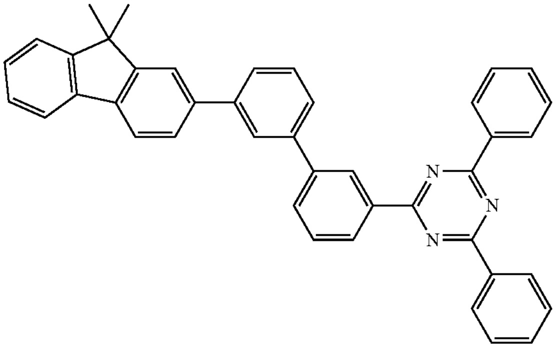
ET38
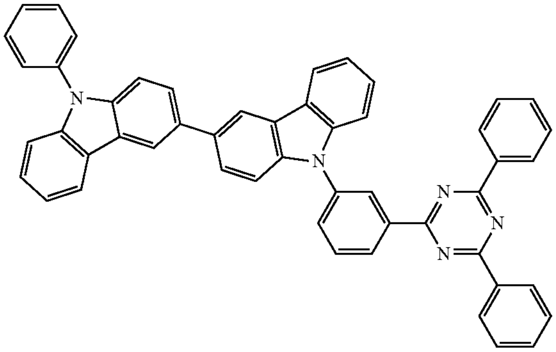

-continued
ET39
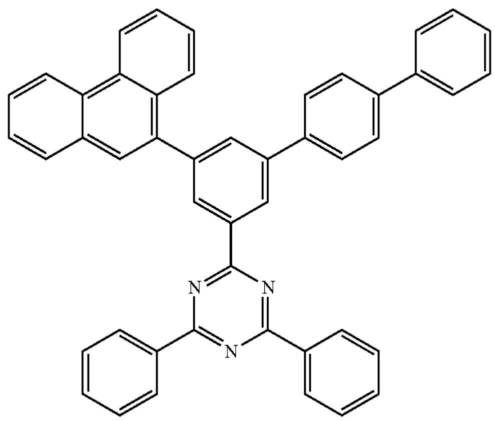
ET40
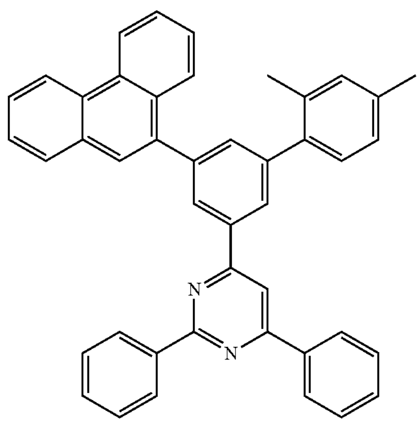
ET41
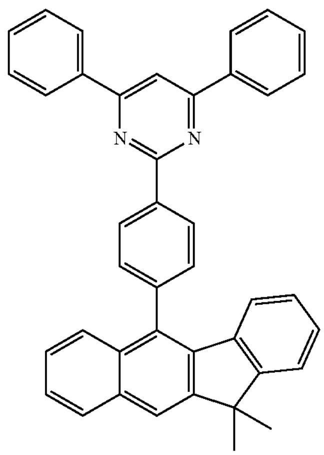
-continued
ET42
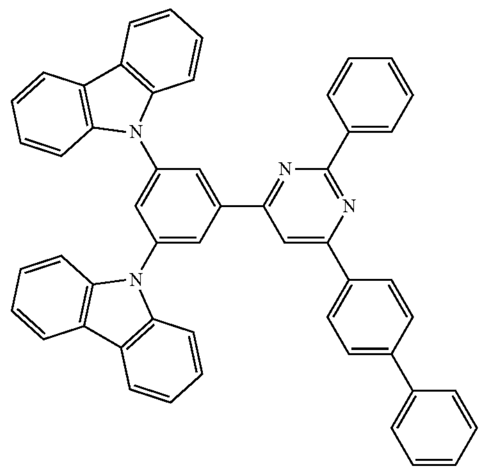
ET43
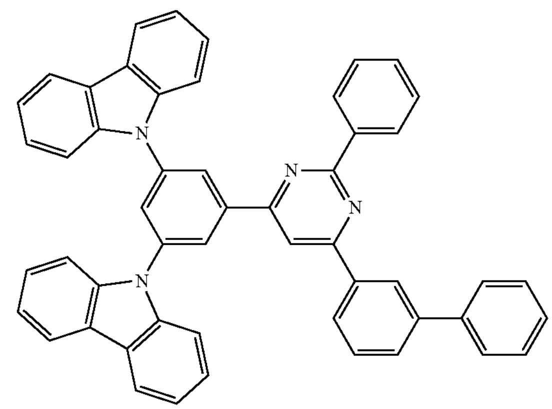
ET44
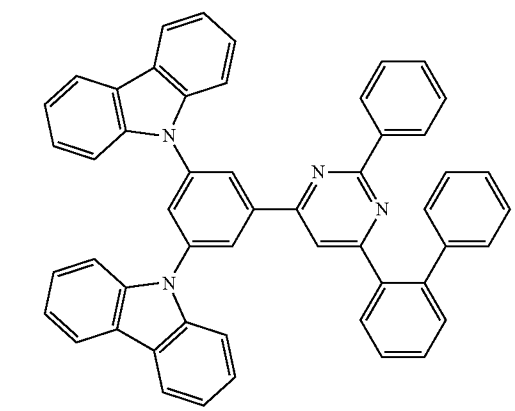
ET45
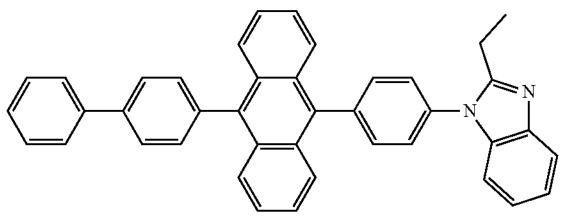

-continued

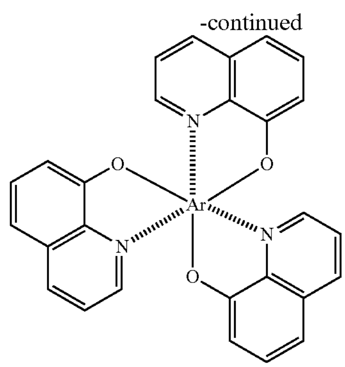

Alq3

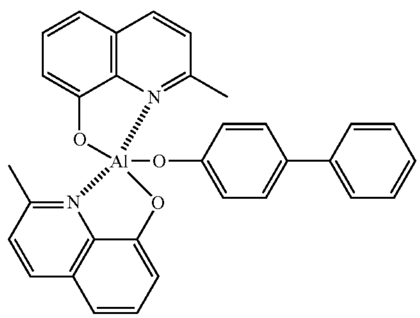

BAlq

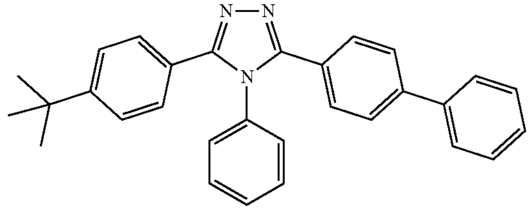

TAZ

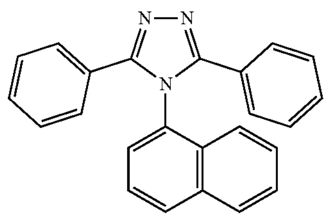

NTAZ

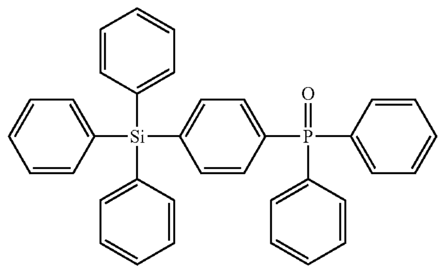

TSPO1

A thickness of the electron transport region may be in a range of about 100 Å to about 5,000 Å. For example, the thickness of the electron transport region may be in a range of about 160 Å to about 4,000 Å. When the electron transport region includes a buffer layer, a hole-blocking layer, an electron control layer, an electron transport layer, or any combination thereof, a thickness of the buffer layer, the hole-blocking layer, or the electron control layer may each independently be in a range of about 20 Å to about 1,000 Å, and a thickness of the electron transport layer may be from about 100 Å to about 1,000 Å. For example, the thickness of the buffer layer, the hole-blocking layer, or the electron control layer may each independently be in a range of about 30 Å to about 300 Å. For example, the thickness of the electron transport layer may be in a range of about 150 Å to about 500 Å. When the thickness of the buffer layer, the hole-blocking layer, the electron control layer, the electron transport layer, and/or the electron transport region are within these ranges, satisfactory electron transporting characteristics may be obtained without a substantial increase in driving voltage.

The electron transport region (for example, an electron transport layer in the electron transport region) may further include, in addition to the materials described above, a metal-containing material.

The metal-containing material may include an alkali metal complex, an alkaline earth metal complex, or any combination thereof. A metal ion of an alkali metal complex may be a Li ion, a Na ion, a K ion, a Rb ion, or a Cs ion, and a metal ion of an alkaline earth metal complex may be a Be ion, a Mg ion, a Ca ion, a Sr ion, or a Ba ion.

A ligand coordinated with the metal ion of the alkali metal complex or with the metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a lithium (Li) complex. The Li complex may include, for example, Compound ET-D1 (LiQ) or Compound ET-D2:

ET-D1

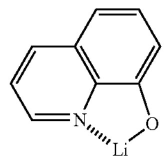

ET-D2

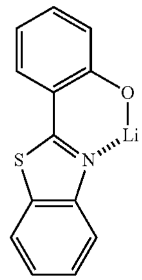

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer including different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, the rare earth metal, or any combination thereof.

The alkali metal-containing compound may include: alkali metal oxides, such as $Li_2O$, $Cs_2O$, or $K_2O$; alkali metal halides, such as LiF, NaF, CsF, KF, LiI, NaI, CsI, or KI; or any combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of an alkali metal ion, an alkaline earth metal ion, and a rare earth metal ion, and a ligand bonded to the metal ion (for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof).

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of an alkali metal-containing compound (for example, an alkali metal halide); or the electron injection layer may consist of an alkali metal-containing compound (for example, an alkali metal halide), and an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the ranges described above, satisfactory electron injection characteristics may be obtained without a substantial increase in driving voltage.

[Second Electrode 150]

The second electrode 150 may be located on the interlayer 130 having a structure as described above. The second electrode 150 may be a cathode, which is an electron injection electrode. A material for forming the second electrode 150 may be a material having a low work function, such as a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure.

[Capping Layer]

The light-emitting device 10 may include a first capping layer outside the first electrode 110, and/or a second capping layer outside the second electrode 150. For example, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be extracted toward the outside through the first electrode 110, which may be a semi-transmissive electrode or a transmissive electrode, and through the first capping layer. Light generated in an emission layer of the interlayer 130 of the light-emitting device 10 may be extracted toward the outside through the second electrode 150, which may be a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 is increased, so that the luminescence efficiency of the light-emitting device 10 may be improved.

The first capping layer and the second capping layer may each include a material having a refractive index equal to or greater than about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. In an embodiment, the carbocyclic compound, the heterocyclic compound, and the amine group-containing compound may be optionally substituted with a substituent including O, N, S, Se, Si, F, Cl, Br, I, or any combination thereof.

In an embodiment, at least one of the first capping layer and the second capping layer may each independently include an amine group-containing compound.

For example, at least one of the first capping layer and the second capping layer may each independently include a compound represented by Formula 201, a compound represented by Formula 202, or any combination thereof.

In an embodiment, at least one of the first capping layer and the second capping layer may each independently include one of Compounds HT28 to HT33, one of Compounds CP1 to CP6, β-NPB, or any combination thereof:

CP1

CP2

CP3

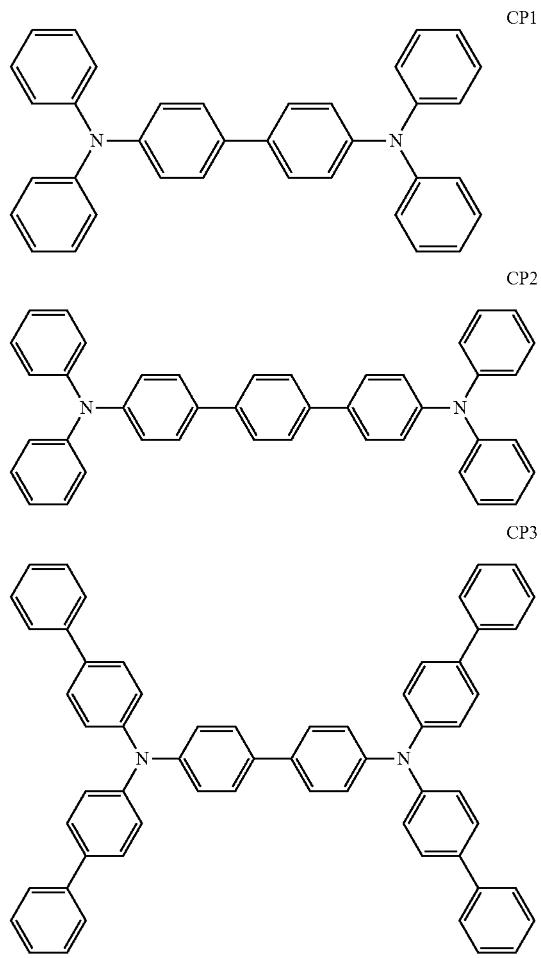

-continued

CP4

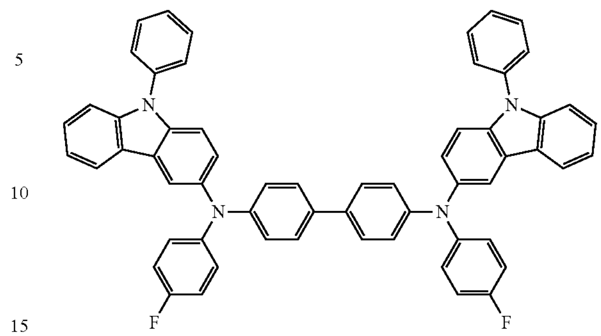

CP5

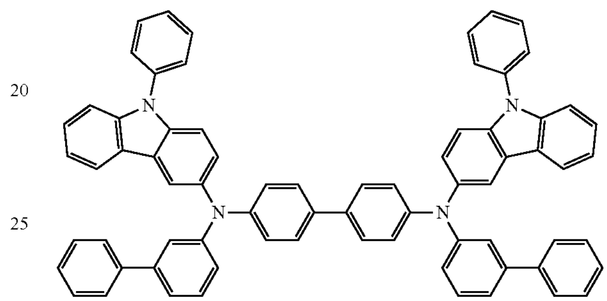

CP6

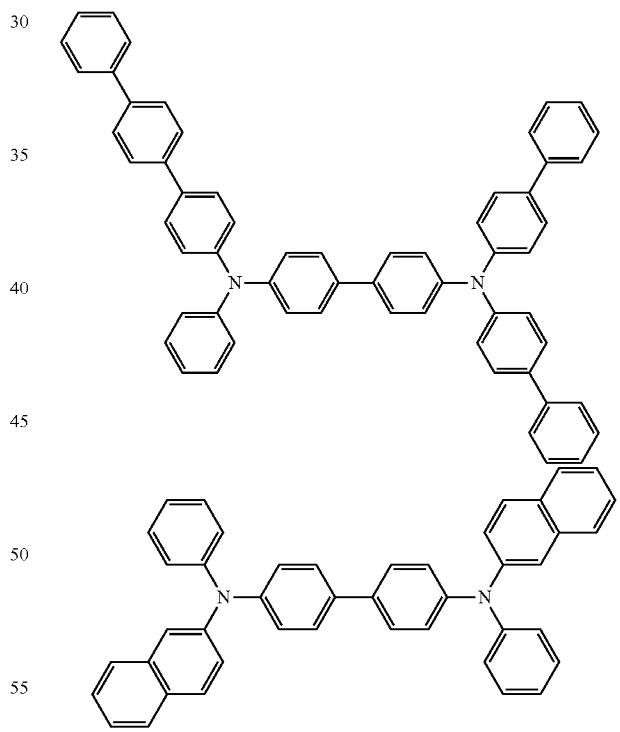

β-NPB

[Film]

The organometallic compound represented by Formula 1 may be included in various films. According to embodiments, a film including an organometallic compound represented by Formula 1 may be provided. The film may be, for example, an optical member (or a light control means) (for example, a color filter, a color conversion member, a capping layer, a light extraction efficiency enhancement layer, a selective light absorbing layer, a polarizing layer, a quantum dot-containing layer, or like), a light-blocking member (for example, a light reflective layer, a light absorbing layer, or the like), or a protective member (for example, an insulating layer, a dielectric layer, or the like).

[Electronic Apparatus]

The light-emitting device may be included in various electronic apparatuses. In an embodiment, an electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be located in at least one direction in which light emitted from the light-emitting device travels. In an embodiment, light emitted from the light-emitting device may be blue light or white light. The light-emitting device may be the same as described herein. In an embodiment, the color conversion layer may include a quantum dot. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be located between the subpixels to define each subpixel.

The color filter may further include color filter areas and light-shielding patterns located between the color filter areas, and the color conversion layer may further include color conversion areas and light-shielding patterns located between the color conversion areas.

The color filter areas (or the color conversion areas) may include a first area emitting first color light, a second area emitting second color light, and/or a third area emitting third color light, wherein the first color light, the second color light, and/or the third color light may have different maximum emission wavelengths from one another. For example, the first color light may be red light, the second color light may be green light, and the third color light may be blue light. In an embodiment, the color filter areas (or the color conversion areas) may include quantum dots. For example, the first area may include a red quantum dot, the second area may include a green quantum dot, and the third area may not include a quantum dot. The quantum dot may be the same as described herein. The first area, the second area, and/or the third area may each include a scatterer.

In an embodiment, the light-emitting device may emit first light, the first area may absorb the first light to emit first-first color light, the second area may absorb the first light to emit second-first color light, and the third area may absorb the first light to emit third-first color light. The first-first color light, the second-first color light, and the third-first color light may have different maximum emission wavelengths from one another. For example, the first light may be blue light, the first-first color light may be red light, the second-first color light may be green light, and the third-first color light may be blue light.

The electronic apparatus may further include a thin-film transistor, in addition to the light-emitting device as described herein. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, or the like.

The active layer may include crystalline silicon, amorphous silicon, an organic semiconductor, an oxide semiconductor, or the like.

The electronic apparatus may further include a sealing portion for sealing the light-emitting device. The sealing portion may be located between the color filter and/or the color conversion layer, and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin film encapsulation layer, the electronic apparatus may be flexible.

Various functional layers may be further included on the sealing portion, in addition to the color filter and/or the color conversion layer, according to the use of the electronic apparatus. Examples of a functional layer may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

[Electronic Device]

The light-emitting device may be included in various electronic devices.

In embodiments, an electronic device including the light-emitting device may be a flat panel display, a curved display, a computer monitor, a medical monitor, a television, a billboard, an indoor light, an outdoor light, a signal light, a head-up display, a fully transparent display, a partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a micro display, a three-dimensional (3D) display, a virtual reality display, an augmented reality display, a vehicle, a video wall with multiple displays tiled together, a theater screen, a stadium screen, a phototherapy device, or a signboard.

The light-emitting device has excellent luminescence efficiency and a long lifespan, such that the electronic device including the light-emitting device may have high luminance, high resolution, and low power consumption.

Figure 2:
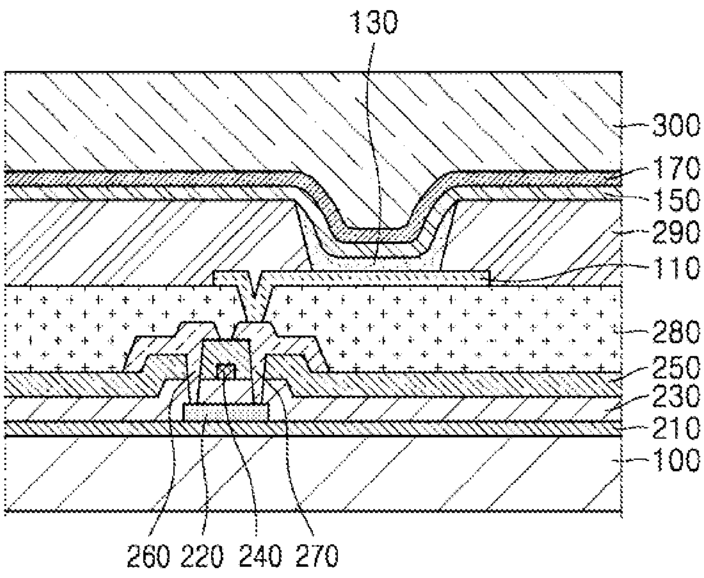
FIG. 2 is a schematic cross-sectional view of an electronic apparatus according to an embodiment.
Figure 3:
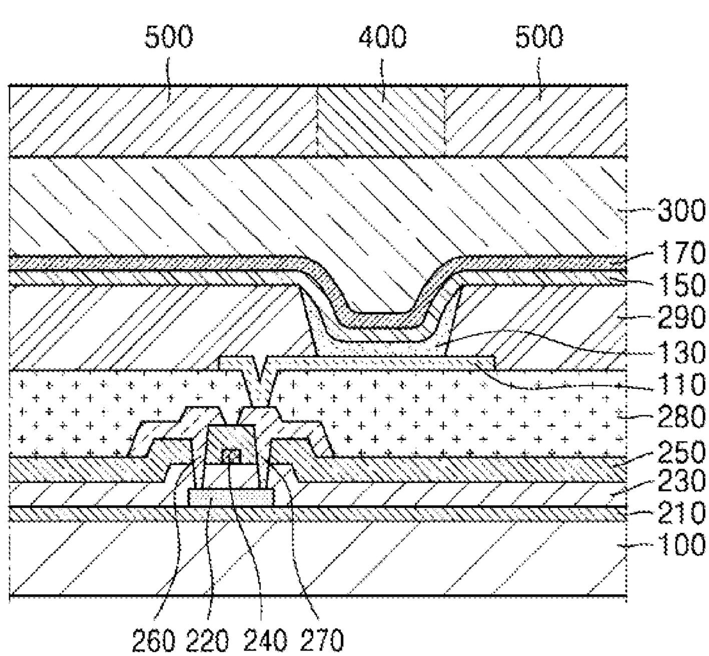
FIG. 3 is a schematic cross-sectional view of an electronic apparatus according to another embodiment.

[Description of FIGS. 2 and 3]

FIG. 2 is a schematic cross-sectional view of an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 may be located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may respectively contact the exposed portions of the source region and the drain region of the active layer 220.

The TFT is electrically connected to a light-emitting device to drive the light-emitting device, and is covered and protected by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be located on the passivation layer 280. The passivation layer 280 may not fully cover the drain electrode 270 and may expose a portion of the drain electrode 270, and the first electrode 110 may be electrically connected to the exposed portion of the drain electrode 270.

A pixel defining layer 290 including an insulating material may be located on the first electrode 110. The pixel defining layer 290 may expose a region of the first electrode 110, and an interlayer 130 may be formed in the exposed region of the first electrode 110. The pixel defining layer 290 may be a polyimide or polyacrylic organic film. Although not shown in FIG. 2, at least some layers of the interlayer 130 may extend beyond the upper portion of the pixel defining layer 290 to be provided in the form of a common layer.

The second electrode 150 may be located on the interlayer 130, and a capping layer 170 may be further included on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or any combination of the inorganic films and the organic films.

FIG. 3 is a schematic cross-sectional view of an electronic apparatus according to another embodiment.

The electronic apparatus of FIG. 3 may differ from the electronic apparatus of FIG. 2, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

Figure 4:
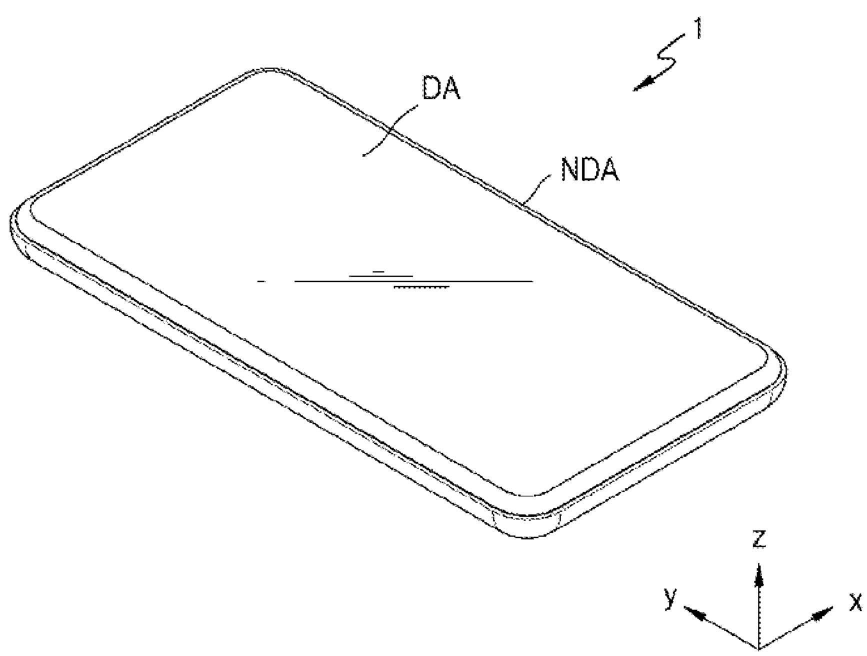
FIG. 4 is a schematic perspective view of an electronic device including a light-emitting device according to an embodiment.

[Description of FIG. 4]

FIG. 4 is a schematic perspective view of an electronic device 1 including the light-emitting device according to an embodiment.

The electronic device 1 may be a device that displays moving images or still images. Examples of the electronic device 1 may include: a portable electronic device, such as a mobile phone, a smart phone, a tablet personal computer (PC), a mobile communication terminal, an electronic notebook, an electronic book, a portable multimedia player (PMP), a navigation device, or an ultra mobile PC (UMPC); or a television; a laptop computer; a monitor; a billboard, or an internet of things (IOT); or a part thereof.

The electronic device 1 may be a wearable device, such as a smart watch, a watch phone, a glasses display, or a head mounted display (HMD), or a part thereof. However, embodiments are not limited thereto.

For example, the electronic device 1 may be a cluster, a center information display (CID) located on the center fascia or dashboard of a vehicle, a room mirror display for replacing a side mirror of a vehicle, an entertainment system for the rear seat of the vehicle or a display located on the back of the front seat, a head up display (HUD) installed in front of the vehicle or projected on the front window glass, or a computer generated hologram augmented reality head up display (CGH AR HUD). FIG. 4 illustrates an embodiment in which the electronic device 1 is a smart phone, for convenience of explanation.

The electronic device 1 may include a display area DA and a non-display area NDA outside the display area DA. The electronic device 1 may implement an image through a two-dimensional array of pixels that are arranged in the display area DA.

The non-display area NDA is an area where an image is not displayed, and may surround the display area DA. A driver for providing an electrical signal or power to display elements located in the display area DA may be located in the non-display area NDA. A pad, which is an area where electronic devices or printed circuit boards can be electrically connected to each other, may be located in the non-display area NDA.

The electronic device 1 may have a length in an x-axis direction and a length in a y-axis direction, which are different from each other. For example, as illustrated in FIG. 4, the length in the x-axis direction may be shorter than the length in the y-axis direction. In another embodiment, the length in the x-axis direction and the length in the y-axis direction may be identical to each other. In still another embodiment, the length in the x-axis direction may be longer than the length in the y-axis direction.

[Description of FIGS. 5 and 6A to 6C]

Figure 5:
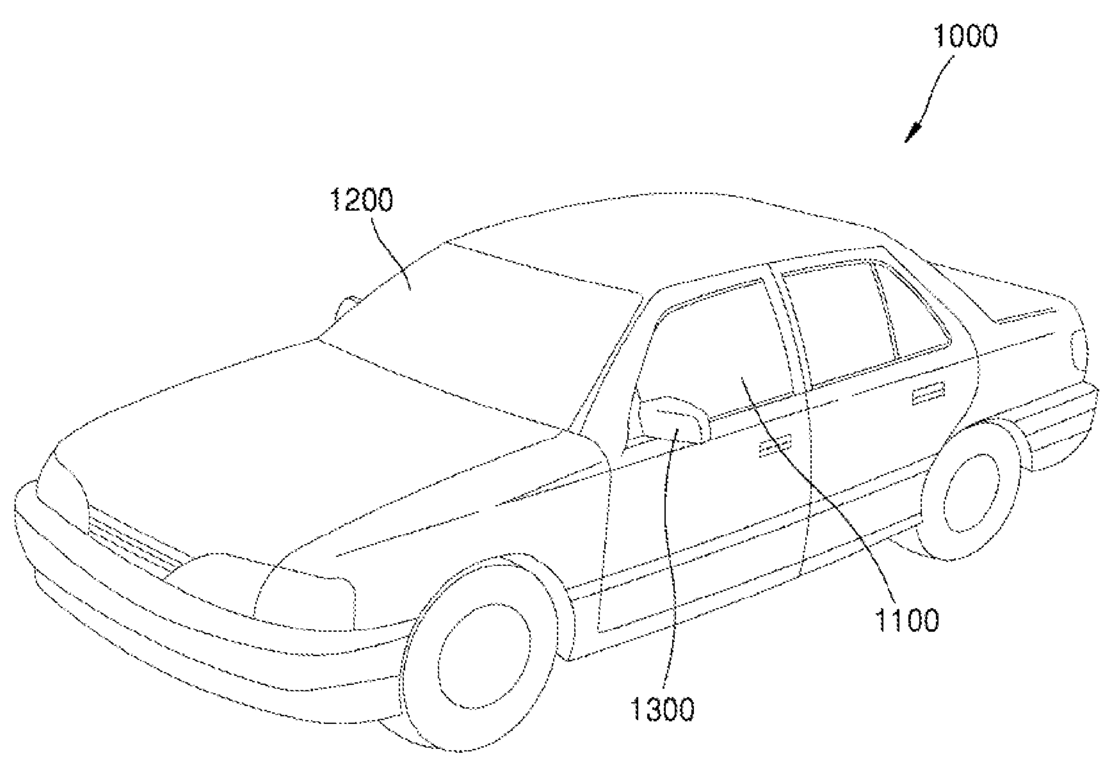
FIG. 5 is a schematic perspective view of the exterior of a vehicle as an electronic device including a light-emitting device according to an embodiment.

FIG. 5 is a schematic perspective view of the exterior of a vehicle 1000 as an electronic device including a light-emitting device according to an embodiment.

Figure 6A:
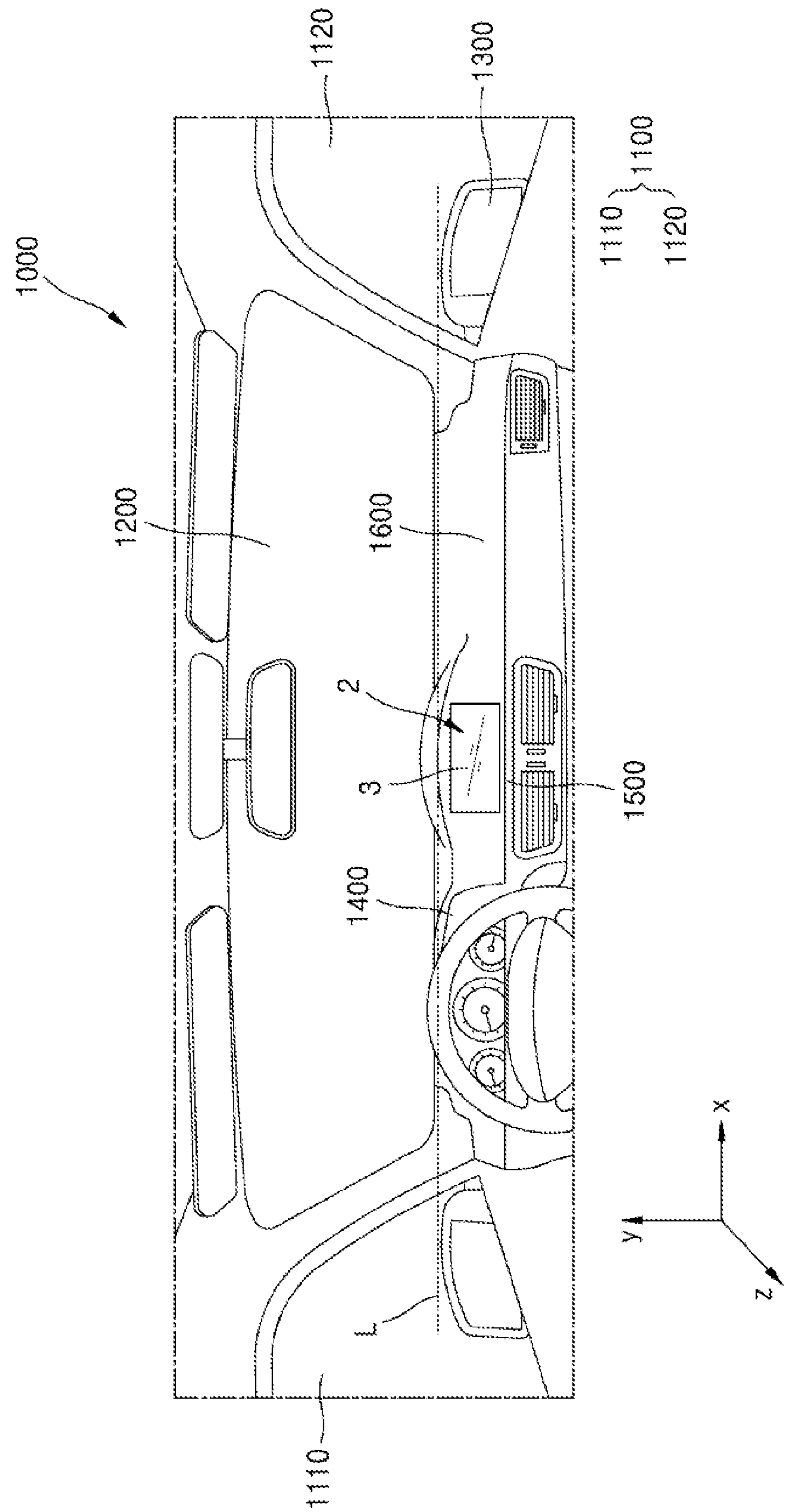
FIGS. 6A to 6C are each a schematic diagram of the interior of a vehicle, according to embodiments.
Figure 6B:
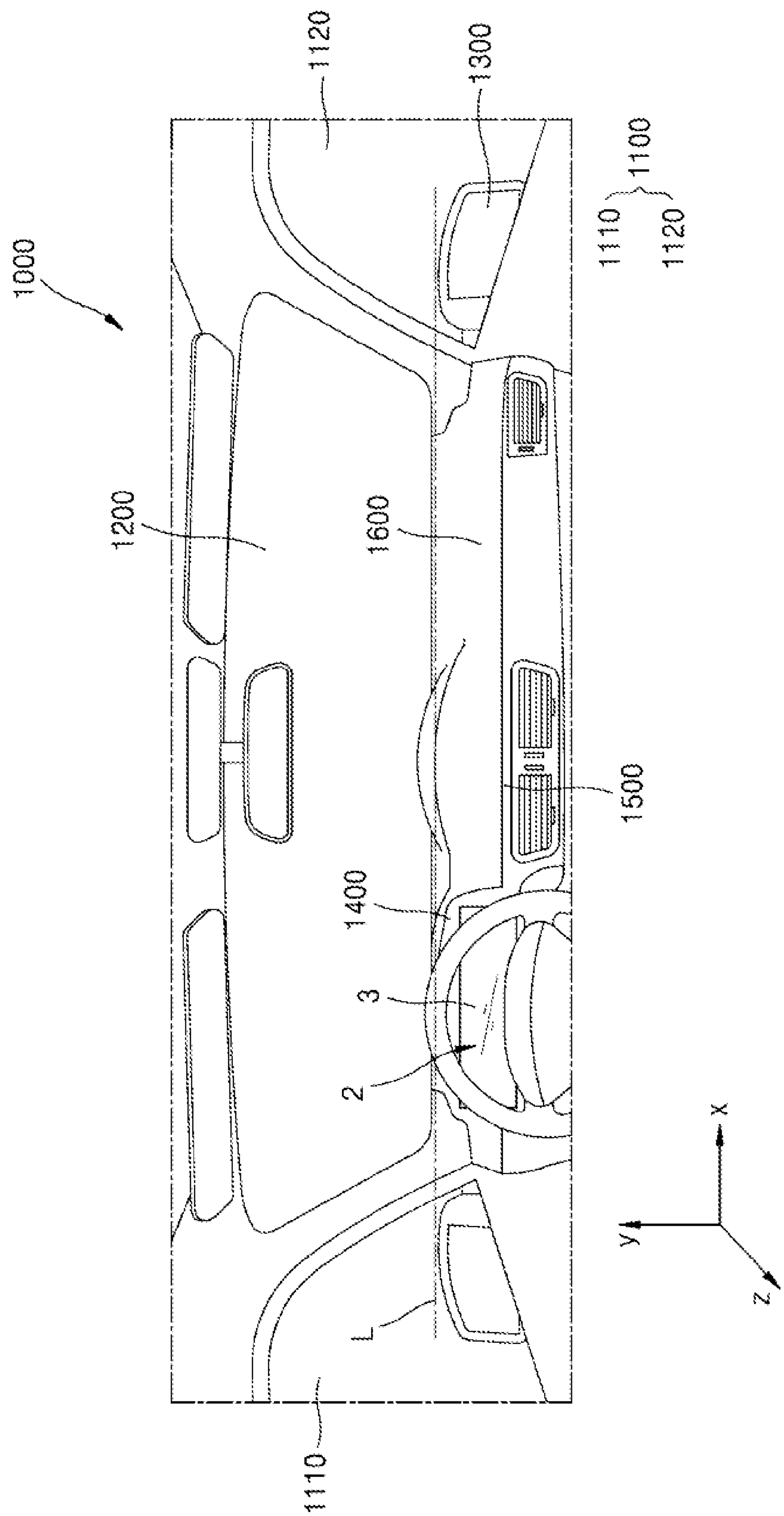
Figure 6C:
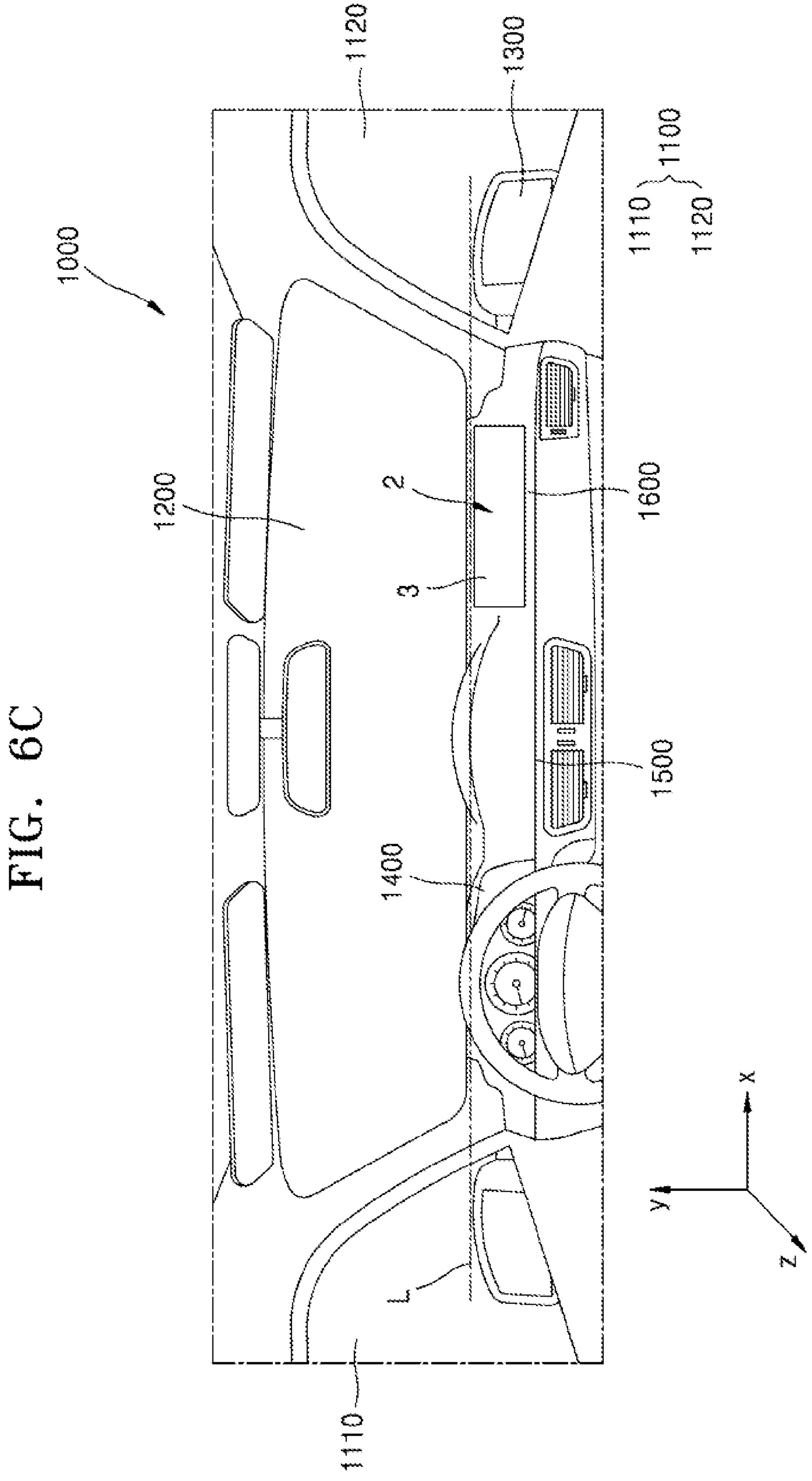

FIGS. 6A to 6C are each a schematic diagram of the interior of a vehicle 1000 according to embodiments.

Referring to FIGS. 5, 6A, 6B, and 6C, the vehicle 1000 may refer to various devices for moving a transported subject, such as a person, an object, or an animal, from a departure point to a destination point. The vehicle 1000 may be a vehicle traveling on a road or a track, a vessel moving over a sea or a river, or an airplane flying in the sky using the action of air.

The vehicle 1000 may travel on a road or a track. The vehicle 1000 may move in a direction according to rotation of at least one wheel. For example, the vehicle 1000 may be three-wheeled or four-wheeled vehicles, construction machinery, two-wheeled vehicles, engines, bicycles, or trains running on tracks.

The vehicle 1000 may include a body having an interior and an exterior, and a chassis which is a portion excluding the body and includes mechanical devices installed therein that are necessary for driving the vehicle. The exterior of the body may include a front panel, a bonnet, a roof panel, a rear panel, a trunk, at least one door, and pillars provided at the boundaries between doors. The chassis of the vehicle 1000 may include a power generating device, a power transmission device, a driving device, a steering device, a braking device, a suspension device, a transmission, a fuel device, and front, rear, left, and right wheels.

The vehicle 1000 may include a side window glass 1100, a front window glass 1200, a side mirror 1300, a cluster 1400, a center fascia 1500, a passenger seat dashboard 1600, and a display apparatus 2.

The side window glass 1100 and the front window glass 1200 may be partitioned by a pillar located between the side window glass 1100 and the front window glass 1200.

The side window glass 1100 may be installed on the side of the vehicle 1000. In an embodiment, the side window glass 1100 may be installed on the door of the vehicle 1000. The side window glass 1100 may include multiple side window glasses which may face each other. In an embodiment, the side window glass 1100 may include a first side window glass 1110 and a second side window glass 1120. In an embodiment, the first side window glass 1110 may be located adjacent to the cluster 1400, and the second side window glass 1120 may be located adjacent to the passenger seat dashboard 1600.

In an embodiment, the side window glasses 1100 may be spaced apart from each other in an x-direction or in a −x-direction. For example, the first side window glass 1110 and the second side window glass 1120 may be spaced apart from each other in the x direction or in the −x direction. An imaginary straight line L connecting the side window glasses 1100 may extend in the x direction or in the −x direction. For example, an imaginary straight line L connecting the first side window glass 1110 and the second side window glass 1120 to each other may extend in the x direction or in the −x direction.

The front window glass 1200 may be installed on the front of the vehicle 1000. The front window glass 1200 may be located between the side window glasses 1100 facing each other.

The side mirror 1300 may provide a view of the rear of the vehicle 1000. The side mirror 1300 may be installed on the exterior of the body. In an embodiment, the side mirror 1300 may include multiple side mirrors. One of the side mirrors 1300 may be located outside the first side window glass 1110. Another of the side mirrors 1300 may be located outside the second side window glass 1120.

The cluster 1400 may be located in front of a steering wheel. The cluster 1400 may include thereon a tachometer, a speedometer, a coolant thermometer, a fuel gauge, a turn signal indicator, a high beam indicator, a warning lamp, a seat belt warning lamp, an odometer, a driving record system, an automatic shift selected lever indicator lamp, a door open warning lamp, an engine oil warning lamp, and/or a low fuel warning light.

The center fascia 1500 may include a control panel having provided thereon buttons for adjusting an audio unit, an air conditioning unit, and a seat heater. The center fascia 1500 may be located on a side of the cluster 1400.

The passenger seat dashboard 1600 may be spaced apart from the cluster 1400 with the center fascia 1500 therebetween. In an embodiment, the cluster 1400 may be disposed to correspond to the driver's seat (not shown), and the passenger seat dashboard 1600 may be disposed to correspond to the passenger's seat (not shown). In an embodiment, the cluster 1400 may be adjacent to the first side window glass 1110, and the passenger seat dashboard 1600 may be adjacent to the second side window glass 1120.

In an embodiment, the display apparatus 2 may include a display panel 3, and the display panel 3 may display an image. The display apparatus 2 may be located inside the vehicle 1000. In an embodiment, the display apparatus 2 may be located between the side window glasses 1100 facing each other. The display apparatus 2 may be located in at least one of the cluster 1400, the center fascia 1500, and the passenger seat dashboard 1600.

The display apparatus 2 may include an organic light-emitting display, an inorganic light-emitting display, or a quantum dot display. Hereinafter, an organic light-emitting display including the light-emitting device according to an embodiment will be described as an example of the display apparatus 2 according to an embodiment. However, various types of display apparatuses as described above may be used as embodiments.

Referring to FIG. 6A, the display apparatus 2 may be located in the center fascia 1500. In an embodiment, the display apparatus 2 may display navigation information. In an embodiment, the display apparatus 2 may display information about audio settings, video settings, or vehicle settings.

Referring to FIG. 6B, the display apparatus 2 may be located in the cluster 1400. The cluster 1400 may show driving information and the like on the display apparatus 2. Thus, the cluster 1400 may digitally implement driving information. The cluster 1400 may digitally display vehicle information and driving information in the form of an image. For example, the needle and gauge of a tachometer and various warning light may be displayed by digital signals.

Referring to FIG. 6C, the display apparatus 2 may be located in the passenger seat dashboard 1600. The display apparatus 2 may be embedded in the passenger seat dashboard 1600 or located on the passenger seat dashboard 1600. In an embodiment, the display apparatus 2 located on the passenger seat dashboard 1600 may display an image about information displayed on the cluster 1400 and/or information displayed on information in the center fascia 1500. In an embodiment, the display apparatus 2 located on the passenger seat dashboard 1600 may display information which is different from the information displayed on the cluster 1400 and/or the information displayed on information in the center fascia 1500.

[Manufacturing Method]

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting of carbon atoms as the only ring-forming atoms and having three to sixty carbon atoms. The term "$C_1$-$C_{60}$ heterocyclic group" as used herein may be a cyclic group that has one to sixty carbon atoms and further has, in addition to a carbon atom, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, a $C_1$-$C_{60}$ heterocyclic group may have 3 to 61 ring-forming atoms.

The term "cyclic group" as used herein may be a $C_3$-$C_{60}$ carbocyclic group or a $C_1$-$C_{60}$ heterocyclic group.

The term "$T_1$ electron-rich $C_3$-$C_{60}$ cyclic group" as used herein may be a cyclic group that has three to sixty carbon atoms and may not include *—N═*' as a ring-forming moiety. The term "π electron-deficient nitrogen-containing $C_1$-$C_{60}$ cyclic group" as used herein may be a heterocyclic group that has one to sixty carbon atoms and may include *—N═*' as a ring-forming moiety.

In embodiments, the $C_3$-$C_{60}$ carbocyclic group may be a T1 group or a group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a group in which two or more T2 groups are condensed with each other, or a group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a group in which two or more T1 groups are condensed with each other, a T3 group, a group in which two or more T3 groups are condensed with each other, or a group in which at least one T3 group and at least one T1 group are condensed with each other (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), and the π electron-deficient nitrogen-containing $C_1$-$C_{60}$ cyclic group may be a T4 group, a group in which two or more T4 groups are condensed with each other, a group in which at least one T4 group and at least one T1 group are condensed with each other, a group in which at least one T4 group and at least one T3 group are condensed with each other, or a group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of a monovalent $C_3$-$C_{60}$ carbocyclic group and a monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

Examples of a divalent $C_3$-$C_{60}$ carbocyclic group and a divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isoctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by $-O(A_{101})$ (wherein $A_{101}$ may be a $C_1$-$C_{60}$ alkyl group), and examples thereof may include a methoxy group, an ethoxy group, and an isopropyloxy group.

The term "$C_1$-$C_{60}$ alkylthio group" as used herein may be a monovalent group represented by $-S(A_{101})$ (wherein $A_{101}$ may be $C_1$-$C_{60}$ alkyl group), and examples thereof may include a methylthio group, an ethylthio group, and an isopropylthio group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo [2.2.1]heptyl group), a bicyclo[1.1.1]pentyl group, a bicyclo [2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group having 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group having 1 to 10 carbon atoms, further including, in addition to carbon atoms, at least one heteroatom, as ring-forming atoms, and having at least one carbon-carbon double bond in the cyclic structure thereof. Examples of a $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of a $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the respective rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of a $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the respective rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of a monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as the monovalent non-aromatic condensed polycyclic group described above.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having no aromaticity in its entire molecular structure. Examples of a monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as the monovalent non-aromatic condensed heteropolycyclic group described above.

The term "$C_6$-$C_{69}$ aryloxy group" as used herein may be a group represented by —O($A_{102}$) (wherein $A_{102}$ may be a $C_6$-$C_{69}$ aryl group), and the term "$C_6$-$C_{69}$ arylthio group" as used herein may be a group represented by —S($A_{193}$) (wherein $A_{103}$ may be a $C_6$-$C_{69}$ aryl group).

The term "$C_7$-$C_{60}$ arylalkyl group" as used herein may be a group represented by -($A_{104}$)($A_{105}$) (wherein A104 may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by -($A_{196}$)($A_{197}$) (wherein $A_{106}$ may be a $C_1$-$C_{59}$ alkylene group, and $A_{107}$ may be a $C_1$-$C_{59}$ heteroaryl group).

In the specification, the group "$R_{10a}$" may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, a Cl-Coo alkoxy group, or a $C_1$-$C_{60}$ alkylthio group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(—O)$_2$($Q_{31}$), or —P(═O)($Q_{31}$)($Q_{32}$).

In the specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein may be any atom other than a carbon atom or a hydrogen atom. Examples of a heteroatom may include O, S, N, P, Si, B, Ge, Se, or any combination thereof.

The term "third-row transition metal" as used herein may include hafnium (Hf), tantalum (Ta), tungsten (W), rhenium (Re), osmium (Os), iridium (Ir), platinum (Pt), gold (Au), or the like.

The term "Ph" as used herein refers to a phenyl group, the term "Me" as used herein refers to a methyl group, the term "Et" as used herein refers to an ethyl group, the terms "tert-Bu" or "But" as used herein each refer to a tert-butyl group, and the term "OMe" as used herein refers to a methoxy group.

The term "biphenyl group" as used herein may be a "phenyl group substituted with a phenyl group." For example, the "biphenyl group" may be a substituted phenyl group having a $C_6$-$C_{60}$ aryl group as a substituent.

The term "terphenyl group" as used herein may be a "phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula or moiety.

In the specification, the terms "x-axis", "y-axis", and "z-axis" are not limited to three axes in a Cartesian coordinate system, and may be interpreted in a broader sense than the three axes in a Cartesian coordinate system. For example, the x-axis, y-axis, and z-axis may describe axes that are orthogonal to each other, or may describe axes that are in different directions that are not orthogonal to each other.

Hereinafter, compounds according to embodiments and light-emitting devices according to embodiments will be described in detail with reference to the following Synthesis Examples and Examples. The wording "B was used instead of A" used in describing Synthesis Examples means that an identical molar equivalent of B was used in place of A.

EXAMPLES

Synthesis Example

Synthesis Example 1: Synthesis of Compound BD1

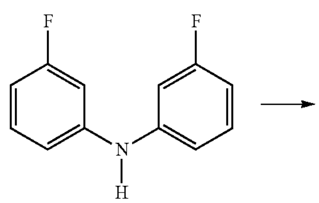

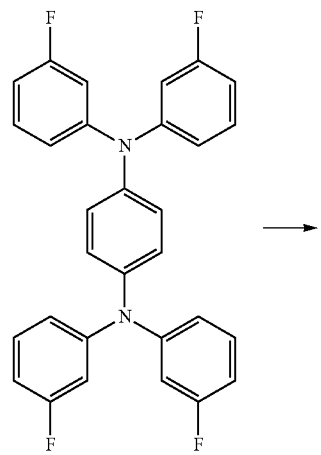

1-1

-continued

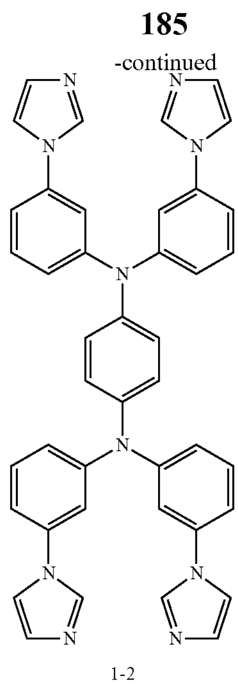

1-2

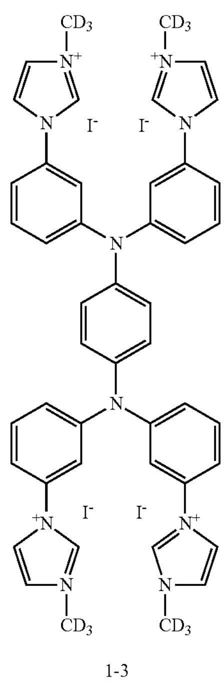

1-3

-continued

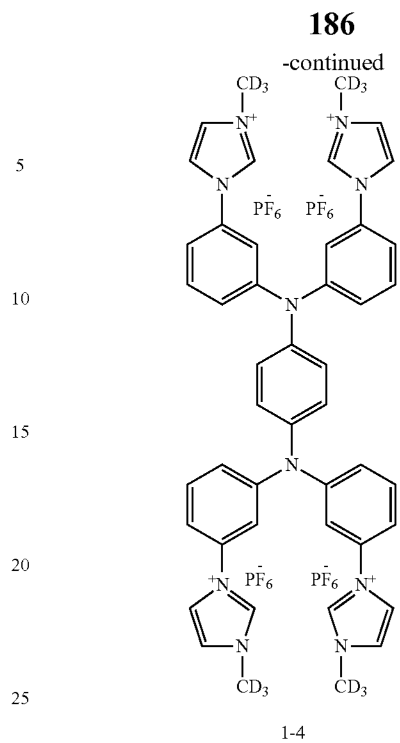

1-4

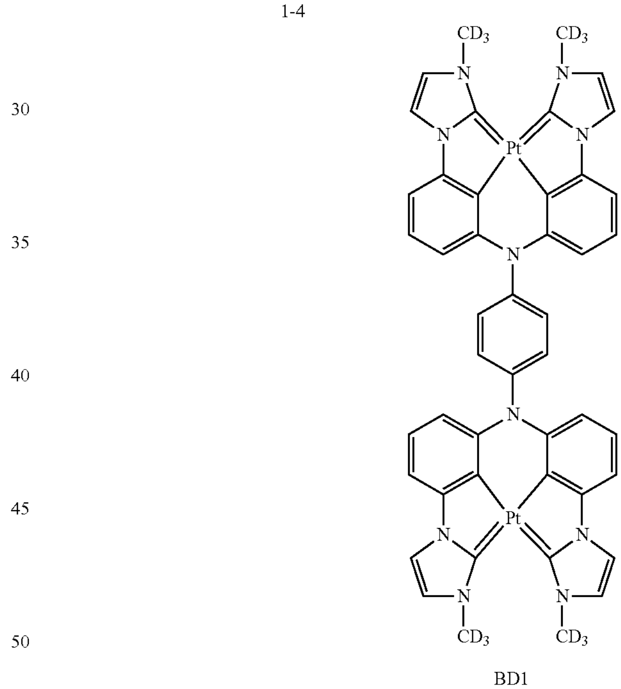

BD1

(1) Synthesis of Intermediate Compound 1-1

22.0 g (51 mmol) of bis(3-fluorophenyl)amine, 4.5 g (22 mmol) of 1,4-dibromobenzene, 0.8 g (0.06 mmol) of Tetrakis(triphenylphosphine)palladium, and 16.5 g (110 mmol) of potassium triphosphate were added to a reaction vessel, and suspended in 650 mL of THF/$H_2O$. The reaction mixture was heated and stirred at 80° C. for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 18.5 g (20 mmol) of Intermediate Compound 1-1.

(2) Synthesis of Intermediate Compound 1-2

18.5 g (20 mmol) of Intermediate Compound 1-1, 12.5 g (125 mmol) of imidazole, and 16.5 g (110 mmol) of potassium triphosphate were placed in a reaction vessel and suspended in 400 mL of dimethylsulfoxide. The reaction mixture was heated, and stirred at the temperature of 160° C. for 24 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom, was separated using column chromatography to obtain 10.2 g (15 mmol) of Intermediate Compound 1-2.

(3) Synthesis of Intermediate Compound 1-3 and Intermediate Compound 1-4

10.2 g (15 mmol) of Intermediate Compound 1-2 and iodomethane-d3 (excess) were placed in a reaction vessel, and suspended in 110 mL of dichloromethane. The reaction mixture was heated to 50° C. and stirred for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 13.0 g (14 mmol) of Intermediate Compound 1-3.

Immediately thereafter, 3.3 g (25 mmol) of ammonium hexafluorophosphate was added to the reaction vessel and suspended in a solution including methanol and water at the volumetric ratio of 2:1. The reaction mixture was stirred at room temperature for 12 hours. After completion of the reaction, the resulting solid was filtered and separated using column chromatography to obtain 12.5 g (13 mmol) of Intermediate Compound 1-4.

(4) Synthesis of Compound BD1

12.5 g (13 mmol) of Intermediate Compound 1-4, 1.0 g (4 mmol) of dichloro(1,5-cyclooctadiene)platinum, and 2.2 g (20 mmol) of sodium acetate were suspended in 100 ml of dioxane. The reaction mixture was heated, and stirred at 120° C. for 72 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 1.5 g (1.3 mmol) of Compound BD1.

Synthesis Example 2: Synthesis of Compound BD8

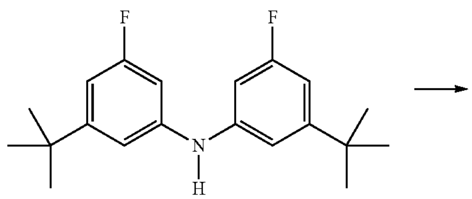

-continued

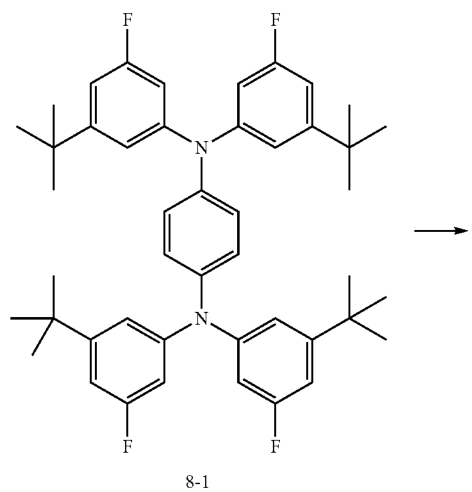

8-1

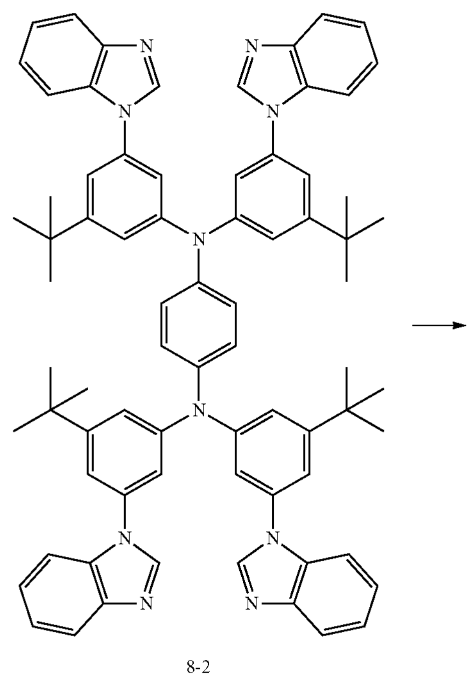

8-2

-continued

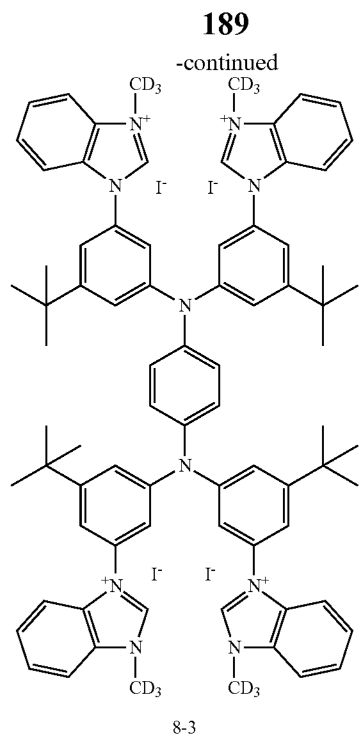

8-3

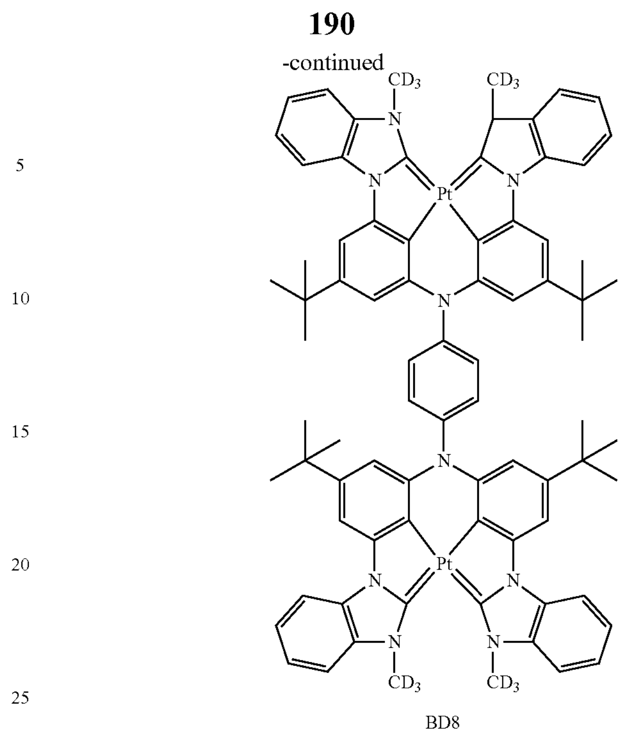

BD8

(1) Synthesis of Intermediate Compound 8-1

24.0 g (50 mmol) of bis(3-fluoro-5-t-butylphenyl)amine, 4.5 g (22 mmol) of 1,4-dibromobenzene, 0.8 g (0.06 mmol) of Tetrakis(triphenylphosphine)palladium, and 16.5 g (110 mmol) of potassium triphosphate were added to a reaction vessel, and suspended in 650 mL of $THF/H_2O$. The reaction mixture was heated and stirred at 80° C. for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 19.5 g (22 mmol) of Intermediate Compound 8-1.

(2) Synthesis of Intermediate Compound 8-2

19.5 g (22 mmol) of Intermediate Compound 8-1, 12.5 g (125 mmol) of benzimidazole, and 16.5 g (110 mmol) of potassium triphosphate were placed in a reaction vessel and suspended in 400 mL of dimethylsulfoxide. The reaction mixture was heated, and stirred at the temperature of 160° C. for 24 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 12.0 g (16 mmol) of Intermediate Compound 8-2.

(3) Synthesis of Intermediate Compound 8-3 and Intermediate Compound 8-4

12.0 g (16 mmol) of Intermediate Compound 8-2 and iodomethane-d3 (excess) were placed in a reaction vessel, and suspended in 110 mL of dichloromethane. The reaction mixture was heated to 50° C. and stirred for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent

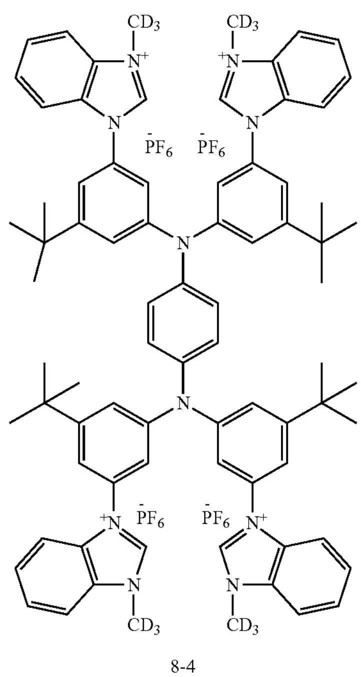

8-4 therefrom was separated by column chromatography to obtain 14.0 g (15 mmol) of Intermediate Compound 8-3.

Immediately thereafter, 3.3 g (25 mmol) of ammonium hexafluorophosphate was added to the reaction vessel and suspended in a solution including methanol and water at the volumetric ratio of 2:1. The reaction mixture was stirred at room temperature for 12 hours. After completion of the reaction, the resulting solid was filtered and separated using column chromatography to obtain 13.5 g (14 mmol) of Intermediate Compound 8-4.

(4) Synthesis of Compound BD8

13.5 g (14 mmol) of Intermediate Compound 8-4, 1.0 g (4 mmol) of dichloro(1,5-cyclooctadiene)platinum, and 2.2 g (20 mmol) of sodium acetate were suspended in 100 ml of dioxane. The reaction mixture was heated, and stirred at 120° C. for 72 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 1.7 g (1.5 mmol) of Compound BD8.

Synthesis Example 3: Synthesis of Compound BD13

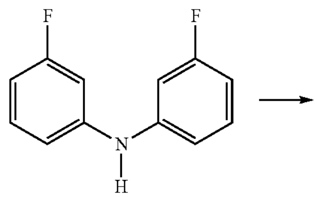

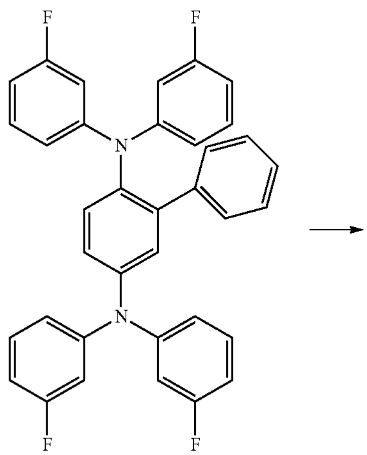

13-1

-continued

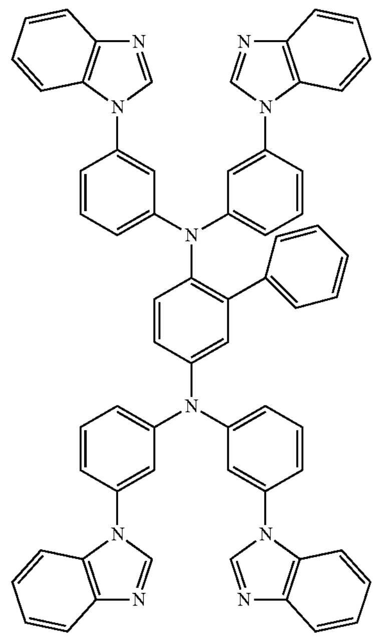

13-2

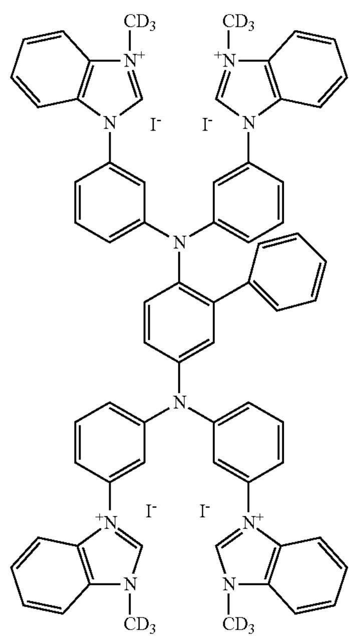

13-3

-continued

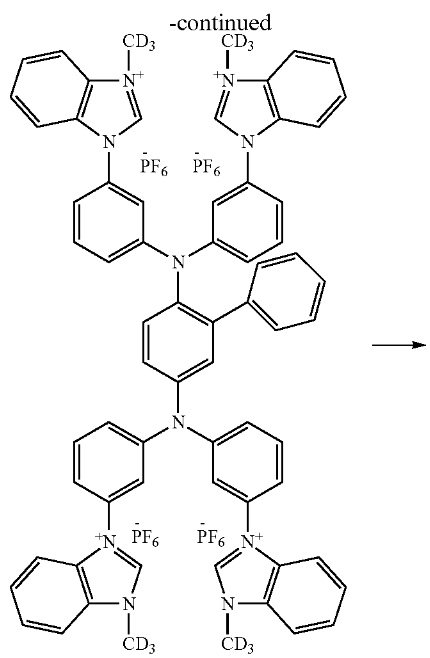

13-4

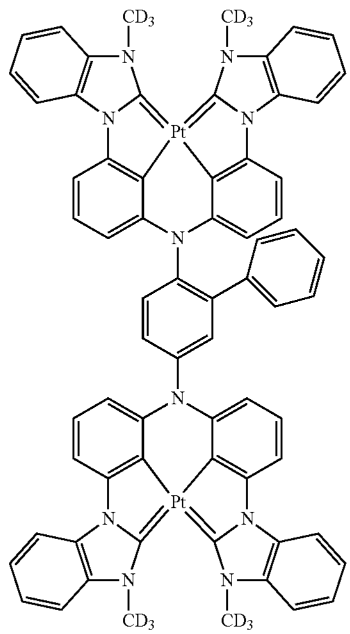

BD13

(1) Synthesis of Intermediate Compound 13-1

25.0 g (62 mmol) of bis(3-fluorophenyl)amine, 5.0 g (28 mmol) of 2,5-dibromo-1,1'-biphenyl, 0.8 g (0.06 mmol) of Tetrakis(triphenylphosphine)palladium, and 18.5 g (124 mmol) of potassium triphosphate was placed in a reaction vessel and suspended in 650 mL of THF/$H_2O$. The reaction mixture was heated and stirred at 80° C. for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 22.5 g (26 mmol) of Intermediate Compound 13-1.

(2) Synthesis of Intermediate Compound 13-2

22.5 g (26 mmol) of Intermediate Compound 13-1, 12.7 g (125 mmol) of benzimidazole, and 18.5 g (120 mmol) of potassium triphosphate were placed in a reaction vessel and suspended in 400 mL of dimethylsulfoxide. The reaction mixture was heated, and stirred at the temperature of 160° C. for 24 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 12.4 g (20 mmol) of Intermediate Compound 13-2.

(3) Synthesis of Intermediate Compound 13-3 and Intermediate Compound 13-4

12.4 g (21 mmol) of Intermediate Compound 13-2 and iodomethane-d3 (excess) were placed in a reaction vessel, and suspended in 110 mL of dichloromethane. The reaction mixture was heated to 50° C. and stirred for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 22.0 g (18 mmol) of Intermediate Compound 13-3.

Immediately thereafter, 3.3 g (25 mmol) of ammonium hexafluorophosphate was added to the reaction vessel and suspended in a solution including methanol and water at the volumetric ratio of 2:1. The reaction mixture was stirred at room temperature for 12 hours. After completion of the reaction, the resulting solid was filtered and separated using column chromatography to obtain 20.6 g (16 mmol) of Intermediate Compound 13-4.

(4) Synthesis of Compound BD13

20.6 g (16 mmol) of Intermediate Compound 13-4, 1.0 g (4 mmol) of dichloro(1,5-cyclooctadiene)platinum, and 2.2 g (20 mmol) of sodium acetate were suspended in 100 ml of dioxane. The reaction mixture was heated, and stirred at 120° C. for 72 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 2.0 g (1.5 mmol) of Compound BD13.

Synthesis Example 4: Synthesis of Compound BD49

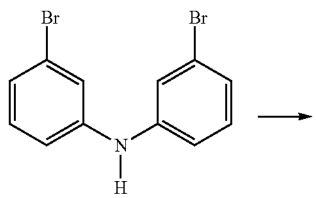

-continued

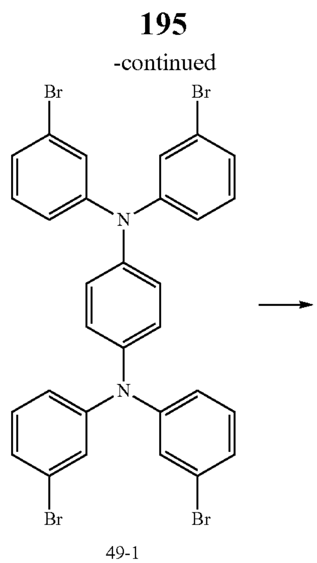

49-1

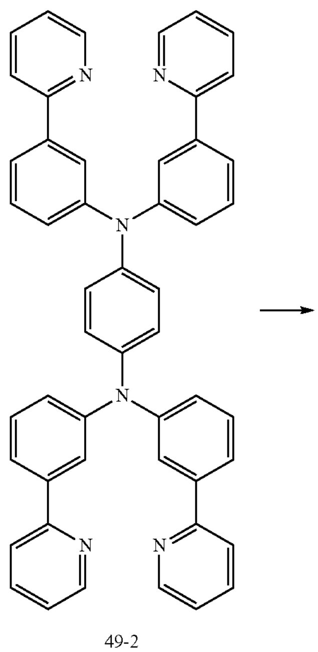

49-2

-continued

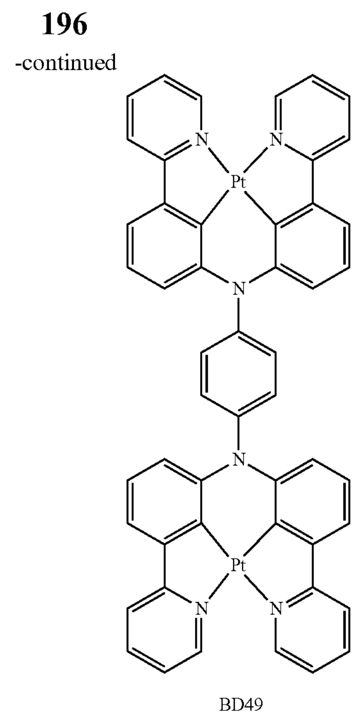

BD49

(1) Synthesis of Intermediate Compound 49-1

11.0 g (30 mmol) of bis(3-bromophenyl)amine, 2.5 g (15 mmol) of 1,4-difluorobenzene, and 9.5 g (60 mmol) of potassium triphosphate were placed in a reaction vessel and suspended in 300 mL of DMF. The reaction mixture was heated, and stirred at 160° C. for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 17.0 g (22 mmol) of Intermediate Compound 49-1.

(2) Synthesis of Intermediate Compound 49-2

17.0 g (22 mmol) of Intermediate Compound 49-1, 12.0 g (100 mmol) of pyridin-2-ylboronic acid, 540 mg (2.5 mmol) of palladium acetate, 1.2 g (5.0 mmol) of triphenylphosphine, and 31.8 g (130 mmol) of potassium carbonate were placed in a reaction vessel and suspended in 430 mL of 1,4-dioxane and 150 mL of water. The reaction mixture was heated to 110° C. and the resultant solution was stirred for 24 hours. After completion of the reaction, the reactant was cooled to room temperature, and an organic layer was extracted with ethyl acetate. An organic layer extracted therefrom was washed with a saturated aqueous sodium chloride solution, and dried using sodium sulfate. The residue from which the solvent was removed was separated using column chromatography to obtain 9.1 g (15 mmol) of Intermediate Compound 49-2.

(3) Synthesis of Compound BD49

9.1 g (15 mmol) of Intermediate Compound 49-2, 1.0 g (4 mmol) of dichloro(1,5-cyclooctadiene)platinum, and 2.2 g (20 mmol) of sodium acetate were suspended in 100 ml of dioxane. The reaction mixture was heated, and stirred at 120° C. for 72 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 1.8 g (1.9 mmol) of Compound BD49.
Synthesis Example 5: Synthesis of Compound BD52
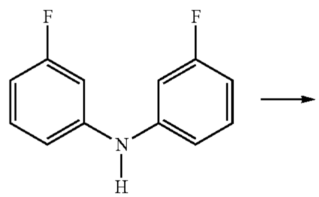
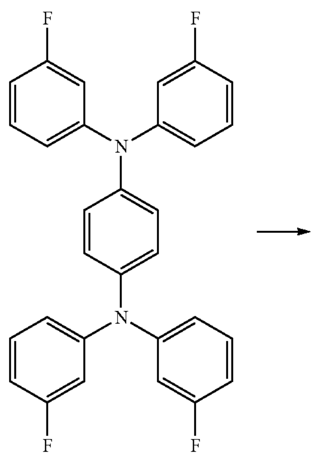
52-1
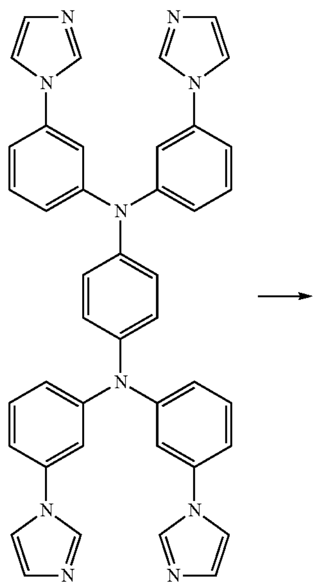
52-2
-continued
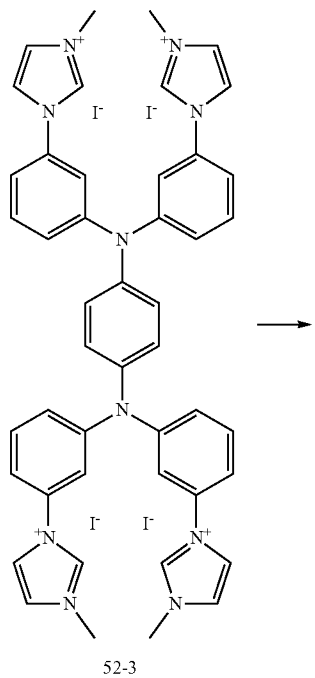
52-3
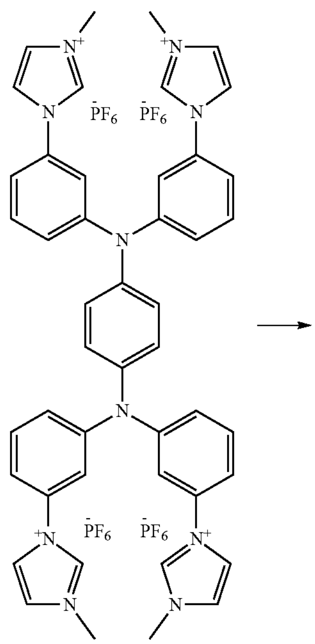
52-4

-continued

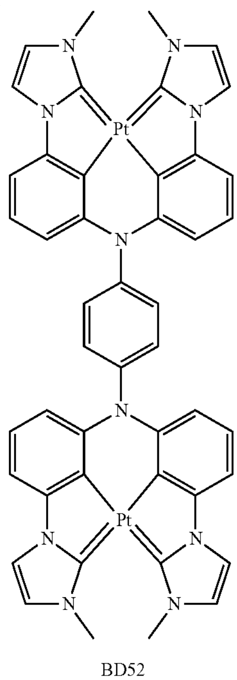

BD52

(1) Synthesis of Intermediate Compound 52-1

22.0 g (51 mmol) of bis(3-fluorophenyl)amine, 4.5 g (22 mmol) of 1,4-dibromobenzene, 0.8 g (0.06 mmol) of Tetrakis(triphenylphosphine)palladium, and 16.5 g (110 mmol) of potassium triphosphate were added to a reaction vessel, and suspended in 650 mL of THF/$H_2O$. The reaction mixture was heated and stirred at 80° C. for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 18.5 g (20 mmol) of Intermediate Compound 52-1.

(2) Synthesis of Intermediate Compound 52-2

18.5 g (20 mmol) of Intermediate Compound 52-1, 12.5 g (125 mmol) of imidazole, and 16.5 g (110 mmol) of potassium triphosphate were placed in a reaction vessel and suspended in 400 mL of dimethylsulfoxide. The reaction mixture was heated, and stirred at the temperature of 160° C. for 24 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom, was separated using column chromatography to obtain 10.2 g (15 mmol) of Intermediate Compound 52-2.

(3) Synthesis of Intermediate Compound 52-3 and Intermediate Compound 52-4

10.2 g (15 mmol) of Intermediate Compound 52-2 and iodomethane (excess) were placed in a reaction vessel and suspended in 110 mL of dichloromethane. The reaction mixture was heated to 50° C. and stirred for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 13.0 g (14 mmol) of Intermediate Compound 52-3.

Immediately thereafter, 3.3 g (25 mmol) of ammonium hexafluorophosphate was added to the reaction vessel and suspended in a solution including methanol and water at the volumetric ratio of 2:1. The reaction mixture was stirred at room temperature for 12 hours. The resulting solid was filtered and separated using column chromatography to obtain 12.5 g (13 mmol) of Intermediate Compound 52-4.

(4) Synthesis of Compound BD52

12.5 g (13 mmol) of Intermediate Compound 52-4, 1.0 g (4 mmol) of dichloro(1,5-cyclooctadiene)platinum, and 2.2 g (20 mmol) of sodium acetate were suspended in 100 ml of dioxane. The reaction mixture was heated, and stirred at 120° C. for 72 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 1.5 g (1.3 mmol) of Compound BD52.

$^1$H NMR and MS/FAB of the compounds synthesized according to the Synthesis Examples are shown in Table 1. Synthesis methods of other compounds in addition to these compounds synthesized in the Synthesis Examples may be readily recognized by those skilled in the art by referring to the synthesis paths and source materials.

TABLE 1

| Compound No. | $^1$H NMR ($CDCl_3$, 400 MHz) | MS/FAB found | MS/FAB calc. |
|---|---|---|---|
| BD1 | 4.31 (d, 4H), 4.57 (d, 4H), 7.12-7.32 (m, 4H), 7.38-7.65 (m, 12H) | 1131.07 | 1130.32 |
| BD8 | 1.42 (s, 36H), 7.05 (d, 4H), 7.10-7.31 (m, 8H), 7.36-7.60 (m, 16H) | 1555.70 | 1554.60 |
| BD13 | 7.05-7.10 (m, 8H), 7.11-7.33 (m, 12H), 7.37-7.67 (m, 16H) | 1407.32 | 1406.41 |
| BD49 | 7.00-7.05 (m, 4H), 7.07-7.22 (m, 12H), 7.29-7.44 (m, 16H) | 1107.01 | 1106.20 |
| BD52 | 1.42 (s, 12H), 4.31 (d, 4H), 4.57 (d, 4H), 7.12-7.32 (m, 4H), 7.38-7.65 (m, 12H) | 1143.05 | 1142.33 |

Example 1

As an anode, an ITO glass substrate with Corning 15 Ω/$cm^2$ (1,200 Å) deposited thereon, was cut to a size of 50 mm×50 mm×0.7 mm, sonicated with isopropyl alcohol and pure water each for 5 minutes, and cleaned by exposure to ultraviolet rays and ozone for 30 minutes. The substrate was provided to a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter, NPB) was vacuum-deposited on the hole injection layer to form a hole transport layer having a thickness of 300 Å.

3,3-di(9H-carbazol-9-yl)biphenyl (mCBP), which is a host, and Compound BD1, which is a dopant, were co-deposited on the hole transport layer at a weight ratio of 90:10 to form an emission layer having a thickness of 300 Å.

TSPO1 (diphenyl(4-(triphenylsilyl)phenyl)-phosphine oxide) was vacuum-deposited on the emission layer to form a hole-blocking layer having a thickness of 50 Å, and $Alq_3$ was deposited on the hole-blocking layer to form an electron transport layer having a thickness of 300 Å. LiF, which is a halogenated alkali metal, was deposited on the electron transport layer to form an electron injection layer having a thickness of 10 Å, and Al was vacuum-deposited on the electron injection layer to a thickness of 3,000 Å, thereby forming a LiF/Al cathode electrode. Thus, the manufacture of a light-emitting device was completed.

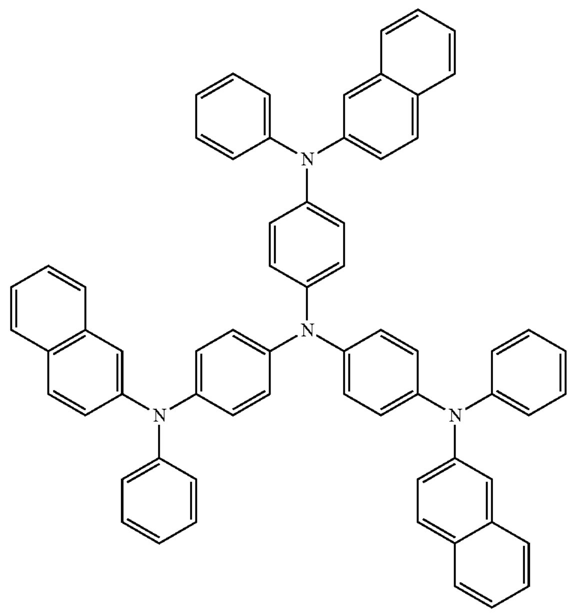

2-TNATA

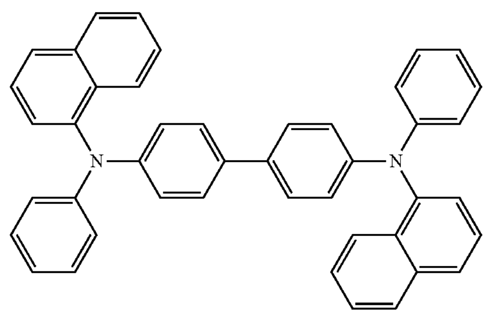

NPB

-continued

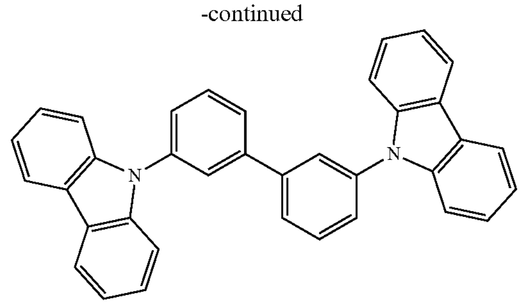

mCBP

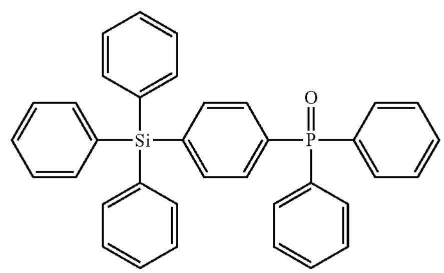

TSPO1

Examples 2 to 5 and Comparative Examples 1 to 4

Light-emitting devices were manufactured in the same manner as in Example 1, except that in forming an emission layer, for use as a dopant, corresponding compounds shown in Table 2 were used instead of Compound BD1.

Evaluation Example

A voltage was applied to the light-emitting devices manufactured according to Examples 1 to 5 and Comparative Examples 1 to 4 such that the light-emitting devices had the current density of 50 $mA/cm^2$, and the driving voltage, current density, luminance, efficiency, emission color and emission wavelength thereof were measured by using Keithley SMU 236 and luminance meter PR650. Results thereof are shown in Table 2.

TABLE 2

| | Dopant in emission layer | Driving voltage (V) | Current density ($mA/cm^2$) | Luminance ($cd/m^2$) | Efficiency (cd/A) | Emission color | Emission wavelength (nm) |
|---|---|---|---|---|---|---|---|
| Example 1 | BD1 | 4.56 | 50 | 4018 | 9.55 | Blue | 460 |
| Example 2 | BD8 | 4.72 | 50 | 4001 | 9.17 | Blue | 461 |
| Example 3 | BD13 | 4.81 | 50 | 4012 | 9.26 | Blue | 462 |
| Example 4 | BD49 | 4.77 | 50 | 3950 | 9.11 | Blue | 461 |
| Example 5 | BD52 | 4.55 | 50 | 4020 | 9.60 | Blue | 460 |
| Comparative Example 1 | CE1 | 5.12 | 50 | 3863 | 7.73 | Blue | 465 |
| Comparative Example 2 | CE2 | 5.17 | 50 | 3880 | 7.89 | Blue | 465 |

TABLE 2-continued
| | Dopant in emission layer | Driving voltage (V) | Current density ($mA/cm^2$) | Luminance ($cd/m^2$) | Efficiency (cd/A) | Emission color | Emission wavelength (nm) |
|---|---|---|---|---|---|---|---|
| Comparative Example 3 | CE3 | 5.05 | 50 | 2000 | 8.51 | Green | 482 |
| Comparative Example 4 | CE4 | 5.22 | 50 | 3902 | 7.70 | Blue | 464 |
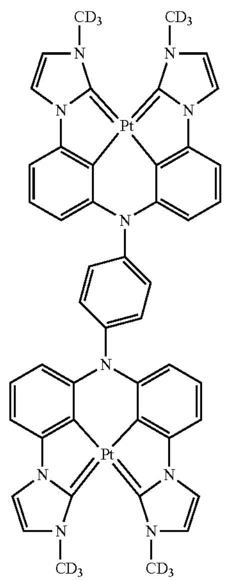
BD1
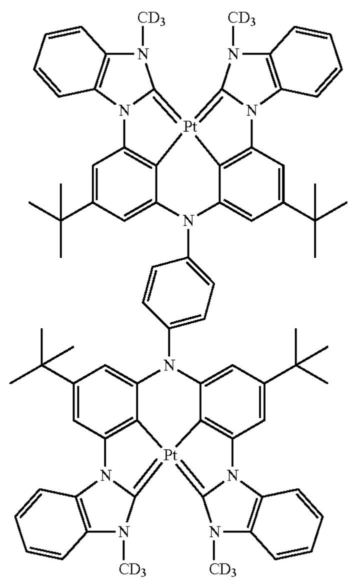
BD8

TABLE 2-continued
| Dopant in emission layer | Driving voltage (V) | Current density ($mA/cm^2$) | Luminance ($cd/m^2$) | Efficiency (cd/A) | Emission color | Emission wavelength (nm) |
|---|---|---|---|---|---|---|
| 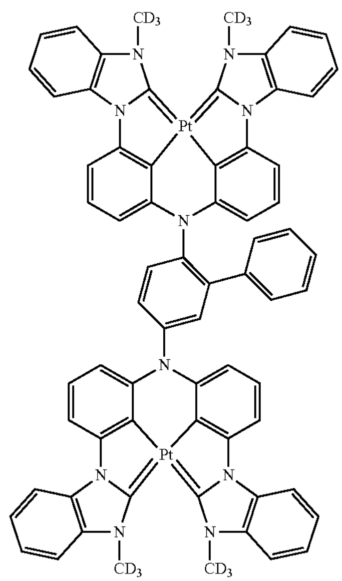 BD13 | | | | | | |
| 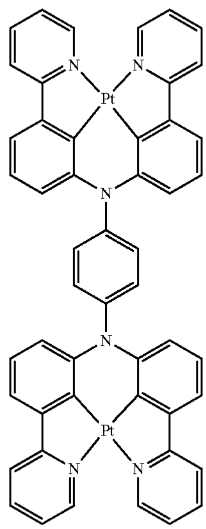 BD49 | | | | | | |

TABLE 2-continued
| Dopant in emission layer | Driving voltage (V) | Current density ($mA/cm^2$) | Luminance ($cd/m^2$) | Efficiency (cd/A) | Emission color | Emission wavelength (nm) |
|---|---|---|---|---|---|---|
| 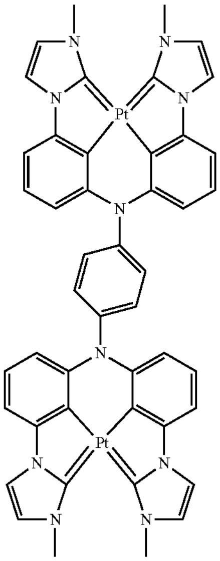 BD52 | | | | | | |
| 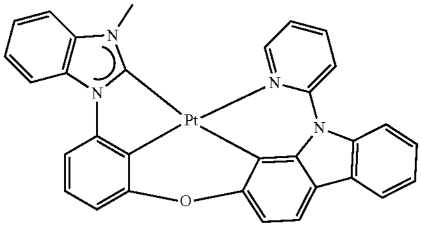 CE1 | | | | | | |
| 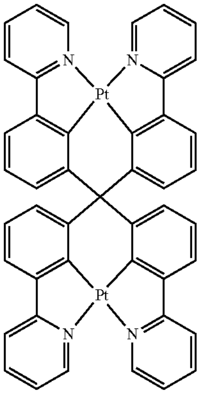 CE2 | | | | | | |
| 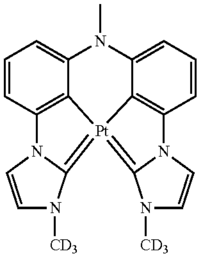 CE3 | | | | | | |

TABLE 2-continued

| | Dopant in emission layer | Driving voltage (V) | Current density ($mA/cm^2$) | Luminance ($cd/m^2$) | Efficiency (cd/A) | Emission color | Emission wavelength (nm) |
|---|---|---|---|---|---|---|---|

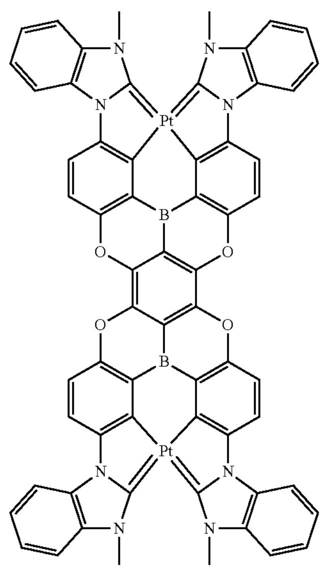

CE4

Referring to Table 2, it can be seen that the light-emitting devices according to Examples have a lower driving voltage and higher luminance and efficiency than the light-emitting devices of Comparative Examples.

A light-emitting device including the organometallic compound may have low driving voltage, and excellent luminance and luminescence efficiency, and thus, may be used to manufacture a high-quality electronic apparatus having excellent light efficiency and long lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device, comprising:

a first electrode;

a second electrode facing the first electrode;

an interlayer between the first electrode and the second electrode and comprising an emission layer; and an organometallic compound represented by Formula 1:

[Formula 1]

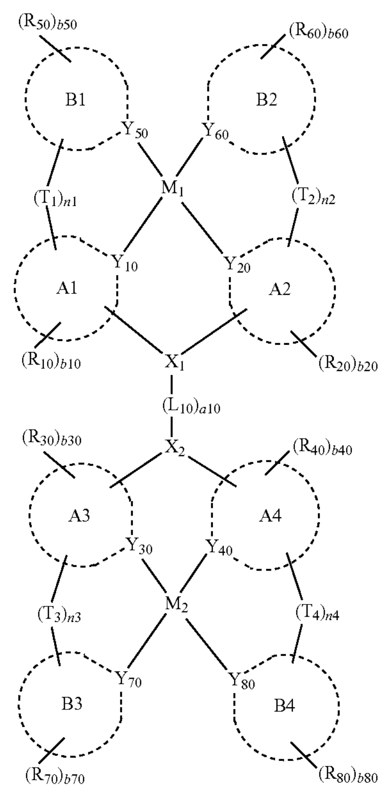

wherein in Formula 1, $M_1$ and $M_2$ are each independently platinum (Pt), palladium (Pd), gold (Au), nickel (Ni), silver (Ag), or copper (Cu), A1 to A4 and B1 to B4 are each independently a $C_5$-$C_{60}$ carbocyclic group or a $C_1$-$C_{60}$ heterocyclic group, $Y_{10}$, $Y_{20}$, $Y_{30}$, $Y_{40}$, $Y_{50}$, $Y_{60}$, $Y_{70}$, and $Y_{80}$ are each independently C or N, two bonds selected from a bond between $Y_{10}$ and $M_1$, a bond between $Y_{20}$ and $M_1$, a bond between $Y_{50}$ and $M_1$, and a bond between $Y_{60}$ and $M_1$ are each a coordinate bond, and the remainder thereof are each a covalent bond, two bonds selected from a bond between $Y_{30}$ and $M_2$, a bond between $Y_{40}$ and $M_2$, a bond between $Y_{70}$ and $M_2$, and a bond between $Y_{80}$ and $M_2$ are each a coordinate bond, and the remainder thereof are each a covalent bond, $T_1$ and $T_2$ are each independently a single bond, *—O—*', *—S—*', *—C($R_1$)($R_2$)—*', *—C($R_1$)=', *=C($R_1$)—*', *—C($R_1$)=C($R_2$)—*', *—C(=O)—*', *—C(=S)—*', *—C≡C—*', *—B($R_1$)—*', *—N($R_1$)—*', *—P($R_1$)—*', *—Si($R_1$)($R_2$)—*', *—P($R_1$)($R_2$)—*', or *—Ge($R_1$)($R_2$)—*', $T_3$ and $T_4$ are each independently a single bond, *—O—*', *—S—*', *—C($R_3$)($R_4$)—*', *—C($R_3$)=*', *=C($R_3$)—*', *—C($R_3$)=C($R_4$)—*', *—C(=O)—*', *—C(=S)—*', *—C≡C—*', *—B($R_3$)—*', *—N($R_3$)—*', *—P($R_3$)—*', *—Si($R_3$)($R_4$)—*', *—P($R_3$)($R_4$)—*' or *—Ge($R_3$)($R_4$)—*', n1 to n4 are each independently 1, 2, or 3, $X_1$ is N, P, C($R_5$), or Si($R_5$), $X_2$ is N, P, C($R_6$), or Si($R_6$), $L_{10}$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a10 is 1, 2, 3, 4, or 5,

* and *' each indicate a binding site to a neighboring atom, $R_1$ to $R_6$, $R_{10}$, $R_{20}$, $R_{30}$, $R_{40}$, $R_{50}$, $R_{60}$, $R_{70}$, and $R_{80}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b10, b20, b30, b40, b50, b60, b70, and b80 are each independently an integer from 0 to 20, each of: $R_1$ and $R_2$; $R_3$ and $R_4$; two or more of $R_{10}$ in the number of b10; two or more of $R_{20}$ in the number of b20; two or more of $R_{30}$ in the number of b30, two or more of $R_{40}$ in the number of b40; two or more of $R_{50}$ in the number of b50; two or more of $R_{60}$ in the number of b60; two or more of $R_{70}$ in the number of b70; and two or more of $R_{80}$ in the number of b80 are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_1$, $R_2$, $R_{10}$, $R_{20}$, $R_{50}$, and $R_{60}$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_3$, $R_4$, $R_{30}$, $R_{40}$, $R_{70}$, and $R_{80}$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is:

deuterium, —F, —Cl, —Br, a hydroxyl group, a cyano group, or a nitro group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_7$-$C_{60}$ arylalkyl group, or a $C_2$-$C_{60}$ heteroarylalkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The light-emitting device of claim 1, wherein the interlayer further comprises:

a hole transport region between the first electrode and the emission layer; and an electron transport region between the emission layer and the second electrode, the hole transport region comprises a hole injection layer, a hole transport layer, an emission auxiliary layer, an electron-blocking layer, or a combination thereof, and the electron transport region comprises a buffer layer, a hole-blocking layer, an electron control layer, an electron transport layer, an electron injection layer, or a combination thereof.

3. The light-emitting device of claim 1, wherein the emission layer includes the organometallic compound.

4. The light-emitting device of claim 1, wherein the emission layer emits blue light having a maximum emission wavelength in a range of about 430 nm to about 470 nm.

5. The light-emitting device of claim 1, wherein the emission layer comprises a host and a dopant, and the dopant includes the organometallic compound.

6. The light-emitting device of claim 2, wherein the electron transport region comprises an electron transport layer and an electron injection layer, and at least one of the electron transport layer and the electron injection layer comprises an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof.

7. An electronic apparatus comprising the light-emitting device of claim 1.

8. The electronic apparatus of claim 7, further comprising:

a thin-film transistor; and a color filter, a color conversion layer, a touch screen layer, a polarizing layer, or a combination thereof, wherein the thin-film transistor includes a source electrode and a drain electrode, and the first electrode of the light-emitting device is electrically connected to the source electrode or the drain electrode.

9. An electronic device comprising the light-emitting device of claim 1, wherein the electronic device is a flat panel display, a curved display, a computer monitor, a medical monitor, a television, a billboard, an indoor light, an outdoor light, a signal light, a head-up display, a fully transparent display, a partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a micro display, a three-dimensional (3D) display, a virtual reality display, an augmented reality display, a vehicle, a video wall with multiple displays tiled together, a theater screen, a stadium screen, a phototherapy device, or a signboard.

10. An organometallic compound represented by Formula 1:

[Formula 1]

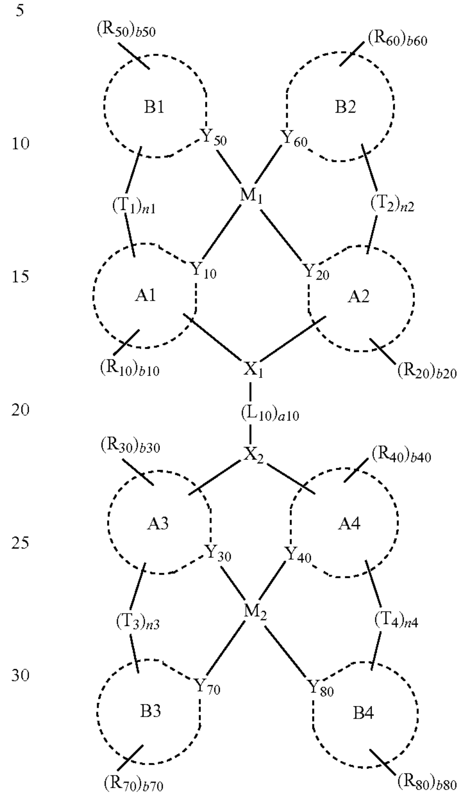

wherein in Formula 1, $M_1$ and $M_2$ are each independently platinum (Pt), palladium (Pd), gold (Au), nickel (Ni), silver (Ag), or copper (Cu), A1 to A4 and B1 to B4 are each independently a $C_5$-$C_{60}$ carbocyclic group or a $C_1$-$C_{60}$ heterocyclic group, $Y_{10}$, $Y_{20}$, $Y_{30}$, $Y_{40}$, $Y_{50}$, $Y_{60}$, $Y_{70}$, and $Y_{80}$ are each independently C or N, two bonds selected from a bond between Yeo and $M_1$, a bond between $Y_{20}$ and $M_1$, a bond between $Y_{50}$ and $M_1$, and a bond between $Y_{60}$ and $M_1$ are each a coordinate bond, and the remainder thereof are each a covalent bond, two bonds selected from a bond between $Y_{30}$ and $M_2$, a bond between $Y_{40}$ and $M_2$, a bond between $Y_{70}$ and $M_2$, and a bond between $Y_{80}$ and $M_2$ are each a coordinate bond, and the remainder thereof are each a covalent bond, $T_1$ and $T_2$ are each independently a single bond, *—O—*', *—S—*', *—$C(R_1)(R_2)$—*', *—$C(R_1)$=*', *=$C(R_1)$—*', *—$C(R_1)$=$C(R_2)$—*', *—C(=O)—*', *—C(=S)—*', *—C≡C—*', *—$B(R_1)$—*', *—$N(R_1)$—*', *—$P(R_1)$—*', *—$Si(R_1)(R_2)$—*', *—$P(R_1)(R_2)$—*', or *—$Ge(R_1)(R_2)$—*', $T_3$ and $T_4$ are each independently a single bond, *—O—*', *—S—*', *—$C(R_3)(R_4)$—*', *—$C(R_3)$=*', *=$C(R_3)$—*', *—$C(R_3)$=$C(R_4)$—*', *—C(=O)—*', *—C(=S)—*', *—C≡C—*', *—$B(R_3)$—*', *—$N(R_3)$—*', *—$P(R_3)$—*', *—$Si(R_3)(R_4)$—*', *—$P(R_3)(R_4)$—*' or *—$Ge(R_3)(R_4)$—*', n1 to n4 are each independently 1, 2, or 3, $X_1$ is N, P, $C(R_5)$, or $Si(R_5)$, $X_2$ is N, P, $C(R_6)$, or $Si(R_6)$, $L_{10}$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a10 is 1, 2, 3, 4, or 5,

* and *' each indicate a binding site to a neighboring atom, $R_1$ to $R_6$, $R_{10}$, $R_{20}$, $R_{30}$, $R_{40}$, $R_{50}$, $R_{60}$, $R_{70}$, and $R_{80}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$alkoxy group unsubstituted or substituted with at least one $R_{10a}$, a $C_1$-$C_{60}$ alkylthio group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b10, b20, b30, b40, b50, b60, b70, and b80 are each independently an integer from 0 to 20, each of: $R_1$ and $R_2$; $R_3$ and $R_4$; two or more of $R_{10}$ in the number of b10; two or more of $R_{20}$ in the number of b20; two or more of $R_{30}$ in the number of b30; two or more of $R_{40}$ in the number of b40; two or more of $R_{50}$ in the number of b50; two or more of $R_{60}$ in the number of b60; two or more of $R_{70}$ in the number of b70; and two or more of $R_{80}$ in the number of b80 are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_1$, $R_2$, $R_{10}$, $R_{20}$, $R_{50}$, and $R_{60}$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_3$, $R_4$, $R_{30}$, $R_{40}$, $R_{70}$, and $R_{80}$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is:

deuterium, —F, —Cl, —Br, a hydroxyl group, a cyano group, or a nitro group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_3$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_7$-$C_{60}$ arylalkyl group, or a $C_2$-$C_{60}$ heteroaralkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

11. The organometallic compound of claim 10, wherein:

a bond between $Y_{50}$ and $M_1$ and a bond between $Y_{60}$ and $M_1$ are each a coordinate bond, $Y_{50}$ and $Y_{60}$ are each independently C or N, a bond between $Y_{10}$ and $M_1$ and a bond between $Y_{20}$ and $M_1$ are each a covalent bond, and $Y_{10}$ and $Y_{20}$ are each independently C or N; and/or a bond between $Y_{70}$ and $M_2$ and a bond between $Y_{80}$ and $M_2$ are each a coordinate bond, $Y_{70}$ and $Y_{80}$ are each independently C or N, a bond between $Y_{30}$ and $M_2$ and a bond between $Y_{40}$ and $M_2$ are each a covalent bond, and $Y_{30}$ and $Y_{40}$ are each independently C or N.

12. The organometallic compound of claim 10, wherein $Y_{10}$, $Y_{20}$, $Y_{30}$, and $Y_{40}$ are each C, and at least two of $Y_{50}$, $Y_{60}$, $Y_{70}$, and $Y_{80}$ are each C.

13. The organometallic compound of claim 10, wherein A1 to A4 and B1 to B4 are each independently a benzene group, a naphthalene group, an anthracene group, a phenanthrene group, an azulene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 2,3-dihydrotriazole group, an oxazole group, an isoxazole group, a thiazole group, an isothiazole group, an oxadiazole group, a thiadiazole group, a benzopyrazole group, a pyrazolopyridine group, a furopyrazole group, a thienopyrazole group, a benzimidazole group, a 2,3-dihydrobenzimidazole group, an imidazopyridine group, a 2,3-dihydroimidazopyridine group, a furoimidazole group, a thienoimidazole group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

14. The organometallic compound of claim 10, wherein the organometallic compound satisfies at least one of Condition 1 and Condition 2:

[Condition 1]

A1 to A4 in Formula 1 are each independently a moiety represented by one of Formula 2-1 to 2-23:

2-1

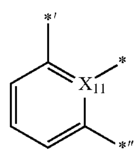

2-2

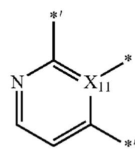

2-3

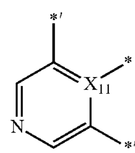

2-4

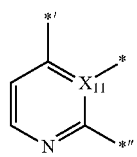

2-5

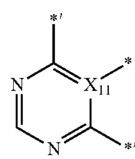

2-6

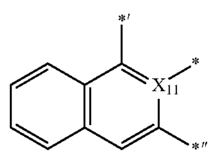

2-7

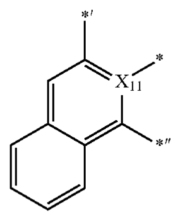

2-8

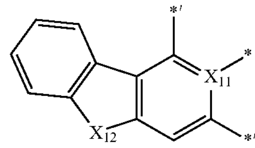

-continued 2-9

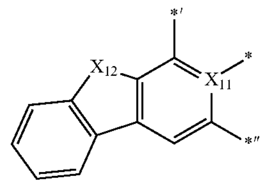

2-10

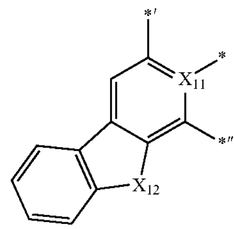

2-11

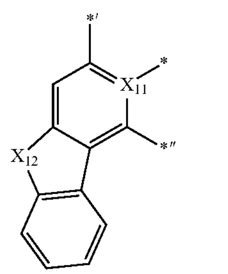

2-12

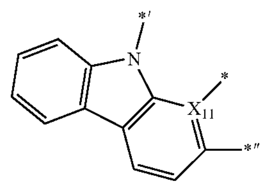

2-13

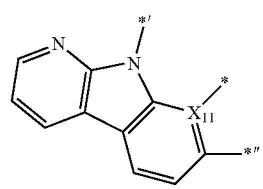

2-14

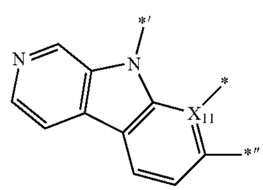

2-15

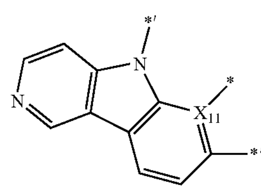

2-16

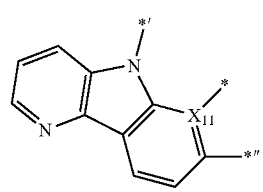

-continued 2-17

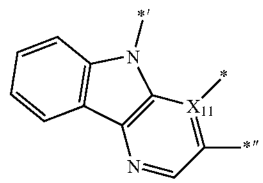

2-18

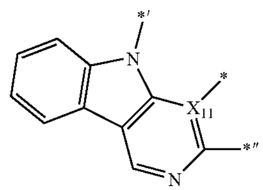

2-19

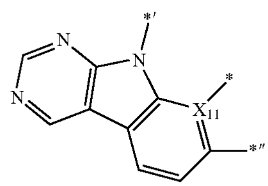

2-20

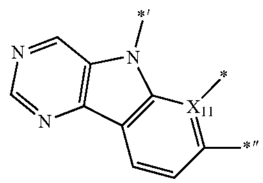

2-21

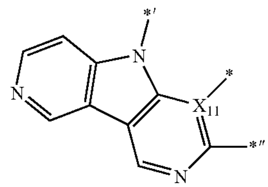

2-22

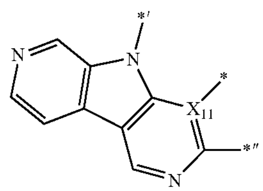

2-23

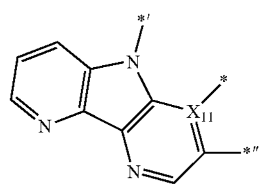

wherein in Formulae 2-1 to 2-23, $X_{11}$ is C or N, $X_{12}$ is O, S, $N(Z_{12})$, $C(Z_{12})(Z_{13})$, or $Si(Z_{12})(Z_{13})$, $Z_{12}$ and $Z_{13}$ are each independently the same as described in connection with $R_{10}$ in Formula 1,

* indicates a binding site to $M_1$ or $M_2$ in Formula 1,

*' indicates a binding site to $(T_1)_{n1}$, $(T_2)_{n2}$, $(T_3)_{n3}$, or $(T_4)_{n4}$ in Formula 1, and

*" indicates a binding site to $X_1$ or $X_2$ in Formula 1; and

[Condition 2]

B1 to B4 in Formula 1 are each independently a moiety represented by one of Formulae 3-1 to 3-35:

3-1

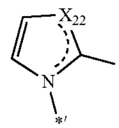

3-2

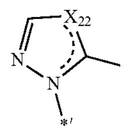

3-3

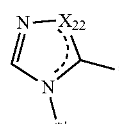

3-4

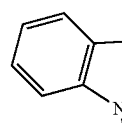

3-5

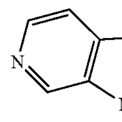

3-6

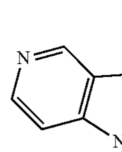

3-7

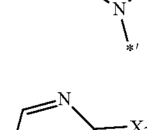

3-8

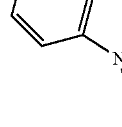

3-9

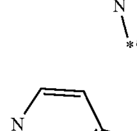

3-10

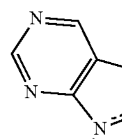

-continued
3-11
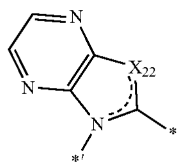
3-12
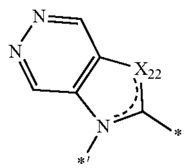
3-13
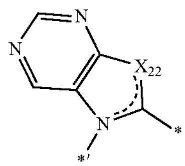
3-14
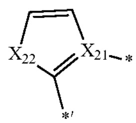
3-15
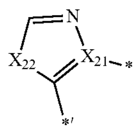
3-16
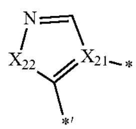
3-17
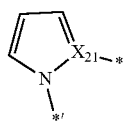
3-18
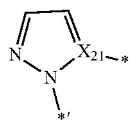
3-19
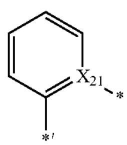
3-20
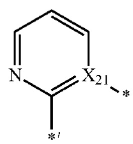
-continued
3-21
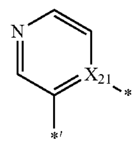
3-22
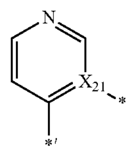
3-23
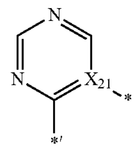
3-24
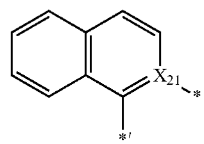
3-25
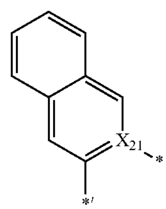
3-26
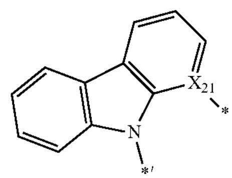
3-27
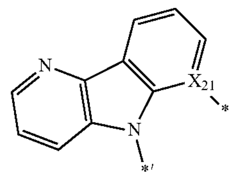
3-28
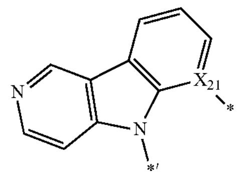
3-29
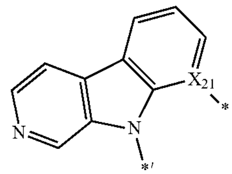

-continued 3-30

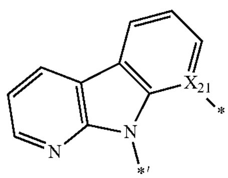

3-31

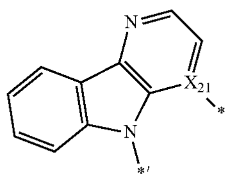

3-32

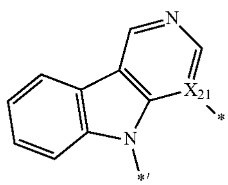

3-33

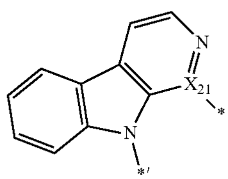

3-34

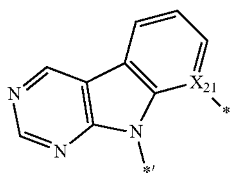

3-35

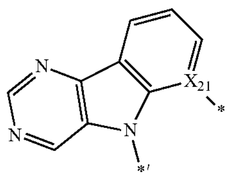

wherein in Formulae 3-1 to 3-35, $X_{21}$ is C or N, $X_{22}$ is O, S, $N(Z_{22})$, $C(Z_{22})(Z_{23})$, or $Si(Z_{22})(Z_{23})$, $Z_{22}$ and $Z_{23}$ are each independently the same as described in connection with $R_{50}$ in Formula 1,

* indicates a binding site to $M_1$ or $M_2$ in Formula 1, and

*' indicates a binding site to $(T_1)_{n1}$, $(T_2)_{n2}$, $(T_3)_{n3}$, or $(T_4)_{n4}$ in Formula 1.

15. The organometallic compound of claim 10, wherein $T_1$ to $T_4$ are each a single bond.

16. The organometallic compound of claim 10, wherein $X_1$ and $X_2$ are each independently N or P.

17. The organometallic compound of claim 10, wherein $L_{10}$ is a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-a fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$, $L_{10}$ is not bonded to each of A1 to A4, $R_{10}$, $R_{20}$, $R_{30}$, and $R_{40}$ in Formula 1, and $R_{10a}$ is the same as described in Formula 1.

18. The organometallic compound of claim 10, wherein $L_{10}$ is a group represented by one of Formulae 4-1 to 4-3:

4-1

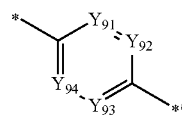

4-2

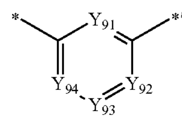

4-3

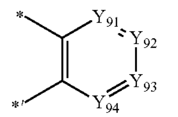

wherein in Formulae 4-1 to 4-3, $Y_{91}$ is $C(R_{91})$ or N, $Y_{92}$ is $C(R_{92})$ or N, $Y_{93}$ is $C(R_{93})$ or N, $Y_{94}$ is $C(R_{94})$ or N, $R_{91}$ to $R_{94}$ are each independently hydrogen, or are each independently the same as described in connection with $R_{10a}$ in Formula 1, and

* and *' each indicate a binding site to a neighboring atom.

19. The organometallic compound of claim 10, wherein $R_{10}$, $R_{20}$, $R_{30}$, $R_{40}$, $R_{50}$, $R_{60}$, $R_{70}$, and $R_{80}$ are each independently:

hydrogen, deuterium, —F, or a cyano group;

a $C_1$-$C_{20}$ alkyl group, a $C_1$-$C_{20}$ alkoxy group, or a $C_1$-$C_{20}$ alkylthio group, each unsubstituted or substituted with deuterium, —F, a cyano group, a phenyl group, a biphenyl group, or a combination thereof;

a cyclopentyl group, a pyrrolidinyl group, a cyclohexyl group, a phenyl group, a pyridinyl group, a pyrazinyl group, a pyrimidinyl group, a pyridazinyl group, a triazinyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, an indazolyl group, a purinyl group, a cinnolinyl group, a carbazolyl group, a benzofuranyl group, a dibenzofuranyl group, a benzothiophenyl group, a dibenzothiophenyl group, a benzocarbazolyl group, or a dibenzocarbazolyl group, each unsubstituted or substituted with deuterium, $—CD_3$, $—CD_2H$, $—CDH_2$, $—CF_3$, $—CF_2H$, $—CFH_2$, a cyano group, a $C_1$-$C_{20}$ alkyl group, $—Si(Q_{31})(Q_{32})(Q_{33})$, $—N(Q_{31})(Q_{32})$, $—B(Q_{31})(Q_{32})$, or a combination thereof; or $—Si(Q_1)(Q_2)(Q_3)$, $—N(Q_1)(Q_2)$, or $—B(Q_1)(Q_2)$, wherein $Q_1$ to $Q_3$ and $Q_{31}$ to $Q_{33}$ are each independently:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or a combination thereof.

20. The organometallic compound of claim 10, wherein the organometallic compound is a compound represented by Formula 1-1:

[Formula 1-1]

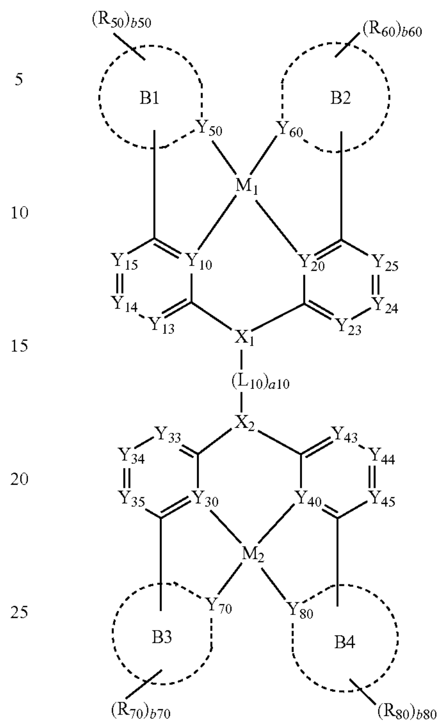

wherein in Formula 1-1, $M_1$, $M_2$, B1 to B4, $Y_{10}$, $Y_{20}$, $Y_{30}$, $Y_{40}$, $Y_{50}$, $Y_{60}$, $Y_{70}$, $Y_{80}$, $X_1$, $X_2$, $L_{10}$, a10, $R_{50}$, $R_{60}$, $R_{70}$, $R_{80}$, b50, b60, b70, and b80 are each the same as described in Formula 1, $Y_{13}$ is $C(R_{13})$ or N, $Y_{14}$ is $C(R_{14})$ or N, $Y_{15}$ is $C(R_{15})$ or N, $Y_{23}$ is $C(R_{23})$ or N, $Y_{24}$ is $C(R_{24})$ or N, $Y_{25}$ is $C(R_{25})$ or N, $Y_{33}$ is $C(R_{33})$ or N, $Y_{34}$ is $C(R_{34})$ or N, $Y_{35}$ is $C(R_{35})$ or N, $Y_{43}$ is $C(R_{43})$ or N, $Y_{44}$ is $C(R_{44})$ or N, $Y_{45}$ is $C(R_{45})$ or N, $R_{13}$ to $R_{15}$ are each independently the same as described in connection with $R_{10}$ in Formula 1, two or more of $R_{13}$ to $R_{15}$ are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{23}$ to $R_{25}$ are each independently the same as described in connection with $R_{20}$ in Formula 1, two or more of $R_{23}$ to $R_{25}$ are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{33}$ to $R_{35}$ are each independently the same as described in connection with $R_{30}$ in Formula 1, two or more of $R_{33}$ to $R_{35}$ are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{43}$ to $R_{45}$ are each independently the same as described in connection with $R_{40}$ in Formula 1, and two or more of $R_{43}$ to $R_{45}$ are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

* * * * *